United States Patent [19]
Bradley et al.

[11] Patent Number: 5,524,281
[45] Date of Patent: Jun. 4, 1996

[54] APPARATUS AND METHOD FOR MEASURING THE PHASE AND MAGNITUDE OF MICROWAVE SIGNALS

[75] Inventors: Donald A. Bradley, Morgan Hill; Martin I. Grace, San Jose; Douglas R. Thornton, Felton; David P. Finch, Morgan Hill, all of Calif.

[73] Assignee: Wiltron Company, Morgan Hill, Calif.

[21] Appl. No.: 400,458

[22] Filed: Mar. 7, 1995

Related U.S. Application Data

[63] Continuation of Ser. No. 764,975, Sep. 23, 1991, abandoned, which is a continuation of Ser. No. 644,684, Jan. 22, 1991, abandoned, which is a continuation of Ser. No. 507,109, Apr. 9, 1990, abandoned, which is a continuation of Ser. No. 176,202, Mar. 31, 1988, abandoned.

[51] Int. Cl.$^6$ .................................................. H04B 17/00
[52] U.S. Cl. ...................................... 455/67.3; 324/601
[58] Field of Search .............................. 455/67.1, 67.4, 455/67.5, 67.6, 314, 315, 316, 317, 165.1, 166.1, 183.1, 184.1, 185.1, 186.1, 207, 208, 209, 226.1; 324/73.1, 601, 606; 331/2, 18, 22

[56] References Cited

U.S. PATENT DOCUMENTS

| | | |
|---|---|---|
| 4,375,698 | 3/1983 | Onotera et al. ............... 455/67.5 |
| 4,510,622 | 4/1985 | Mori et al. ..................... 455/67.5 |
| 4,545,072 | 10/1985 | Skutta ............................. 455/317 |
| 4,551,856 | 11/1985 | Victor et al. ................... 455/316 |
| 4,661,995 | 4/1987 | Kashiwagi ...................... 455/317 |
| 4,742,561 | 5/1988 | Tipton ............................ 455/67.3 |
| 4,839,578 | 6/1989 | Roos ............................... 324/601 |
| 4,982,164 | 1/1991 | Schiek et al. ............. 324/601 X |
| 5,233,418 | 8/1993 | Gumm et al. ............ 455/67.4 X |

*Primary Examiner*—Edward F. Urban
*Attorney, Agent, or Firm*—Fliesler, Dubb, Meyer & Lovejoy

[57] ABSTRACT

A measurement system is provided which comprises: source circuit for receiving feedback signals and for providing respective signals at respective discrete frequencies in a prescribed microwave frequency range, wherein the respective provided signals at respective discrete frequencies are substantially phase locked to at least one downconverted signal in response to the feedback signals; downconverting circuit for linearly downconverting the respective provided signals and for providing the at least one respective downconverted signal; and phase detector circuit for receiving the at least one respective downconverted signal and for providing the feedback signals.

50 Claims, 89 Drawing Sheets

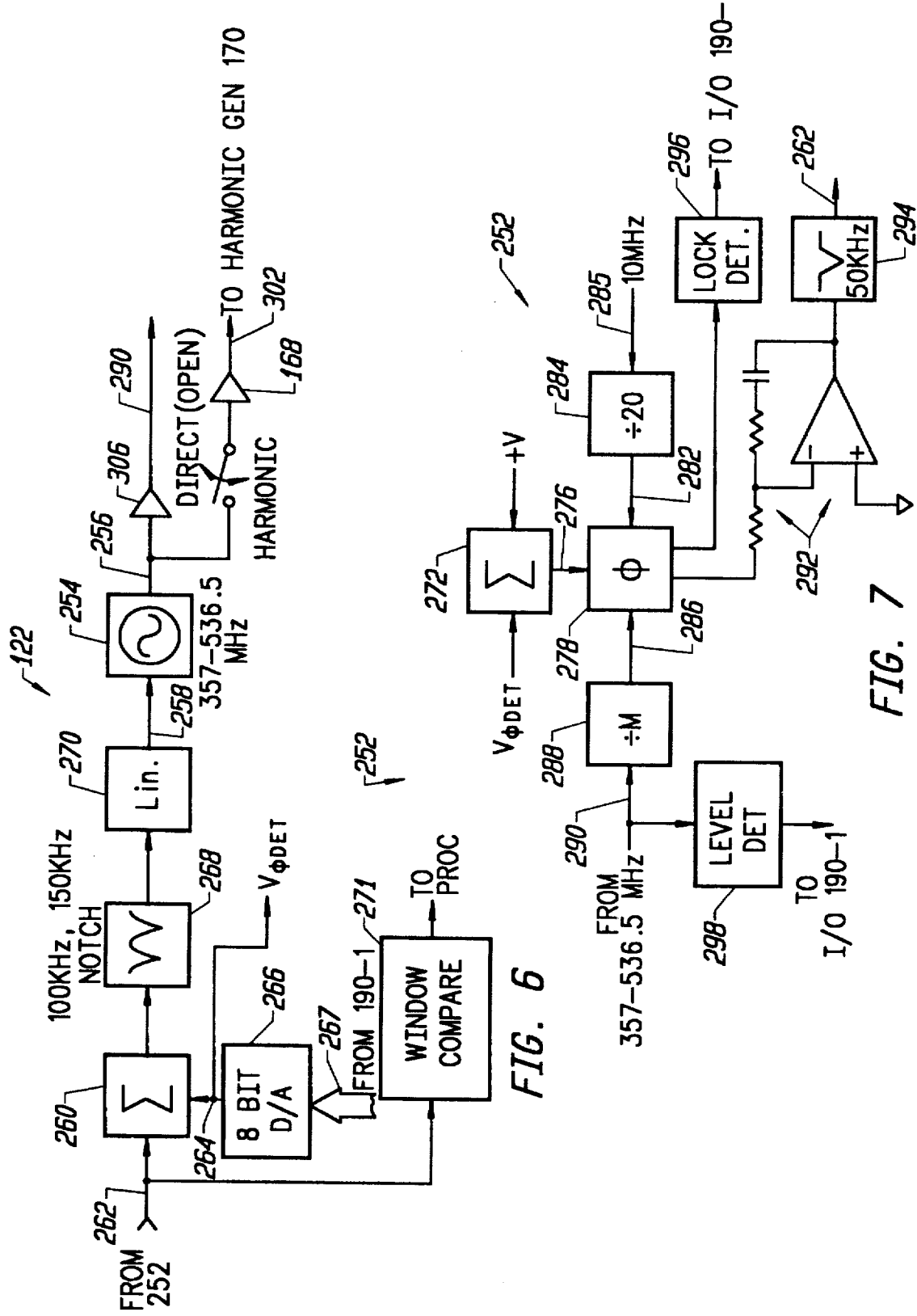

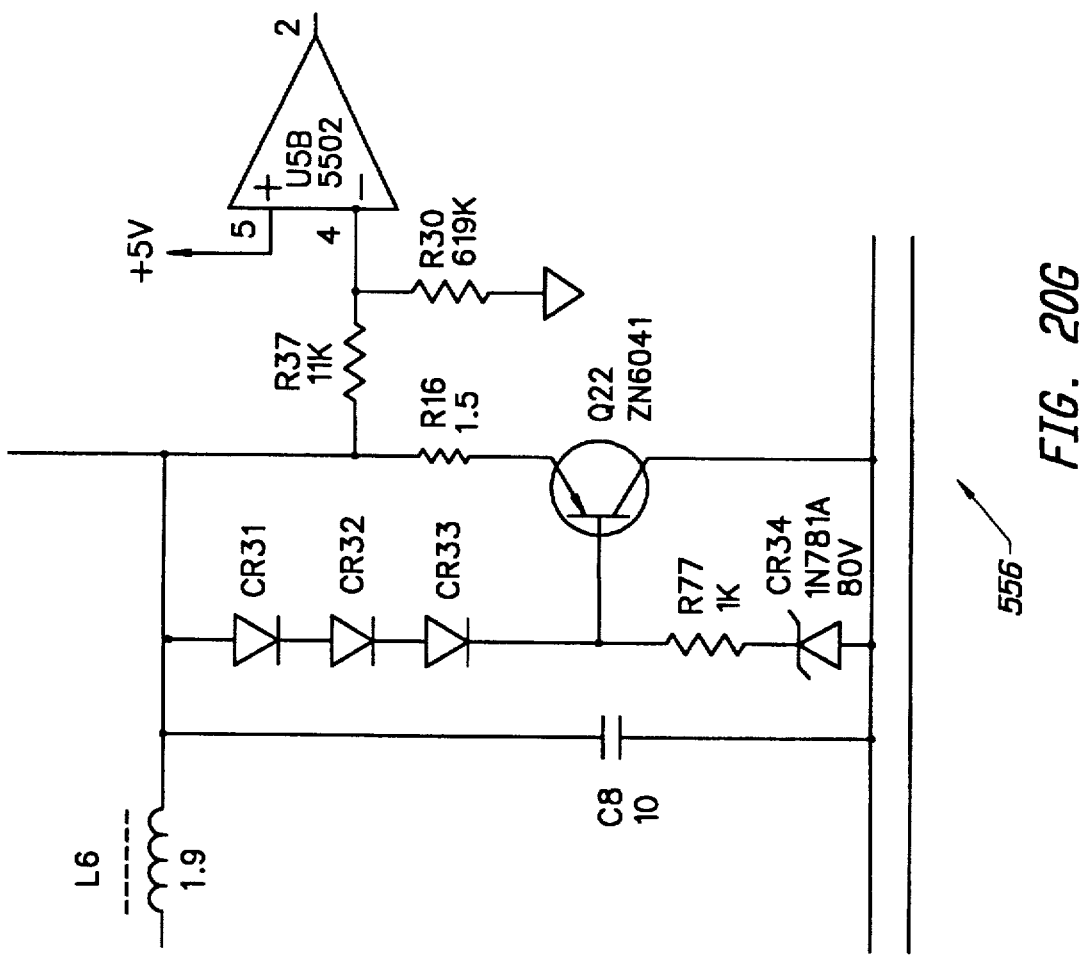

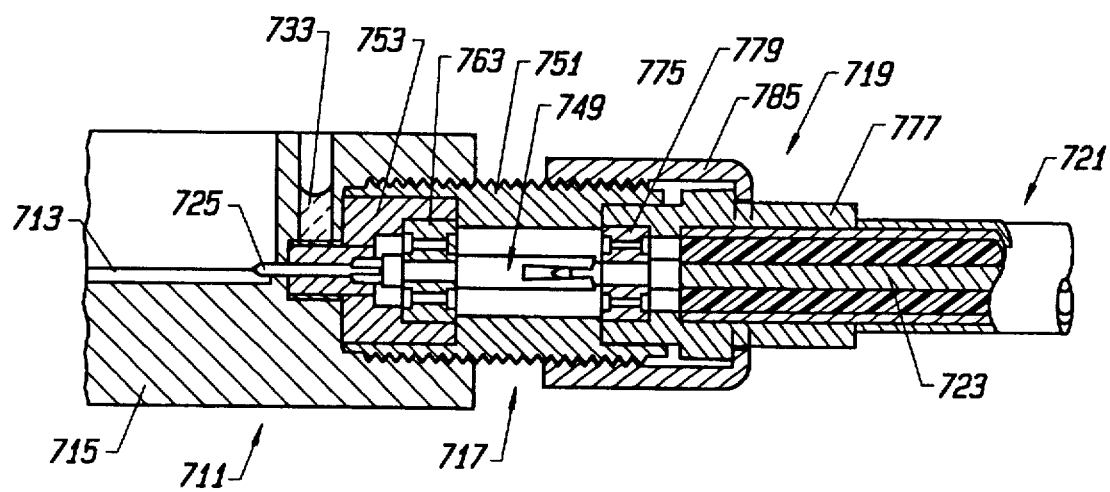
FIG. 23
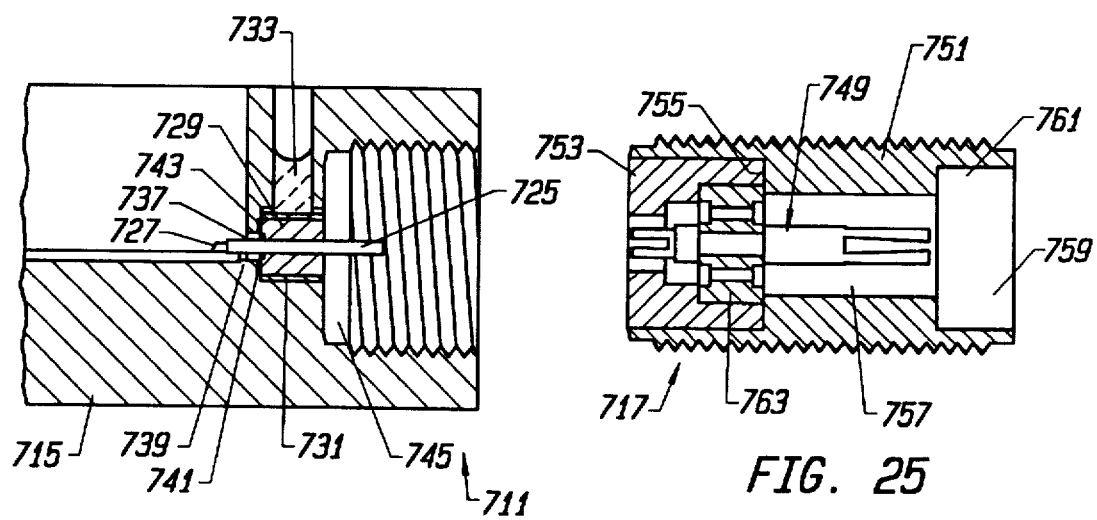
FIG. 24
FIG. 25
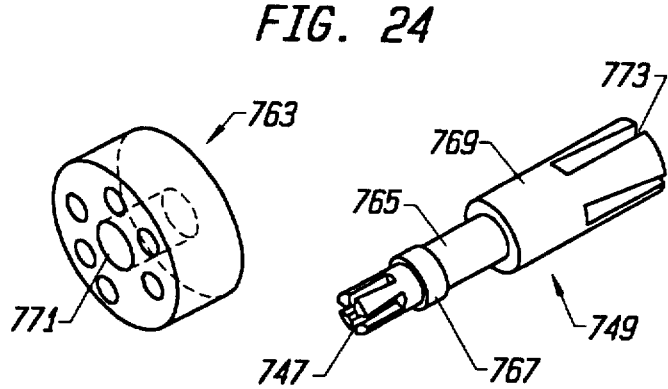
FIG. 26    FIG. 27    FIG. 28

TRANSMISSION AND REFLECTION MEASURE

Gain (dB)
Insertion Loss (dB)
Insertion Phase (degrees)
Transmission Coefficients ($S_{12}$, $S_{21}$)
Separation of Transmission
   Components (Real and Imaginary)
Electrical Length (m)
Electrical Delay (s)
Deviation from Linear Phase (degrees)
Group Delay (s)

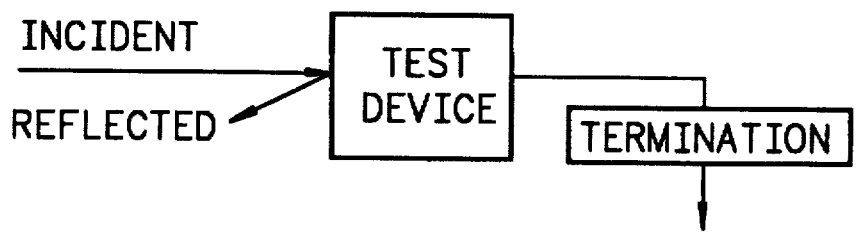

Return Loss (dB)
Reflection Coefficients ($S\cdots$, $S_{22}$)
Reflection Coefficients vs Distance
   (Fourier Transform)
Impedance ($R \pm jX$)
SWR

FIG. 33

A NETWORK ANALYZER IS A TUNED RECEIVER

- GREATER DYNAMIC RANGE
- LESS SENSITIVITY TO INTERFERING SIGNALS

S21 FORWARD TRANSMISSION

S12 REVERSE TRANSMISSION

MAGNITUDE AND PHASE OF
EACH ERROR SIGNAL IS MEASURED

THEN THE RESULTANT VECTOR IS
APPLIED MATHEMATICALLY, HENCE
VECTOR ERROR CORRECTION

CALIBRATION
- ☐ FULL 12 TERM
- ☐ 1 PATH 2 PORT
- ☐ FREQUENCY RESPONSE
- ☐ REFLECTION ONLY
- ☐ NONE

BEGIN CAL

○ APPLY CAL

FIG. 53

TABLE A

| MENU | PORT 1 DEVICE | PORT 2 DEVICE |
|------|---------------|---------------|
| C7A  | BROADBAND LOAD | BROADBAND LOAD |
| C7B  | SLIDING LOAD   | BROADBAND LOAD |
| C7C  | SLIDING LOAD   | INACTIVE |
| C7D  | BROADBAND LOAD | INACTIVE |
| C7E  | BROADBAND LOAD | SLIDING LOAD |
| C7F  | BROADBAND LOAD | BROADBAND LOAD |
| C7G  | OPEN           | SHORT |
| C7H  | SHORT          | OPEN |
| C7I  | BROADBAND LOAD | INACTIVE |
| C7J  | OPEN           | INACTIVE |
| C7K  | SHORT          | INACTIVE |
| C7L  | BROADBAND LOAD | BROADBAND LOAD |

*FIG. 55*

TABLE B

| MESSAGE A | MESSAGE B | MESSAGE C |
|-----------|-----------|-----------|
| PRESS <ENTER> TO MEASURE DEVICE(S) | MEASURING... PRESS <CLEAR> TO RESTART MEASUREMENT | PRESS <ENTER> FOR NEXT CAL STEP OR PRESS <CLEAR> TO REMEASURE |

*FIG. 56*

CALIBRATION SEQUENCE FLOWCHART

*Channel 1, 2, 3, or 4.* You select this display type by choosing "single display" on menu CM (Figure 3-73). Possible graph-types are either single Smith, polar, or rectilinear or dual rectilinear (magnitude and phase).

*Channels 1 and 3 or 2 and 4.* If you have chosen to display magnitude and phase, the affected area of the CRT screen is subdivided onto two smaller portions. You select this display type by choosing "Dual Display" in Menu CM.

*Channels 1, 2, 3 and 4.* From four-to-eight graph-types are displayed. In each quadrant, the graph-type can by any of the possible choices listed in the GT menus (Figure 3-76 and 3-77) if you have chosen to display magnitude and phase for a channel the quadrant displaying that channel is further subdivided as described above. You select this display type by choosing "All Four Channels" in menu CM.

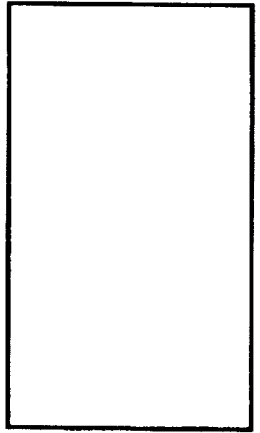

[WILTRON]

360 NETWORK ANALYZER

MODEL:     TEST DEVICE                    DATE: 8/28/87
DEVICE ID: 12345678                       OPERATOR: ROY STEWART

SWEEP DATA
START:  0.5000 GHz
STOP:   18.0000 GHz                       GATE START:
STEP:   350.0 MHz                         GATE STOP:
                                          GATE:
                                          WINDOW:

ERROR CODE: NONE
                                                                        AVERAGING:      1 PTS
                                                                        IF BNDWDTH: REDUCED

|  | ----CH1---- | ----CH2---- | ----CH3---- | ----CH4---- |
|---|---|---|---|---|
| S-PARAMETER: | S11 | S12 | S21 | S22 |
| NORMALIZATION: | OFF | OFF | OFF | OFF |
| REF DELAY: | 0.000  ps | 0.000  ps | 0.000  ps | 0.000  ps |
| SMOOTHING: | 0.0 PERCENT | 0.0 PERCENT | 0.0 PERCENT | 0.0 PERCENT |
| DELAY APERTURE: | — | — | — | — |

MARKERS:

| MKR | FREQ GHz | RESISTANCE OHMS | REACTANCE OHMS | MAGNITUDE dB | PHASE Deg | MAGNITUDE dB | RESISTANCE OHMS | REACTANCE OHMS |
|---|---|---|---|---|---|---|---|---|
| 1 | 7.8500  | 85.703E+00 | -11.970E+00 | 3.718 | -151.694 | 12.011 | 19.825E+00 | 20.716E+00 |
| 3 | 4.6650  | 37.349E+00 | -4.518E+00  | 4.207 | -0.361   | 12.489 | 58.958E+00 | -34.059E+00 |
| 5 | 13.4850 | 41.725E+00 | -6.515E+00  | 3.511 | 59.233   | 11.128 | 34.309E+00 | -6.206E+00 |
| 6 | 19.5450 | 38.332E+00 | -28.390E+00 | 4.372 | 29.332   | 11.341 | 73.573E+00 | -55.371E+00 |

FREQUENCY POINTS:

| Ph1 | FREQ GHz | RESISTANCE OHMS | REACTANCE OHMS | MAGNITUDE dB | PHASE Deg | MAGNITUDE dB | PHASE Deg | RESISTANCE OHMS | REACTANCE OHMS |
|---|---|---|---|---|---|---|---|---|---|
| 1 | 0.5000 | 47.243E+00 | -14.343E+00 | 4.528 | 116.710 | 15.006 | -8.387 | 117.751E+00 | 56.388E+00 |
| 2 | 1.2350 | 63.165E+00 | -5.036E+00 | 4.154 | -37.849 | 12.883 | -32.621 | 48.275E+00 | 16.530E+00 |
| 3 | 1.9701 | 42.529E+00 | -7.470E+00 | 6.421 | 166.338 | 12.568 | 22.254 | 26.752E+00 | 17.790E+00 |
| 4 | 2.7050 | 60.108E+00 | 13.569E+00 | 6.168 | -17.869 | 12.237 | 73.697 | 34.823E+00 | 3.727E+00 |
| 5 | 3.4400 | 39.521E+00 | -7.783E+00 | 4.295 | 176.085 | 12.546 | 128.759 | 50.463E+00 | -4.268E+00 |
| 6 | 4.1750 | | | | 6.918 | 12.338 | -177.085 | 29.507E+00 | 15.016E+00 |
| 7 | | | | | | | -124.935 | 28.507E+00 | 4.322E+00 |
| 23 | 15.9350 | 50.436E+00 | 4.925E+00 | 5.309 | 61.612 | 9.722 | 12.829 | | |
| 23 | 16.6700 | 59.046E+00 | 8.758E+00 | 3.155 | -112.332 | | | | |
| 24 | 17.4058 | 50.326E+00 | -21.596E+00 | 4.389 | 55.676 | 9.890 | 59.387 | 41.193E+00 | 21.928E+00 |
| 25 | 18.0000 | 66.534E+00 | -31.892E+00 | 4.374 | 155.557 | 10.683 | 9.061 | 168.743E+00 | 40.409E+00 |
| | | 59.154E+00 | 7.583E+00 | 3.536 | | | | | |

```
WILTRON
360 NETWORK ANALYZER
MODEL:      TEST_DEVICE
DEVICE ID:  12345678
```

SWEEP DATA

| | | | | |
|---|---|---|---|---|
| START: | 0.5000 GHz | GATE START: — | ERROR CORR: | NONE |
| STOP: | 18.0000 GHz | GATE STOP: — | AVERAGING: | 1 PTS |
| STEP: | 350.0 MHz | GATE: — | IF BNDWDTH: | REDUCED |
| | | WINDOW: — | | |

| | -------- CH1 -------- | -------- CH3 -------- |
|---|---|---|
| S-PARAMETER: | S11 | S21 |
| NORMALIZATION: | OFF | OFF |
| REF DELAY: | 0.000 p5 | 0.000 p5 |
| SMOOTHING: | 0.0 PERCENT | 0.0 PERCENT |
| DELAY APERTURE: | — | — |

MARKERS:

| MKR * | FREQ GHz | RESISTANCE OHMS | REACTANCE OHMS | MAGNITUDE dB | PHASE Deg |
|---|---|---|---|---|---|
| 1 | 7.8500 | 85.621E+00 | −11.990E+00 | 12.005 | 88.681 |
| 3 | 4.6650 | 37.355E+00 | −4.512E+00 | 12.482 | −21.169 |
| 5 | 13.4850 | 41.736E+00 | −6.530+00 | 11.121 | −105.378 |
| 6 | 10.5450 | 38.324E+00 | −28.107E+00 | 11.839 | 45.982 |

FREQUENCY POINTS:

| PNT * | FREQ GHz | RESISTANCE OHMS | REACTANCE OHMS | MAGNITUDE dB | PHASE Deg |
|---|---|---|---|---|---|
| 1 | 0.5000 | 47.248E+00 | −14.036E+00 | 13.006 | −8.877 |
| 2 | 1.2350 | 63.171E+00 | −5.023E+00 | 12.874 | −32.635 |
| 3 | 1.9700 | 42.523E+00 | −7.461E+00 | 12.557 | 22.233 |
| 4 | 2.7050 | 60.396E+00 | 13.547E+00 | 12.226 | 73.679 |
| 5 | 3.4400 | 39.521E+00 | −7.777E+00 | 12.538 | 128.750 |
| 6 | 4.1750 | 42.178E+00 | 6.193E+00 | 12.328 | −177.098 |
| 7 | 4.9100 | 65.105E+00 | 377.203E−03 | 12.097 | −124.948 |
| 8 | 5.6450 | 50.254E+00 | −7.799E+00 | 12.627 | −69.019 |
| 9 | 6.3800 | 71.803E+00 | 26.052E+00 | 12.001 | −18.102 |
| 10 | 7.1150 | 55.862E+00 | −1.837E+00 | 12.188 | 35.397 |
| 11 | 7.8500 | 85.621E+00 | −11.990E+00 | 12.005 | 88.681 |
| 12 | 8.5850 | 41.437E+00 | 24.506E+00 | 11.976 | 143.947 |

[WILTRON]

360 NETWORK ANALYZER

MODEL: TEST DEVICE  
DEVICE ID: 12345678

DATE: 8/28/87  
OPERATOR: ROY STEWART

PAGE 1

SWEEP DATA  
START: 0.5000 GHz  
STOP: 18.0000 GHz  
STEP: 350.0 MHz

DATE START: —  
DATE STOP: —  
DATE: —  
WINDOW:

ERROR CORR:  
AVERAGING: 1 PTS  
IF BNDWDTH: REDUCED

|  | —CH1— | —CH2— | —CH3— | —CH4— |
|---|---|---|---|---|
| S-PARAMETER: | S11 | S12 | S21 | S22 |
| NORMALIZATION: | OFF | OFF | OFF | OFF |
| REF DELAY: | 0.000 ps | 0.000 ps | 0.000 ps | 0.000 ps |
| SMOOTHING: | 0.0 PERCENT | 0.0 PERCENT | 0.0 PERCENT | 0.0 PERCENT |
| DELAY APERTURE: |  |  |  |  |

FIG. 65

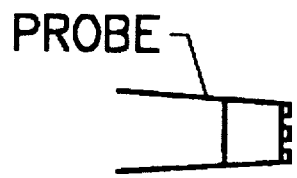
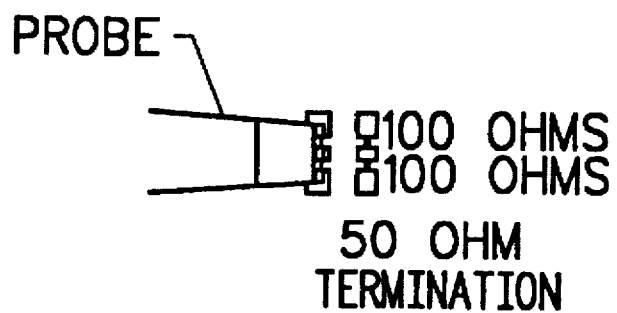
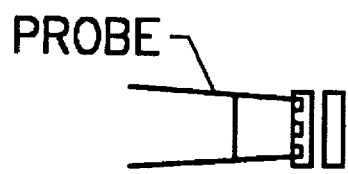
SHORT CIRCUIT
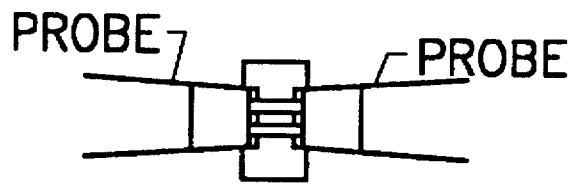
50 OHM THROUGHLINE
FIG. 74

SPECIAL CALIBRATION KITS

Not Perfect Either

CIRCUIT ELEMENTS
Lowpass Impulse Response

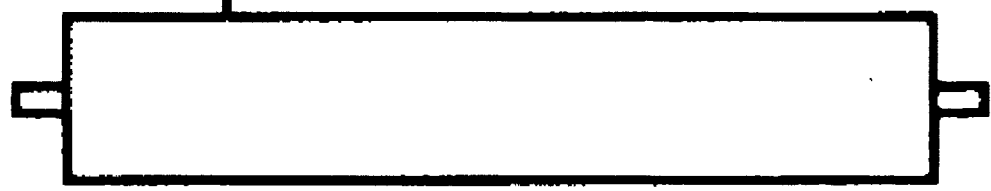
FIG. 77

CIRCUIT ELEMENTS
Lowpass Step Response
| Impedance | $S_{11}$ Real |
|---|---|
| $R > Z_0$ |  |
| $R < Z_0$ |  |
| Shunt C |  |
| Series L |  |
*FIG. 78*

CIRCUIT ELEMENTS
Bandpass impulse Response
| Impedance | $S_{11}$ Log Magnitude |
|---|---|
| $R > Z_0$ |  |
| $R < Z_0$ |  |
| Shunt C |  |
| Series L |  |
FIG. 80
CIRCUIT ELEMENTS
Bandpass-Phasor impulse Response
| Impedance | Real $S_{11}$ | Imaginary $S_{11}$ |
|---|---|---|
| $R > Z_0$ |  |  |
| $R < Z_0$ |  |  |
| Shunt C | 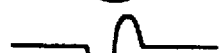 |  |
| Series L | 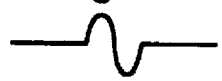 |  |
FIG. 81

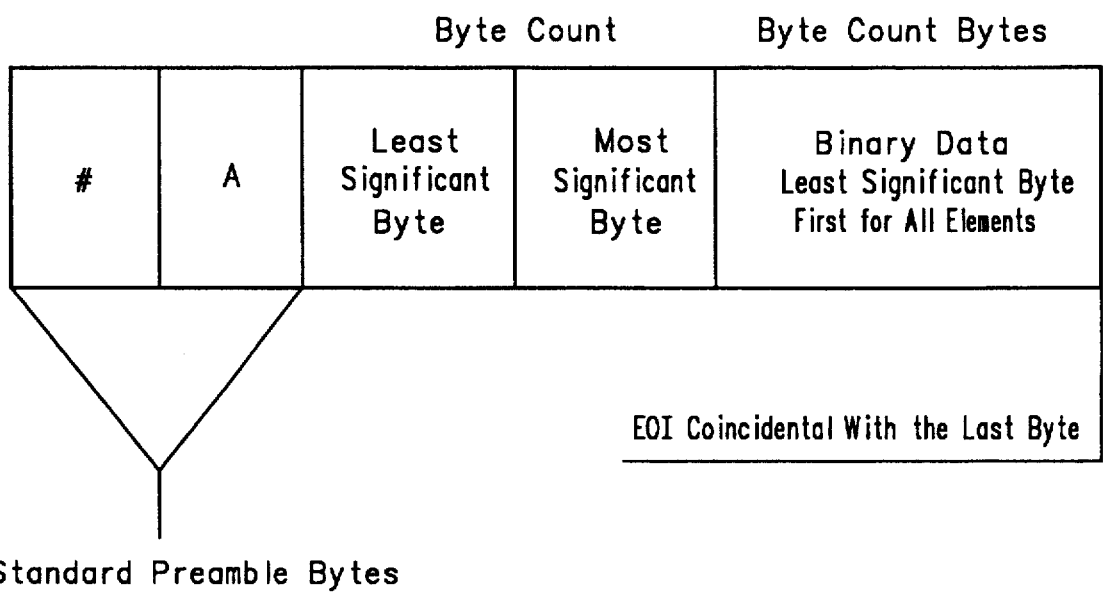
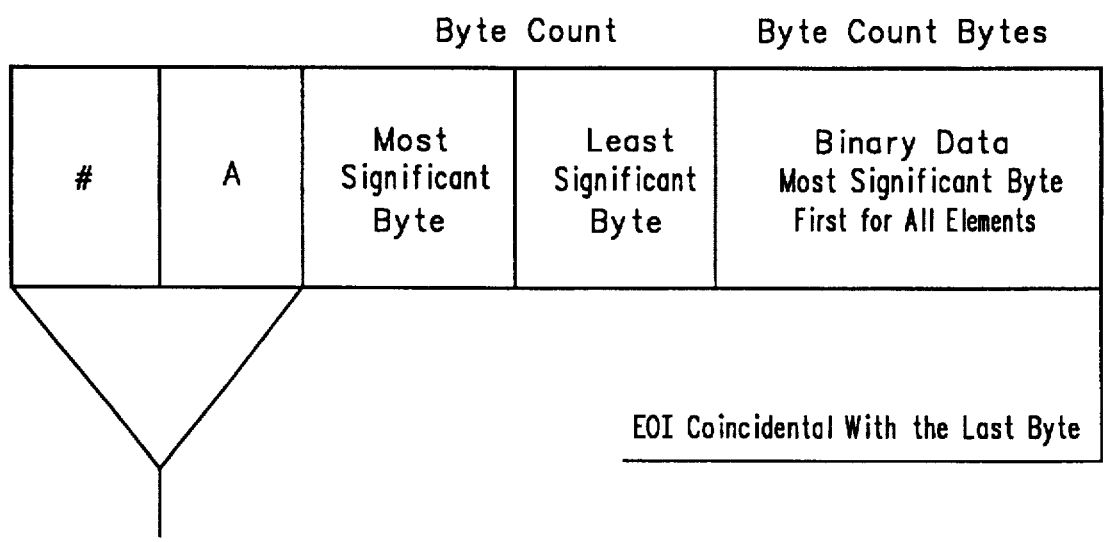
FIG. 89

5,524,281

APPARATUS AND METHOD FOR MEASURING THE PHASE AND MAGNITUDE OF MICROWAVE SIGNALS

This is a continuation of U.S. Ser. No. 07/764,975, filed Sep. 23, 1993, now abandoned, U.S. Ser. No. 07/644,684, filed Jan. 22, 1991, now abandoned, U.S. Ser. No. 507,109, filed Apr. 9, 1990, now abandoned, and U.S. Ser. No. 176,202, filed Mar. 31, 1988, now abandoned, assigned to the assignee of the present application, and incorporated by reference herein.

LIMITED COPYRIGHT WAIVER

A portion of this patent document, contains material to which a claim of copyright protection is made. The copyright owner has no objection to the facsimile reproduction by anyone of the patent document, or the patent disclosure as it appears in the U.S. Patent and Trademark Office patent file records, but reserves all other rights whatsoever.

BACKGROUND OF THE INVENTION

1. Field of the Invention

The invention relates generally to systems for measuring microwave frequency signals and more particularly to systems used to extract phase and magnitude information from microwave frequency signals.

2. Description of the Related Art

Earlier vector network analyzers with integral processors exist which can perform both phase and magnitude measurements of microwave frequency signals. Unfortunately, there have been shortcomings with these earlier analyzers. In particular, such earlier analyzers often employed relatively expensive techniques to achieve frequency accuracy from a microwave frequency signal source. Furthermore, such earlier analyzers often performed measurements of signals relatively slowly, were relatively clumsy to operate and failed to conveniently provide to an analyzer user desired microwave frequency measurement information.

Thus, there has been a need for a more economical microwave frequency signal measurement system which takes more rapid measurements of microwave frequency signals, which is relatively easy to use and which can, at any moment, provide a user with a wider range of microwave frequency measurement information. Furthermore, there has been a need for such a system which provides relatively low noise signals for phase and magnitude measurement. The present invention meets these needs.

SUMMARY OF THE INVENTION

The present invention provides a measurement system. The system includes a source of signals at discrete microwave frequencies in a prescribed microwave frequency range. The signal source receives feedback signals. The discrete microwave frequency signals are substantially phase-locked to at least one downconverted signal in response to the feedback signals. Downconverting circuitry linearly downconverts the signals at the discrete frequencies and provides the at least one downconverted signal. A phase detector receives the at least one downconverted signal and provides the feedback signals.

BRIEF DESCRIPTION OF THE DRAWINGS

Further details of the present invention are explained with the help of the attached drawings in which:

FIG. 6 illustrates details of the first local oscillator 122 of FIG. 1;

FIG. 7 illustrates details of the phase lock circuit 252 used to control the frequency of operation of the first local oscillator of FIG. 6;

FIGS. 23–32 illustrate details of the test port connectors of the present invention;

FIG. 33 illustrates the types of measurements that the model 360 is capable of making;

FIG. 53 illustrates the calibration keys;

FIGS. 55–57 show calibration menus;

FIG. 59 shows available display formats;

FIG. 63 shows a Tabular Printout Format;

FIG. 64 shows an Alternate Data Format;

FIG. 65 shows a header which prints before the screen data prints;

FIG. 74 shows open, short and termination measurement configurations with transition from a coax to permit solving for unknowns;

FIG. 77 illustrates the impulse response of a stepped attenuator;

FIG. 78 illustrates the impuilse response for a series inductance;

FIG. 80 shows the bandpass-impulse response for various impedance discontinuities;

FIG. 81 illustrates a phasor-impulse response for various devices;

FIG. 89 illustrates a binary data transfer message format.

DETAILED DESCRIPTION OF THE PREFERRED EMBODIMENT

Figure 1:
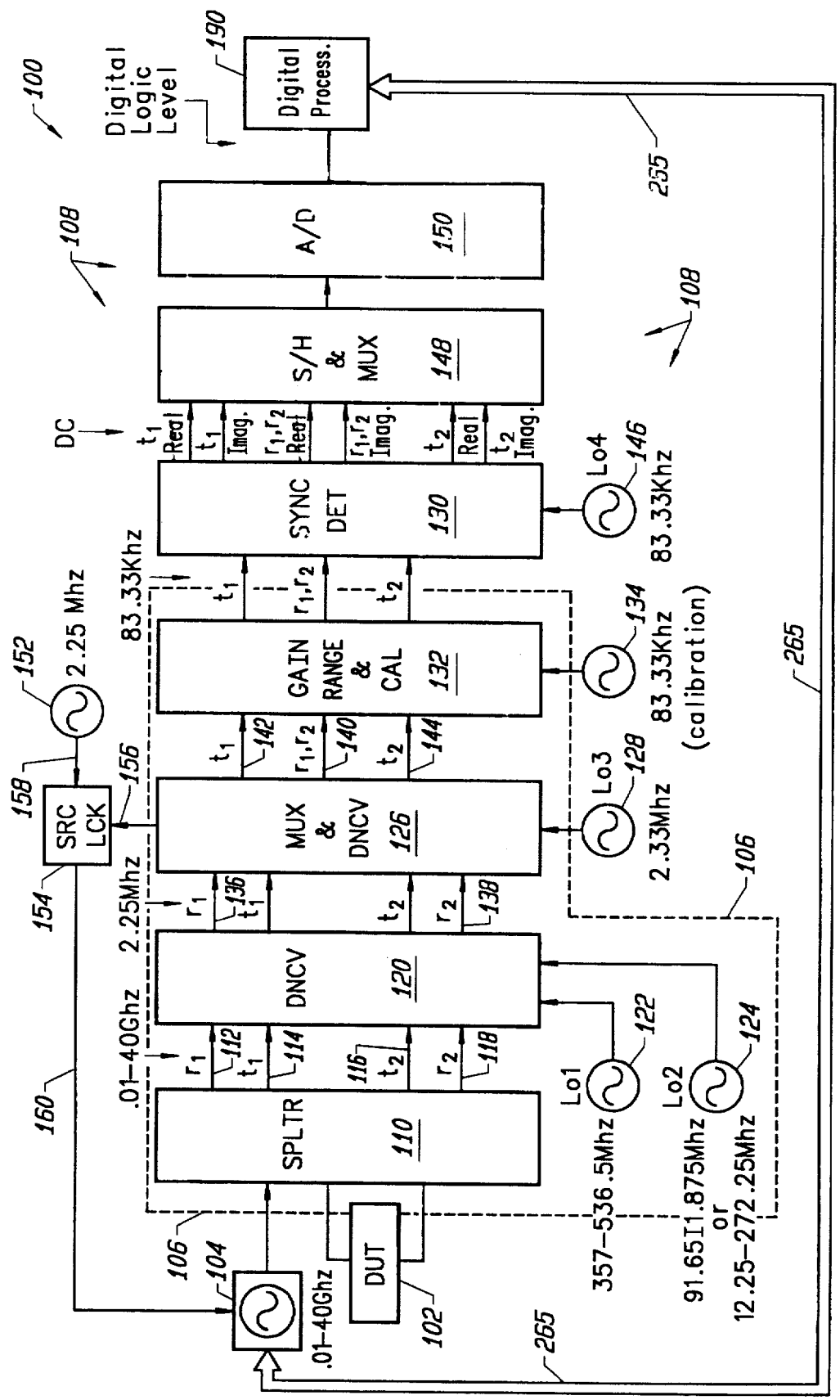
FIG. 1 shows a block diagram illustrating the measurement system of the present invention.

Referring to FIG. 1, there is shown a first block diagram illustrating the measurement system 100 of the preferred embodiment. The system generates stimulus signals over a range of individual frequencies. For each frequency, a stimulus signal is applied to a Device Under Test (DUT) 102. For each frequency, the system produces test signals which contain phase and magnitude information which can be used to characterize the DUT 102 at that frequency. The test signals comprise bidirectional signals transmitted through or reflected by the DUT 102 at the stimulus signal frequency. The system also produces reference signals at the stimulus signal frequency. The system downconverts the test and reference signals from the stimulus signal frequency, to a DC in phase and quadrature component. For each stimulus signal frequency, the system produces digital logic level signals carrying phase and magnitude information which characterize the DUT 102 at the particular stimulus signal frequency. The digital logic level signals are provided to digital processing circuitry 190 which, in addition to processing the digital logic level signals and producing a display, controls the signal source 104 via signals on GPIB 265.

In the first block diagram, details of the system 100 relating to the processing of the digital logic level signals and to the display of the phase and magnitude information have been omitted in order to simplify the diagram. These components are described in relation to other figures.

The measurement system 100 includes a signal source 104 which provides individual stimulus signals over a range of frequencies. The system includes a test set shown within dashed lines 106. The test set 106 splits stimulus signals into two signals at the stimulus signal frequency. One of the two split signals is used as a reference signal, and the other split signal is provided to the DUT 102 to generate test signals at the stimulus signal frequency. The test set 106 can provide split signals to the DUT 102 in either a forward or a reverse direction, as described below, so as to generate forward and reverse scattering parameters for the DUT 102.

The test signals comprise split signals transmitted through the DUT 102 or reflected by it. The phase and magnitude of the test signals relative to the reference signal depends upon the characteristics of the DUT 102. Thus, for each individual stimulus signal frequency, the phase and magnitude of the test signals relative to those of the reference signal provides information about the characteristics of the DUT 102 at the individual stimulus signal frequency.

In order to facilitate the extraction of the phase and magnitude information from the reference and test signals, the test set 106 downconverts the reference and test signals from the stimulus signal frequency to an intermediate frequency of 83.33 Khz. Since the frequency downconversion is a linear process, the test signals downconverted to 83.33 Khz retain the same phase and magnitude relative to the reference signals downconverted to 83.33 Khz.

For each stimulus signal frequency, the test set 106 provides the downconverted 83.33 Khz test and reference signals to an analyzer, indicated by the reference numeral 108. The analyzer 108 analyzes the downconverted test and reference signals to extract the phase and magnitude information. It then provides to the digital processing circuitry 190, digital logic level signals containing phase and magnitude information which can be used to characterize the DUT 102 at each discrete stimulus signal frequency.

In the presently preferred embodiment, the signal source 104 can provide stimulus signals over a range of frequencies from 0.01 to 40 Ghz. The WILTRON 360SS69 available from WILTRON Company, Morgan Hill, Calif. is the signal source in the preferred embodiment. The signal source 104 is a sweeper which provides a series of unsynthesized stimulus signals over a range of frequencies for which the characteristics of the DUT 102 are to be tested.

The test set 106 includes a signal splitter 110 which receives discrete stimulus signals in the series over a desired frequency range from the signal source 104. In the preferred embodiment, the test set 106 is the 3611A available from WILTRON company. The signal splitter 110 splits each received signal into two signals having the same phase and magnitude. One of the split signals is provided on either line 112 or 118 as a reference signal, and the other split signal is applied to the DUT 102. Constituents of the split signal applied to the DUT 102 which are transmitted through it or reflected by it constitute test signals provided on lines 114 and 116. For each stimulus signal frequency, the test signals typically differ in phase or magnitude from the reference signal. This phase and magnitude difference represents information which can be used to characterize the DUT 102.

As will be more fully explained below, the splitter 110 is capable of applying stimulus signals to the DUT 102 in either a forward or a reverse direction. Thus, information can be obtained about both the forward and reverse transmission and reflection of stimulus signals by the DUT 102. When the splitter 110 applies signals to the DUT 102 in the forward direction: a reference signal $r_1$ is provided on line 112; a reflected test signal is provided on line 114 as signal $t_1$; and a transmitted test signal is provided on line 116 as signal $t_2$. When, on the other hand, the splitter 110 provides a signal to the DUT 102 in the reverse direction: a reference signal $r_2$ is provided to line 118; a transmitted signal is provided to line 114 as signal $t_1$; and a reflected signal is provided on line 116 as signal $t_2$.

The test set 106 includes a microwave downconverter 120 which receives mixing signals from respective first and second local oscillators 122 and 124. The downconverter 120 downconverts the respective reference and test signals from the stimulus signal frequency generated by the signal source 104 to a second intermediate frequency (IF$_2$) of 2.25 Mhz.

The first local oscillator 122 has a frequency range of approximately 357–536.5 Mhz. The second local oscillator 124 has a frequency range of approximately 91.65±1.875 Mhz when the system is operating in a "harmonic mode", and has a frequency range of approximately 12.25–272.25 Mhz when the system is operating in a "direct mode". As explained below, the exact frequency of operation of the respective first and second local oscillators 122 and 124 depends upon the frequency of the stimulus signal provided by the source 104.

In operation, the signal source 104 typically provides a series of stimulus signals at discrete frequencies over a prescribed range of frequencies in order to characterize the DUT 102 over that prescribed frequency range. Thus, the respective frequencies of the first and second local oscillators 122 and 124 are varied such that, for each different stimulus signal frequency, the test and reference signals are downconverted to an IF$_2$ of 2.25 Mhz.

A multiplexer/downconverter 126 receives the 2.25 Mhz reference and test signals as well as a 2.33 Mhz signal generated by a third local oscillator 128. It downconverts the 2.25 Mhz reference and test signals to a third intermediate frequency (IF$_3$) of 83.33 Khz.

The multiplexer/downconverter 126 also selects either the reference signal $r_1$ on line 136 or reference signal $r_2$ on line 138 for provision to synchronous detectors 130. As explained above, at any given moment during the testing of a DUT 102, only one reference signal is provided by the splitter 110. When the splitter 110 applies signals to the DUT 102 in the forward direction, then multiplexer/downconverter 126 selects reference signal $r_1$. When the splitter 110 applies signals to the DUT 102 in the reverse direction, then multiplexer/downconverter 126 selects reference signal $r_2$. For each discrete stimulus signal frequency, the test set 106 can automatically switch between applying signals in the forward direction to the DUT 102 and applying signals in the reverse direction to the DUT 102.

Thus, at any moment during the testing of a DUT 102, the measurement system provides three channels: test channel $t_1$, test channel $t_2$ and reference channel $r_1$, $r_2$. In operation, as explained below, the splitter 110 can be caused to alternate between applying the stimulus signal to the DUT 102 in the forward direction and in the reverse direction. Consequently, multiplexer/downconverter 126 must be capable of alternatively coupling reference signal $r_1$ on reference line 136 or reference signal $r_2$ on line 138 to line 140 such that: when the splitter 110 applies the stimulus signal in the forward direction, signal $r_1$ is provided on line 140, and when the splitter 110 provides the stimulus signal in the reverse direction, signal $r_2$ is provided on line 140.

Gain ranging/calibration circuitry 132 receives the 83.33 Khz test and reference signals from the multiplexer/downconverter 126. During normal testing operations, this circuitry 132 amplifies these signals and provides them to the synchronous detectors 130 of the analyzer 108. The amplification of the reference and test signals ensures that they are at a high enough signal level to be accurately converted by the synchronous detectors 130 and the ADC 150.

Periodically (approximately once every two and one-half minutes in the presently preferred embodiment), in the course of the normal testing operation of the measurement system, the gain ranging/calibration circuitry 136 decouples the test and reference signals on lines 140, 142 and 144 from gain ranging amplifier assemblies (discussed below) and the amplifiers and the synchronous detectors 130, and couples the gain ranging amplifier assemblies and the synchronous detectors 130 to an 83.33 Khz calibration signal provided by a calibration oscillator 134. The calibration signal is used to calibrate a gain ranging amplifier assembly, discussed below, and to calibrate the synchronous detectors 130 to compensate for phase and magnitude drift in the test and reference signals. The manner in which this calibration is accomplished is discussed in more detail below.

The analyzer 108 incorporates the synchronous detectors 130. In the preferred embodiment, the analyzer 108 is the WILTRON Model 360 Network Analyzer available from WILTRON Company.

The synchronous detectors 130 receive the downconverted 83.33 Khz test and reference signals and an 83.33 Khz signal provided by respective fourth local oscillators 146. The synchronous detectors provide DC Real and DC Imaginary signals containing the phase and magnitude information carried by the respective test and reference signals.

A Sample/Hold (S/H) and multiplexer circuit 148 receives the DC Real and DC Imaginary signals. It parallel samples all of the signals and holds the sampled signals until they can be individually applied to an analog-to-digital converter (ADC) 150 which converts the sampled signals to digital logic levels. The digital logic level signals are provided to the processing circuitry 190 which processes the signals and produces a display illustrating the phase and magnitude information characterizing the DUT 102 over the frequency range of interest or upon further processing, displays the time domain representation of the signals.

The analyzer 108 includes a 2.25 Mhz oscillator 152 and a source lock circuit 154. The source lock circuit 154 receives on line 156 the 2.25 Mhz downconverted version of the reference signal, $r_1$ or $r_2$ (depending upon whether the test set 106 applies the stimulus signal to the DUT 102 in the forward or the reverse direction). At the same time, the source lock circuit 154 receives on line 158 a 2.25 Mhz signal provided by oscillator 152. In response to phase differences between these two received signals, the source lock 154 provides to the signal source 104, via line 160, a correction signal used to remove any phase drift in the stimulus signal frequency. The signal source 104, therefore, is phase-locked to a desired stimulus frequency using a downconverted 2.25 Mhz version of a reference signal, either $r_1$ or $r_2$.

Figure 2A:
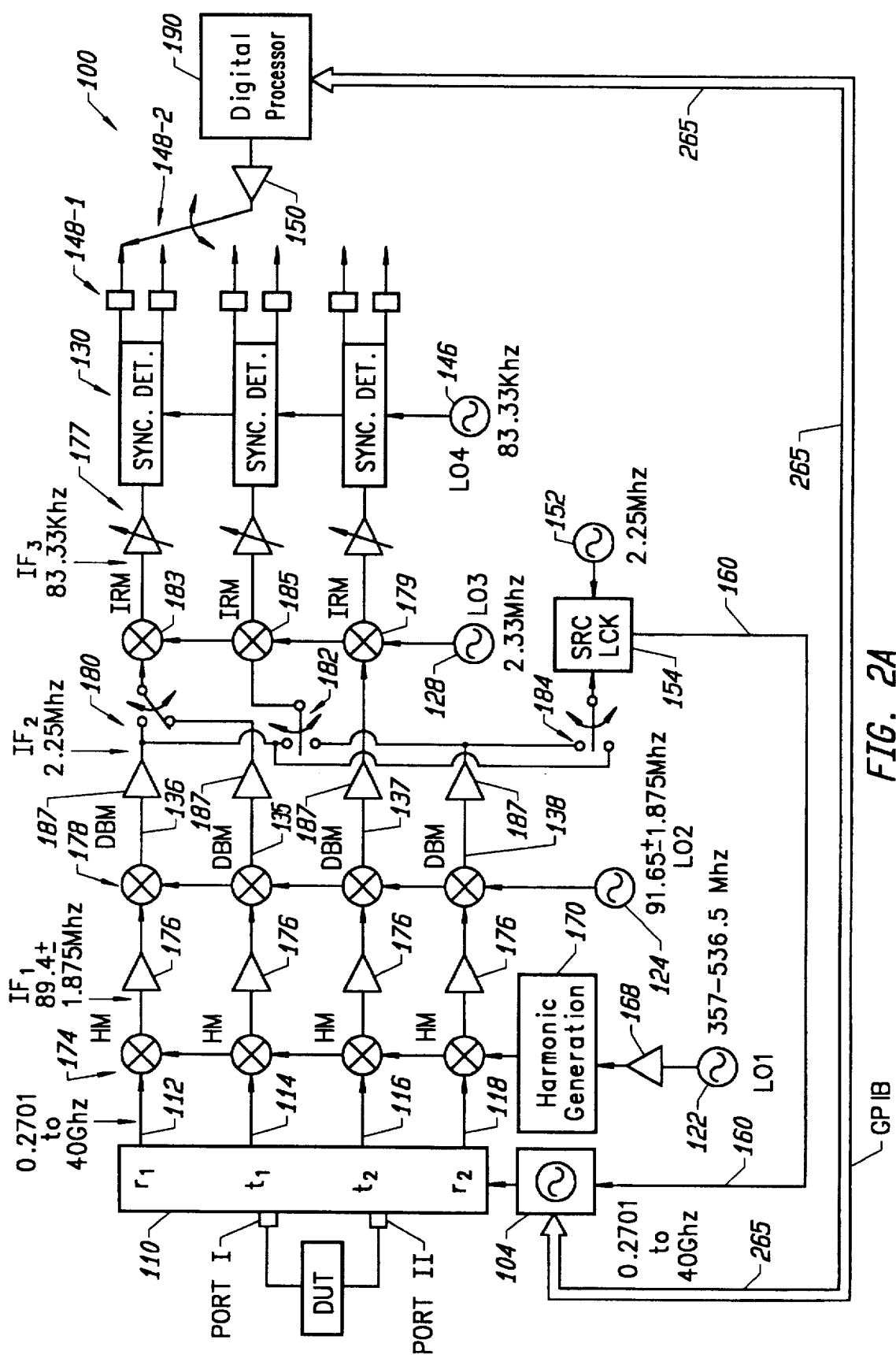
FIG. 2A illustrates the system of FIG. 1 operating in the harmonic mode.
Figure 2B:
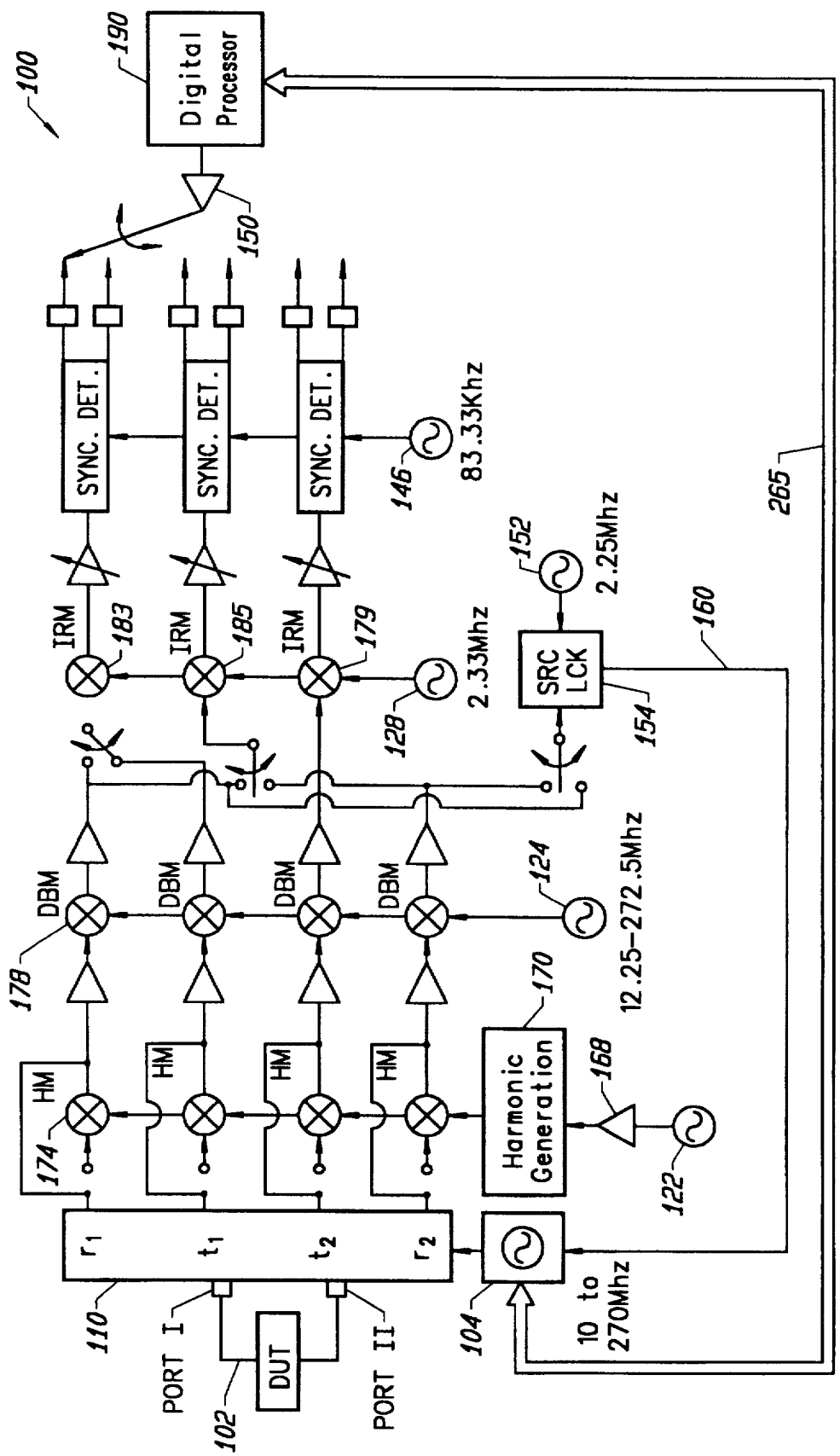
FIG. 2B illustrates the system of FIG. 1 operating in the direct mode.

An overview of the operation of a presently preferred embodiment of the measurement system will now be provided with reference to FIGS. 2A and 2B. The drawings of FIGS. 2A and 2B are stripped-down representations of the system. These two figures are merely intended to aid in the explanation of the reference and test signal downconversion and the source lock of the signal source using the $IF_2$ reference signals. The drawings of these two figures are not intended to provide a detailed representation of the system.

In order to reduce the noise level of the downconverted versions of the reference and test signals, the system can operate in either a "harmonic mode" or a "direct mode". The system 100 operating in the harmonic mode is illustrated in FIG. 2A, and the system 100 operating in the direct mode is illustrated in FIG. 2B. The system 100 operates in the harmonic mode when the stimulus signal frequency is in the range of 0.2701–40 Ghz, and the system 100 operates in a direct mode when the stimulus signal frequency is in the range of 10–270 Mhz.

In FIG. 2A, the signal source 104 provides a stimulus signal in the range of 0.2701–40 Ghz, and the system 100 operates in the harmonic mode. The signal source 104 is under control of digital processing circuitry 190 via GPIB 265. The splitter 110 provides reference signals on lines 112 and 118, and it provides test signals on lines 114 and 116. The first local oscillator 122 provides a signal at a prescribed frequency in the range of 357–536.5 Mhz, via driver 168, to a harmonic generator 170. The harmonic generator, in turn, provides sampling pulses at a desired sampling rate to harmonic mixers 174. The harmonic mixers 174 sample the reference signals and the test signals, at the sampling rate. The sampled reference and test signals are thereby downconverted from the stimulus signal frequency to a first intermediate frequency ($IF_1$) of 89.4±1.875 Mhz.

The precise frequency at which the first local oscillator 122 operates is selected according to an algorithm described below. The selected frequency is chosen such that the harmonic mixers 174 sample the reference and test signals at a prescribed sampling rate so as to downconvert them to the desired first intermediate frequency ($IF_1$).

The downconverted reference and test signals at the $IF_1$ frequency are passed through respective drivers 176. The signals are provided to respective double balanced mixers 178 where they are mixed with a signal at a frequency in the range of 91.65±1.875 Mhz provided by the second local oscillator 124. The precise frequency of the signal provided by the second local oscillator 124 also is chosen in accordance with the algorithm described below. The respective double balanced mixers 178 output, onto lines 135 and 137 the test signals downconverted to the second intermediate frequency ($IF_2$) of 2.25 Mhz and onto lines 136 and 138 the reference signals downconverted to 2.25 Mhz.

During normal test measurement operation, test signal $t_2$ on line 137 is provided to image reject mixer 179. Switch 180 couples the test signal $t_1$ on 135 to image reject mixer 183. Switches 182 and 184 operate in unison to couple either reference signal $r_1$ on line 136 or $r_2$ on line 138 to image reject mixer 185 and to the source lock 154. When the splitter 110 applies signals to the DUT 102 in the forward direction, reference signal $r_1$, is coupled to image reject mixer 185 and to the source lock 154, and when the splitter 110 applies signals to the DUT 102 in the reverse direction, reference signal $r_2$ is so coupled. Thus, the switch positions of switches 182 and 184 depend upon the operation of the splitter 110.

The respective 2.25 Mhz test signals $t_1$ and $t_2$ are provided, via respective drivers 187, to image reject mixers 179 and 183 which mix them with a 2.33 Mhz signal provided by the third local oscillator 128 and which output versions of the test signals downconverted to 83.33 Khz.

As explained above, switch 182 couples either reference signal $r_1$, or $r_2$ to image reject mixer 185. The coupled reference signal is provided to image reject mixer 185 via a respective driver 187. The image reject mixer 185 mixes the selected 2.25 Mhz reference signal with the 2.33 Mhz signal provided by the third local oscillator 128 and outputs the coupled reference signal downconverted to 83.33 Khz.

The 83.33 Khz reference and test signals are respectively provided, via variable driver assemblies 177, to the synchronous detectors 130 wherein they are mixed with an 83.33 Khz signal produced by respective fourth local oscillators 146. The resultant DC Real and DC Imaginary reference and test signals are provided to sample and hold (S/H) circuitry 148-1.

DC Real and DC Imaginary signals stored by the S/H circuitry 148-1 are serially provided, via multiplexer 148-2, to ADC 150. The ADC 150 provides digital logic level signals to digital processing circuitry 190.

In the course of the downconversion of the stimulus signal, the reference signal downconverted to the $IF_2$ frequency, is used to generate a signal on line 156 which is provided to the source lock 154. At the same time, oscillator 152 provides a 2.25 Mhz signal to the source lock 154. The source lock 154, in turn; feeds back the correction signal, via line 160, to the signal source 104 to correct any drift in the signal source 104. Thus, the signal source 104 is phase-locked to a desired stimulus frequency using the $IF_2$ reference signal and the 2.25 Mhz signal provided by oscillator 152.

In FIG. 2B, the signal source 104 provides a stimulus signal in the range of 10–270 Mhz, and the system operates in the direct mode. One difference in the operation of the system in the direct mode from its operation in the harmonic mode is that, in the direct mode, the respective harmonic mixers 174 are bypassed such that the reference and test signals pass through substantially unaffected. Thus, the reference and test signals are conducted at the stimulus signal frequency directly to the respective double balanced mixers 178. Another difference is that the second local oscillator 124, in the direct mode, operates in a frequency range of 12.25–272.25 Mhz. The exact frequency at which the second local oscillator 124 operates is selected according to an algorithm discussed below. In all other significant respects, the operation of the system in the direct mode is substantially the same as its operation in the harmonic mode.

The use of both a harmonic mode and a direct mode improves the noise performance of the system 100 over the broad stimulus signal frequency range of 0.01–40 Ghz. More specifically, it is well known that system noise increases with harmonic number. By incorporating a first local oscillator 122 which, in the harmonic mode, operates in the range of 357–536.5 Mhz, the largest number harmonic of the system is 75 (536.5 Mhz×75=40 Ghz). Relatively speaking, 75 is a low harmonic number, and therefore, system noise is reduced. Thus, by using a relatively large high-end frequency (536.5 Mhz) for the first local oscillator 122, the largest harmonic number of the system, as well as system noise, are reduced.

In order to further reduce system noise, the first local oscillator 122 not only uses a relatively large high-end frequency (536.5 Mhz), but also itself operates with relatively low noise. Low noise operation of the first local oscillator 122 is important because any noise carried by its signal is multiplied by the harmonic generator 170. In order to reduce the noise level of signals produced by the first local oscillator 122, a relatively narrow frequency range (357–536.5 Mhz) is used so as to make the oscillator more resistant to noise in the tuning voltage used to tune the oscillator. Since the stimulus signal frequency range extends below the low end (357 Mhz) of the first local oscillator's frequency range, the system bypasses the harmonic mixers 174 and operates in the direct mode when the stimulus signal is in a relatively lower frequency range (10–270 Mhz).

Figure 3A:
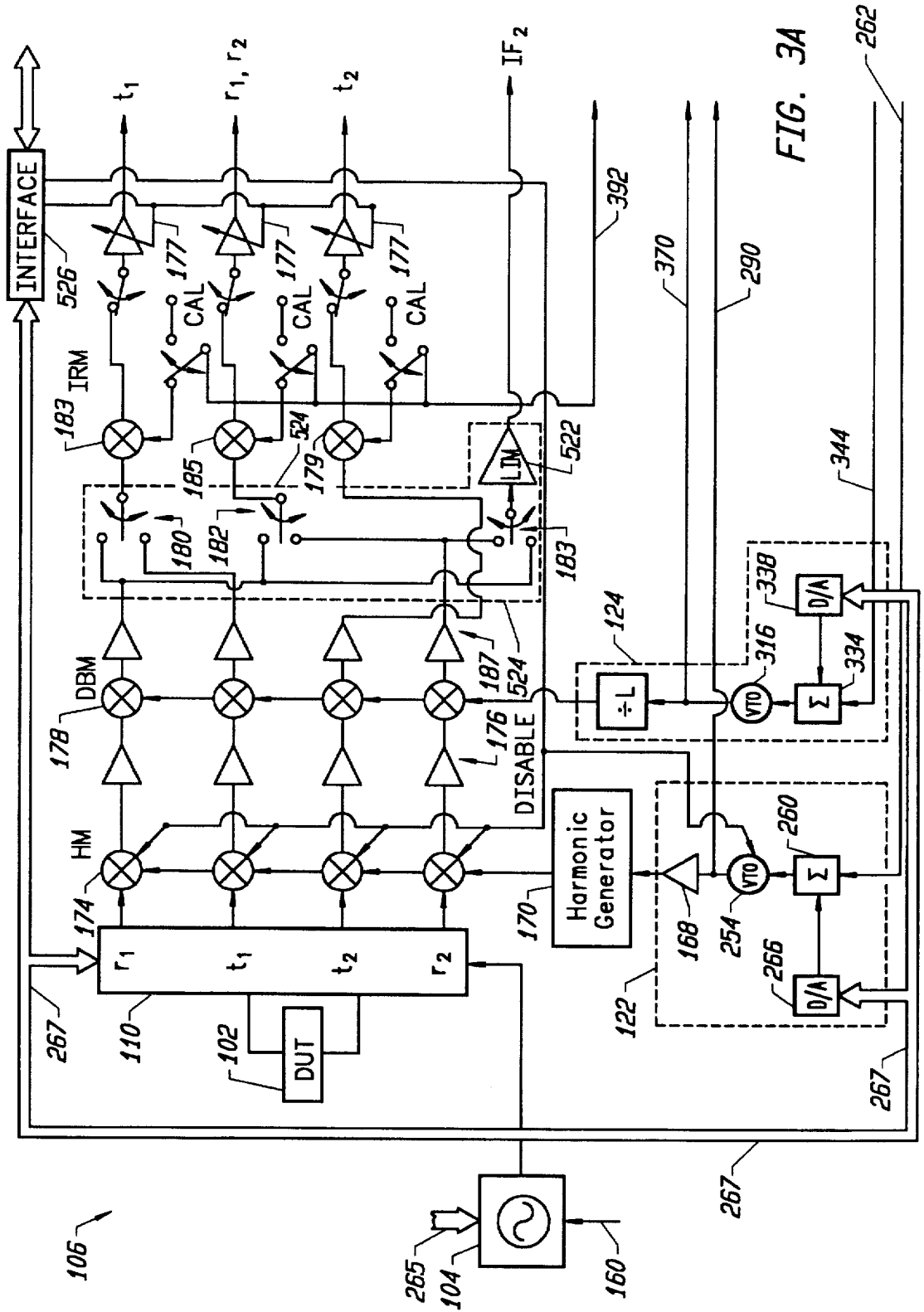
FIG. 3A illustrates further details of the test set 106 of FIG. 1.
Figure 3B:
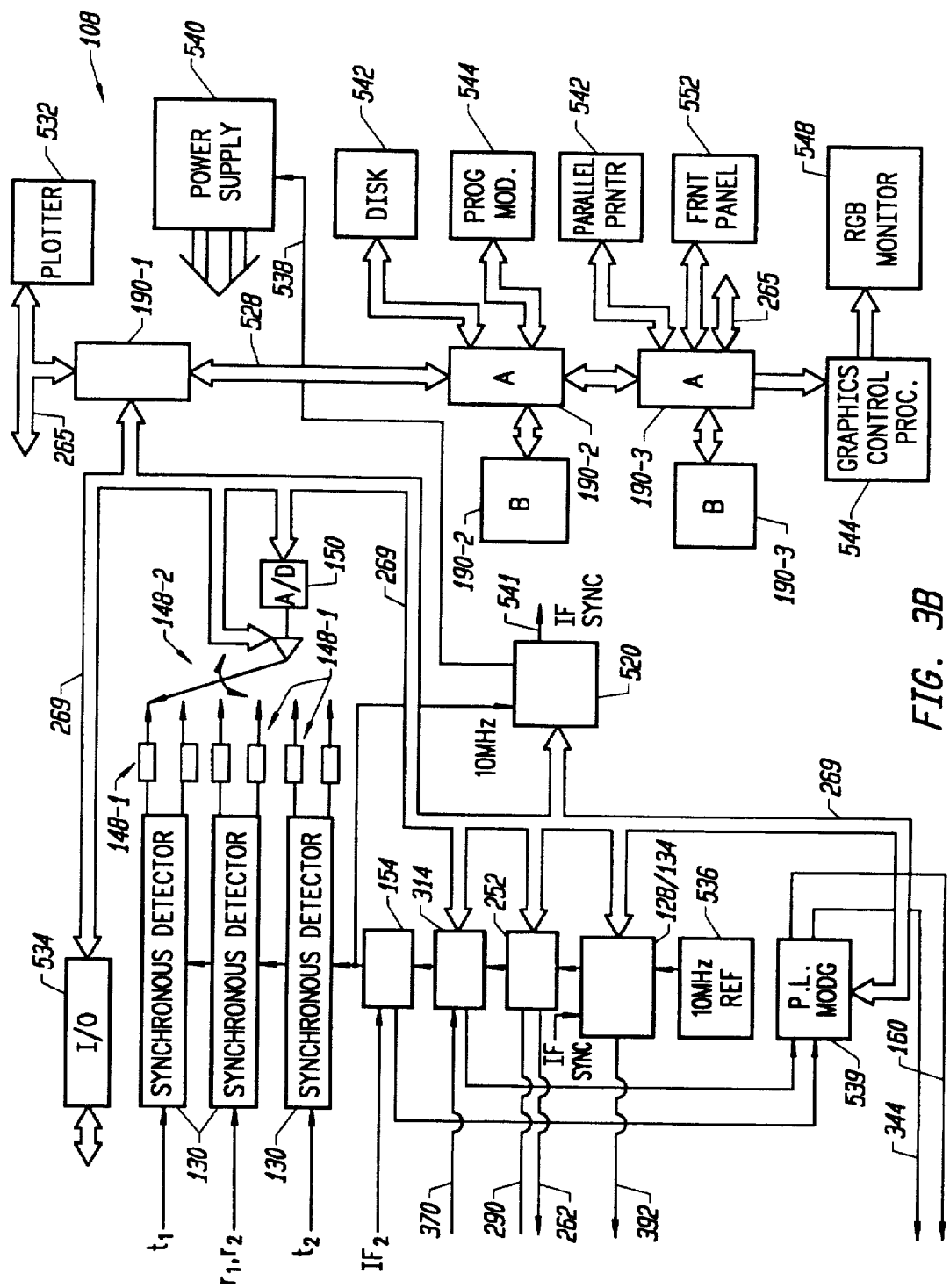
FIG. 3B illustrates details of the the analyzer 108 of FIG. 1.

Referring to FIGS. 3A and 3B, there are shown additional details of the system 100. FIG. 3A illustrates further details of the test set 106 which includes the first and second local oscillators 122 and 124. It also includes switches 180, 182 and 183 as well as limiter 522 shown within dashed lines 524. Furthermore, the test set 106 includes a digital interface 526 to analyzer 108.

The first local oscillator 122 includes a 357–536.5 Mhz voltage tuned oscillator (VTO) 254, tuning voltage summation circuit (TVS-1) 260 and digital-to-analog converter 266. Additional features of the first local oscillator 122 are described below.

The second local oscillator 124 includes a 98–272.5 Mhz VTO 316, tuning voltage summation circuit (TVS-2) 334, digital-to-analog converter 338, and "÷L" components. Additional features of the second local oscillator 124 are described below.

FIG. 3B illustrates details of the the analyzer 108 which includes a plurality of microprocessors in its digital processing circuitry 190. I/O processor 190-1 comprises an 8088 microprocessor produced by Intel Corp. which has a place of business in Sunnyvale, Calif. A first main processor 190-2A comprises an 8088 microprocessor, and a first math co-processor 190-2B comprises an Intel 8087 math co-processor. A second main processor 190-3A comprises an 8088 microprocessor, and a second math co-processor 190-3B comprises an Intel 8087 math co-processor.

The I/O processor 190-1 and the first main processor 190-2A are coupled to engage in two-way digital communication via FIFO circuitry 528. The first main processor 190-2A and the second main processor 190-3A are coupled to engage in two-way digital communication via FIFO circuitry 530.

The I/O processor 190-1 is coupled to the signal source 104 via the GPIB 265. Optionally, the I/O processor 190-1 also can be coupled to a plotter 532 via the GPIB 265.

The I/O processor 190-1 is coupled to a test set I/O circuit 534 via bus 269. The test set I/O circuit 534, which is part of the analyzer 108, is coupled to the digital interface 526, which is part of the test set 106.

The digital interface 526 is coupled to provide control signals, via I/O bus 267, to components of the test set 106 such as the splitter 110, digital-to-analog converters 266 and 338, the gain ranging amplifier assemblies 177 and the harmonic mixers 174. Thus, the I/O processor 190-1, in effect, controls the operation of the test set 106.

The analyzer 108 includes a 10 Mhz crystal controlled reference oscillator 536 which provides 10 Mhz reference signals to the third local oscillator 128 and the calibration oscillator 134, to the source lock 154 and to phase lock circuits 252 and 314. The reference oscillator also provides 10 Mhz signals to the synchronous detectors 130.

The system 100 can operate in either a sweeper mode in which the signal source 104 is an unsynthesized sweeper or in a synthesizer mode in which a synthesizer is substituted for the sweeper. A phase lock mode control 539 receives control signals from the source lock 154 and phase lock circuit 314. When the system 100 is in a sweeper mode, the mode control 539 provides the source lock control signal to the signal source 104 and provides the control signal from phase lock circuit 314 to the second local oscillator 124. When the system 100 is in the synthesizer mode, the mode control 539 provides the source lock control signal to the second local oscillator 124. Thus, in the sweeper mode, the signal source 104 is phase locked to the $IF_2$ reference, and in the synthesizer mode the second local oscillator 124 is phased locked to the $IF_2$ reference.

If synchronization control circuitry 520 provides an absolute phase reference for the system 100. Circuitry 520 receives 10 Mhz signals generated by the crystal controlled reference signal generator 536. Circuitry 520 provides IF synchronization signals on line 541. It also provides to switching power supply 540, via line 538, signals which place the side bands of the switching power supply signals at approximately 55 Khz and 111 Khz, equally spaced on either side of the 83.33 Khz reference and test signals. The switching power supply 540, therefore, is injection locked by signals provided on line 538 to a frequency which does not interfere with measurements by the system 100.

The first main processor 190-2A is interfaced to a disk drive 542 and to a programmable module 544. A software operating system can be booted-up either from the disk drive 542 or the module 544.

The second main processor 190-3A is interfaced to a parallel printer 542, to a front panel 552, to the GPIB 265 and to a graphics control processor 544. The graphics control processor 546 in turn, is interfaced to an RGB (Red-Green-Blue) monitor 548.

The system 100 can buffer data to be printed. Therefore, the parallel printer 542 can print while the second main processor 190-3A is engaged in other processing.

A user can control the system 100 through the front panel 552. The user can monitor system measurements through the RGB monitor 548.

Figure 4:
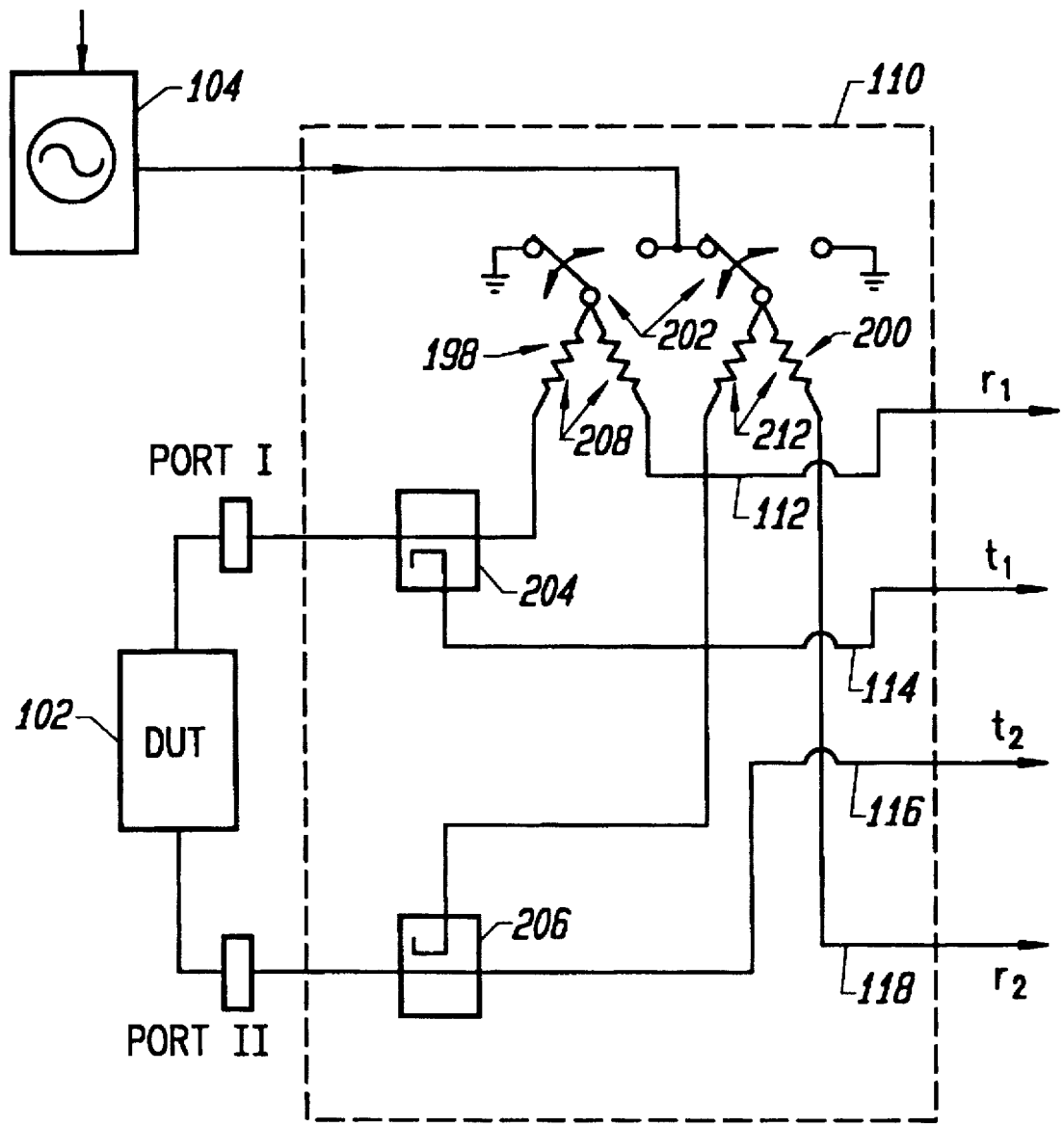
FIG. 4 illustrates details of the splitter 110 of FIG. 1.

Referring to the illustrative drawings of FIG. 4, there are shown details of the splitter 110. The splitter 110 includes first and second splitter circuits 198 and 200 which can be individually coupled to receive the stimulus signal from the signal source 104. PIN diode switches 202 couple either splitter circuit 198 or 200 to the signal source. The test set also includes respective first and second couplers 204 and 206. Coupler 206 is asymmetrically coupled, as described below, in order to increase the dynamic range of scattering parameter $S_{21}$ in the forward direction Details of the first and second couplers are provided in co-pending commonly assigned Patent Application entitled DIRECTIONAL COUPLER AND TERMINATION FOR STRIPLINE AND COAXIAL CONDUCTORS, invented by William W. Oldfield, et al., Ser. No. 176,100, now U.S. Pat. No. 5,047,737, which was filed on the same date as this Application and which is hereby incorporated herein in its entirety by this reference.

The first splitter circuit 198, when coupled to receive the stimulus signal, splits that signal using two 50 ohm loads 208. A first one of the two split signals is provided on line 112 as reference signal $r_1$. A second one of the two split signals is provided to the through-arm of the first coupler 204.

The second splitter circuit 200, when coupled to receive the stimulus signal, splits that stimulus signal using two 50 ohm loads 212. A first one of those two split signals is provided on line 118 as reference signal $r_2$. A second one of those two split signals is provided to the coupling-arm of the second coupler 206.

Respective through-arms of couplers 204 and 206 are connected to the DUT 102 through Ports I and II, respectively. The coupling-arm of the first coupler 204 provides test signals on line 114 as described below, and the through-arm of the second coupler 206 provides test signals on line 116 as described below.

In operation, the test set 106 is used to generate reference and test signals used to calculate the "Scattering Parameters" for the DUT 102. The Forward Scattering Parameters are generated by connecting the first splitter circuit 198 to receive the stimulus signals. The first split signals are provided on line 112 as reference signal $r_1$. The second split signals provided to the through-arm of the first coupler 204 are conducted through Port I to the DUT 102. Forward Transmission test signals are transmitted through the DUT 102 and through Port II to the through-arm of the second coupler. The Forward Transmission test signals are provided, via the through-arm of the second coupler 206, as test signal $t_2$ on line 116. Forward Reflection test signals are reflected by the DUT 102 back through Port I. The Forward Reflection test signals are conducted, via the coupling-arm of the first coupler 204, to line 114 as test signal $t_1$.

The Forward Scattering Parameters are represented by the following equations. In these equations, $S_{21}$ represents the Forward Transmission Scattering Parameter, and $S_{11}$ represents the Forward Reflection Scattering Parameter.

$$S_{21}\ t_2/r_1 \tag{1}$$

$$S_{11}\ t_1/r_1 \tag{2}$$

Reverse Scattering Parameters are generated by connecting the second splitter circuit 200 to receive the stimulus signals. The first split signal is provided on line 118 as reference signal $r_2$. The second split signals provided to the coupling-arm of the second coupler 206 are conducted, via Port II, to the DUT 102. The Reverse Transmission test signals are coupled to the coupling-arm of the first coupler 204 and are provided on line 114 as test signal t. The Reverse Reflection test signals are reflected by the DUT 102 back through Port II and travel, via through-arm of the second coupler 206, to line 116 where they are provided as test signal $t_2$.

The Reverse Scattering Parameters are represented by the following equations. In these equations, $S_{12}$ represents the Reverse Transmission Scattering Parameter, and $S_{22}$ represents the Reverse Reflection Scattering Parameter.

$$S_{12}\ t_1/r_2 \tag{3}$$

$$S_{22}\ t_2/r_2 \tag{4}$$

It will be appreciated that the first and second couplers 204 and 206 are not identically coupled to the respective first and second splitter circuits 198 and 200. The first coupler 204 is coupled by its through-arm to the first splitter 198; whereas the second coupler 206 is coupled by its coupling-arm to the second splitter 200. The result is that the Forward Transmission test signals provided on line 116 as test signals $t_2$ suffer significantly less loss than do the Reverse Transmission test signals provided on line 114 as test signals $t_1$. In the preferred embodiment, the Forward Transmission test signals suffer only approximately a 7 dB loss; whereas the Reverse Transmission test signals suffer approximately a 26 dB loss. Since the Forward Transmission test signals generally are of greater interest to users than are the Reverse Transmission test signals, this asymmetrical coupling of couplers 204 and 206 advantageously ensures that the more desirable Forward Transmission test signals are transmitted with less loss.

Details of the splitter 110 are described further in co-pending commonly assigned patent application entitled, ASYMMETRICAL COUPLING CIRCUIT, invented by Martin I. Grace, Ser. No. 175,956, now U.S. Pat. No. 4,808,913 filed on the same date as this Application and which is hereby incorporated herein in its entirety by this reference.

Figure 5:
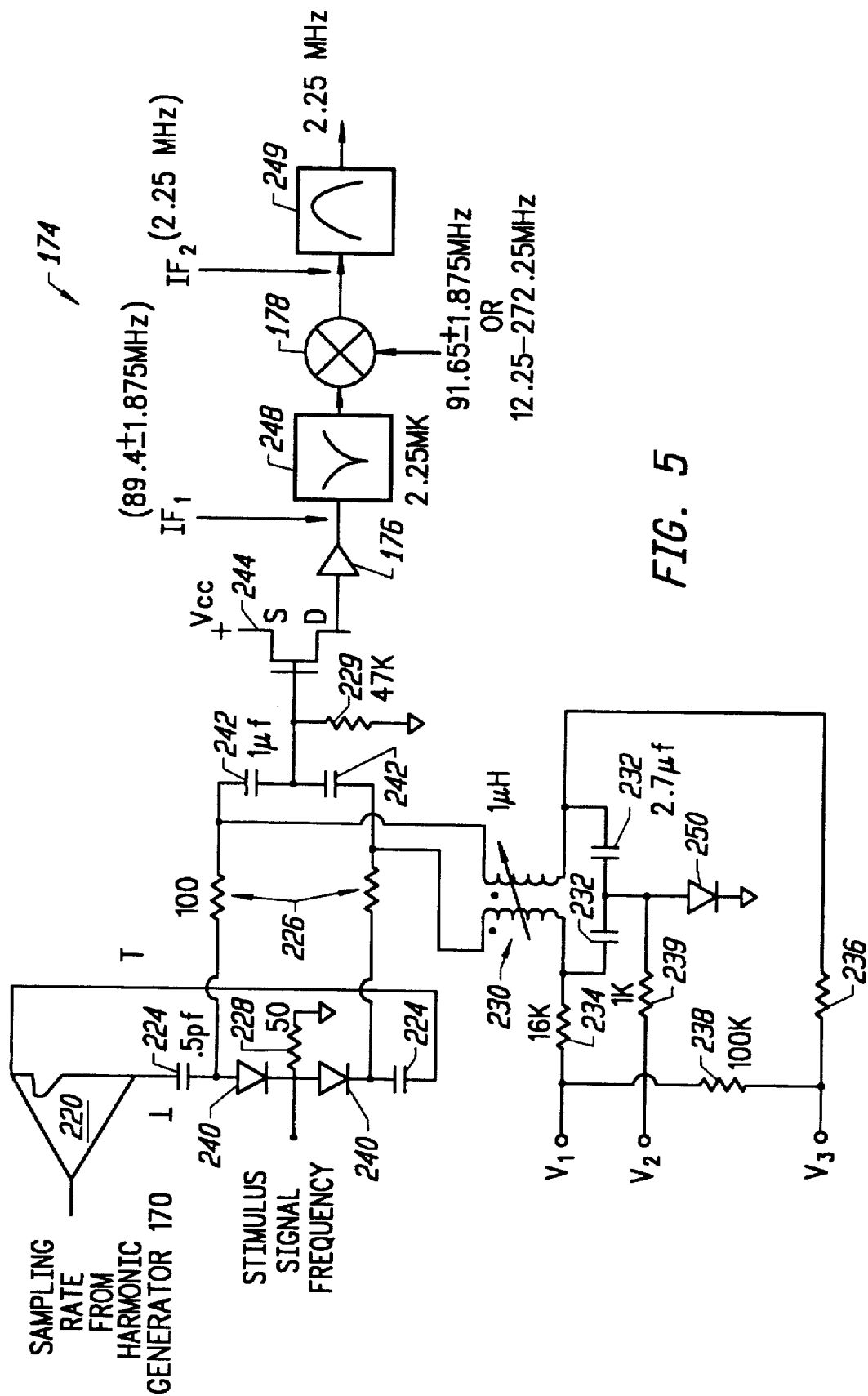
FIG. 5 illustrates details of one of the harmonic mixers 174 used in the present invention.

Referring to the illustrative drawings of FIG. 5, there are shown details of one of the harmonic mixers 174 of the preferred embodiment. Each of the harmonic mixers of the embodiment are substantially identical. The harmonic mixer 174 receives from the splitter 110 signals at the stimulus signal frequency. Sampling signal pulses generated at the sampling rate are provided to the dual slotline 220. The harmonic mixer 174 includes two 0.5 pf capacitors 224, two 100 ohm resistors 226, two 1 nF capacitors 242 as well as a 50 ohm resistor 228 and a 47k ohm resistor 229. The harmonic mixer also includes a tuneable one microhenry inductor 230 as well as two 2.7 nf capacitors 232 and respective 16k ohm resistors 234 and 236, a 100k ohm resistor 238 and a 1k ohm resistor 239.

The sampling signal pulses generated by the harmonic generator 170 are provided to a power splitter (not shown). Each of the two split sampling signal pulses then is provided to the dual slotline 220. Details of the dual slotline 220 and the manner in which stimulus frequency signals are provided to the dual slotline 220 are set forth in co-pending commonly assigned Patent Application, entitled DUAL SLOTLINE FEED, invented by W. Moberg, Ser. No. 176,098, now abandoned, filed on the same date as this Application and which is hereby incorporated herein in its entirety by this reference.

In operation, each respective sampling signal pulse causes respective diodes 240 to momentarily turn ON resulting in sampling of the signal provided by the splitter 110 at the stimulus signal frequency. The sampled signal is provided, via bypass capacitors 242 to the gate of FET 244. The output signal at the $IF_1$ frequency of 89.4±1.875 Mhz is provided on the drain terminal of the FET 244 to a driver 176 and then to a 2.25 Mhz notch filter 248. The notch filter 248 blocks spurious signals at the $IF_2$ so that such signals are not propagated to double balance mixer 178. Mixer 178 provides signals at $IF_2$ to bandpass filter 249.

During operation in the harmonic mode, voltages $V_1$ and $V_3$ are allowed to float so that diodes 240 are self-biasing. Voltage $V_2$ is +15 volts which turns ON PIN diode 250. The PIN diode 250, when turned ON, couples inductor 230 to the harmonic mixer 174. The inductor 230 ensures that the harmonic mixer has a frequency passband at the $IF_1$ of 89.4±1.875 Mhz. It should be noted that the $IF_1$ frequency is selected so as to provide continuous frequency coverage in the harmonic mode for the entire range of stimulus signal frequencies in that mode.

Figure 5A:
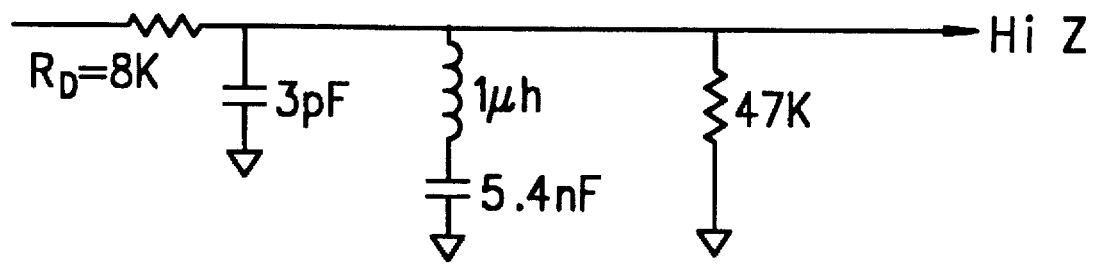
FIG. 5A illustrates the nature of the harmonic mixer of FIG. 5 in a harmonic mode.

FIG. 5A illustrates the nature of the harmonic mixer 174 in the harmonic mode. The 3 pF capacitance is due to capacitors 224, 242 and to stray capacitance. The 5.4 nF capacitance is due to capacitors 232. The resistance $R_D$ of 8k ohms is due to diodes 240.

Figure 5B:
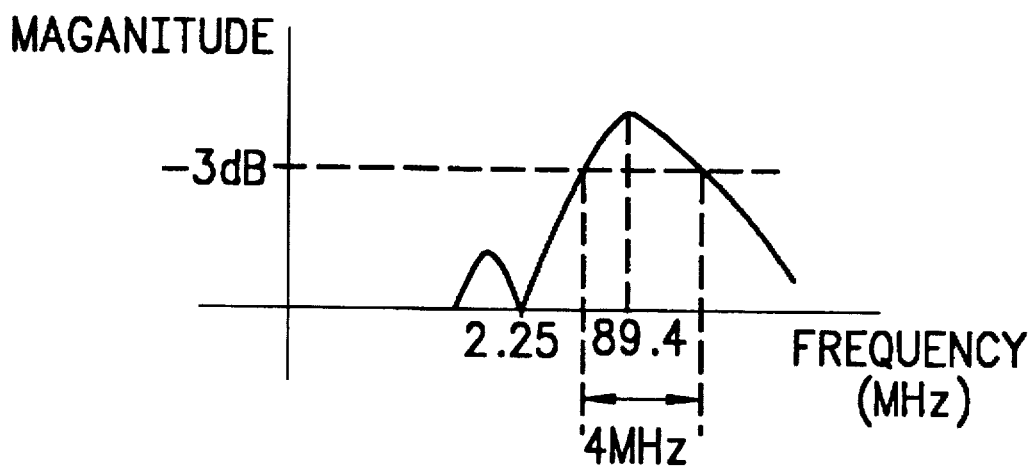
FIG. 5B illustrates the filter behavior of the harmonic mixer of FIG. 5 in a harmonic mode.

FIG. 5B illustrates the filter behavior of the harmonic mixer 174 in the harmonic mode. The frequency of 89.4 Mhz is in the passband, and the frequency of 2.25 Mhz is rejected.

During operation in the harmonic mode, when one of the respective harmonic mixers 174 is receiving low level signals, it is sometimes necessary to shut OFF another one of the harmonic mixers 174. The shutting OFF is referred to as "blanking". Blanking is accomplished by providing $V_1=+2.5$ v. and $V_3=-2.5$ v. Details of the blanking operation are provided in co-pending commonly assigned Patent Application entitled REFLECTED SIGNAL MEASUREMENT BLANKING CIRCUIT, invented by Glenn Ewart, Ser. No. 176,099, now U.S. Pat. No. 4,896,096 filed on the same day as this Application and which is hereby incorporated herein in its entirety by this reference.

During operation in the direct mode, voltage $V_1$ is −15 volts, and voltage $V_3$ is +15 volts. Thus, diodes 240 are permanently turned ON in the direct mode allowing signals provided by the splitter 110 at the stimulus signal frequency to be transmitted through the harmonic mixer 174 without being downconverted through sampling. Voltage $V_2$ is set to 0 volts so as to turn OFF PIN diode 250. Thus, in the direct mode, the inductor 230 is effectively decoupled from the harmonic mixer 174. As a result, the passband of the harmonic mixer in the direct mode is wide enough to accommodate all signals in the stimulus signal frequency range (10–270 Mhz) in that mode.

FIG. 6 illustrates details of the first local oscillator 122. FIG. 7 illustrates details of the phase lock circuit 252 used to control the frequency of operation of the first local oscillator 122.

The first local oscillator 122 includes a voltage tuned oscillator 254 which provides on line 256 signals in the frequency range 357–536.5 Mhz, and which receives on line 258 tuning voltage signals which tune the oscillator to a desired precise frequency of operation within that range.

The first local oscillator 122 includes tuning voltage summation circuit (TVS-1) 260 which receives on line 262 fine frequency steering signals from the phase lock control circuit 252. The TVS-1 260 receives on line 264 coarse frequency steering signals from eight bit digital-to-analog converter 266. The coarse steering signals provided by the digital-to-analog converter 266 are controlled by signals provided by the I/O processor 190-1, via I/O bus 269.

The tuning voltage signals generated by TVS-1 260 are provided to a 100 Khz, 150 Khz notch filter 268 used to remove sidebands caused by fractional M division explained below. The filtered signals are provided to a linearizer circuit 270 to obtain a linear frequency versus voltage tuning signal. The linearizer circuit 270, in turn, provides the linearized tuning voltage signals, via line 258, to the voltage tuned oscillator 254.

Window compare circuitry 271 receives the fine frequency steering signals on line 262 and provides signals to the I/O processor 190-1 used for diagnostics. The coarse frequency steering signals on line 264 are provided as signal $V_{\phi DET}$ to the phase lock circuit 252 as explained below.

Signal $V_{\phi DET}$ varies within the voltage range of 0 to 12 volts. When $V_{\phi DET}$ is at 0 volts then frequency $F_{LO1}$ (the frequency of operation of the first local oscillator 122) is at its lowest, and when $V_{\phi DET}$ is 12 volts then frequency $F_{LO1}$ is at its highest.

The phase lock control circuit 252 includes loop gain compensation control circuitry 272 which receives the $V_{\phi DET}$ Signal. The circuitry 272 also receives a biasing voltage to provide nominal gain even when $V_{\phi DET}$ is at 0 volts. The loop gain compensation control circuitry 272 provides on line 276 signals which maintain a constant loop gain in the phase lock circuit 252 despite variations in the divisor M discussed below.

A phase detector 278 receives the signals provided on line 276 by the loop gain compensation control circuitry 272. It also receives 0.5 Mhz signals provided on line 282 by divide-by-twenty circuit 284. The divide-by-twenty circuit 284 receives the 10 Mhz crystal controlled reference signal on line 285. Finally, the phase detector 278 receives on line 286 signals provided by divide-by-M circuitry 288.

The divide-by-M circuitry 288 receives on line 290 signals at the precise frequency of operation of the first local oscillator 122. These signals are provided by the first local oscillator 122, via driver 306. The value of M ranges from 714.0 to 1073.0. The resolution of the divide-by-M circuitry 288 is 50 Khz. In order to achieve this resolution with minimal lock-up time, the circuitry 288 includes a fractional frequency divider described in co-pending commonly assigned Patent Application, entitled DUAL MODULUS FRACTIONAL DIVIDER, invented by Donald A. Bradley, Ser. No. 175,759, filed on the same date as this Application which is hereby incorporated herein in its entirety by this reference. Lock-up time, of course, is the time necessary to achieve phase lock. It will be appreciated that (714.0)×(0.5 Mhz)=357 Mhz, and that (1073.0)×(0.5 Mhz)=536.5 Mhz.

The phase detector 278 provides phase correction signals to loop amplifier 292. The loop amplifier, in turn, provides these signals, to a 50 Khz notch filter 294 used to remove sidebands caused by fractional M division. The filtered signals are provided to line 262.

The phase detector 278 provides to lock detector 296 signals which indicate when phase lock has been achieved. The lock detector 296 provides signals to the I/O processor 190-1 to indicate when phase lock has been achieved and data measurements can be taken. The signals provided on line 290 to the divide-by-M circuitry 288 also are provided to a level detector 298. The level detector indicates to the I/O processor whether there is sufficient signal amplitude provided on line 290 to accurately achieve locking.

The first local oscillator 122 provides, via driver 168, signals on line 302 at a prescribed frequency in the range 357–536.5 Mhz. These signals are provided to the harmonic generator 170. Switch 304 is closed in the harmonic mode and is opened in the direct mode. Thus, in the direct mode, the first local oscillator 122 provides no signals to the harmonic generator 170.

Figure 8:
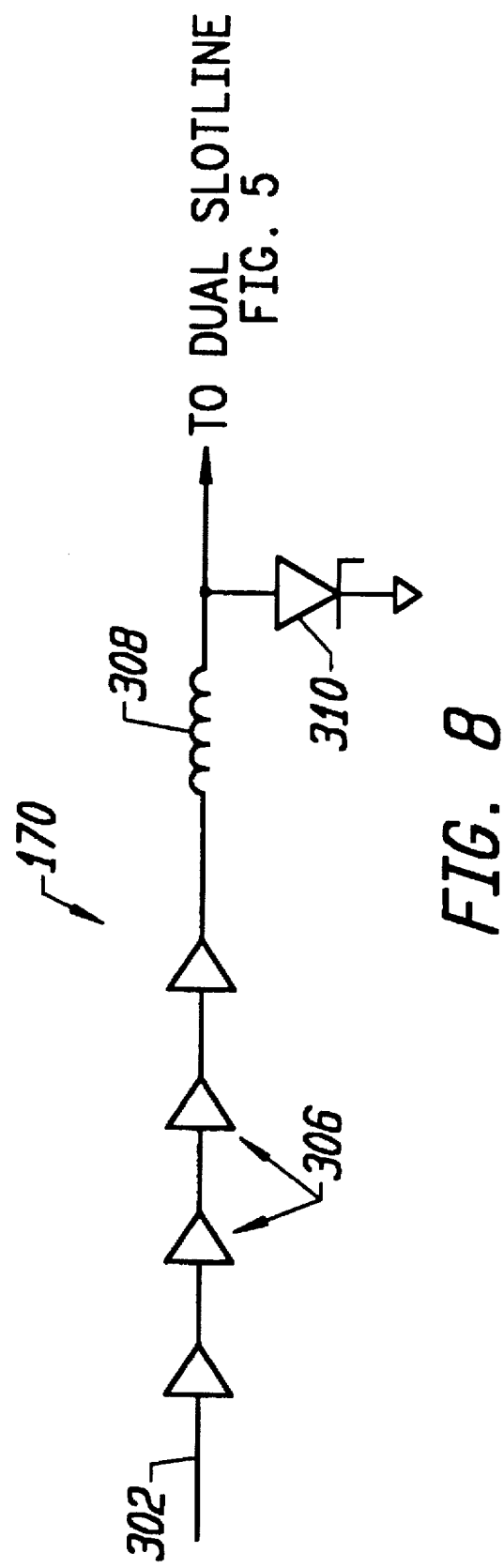
FIG. 8 illustrates details of the harmonic generator 170 of the present invention.

FIG. 8 illustrates details of the harmonic generator 170. Signals are provided by the first local oscillator 122 on line 302. These signals are amplified by drivers 306 and are provided, via inductor 308, to the step recovery diode (SRD) 310. The output of the harmonic generator 170 comprises sampling signals provided at the sampling rate to the harmonic mixers 174 as explained above with reference FIG. 5. The operation of a harmonic generator such as that illustrated in FIG. 8 is well-known to those skilled in the art and need not be described in detail herein.

Figure 9:
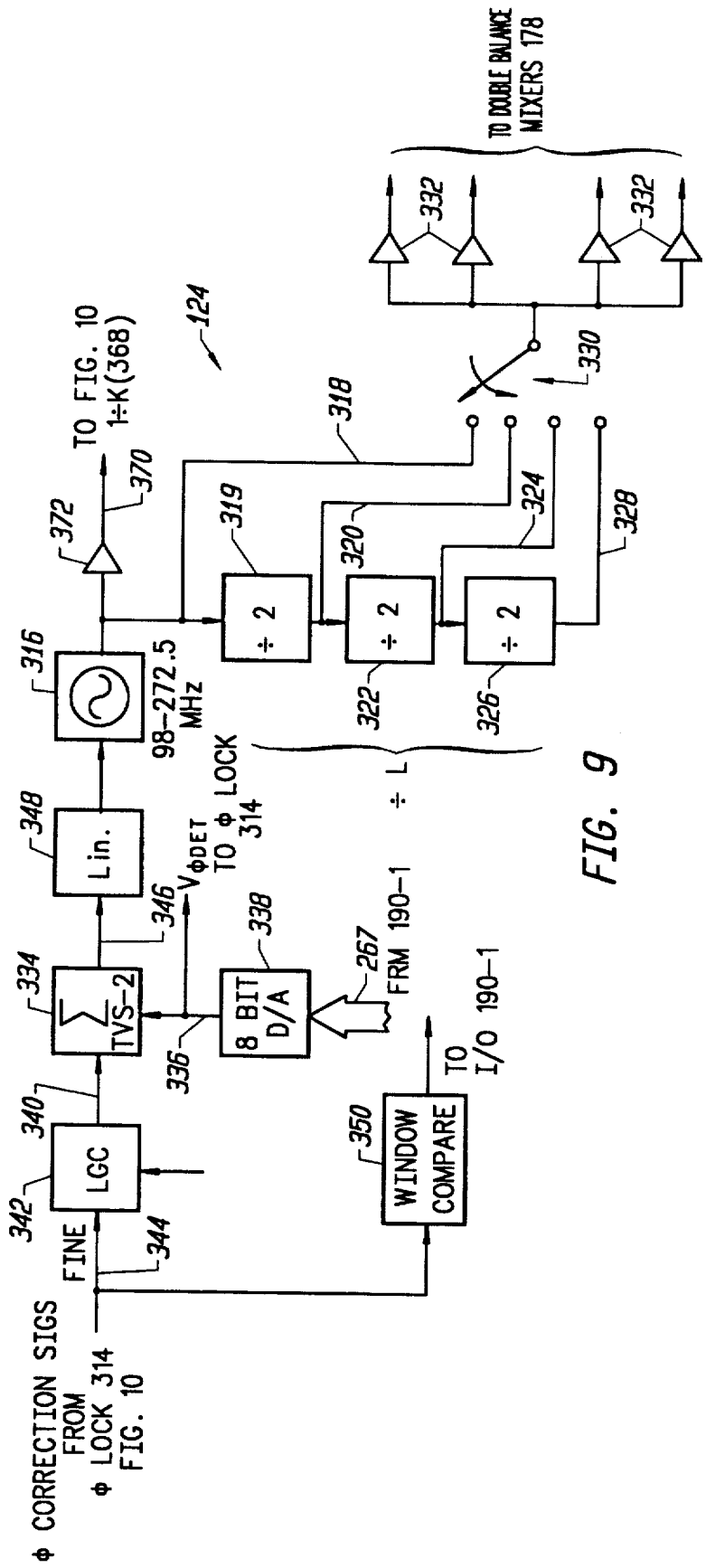
FIG. 9 illustrates details of the second local oscillator 124 of FIG. 1.
Figure 10:
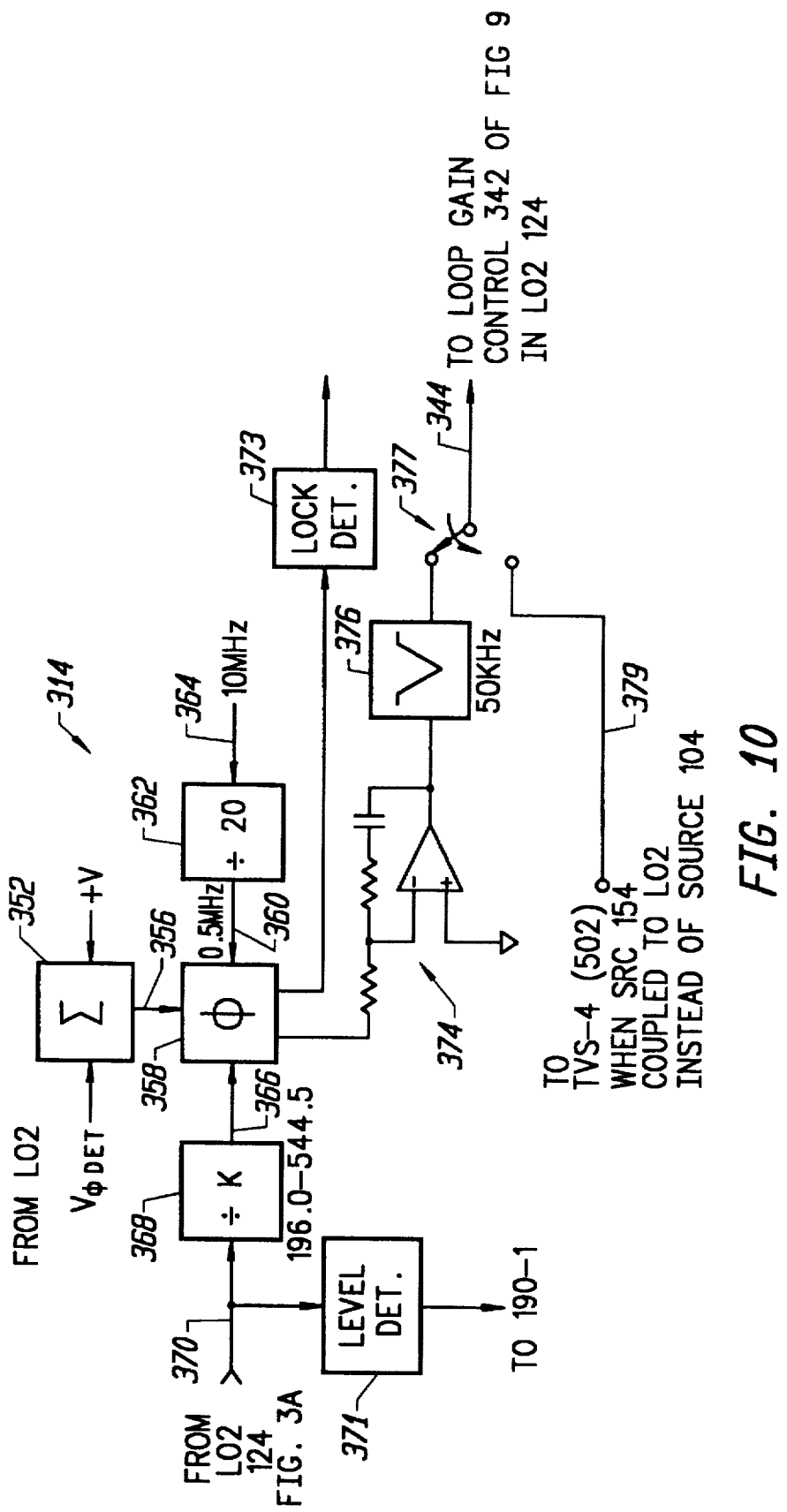
FIG. 10 illustrates details of the phase lock circuit 314 used to control the frequency of operation of the second local oscillator 124 of FIG. 9.

FIG. 9 illustrates details of the second local oscillator 124. FIG. 10 illustrates details of the phase lock circuit 314 used to control the frequency of operation of the second local oscillator 124.

The second local oscillator 124 includes a voltage tuned oscillator 316 having a range of operation of 98–272.5 Mhz. The output frequency of oscillator 316 is provided both to line 318 and to a first divide-by-two circuit 319. The output frequency of the first divide-by-two circuit 319 is provided both to line 320 and to a second divide-by-two circuit 322. The output frequency of the second divide-by-two circuit 322 is provided both to line 324 and to a third divide-by-two circuit 326. The output frequency of the third divide-by-two circuit is provided to line 328. Switch 330 selects among the signals provided on lines 318, 320, 324, and 328 and provides the selected signal, via respective drivers 332 to the respective double balance mixers 178.

The second local oscillator 124 includes a tuning voltage summation circuit (TVS-2) 334 which receives on line 336 coarse frequency steering signals from eight bit digital-to-analog converter 338. The coarse steering signals provided by the digital-to-analog converter 338 are controlled by signals provided by the I/O processor 190-1, via I/O bus 267.

TVS-2 334 receives on line 340 fine frequency steering signals from loop gain control circuitry 342. These signals compensate for variations in loop gain caused by the "÷L" components when the source lock 154 provides control signals to the second local oscillator 124 instead of to the signal source 104. The loop gain control circuitry 342 receives on line 344 phase correction signals provided by the phase lock circuit 314 as explained below.

The TVS-2 provides voltage tuning signals on line 346 to a linearizer 348 which provides a linear frequency versus voltage tuning signal to the voltage tuned oscillator 316. Furthermore, window compare circuitry 350 receives the fine frequency steering signal on line 344 and provides diagnostic signals to the I/O processor 190-1. Finally, the coarse frequency steering signals on line 336 are provided as signal $v_{\phi DET}$ to the phase lock circuit 314 as explained below.

The phase lock circuit 314 includes loop gain compensation control circuitry 352 which receives the $v_{\phi DET}$ signal.

The circuitry 352 also receives a biasing voltage used to provide nominal gain even when $V_{\phi DET}$ is at 0 volts. The loop gain compensation control circuitry 352 provides on line 356 signals which maintain a constant loop gain in the phase lock control circuit 314 despite variations in the divisor K discussed below.

A phase detector 358 receives the signals provided on line 356 by loop gain compensation control circuitry 352. It also receives 0.5 Mhz signals provided on line 360 by divide-by-twenty circuit 362. The divide-by-twenty circuit 362 receives the 10 Mhz crystal controlled reference signals on line 364. Finally, the phase detector 358 receives on line 366 signals provided by divide-by-K circuitry 368.

The divide-by-K circuitry 368 receives on line 370 signals provided on line 370 by the voltage tuned oscillator 316 via driver 372. The value of K ranges from the 196.0–544.5. The resolution of the divide-by-K circuitry 368 is 50 Khz. In order to achieve this resolution and to achieve rapid phase-lock of the second local oscillator 124, a fractional frequency divider described in the above-referenced co-pending application is included in the divide-by-K circuitry 368.

The phase detector 358 provides phase correction signals to loop amplifier 374. The loop amplifier, in turn, provides the signals, via 50 Khz notch filter 376, to the loop gain control circuitry 342 of the second local oscillator 124. The 50 Khz notch filter 376 removes sidebands caused by fractional K division.

The phase detector 358 provides to lock detector 373 signals which indicate when phase lock has been achieved. The lock detector 373 provides signals to the I/O processor 190-1 indicating when the second local oscillator 124 is in phase lock and test measurements can be taken. The signals provided on line 370 are provided to a level detector 371. The level detector 371 provides diagnostic signals to the I/O processor 190-1.

Switch 377 alternatively couples line 344 to the phase lock circuit 314 or to TVS-4 502 discussed below in relation to FIG. 14. Switch 377 couples line 344 to TVS-4 when the source lock 154 is to be coupled to the second local oscillator 124 instead of to the signal source 104.

This alternative coupling, for example, is used in the synthesizer mode when a synthesized signal source (not shown) is incorporated in the system 100. The phase lock of the $IF_2$ to the 2.25 Mhz synthesized reference frequency reduces measurement noise regardless of whether the signal source 104 or the second local oscillator 124 is controlled.

It will be appreciated that an important advantage of the system 100 is that it permits the use of an unsynthesized signal source 104. This particular advantage is gained by using the source lock 154 to phase lock the signal source 104 to an $IF_2$ reference signal. Typically, an unsynthesized signal source 104 is significantly less expensive than a synthesized source. Furthermore, the system 100 permits the use of an unsynthesized signal source 104 without suffering a degradation in stimulus signal frequency accuracy.

Figure 11:
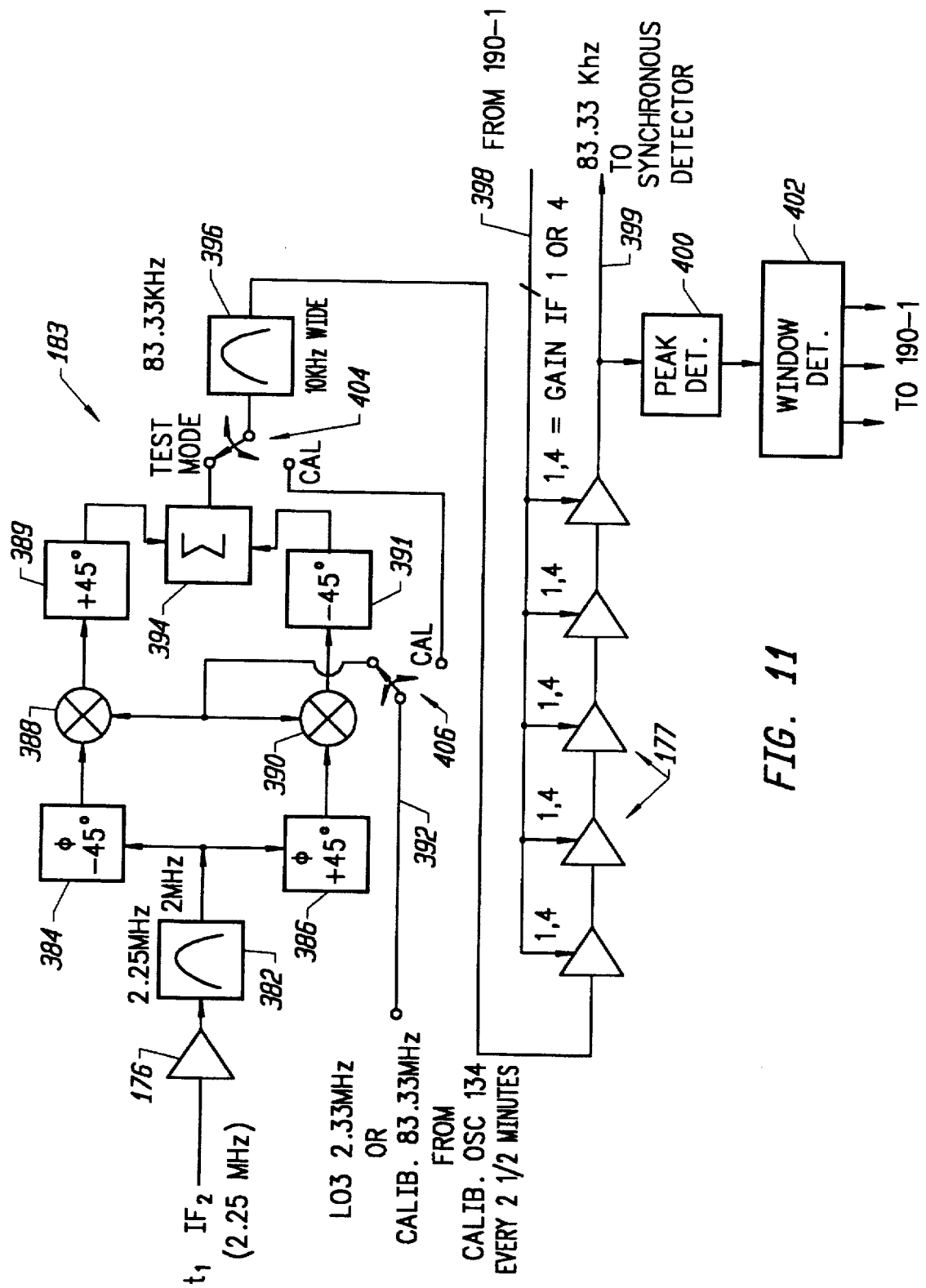
FIG. 11 illustrates details of image reject mixer 183 and its associated variable driver assembly 177 for the present invention.

FIG. 11 illustrates details of image reject mixer 183 and its associated variable driver assembly 177. It will be appreciated that the image reject mixers indicated by reference numerals 179 and 185 are substantially identical to that illustrated in FIG. 11.

The image reject mixer 183 is operable in either a test mode or a calibration mode. In the test mode, downconverted versions of the test signal $t_1$ at the $IF_2$ of 2.25 Mhz are received by driver 176 and are provided to 2 Mhz bandpass filter 382 centered at 2.25 Mhz. The filtered $IF_2$ signal is split in order to allow for quadrature phasing at $IF_2$ of the split signals as follows. One split signal is provided to a −45° phase shifter 384, and the other split signal is provided to +45° phase shifter 386. The respective phase shifted signals are provided to respective double balanced mixers 388 and 390 where they are mixed with the 2.33 Mhz signal provided on line 392 by the third local oscillator 128. The mixed signal output by mixer 388 is provided to +45° phase shifter 389, and the mixed signal output by mixer 390 is provided to −45° phase shifter 391. The resulting signals are provided to summation circuit 394 which, in turn, provides their sum to 10 Khz bandpass filter 396 centered at 83.33 Khz.

Thus, in test mode the image reject mixer 183 downconverts the IF$_2$ signal to a third intermediate frequency (IF$_3$) of 83.33 Khz. The 83.33 Khz signal is provided to a gain ranging amplifier assembly 177 which comprises a series of five individual drivers. These drivers can be set by control signals provided on lines 398 by the I/O processor 190-1 to individually provide gain of either one or four. Consequently, a variable gain is provided to signals output by the double balance mixer 183 for provision to a synchronous detector 130. Peak detector 400 monitors the peak amplitude of the signals output by the gain ranging amplifier assembly 177. Window detector 402 provides to the I/O processor 190-1 signals indicating when the signals on line 399 are within a desired signal level suitable for provision to the synchronous detector 130.

In the calibration mode, switches 404 and 406 couple line 392 directly to bandpass filter 396, and the calibration oscillator 134 provides on line 392 calibration signals at 83.33 Khz as explained below. In the calibration mode, the 83.33 Khz signal provided by the calibration oscillator 134 is used to calibrate the gain ranging amplifiers 177 and the synchronous detectors 130.

Calibration occurs approximately once every two and one-half minutes. During calibration, the ADC 150 is calibrated using a precision DC reference (not shown). The gain and phase shifts experienced by a signal propagated through the gain ranging amplifier assembly 177 due to gain settings of one and four are determined and stored in memory. Also, circularity errors in the synchronous detectors 130 are identified and stored in memory. The stored errors are used later to correct measurement data.

Figure 12:
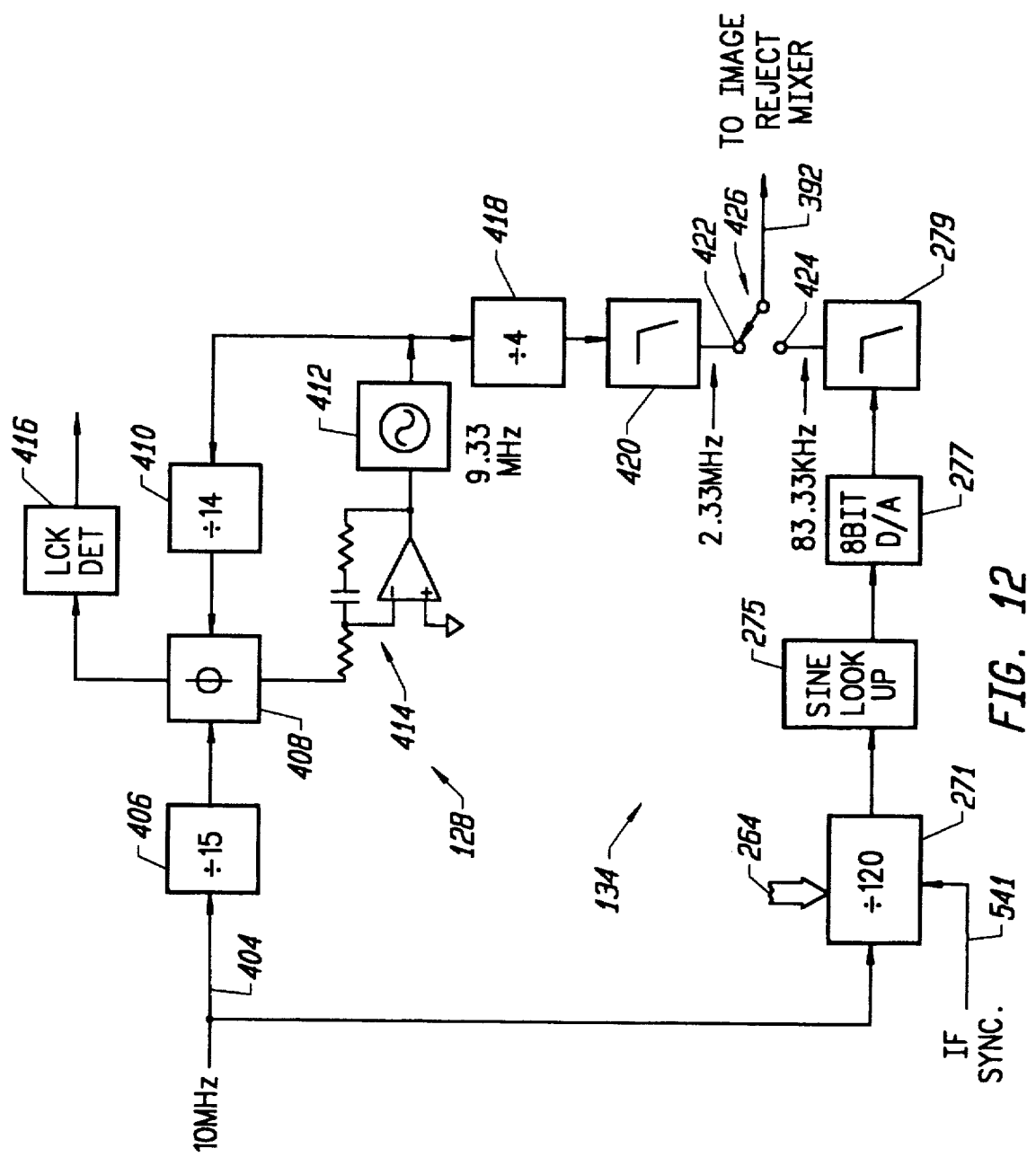
FIG. 12 illustrates details of the calibration oscillator 134 and the third local oscillator 128 of FIG. 1.

FIG. 12 illustrates details of the calibration oscillator 134 and the third local oscillator 128. The third local oscillator 128 receives the 10 Mhz crystal control reference signal on line 404. The divide-by-fifteen circuit 406 downconverts the 10 Mhz signal to the 666 Khz. The downconverted 666 Khz signal is provided to phase detector 408. Divide-by-fourteen circuit 410 receives an input from 9.33 Mhz voltage tuned oscillator (VTO) 412 and provides an output signal at approximately 666 Khz to the phase detector 408. The phase detector 408 provides an output to loop amplifier 414 which, in turn, provides an amplified voltage tuning signal to the 9.33 Mhz VTO 412. The phase detector also provides a signal to lock detector 416 which, in turn, indicates to the I/O processor 190-1 when the third local oscillator 128 is phase locked and measurements can be taken.

The 9.33 Mhz VTO 412 provides its output signal both to the divide-by-fourteen circuit 410 and to a divide-by-four circuit 418. The output of the divide-by-four circuit 418 is provided to a 3 Mhz low-pass filter 420. Thus, at terminal 422 a 2.33 Mhz signal is provided by the third local oscillator 128.

A byte provided on bus 269 to divide-by-one hundred and twenty circuit 271 indicates the phase of the 83.33 Khz calibration signal relative to the IF synchronization signal provided on line 541 by the IF synchronization circuitry 520. A sine look-up table 275 converts the signals provided by the circuit 271 to a series of pulses which, in turn, are converted by digital-to-analog converter 277 to an 83.33 Khz sinc wave. Filter 279 provides filtering to the 83.33 Khz calibration signal on terminal 424.

Switch 426 can be used to select between terminals 422 and 424. When terminal 422 is selected, the 2.33 Mhz signal provided by the third local oscillator 128 is provided on line 392 and when terminal 424 is selected, the 83.33 Khz signal provided by the calibration oscillator 134 is provided on line 392.

Figure 13:
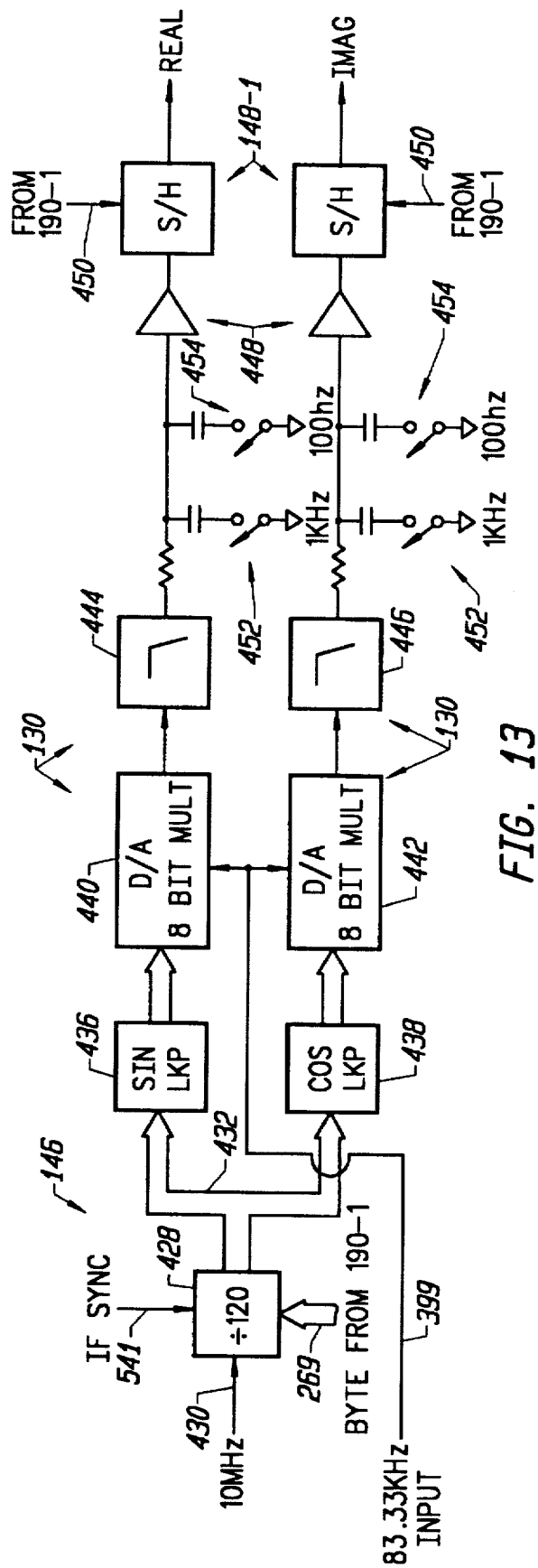
FIG. 13 illustrates details of a respective fourth local oscillator 146 and the details of one of the three synchronous detectors 130 and two of the six sample/hold circuits 148 from FIG. 1.

FIG. 13 illustrates details of a respective fourth local oscillator 146 and the details of one of the three synchronous detectors 130 and two of the six sample/hold circuits 148-1. In operation, divide-by-one hundred and twenty circuit 428 receives the 10 Mhz crystal controlled reference signals on line 430. The circuit 428 receives on bus 269 a control byte from the I/O processor 190-1 which indicates the phase of the output signal of the oscillator relative to the IF synchronization signal. The circuit 428 also receives the IF synchronization signal. The circuit 428 provides on lines 432 a digital representation of a 83.33 Khz signal.

The synchronous detector 130 includes a respective sine look-up table 436 and a respective cosine look-up table 438 which respectively receive the digital signal representation provided by the divide-by-one hundred and twenty circuit 428. The respective sine and cosine look-up tables 436 and 438 respectively provide digital sine and cosine representations of the 83.33 Khz signal to respective digital-to-analog converters and eight bit multiplier circuits 440 and 442.

Circuit 440 converts the signals provided by sine look-up table 436 from digital to analog. Circuit 442 converts the signals provided to it by cosine look-up table 438 from digital to analog. Circuit 440 multiplies the analog versions of the signals provided by the sine look-up table 436 with 83.33 Khz signals provided on line 399. Circuit 442 multiplies the analog versions of the signals provided by the cosine look-up table 438 with the 83.33 Khz signals provided on line 399.

The output of circuit 440 is provided to the 100 Khz low-pass filter 444. The output of filter 444 represents the "Real" (or in-phase) component of the signal on line 399.

The output of circuit 442 is provided to 100 Khz low-pass filter 446. The output of filter 446 represents the "Imaginary" (or quadrature) component of the signal on line 399.

The respective outputs of filters 444 and 446 are provided, via respective drivers 448, to sample-and-hold circuits 148-1. The I/O processor 190-1 controls the operation of the sample-and-hold circuits 148-1 using control signals provided on lines 450. Sampling of the Real and Imaginary components by all three channels occurs simultaneously. The simultaneous sampling advantageously preserves the correlated noise on the channels which is normalized out during S-parameter display.

The respective outputs of the filters 444 and 446 can undergo additional filtering to remove noise using either respective 1 Khz filters 452 or using respective 100 hz filters 454. Alternatively, the outputs of respective filters 444 and 446 can be provided directly to respective drivers 448 without further filtering. The selection of the respective filters 452 and 454 is provided by the front panel 552.

Filters 444, 446 and 452, 454 advantageously filter out noise in the downconverted signals outside the filter bandwidths without the need for involvement of the processors 190-1, 190-2 or 190-3. More specifically, the filters can be used to filter out noise without the need to take a relatively large number of stimulus signal measurements and then average the results, using the processors, in order to reduce noise. Thus, the processor is free to undertake other tasks, and in fact, the settling time of filters 444, 446 and 452, 454 is short enough such that accurate measurements often can be taken more rapidly using such filtering than if the processors were involved in calculating average measurement values in order to remove noise. Optionally, of course, the processors (instead of the filters) can be used to remove such noise or the two can be used together for even greater noise reduction.

In the preferred embodiment, the use of the 1 Khz filters 452 results in a sampling time of approximately 2.1 msec for each discrete stimulus signal frequency, and use of filters 454 results in a sampling time of approximately 11.1 msec. Whereas, use of neither filters 452 nor 454 results in a sampling time of approximately 1.1 msec. The additional sampling time incurred by using either filters 452 or 454 is due to an increased settling time for narrower bandwidth filters.

It will be appreciated that the discussion with respect to FIG. 13 applies to each and every one of the synchronous detectors 130.

In operation, for each stimulus signal frequency, the Real and Imaginary signal levels are adjusted prior to their actual measurement so as to obtain maximum resolution from the ADC 150. For each stimulus signal frequency tested and for each channel, the I/O microprocessor 190-1 first determines that the first and second local oscillators 122 and 124 and the signal source 104 are phase locked. Then it increases or decreases the gain provided by the gain ranging amplifier assemblies 177 as needed to maintain the downconverted signals on each of the three respective channels within the desired limits of the window detectors 402. For each of the three channels, once proper signal magnitude has been achieved by increasing or decreasing the gain, the I/O processor 190-1 measures the Real and Imaginary outputs of the channel's synchronous detector 130 and increases or decreases the phase byte provided on bus 269 so as to make the Real and the Imaginary signals equal and positive. This assures that the signal magnitude will be maximized for both the Real and the Imaginary signals. The adjustments just described minimize quantization error in Real and Imaginary signals on each of the three channels converted by the ADC 150.

Figure 14:
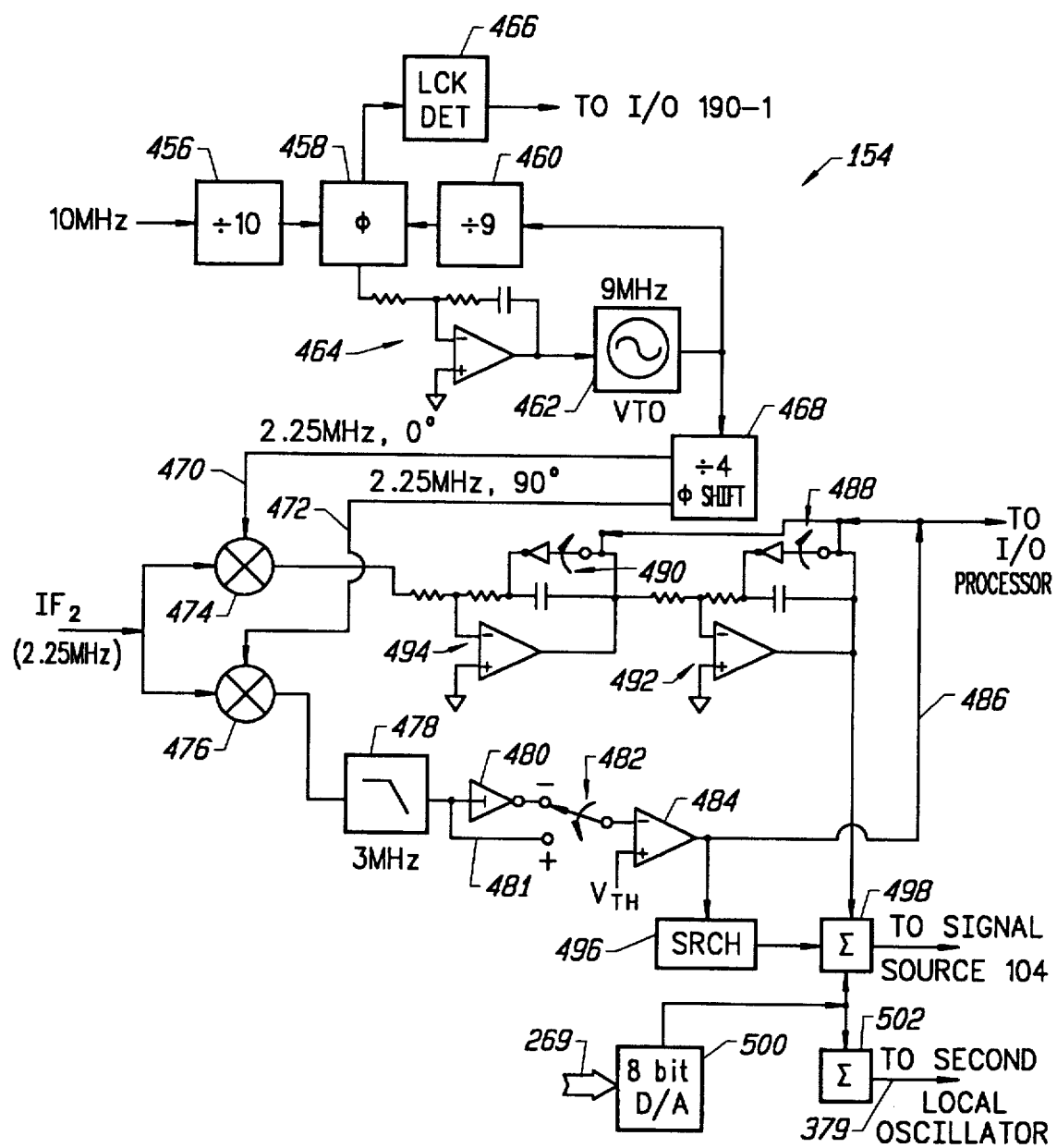
FIG. 14 illustrates details of the source lock circuitry 154 of FIG. 1.

FIG. 14 illustrates details of the source lock circuitry 154. Divide-by-ten circuit 456 receives the 10 Mhz reference signals. Circuit 456, in turn, provides 1 Mhz signals to phase detector 458. Divide-by-nine circuit 460 receives signals from 9 Mhz voltage tuned oscillator (VTO) 462, and provides 1 Mhz signals to the phase detector 458. The phase detector 458 provides a correction signal to a loop amplifier 464 which, in turn, provides an amplified tuning voltage signal to the 9 Mhz VTO. The phase detector 458 also provides a signal to lock detector 466 which provides a lock detection signal to the I/O processor 190-1.

The 9 Mhz VTO 462 provides to divide-by-four and phase shifting circuit 468 its output at the 9 Mhz frequency. Circuit 468 provides on line 470 a 2.25 Mhz signal with 0° phase shift and provides on line 472 a 2.25 Mhz signal with a 90° phase shift. The signal on line 470 is provided to double balanced mixer 474 which mixes it with an $IF_2$ reference signal. Similarly, the signal on line 472 is provided to double balanced mixer 476 which mixes it with an $IF_2$ reference signal.

The output of mixer 474 is used to generate the correction signal provided on line 160 to the signal source 104. The output of mixer 476 is used to detect when the $IF_2$ reference signal is in phase lock with the signal provided on line 472.

The output of mixer 476 is provided to 3 Mhz low-pass filter 478. The output of filter 478 is provided to inverter 480 and to line 481. Switch 482 is preset by the I/O processor 190-1 to couple a positive polarity signal to the positive terminal of comparator 484 upon achieving phase lock with $IF_2$.

Table 1 indicates the position of switch 482 over various frequency ranges.

TABLE 1

| Terminal | Frequency Range |
| --- | --- |
| (+) | 110–270 Mhz |
| (−) | 270.1–447 Mhz |
| (+) | 447.1–626 Mhz |
| (−) | 0.6261–40 Ghz |

Upon the achievement of phase-lock with $IF_2$ the comparator 484 provides a signal on line 486 causing switches 488 and 490 to open. Thus, upon achieving phase lock, the first and second integrators 492 and 494 are incorporated into the feedback path of the correction signal provided on line 160. The signal source 104 in conjunction with the first and second integrators 492 and 494 form a third order loop. Optionally, when the second local oscillator 124 is in the feedback loop, it together with the first and second integrators 492 and 494 forms a third order loop. The use of a third order loop significantly reduces noise in the system 100.

Additionally, upon the achievement of phase lock with $IF_2$ the signal provided by comparator 484 disables a search oscillator 496. Before phase-lock is achieved, the search oscillator 496 sweeps in frequency from 3 Mhz above to 3 Mhz below the desired stimulus signal frequency to be generated by the signal source 104. The search oscillator provides its output frequency sweep signal to tuning voltage summation circuitry (TVS-3) 498.

TVS-3 circuit 498 also receives from the 8-bit digital-to-analog converter (DAC) 500 coarse tuning signals. The DAC 500 is under control of signals provided on bus 269. TVS-3 498 provides correction signals on line 160 to the signal source 104.

Additionally, the DAC 500 provides a signal to tuning voltage summation circuitry (TVS-4) 502 which can provide a control signal to the phase lock circuit 314, via line 379, when the second local oscillator is phase-locked to $IF_2$.

In order to decrease heat dissipation requirements, weight and volume of the power supply of the system 100, a switching power supply 540 is used. It is well known that switching power supplies typically generate electromagnetic interference (EMI) which potentially can interfere with measurement signals ($t_1$, $t_2$, $r_1$, and $r_2$) if the EMI falls within the passband of the measurement signals.

In the system 100 of the present invention, the frequency of operation of the switching power supply 540 is injection locked so as to strategically place sidebands of the EMI produced by the switching power supply 540 in frequency bands (approximately 55 Khz and 111 Khz) equally spaced above and below the highly sensitive 83.33 Khz ($IF_3$) measurement signals. Injection locking ensures long term frequency accuracy of the EMI so as to avoid drift into the $IF_3$ passband.

Details of the switching power supply 540 and injection locking as accomplished in the presently preferred embodiment are provided in commonly assigned co-pending Patent Application, entitled SWITCHING POWER SUPPLY WITH AN INJECTION SIGNAL FREQUENCY LOCKING CIRCUIT, invented by Donald A. Bradley Ser. No. 176,095, now U.S. Pat. No. 4,858,097 filed on the same date as this Application and which is hereby incorporated herein in its entirety by this reference.

FIGS. 19-20 provide schematic diagrams illustrating details of the test set I/O circuit 534. Referring to FIG. 20, the I/O circuit 534 includes five overcurrent protection circuits 554. Each respective overprotection circuit 554 is coupled to respective indicator circuitry 556 which indicates when an overcurrent condition has occurred. Each respective indicator circuit 556 is coupled to respective circuitry 558 which communicates with the I/O processor 190-1.

Details of the overcurrent protection circuits 554 and their operation are provided in commonly assigned co-pending Patent Application, entitled OVER-CURRENT PROTECTION CIRCUIT, invented by Donald A. Bradley, Ser. No. 175,957, now U.S. Pat. No. 4,926,288 filed on the same date as this Application and which is hereby incorporated herein in its entirety by this reference.

Frequency Solution

In operation, the network analyzer system of the present invention can provide scattering parameters for a DUT 102 over a range of discrete frequencies. The number of stimulus signal frequencies for which phase and magnitude information can be measured and the frequency range of interest can be selected by the user. In the preferred embodiment, the maximum number of stimulus signal frequency points is 512, and the minimum number is 74. The number of frequency data points can be chosen by the user so as to optimize phase and magnitude resolution versus speed of operation. It will be appreciated that the more frequency points measured, the longer it will take for the system to provide to the user phase and magnitude information for all of these points.

The measurement system advantageously permits a user to select discrete frequency points within a desired range of frequencies. Alternatively, the user may designate a range of frequencies of interest, and the measurement system will automatically select discrete frequency points within that range for testing of the DUT 102.

Figure 15:
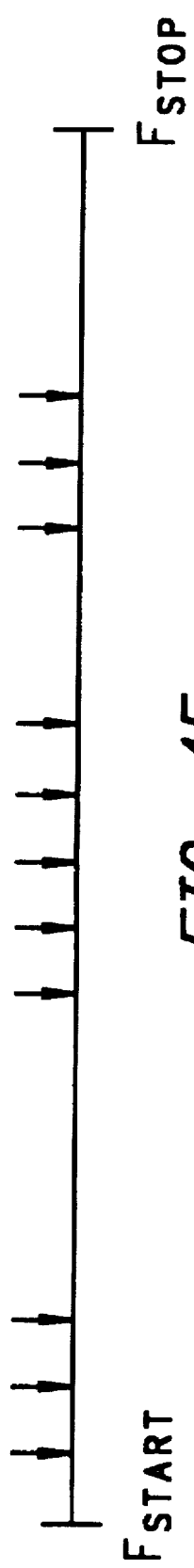
FIG. 15 illustrates the ability of the system to select unevenly spaced discrete frequency points.
Figure 16:
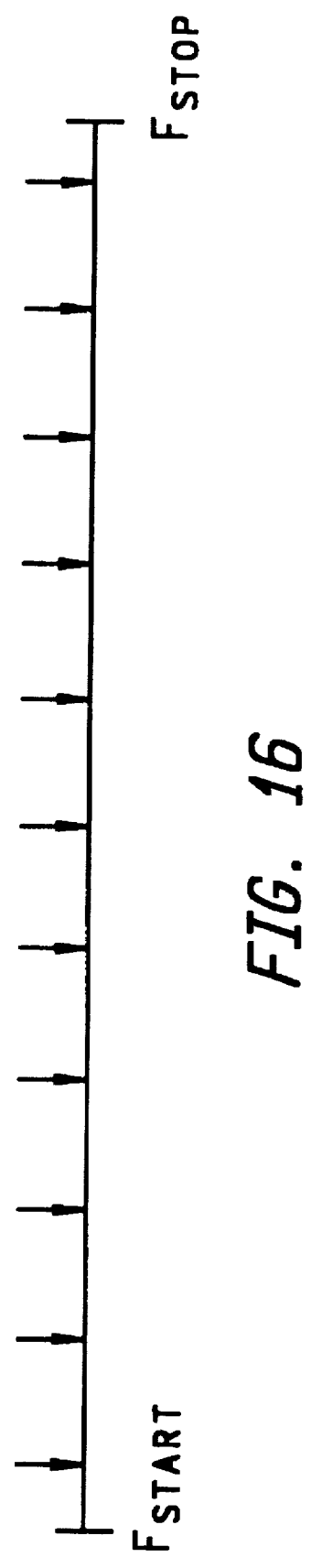
FIG. 16 illustrates the ability of the system to select evenly spaced frequencies.

The ability of the user to select discrete frequency points is particularly advantageous where the DUT 102 is a device such as a filter in which more frequency points are desired in the skirts than in the pass band of the filter. FIG. 15 illustrates the selection of unevenly spaced discrete frequency points within a range of frequencies of interest bounded by a starting frequency ($F_{Start}$) and a stopping frequency ($F_{Stop}$). FIG. 16 illustrates a range of frequencies of interest which are evenly spaced within the range of frequencies of interest. In the preferred embodiment, the frequency resolution provided by the signal source 104 is 50 Khz.

The measurement system uses an algorithm to select the frequency of operation of the respective first and second local oscillators 122 and 124 for each frequency point selected by the user. The system then stores these oscillator frequencies for each frequency point, and during actual measurement of a DUT 102, for each discrete test frequency, the stored frequencies of operation of the respective first and second local oscillators 122 and 124 are recalled and are used to control the frequency of operation of the first and second local oscillators 122 and 124.

The algorithm advantageously seeks to use a relatively low harmonic number to generate the 89.4 Mhz first intermediate frequency ($IF_1$). In practice, this means that it is desirable to use a relatively high frequency of operation for the first local oscillator 122 for each discrete stimulus frequency point. Furthermore, as mentioned above, it is desirable to use a first intermediate frequency of approximately 89.4 Mhz in order to provide continuous frequency coverage in the harmonic mode. The relationship between $IF_1$ and the frequency of operation of the first local oscillator ($F_{LO1}$), the harmonic number and the stimulus signal frequency ($F_{ST}$) is expressed by the following equation:

$$IF_1 = |H(F_{LO1}) - F_{ST}| \tag{5}$$

The algorithm is explained as follows:

$$F = (F_{ST}) (20) \tag{6}$$

$$H = 1 + INT((F + 1788)/10730) \tag{7}$$

$$Z = 5365/(3 + H/1250) \tag{8}$$

$$F_{LO1} = (1 + INT((F + Z)/H)/20 \tag{9}$$

$$F_{LO2} = (H) (F_{LO1}) - F/20 + 2.25 \tag{10}$$

It will be noted that the number 20 is used to normalize the 50 Khz resolution to 1 Mhz in order to simplify the algorithm.

The following illustrates use of the above algorithm to determine the respective frequencies of operation of the first and second local oscillators 122 and 124 for a stimulus signal frequency of 10,000.1 Mhz. The calculation is as follows:

$$F = (20) (10,000.1) = 200,002 \tag{11}$$

$$H = 1 + INT(18.81) = 19 \tag{12}$$

$$Z = 5365/(3 + 19)/1250) = 1779.3 \tag{13}$$

$$F_{LO1} = (1 + INT(200,002 + 1779.3)/19)/20 = 531.05 \tag{14}$$

$$F_{LO2} = 19,531.05 - 200,002/20 + 2.25 = 92.1 \tag{15}$$

Thus for a stimulus frequency of 10,000.1 Mhz, the first local oscillator 122 operates on an $F_{LO1}$ of 531.05 Mhz, and the second local oscillator 124 operates at a frequency of $F_{LO2}$–92.1 Mhz. The precise frequencies of operation, however, may be varied in accordance with the spur search and avoidance algorithm which is discussed next.

After the determination of the individual values for $F_{LO1}$ and $F_{LO2}$ for each of the discrete stimulus signal frequency points selected by a user, the measurement system employs an algorithm to detect spurious signals (spurs) likely to be generated during measurements of a DUT 102. The system uses the algorithm for each discrete selected stimulus signal frequency point for which spurious signals are found, to vary the values of $F_{LO1}$ and $F_{LO2}$ so as to remove the spurious signals. The result is a significant reduction of spur-related noise in the downconverted reference and test signals. The values for $F_{LO1}$ and $F_{LO2}$ as modified to avoid spurs, then are stored by the system for use during measurement of a DUT 102.

Spurious signals can result, for example, from the fact that both harmonics of a discrete stimulus signal frequency $F_{ST}$ and harmonics of the first local oscillator signal frequency $F_{LO1}$ exist due to nonlinearities in the harmonic mixers 174. These harmonics may have a mix product in the noise bandwidth of the system 100.

In addition, small portions of the original $F_{ST}$ and $F_{LO1}$ signals can pass through the harmonic mixers 174 with the desired $IF_1$ signal. These small portions can mix with harmonics of the signals produced by the respective second and third local oscillators 124 and 128 so as to provoke still further spurious signals.

In order to allow maximum dynamic range of the measurement system, it is desirable to eliminate these spurs. The elimination of these spurs using a spur detection and avoidance algorithm is first explained for a particular stimulus signal frequency point at $F_{ST}=3140.90$ Mhz. Then the algorithm is explained in general using the flow diagram of FIG. 18.

Using the algorithm discussed above for selecting $F_{LO1}$ and $F_{LO2}$ the values in Table 2 are selected for $F_{ST}=3140.90$ Mhz.

TABLE 2

| |
|---|
| $F_{ST}$ = 3140.90 Mhz |
| $F_{LO1}$ = 461.50 Mhz |
| H = 7 |
| $IF_1$ = 89.6 Mhz |
| $F_{LO2}$ = 91.85 Mhz |
| $IF_2$ = 2.25 Mhz |
| $F_{LO3}$ = 2.33 Mhz |
| $IF_3$ = 83.33 Khz |

In this example, the seventh harmonic of $F_{LO1}$ (461.50 Mhz×7=3230.5 Mhz) is mixed with the $F_{ST}$ signal to produce $IF_1$ (89.6 Mhz). $IF_1$ is mixed with $F_{LO2}$ to produce the $IF_2$ of 2.25 Mhz. The equations are as follows:

$$IF_1 = H*F_{LO1} - F_{ST} \tag{17}$$

$$IF_2 = F_{LO2} - IF_1 \tag{18}$$

Combining:

$$IF_2 = F_{LO2} - (H*F_{LO1} - F_{ST}) \tag{19}$$

Putting in actual values from Table 2:

$$2.25 = 91.85 - (7*461.5 - 3140.9) \tag{20}$$

Note that the fifth harmonic of $F_{LO2}$ will mix with the frequency of the $F_{LO1}$ producing a spurious $IF_3$ which does not result from an R.F. input:

$$461.50 - (5 \times 91.85) = 2.25 \tag{21}$$

This spur will produce a nonzero $IF_3$ output without any R.F. input. In fact, the possibility exists that several different harmonics of $F_{LO1}$ and $F_{LO2}$ may create spurs. In general, a spur is present if the following conditions are satisfied:

$$|(M*F_{LO1} - N*F_{LO2})| < IF_3 - PB_{IF_3}/2 \text{ and} \tag{22}$$

$$|(M*F_{LO1} - N*F_{LO2})| > IF_3 + PB_{IF_3}/2 \tag{23}$$

M and N are small integers whose range depends upon the passband of the system, and $PB_{IF_3}$ is the passband of the bandpass filter 396, e.g., 10 Khz (see FIG. 11).

Figure 17:
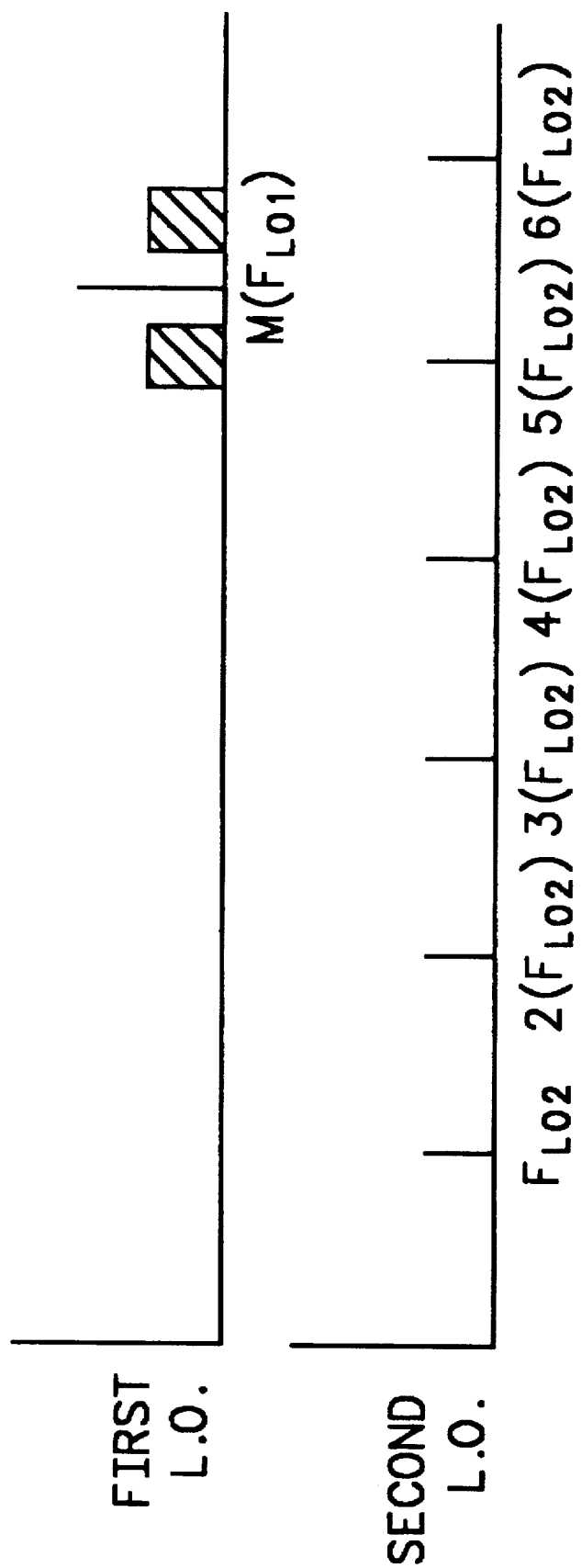
FIG. 17 illustrates conditions necessary to create a spurious If signal.

This relationship is illustrated in FIG. 17 in which M=1. The absolute value of the first terms of the inequalities is reflected in a range above and below the $F_{LO1}$. In this example, only the fundamental (first harmonic, M=1) of $F_{LO1}$ is capable of causing a spur; M is limited to the value of 1. If the value of $F_{LO2}$ is approximately 90 Mhz, for example, and the value of $F_{LO1}$ can range from 357 Mhz to 536.5 Mhz, then the meaningful values for N would be 4 through 6. So all of the combinations of M=1 and N=4 through N=6 must be tested in inequalities 22 and 23.

In order to remove this spur, the values of M and $F_{LO2}$ can be changed so as to maintain the same resulting $IF_3$ while avoiding creation of a spur. This can be explained as follows. By rearranging equation (19), we have:

$$F_{ST} = H*F_{LO1} - F_{LO2} + IF_2 \tag{24}$$

Thus, the values of $F_{LO1}$ and $F_{LO2}$ can be varied to maintain this equation, while avoiding the conditions of inequalities (22) and (23). In the case of the preferred embodiment, the first and second local oscillators 122 and 124 are programmable in 50 Khz steps; so their frequencies must be changed by multiples of this value. If the value of $F_{LO1}$ is increased by 1 Mhz/H, or 150 Khz (H=7) at 50 Khz resolution, then the value of $F_{LO2}$ must be increased by H*150 Khz or 1.05 Mhz at 50 Khz resolution. Substituting into equation (19):

$$2.25 = 92.9 - (7*461.65 - 3140.9) \tag{25}$$

The new values, corrected for spurs, for $F_{ST}=3140.9$ Mhz will be as follows:

TABLE 3

| |
|---|
| $F_{ST}$ = 3140.90 Mhz |
| $F_{LO1}$ = 461.65 Mhz |
| $IF_1$ = 90.65 Mhz |
| $F_{LO2}$ = 92.9 Mhz |
| $IF_2$ = 2.25 Mhz |
| $F_{LO3}$ = 2.33 Mhz |
| $IF_3$ = 83.33 Khz |

As can clearly be seen from Table 3, the new frequencies $F_{LO1}$ and $F_{LO2}$ have no effect upon the final results. Note that $IF_1$ is slightly higher, but the fairly broad band I.F. filter can be used to pass this frequency as well. FIG. 5 and 5B illustrate filtering of $IF_1$.

The effect on the spur of the new values in Table 3 is that the fifth harmonic of $F_{LO2}$ and the harmonic of $F_{LO1}$ results in a frequency of 2.85 Mhz, outside the passband of filter 396.

Figure 18:
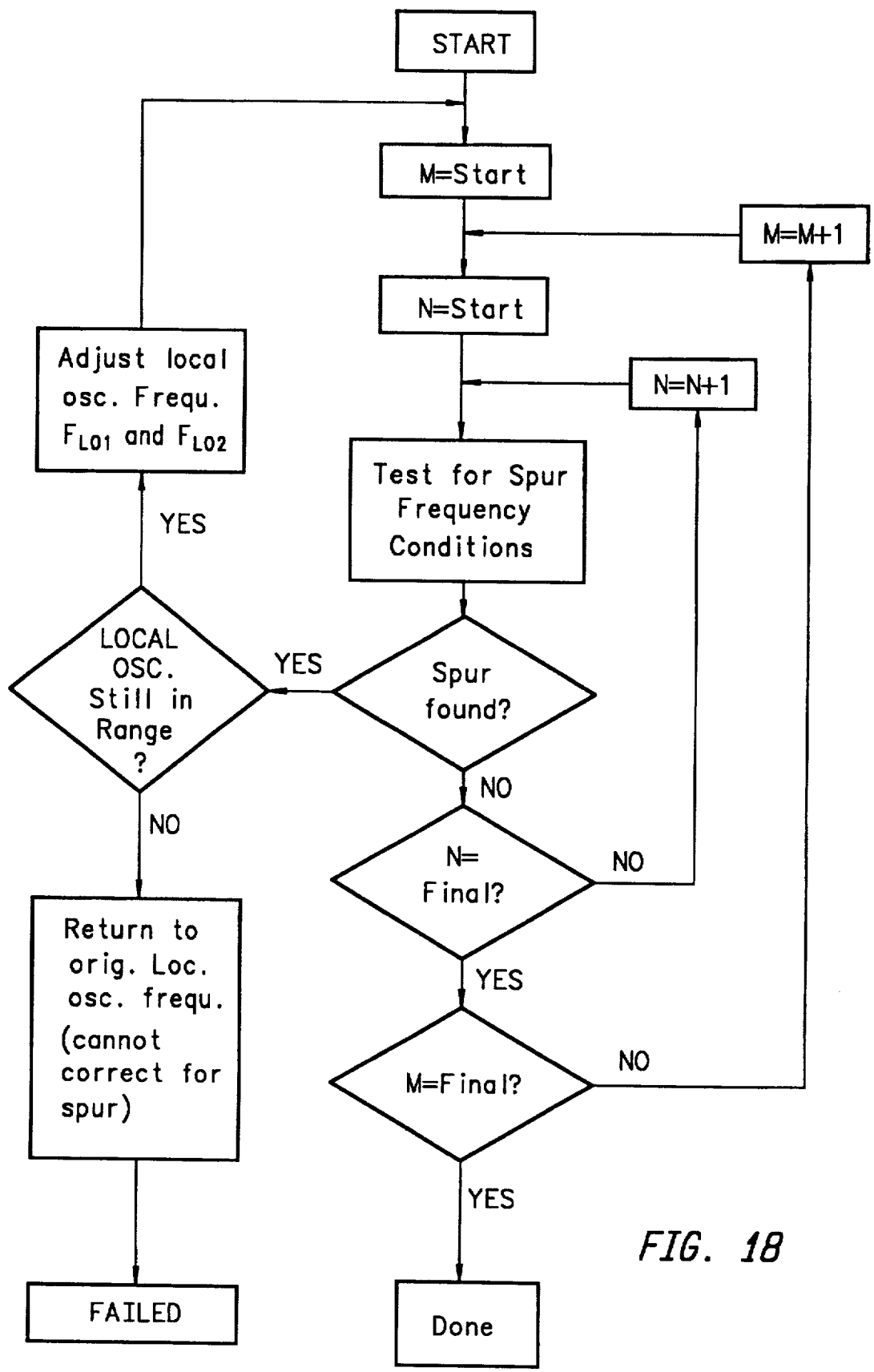
FIG. 18 shows an algorithm for automatically checking for spurious harmonics.
Figure 19A:
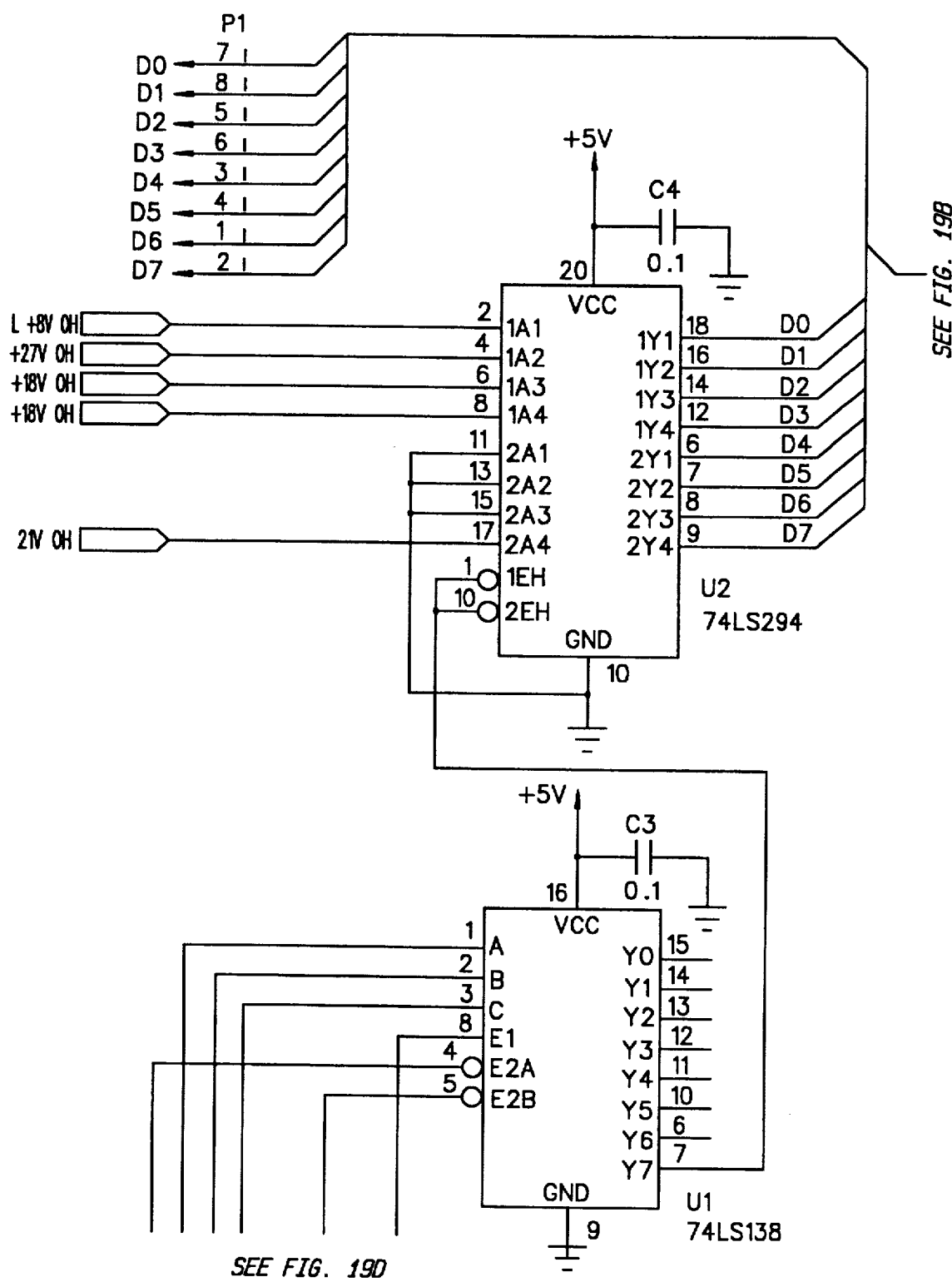
FIGS. 19–20 provide schematic diagrams illustrating details of the test set I/O circuit 534 of FIG. 3B.
Figure 19B:
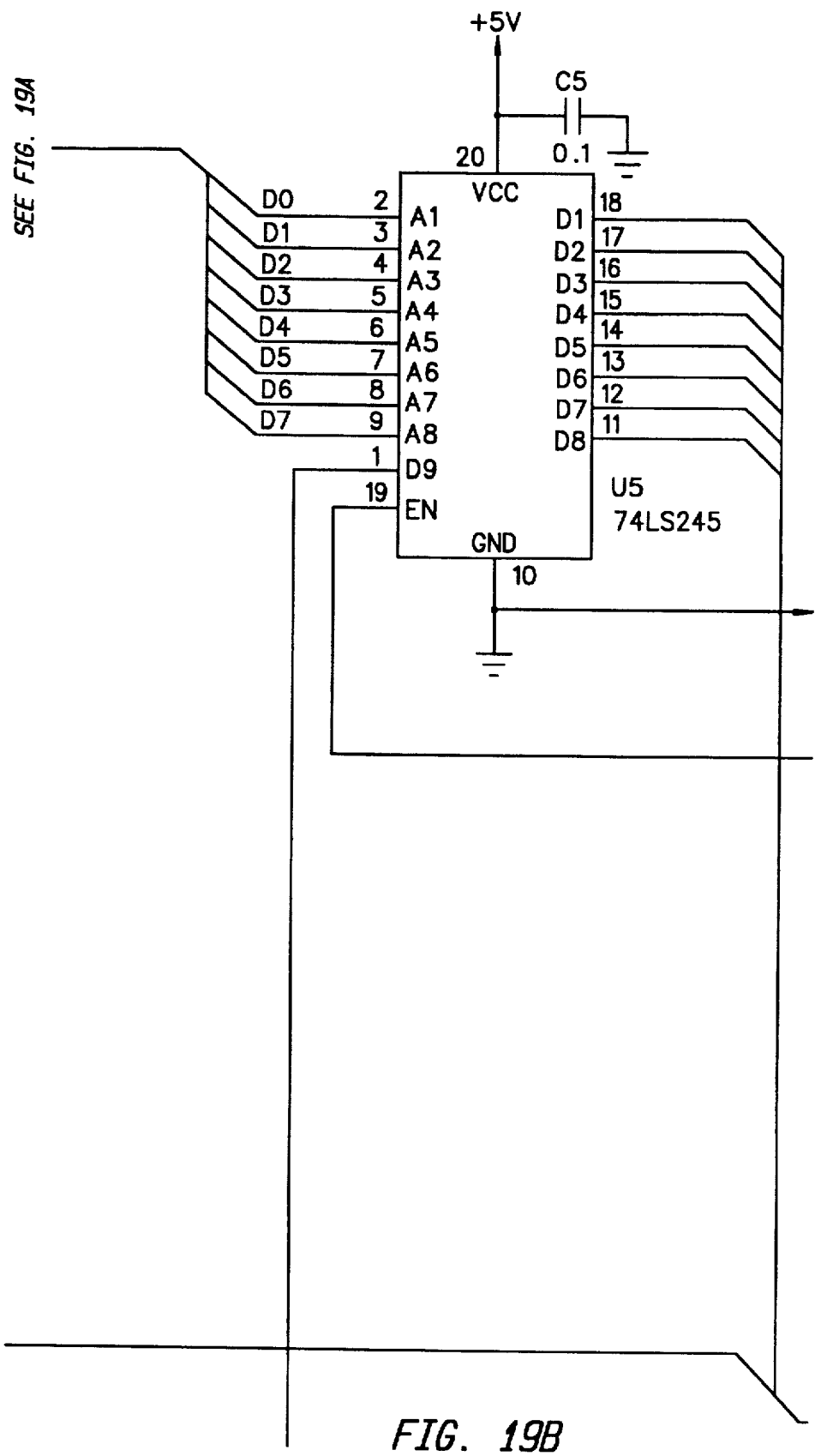
Figure 19C:
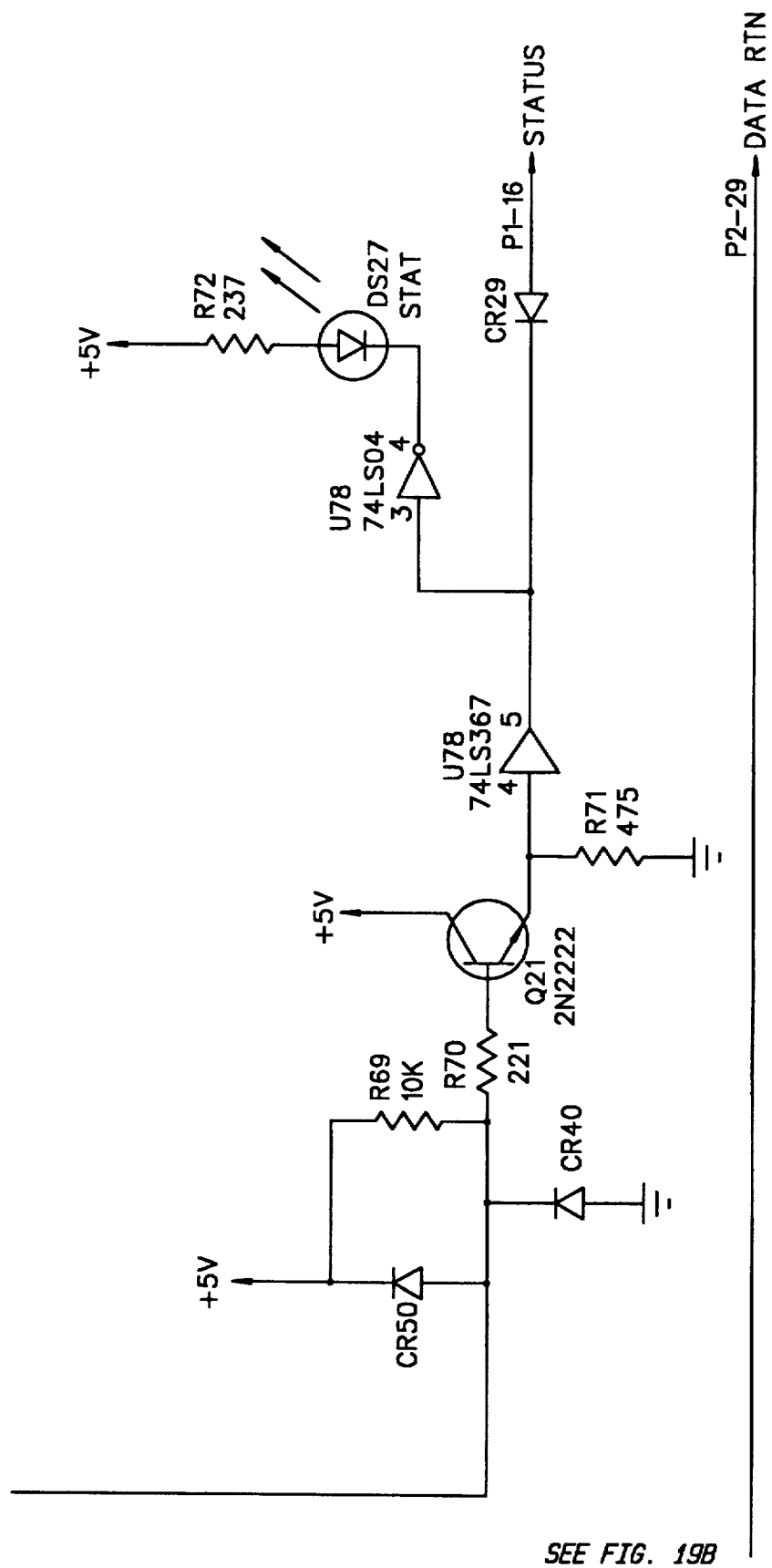
Figure 19D:
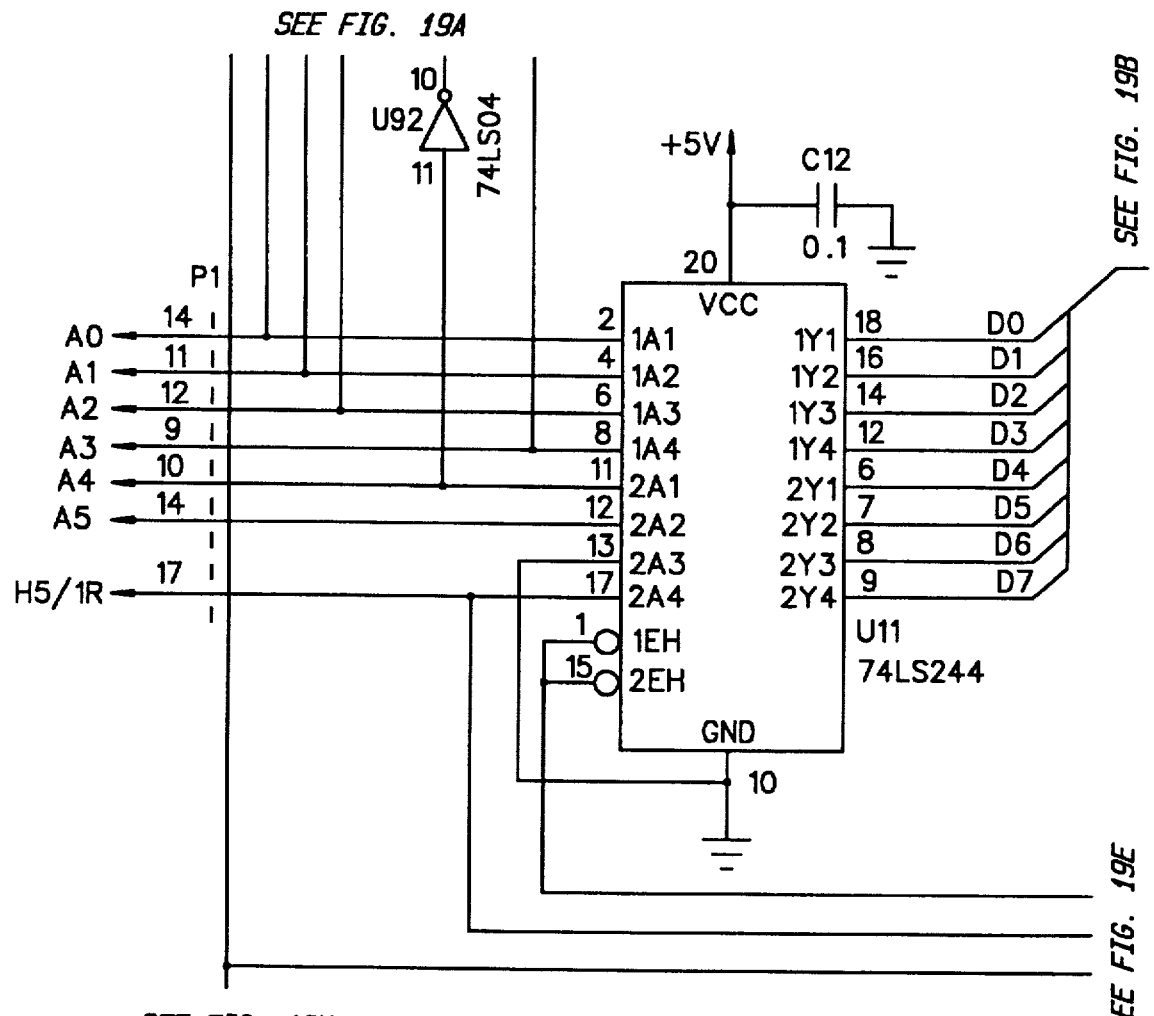
Figure 19E:
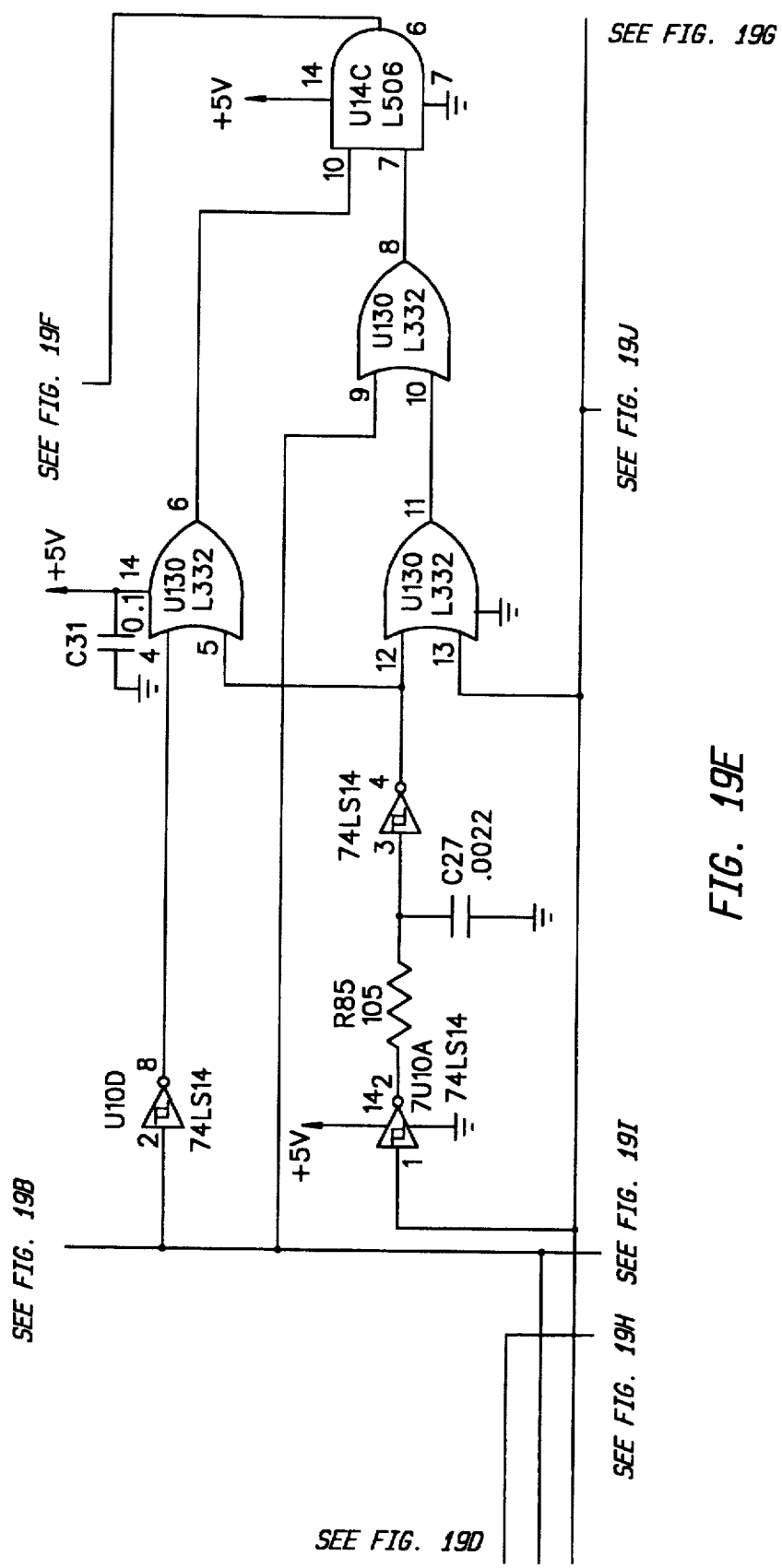
Figure 19F:
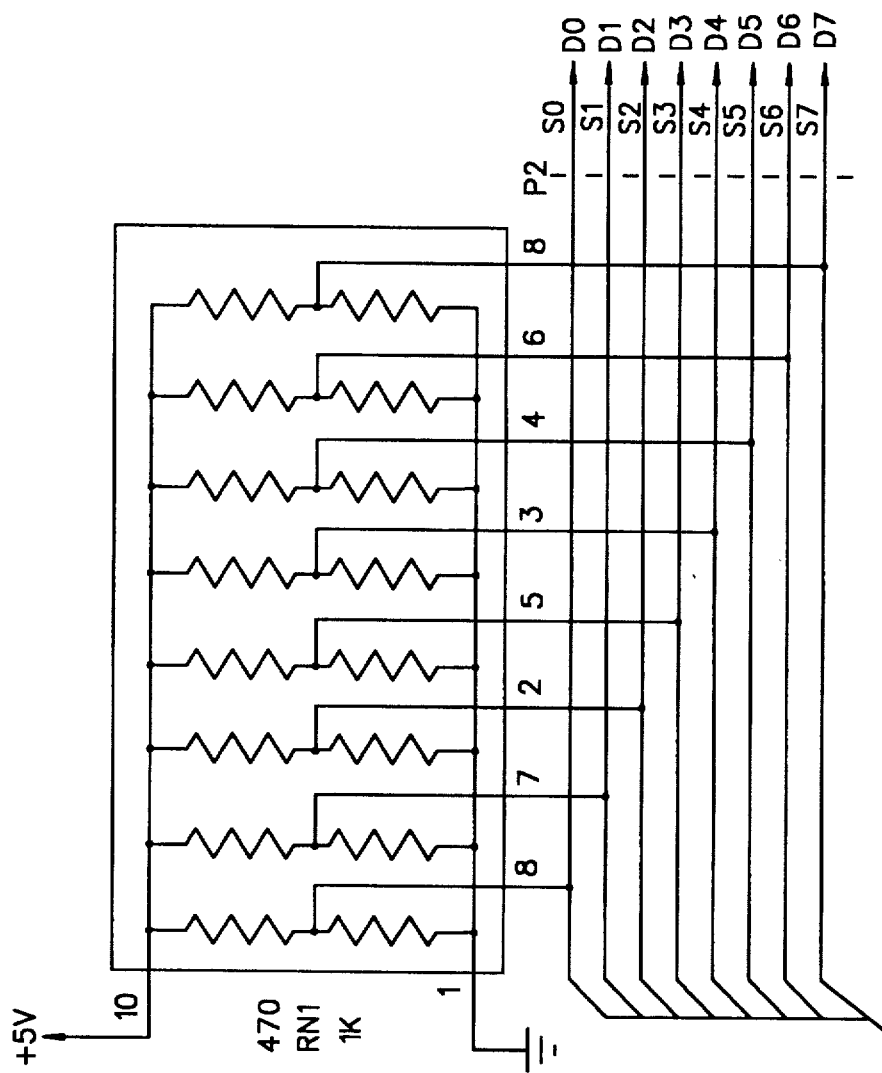
Figure 19G:
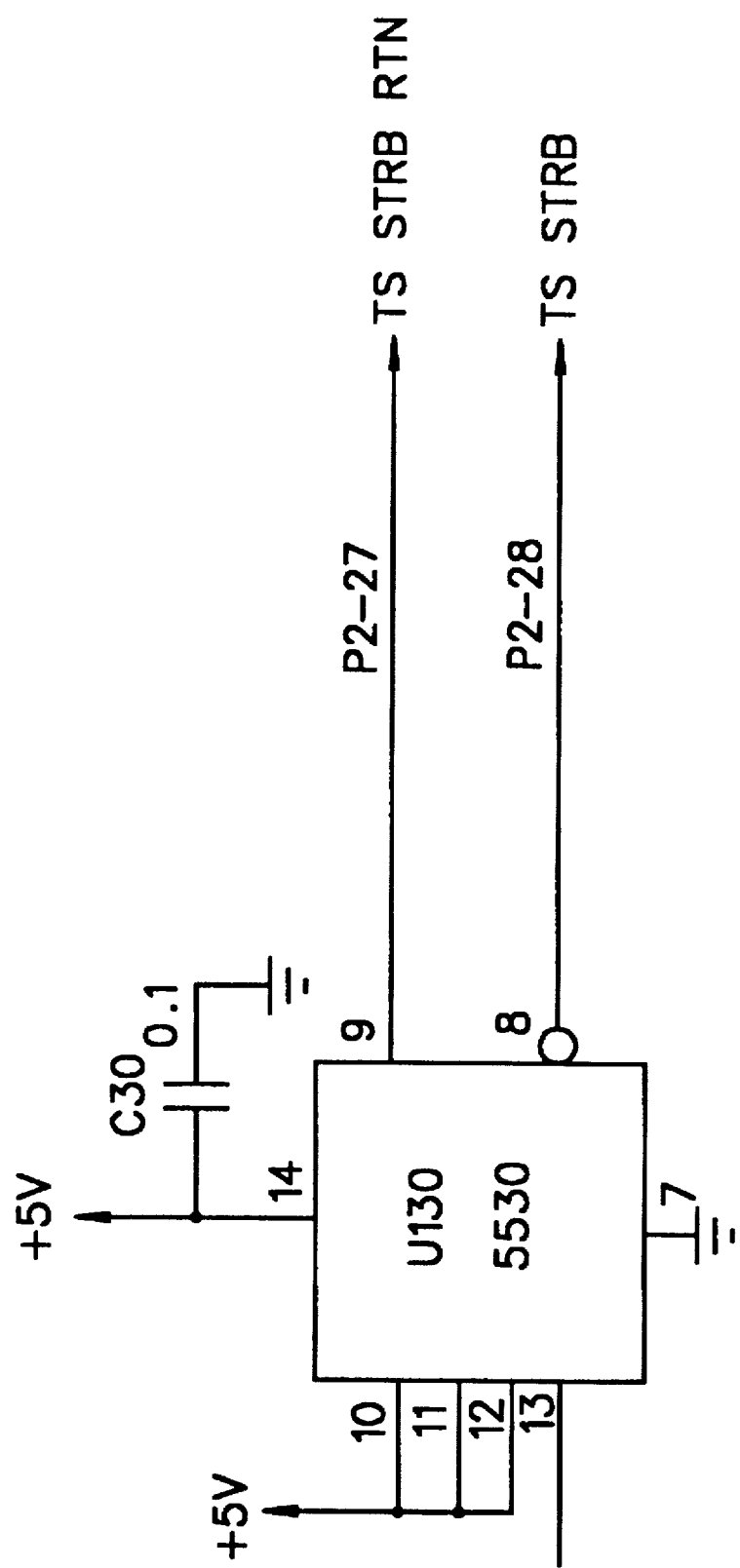
Figure 19H:
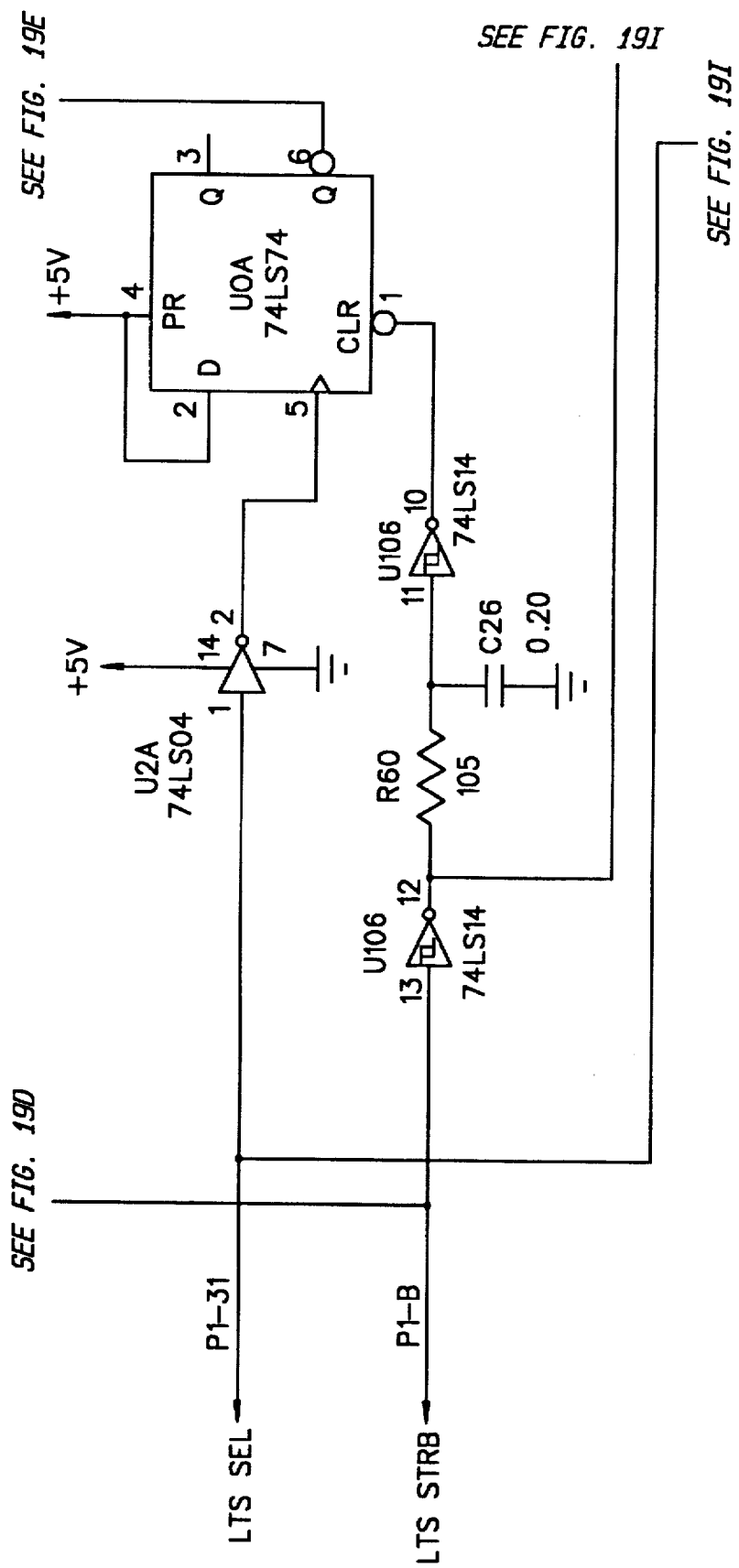
Figure 19I:
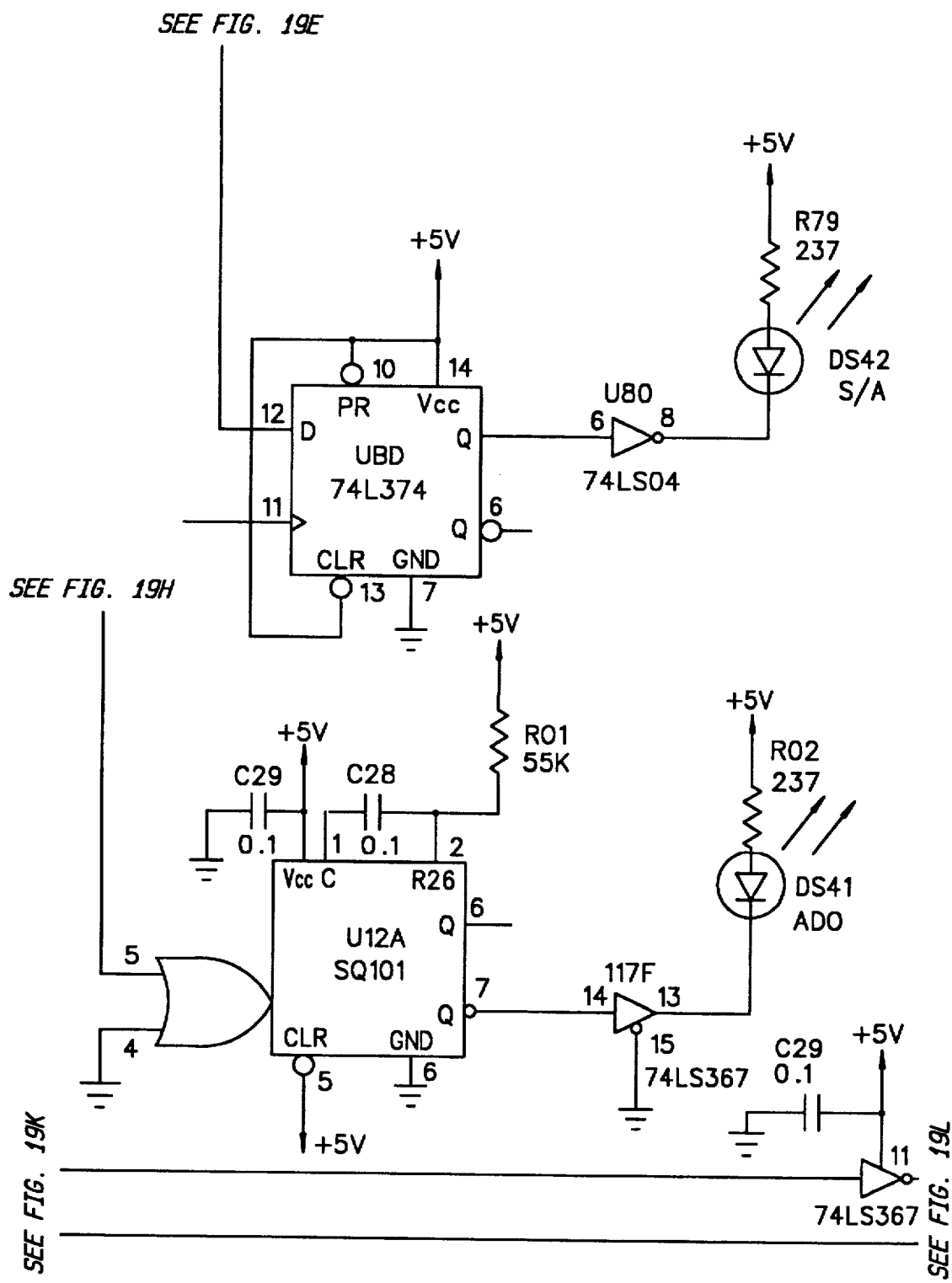
Figure 19J:
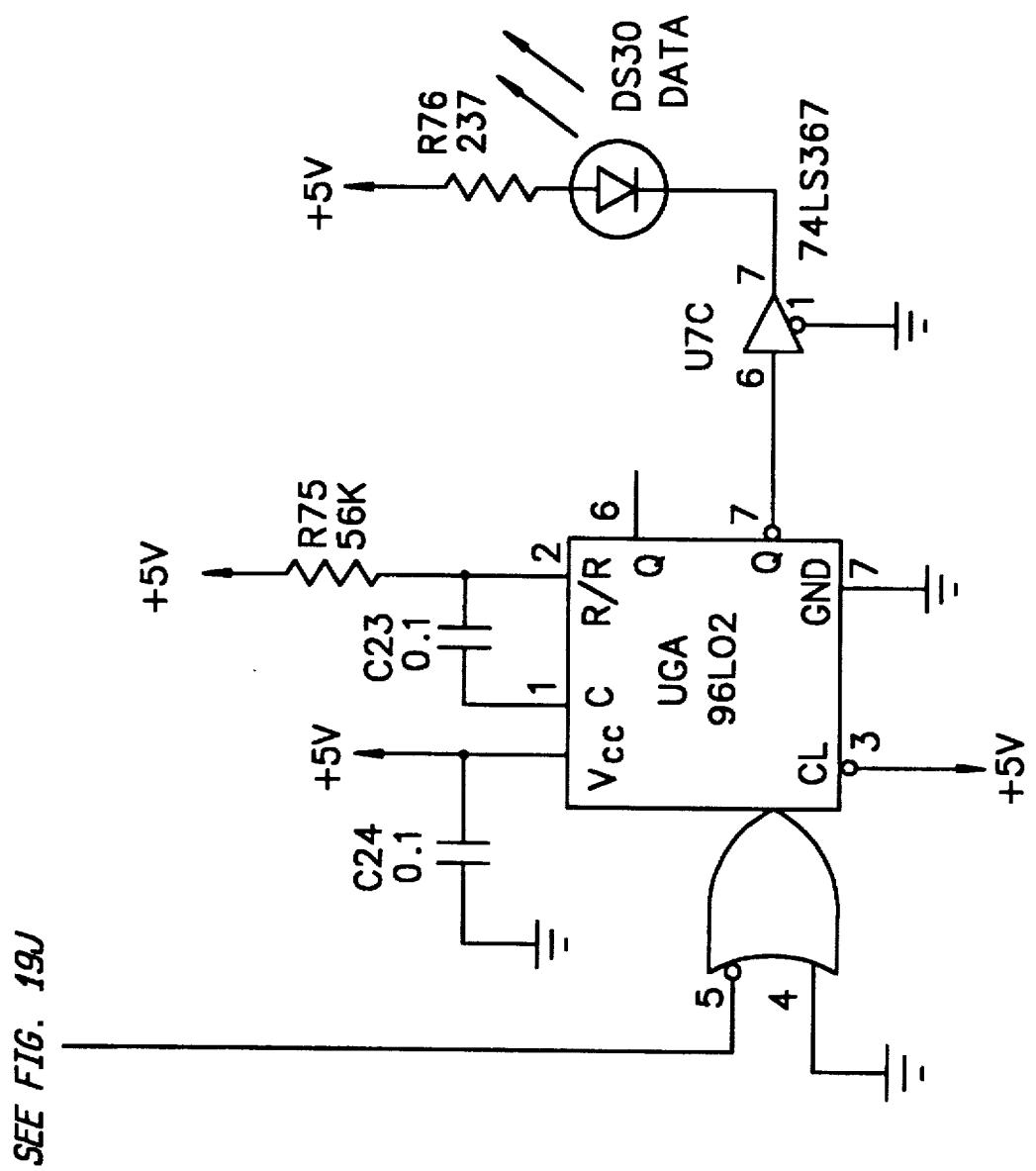
Figure 19K:
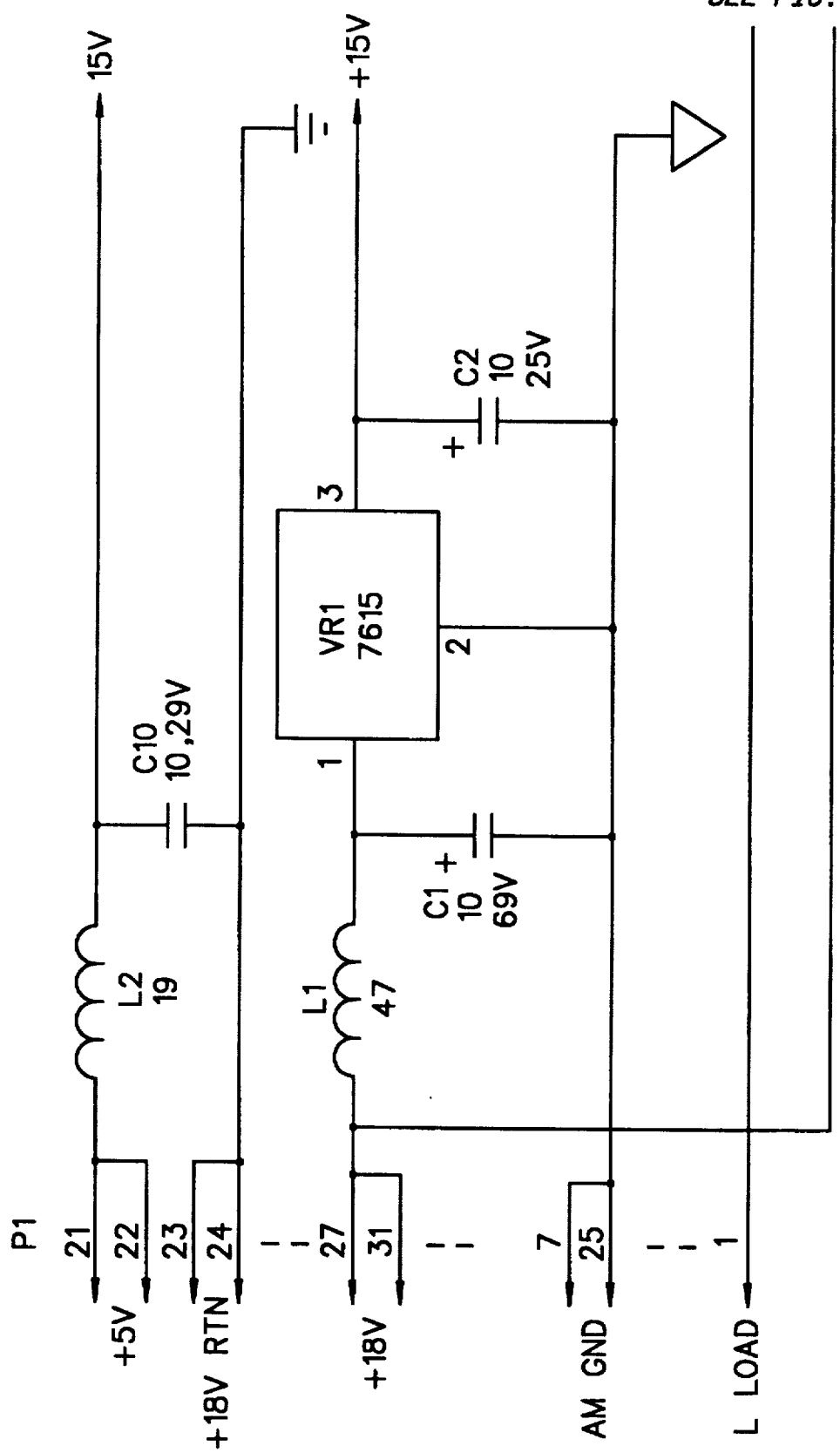
Figure 19L:
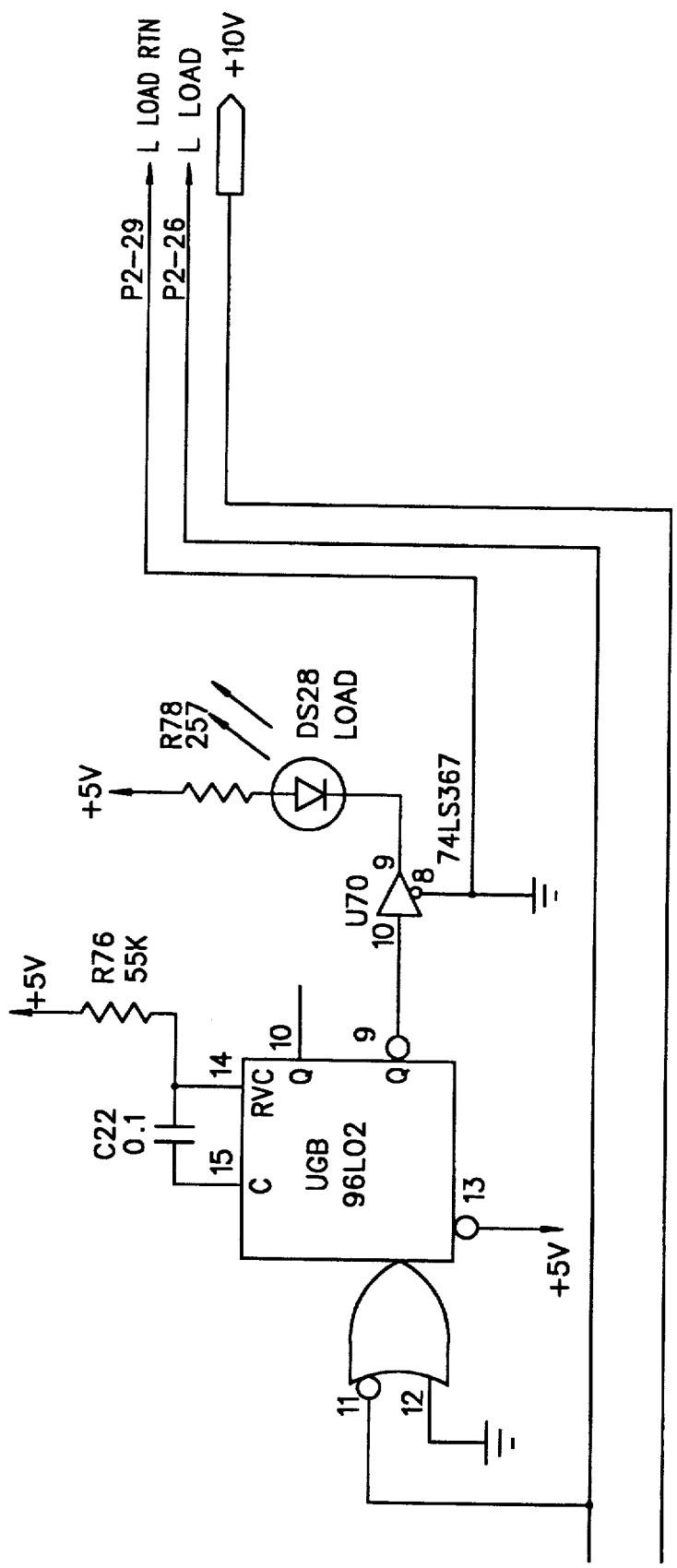
Figure 20A:
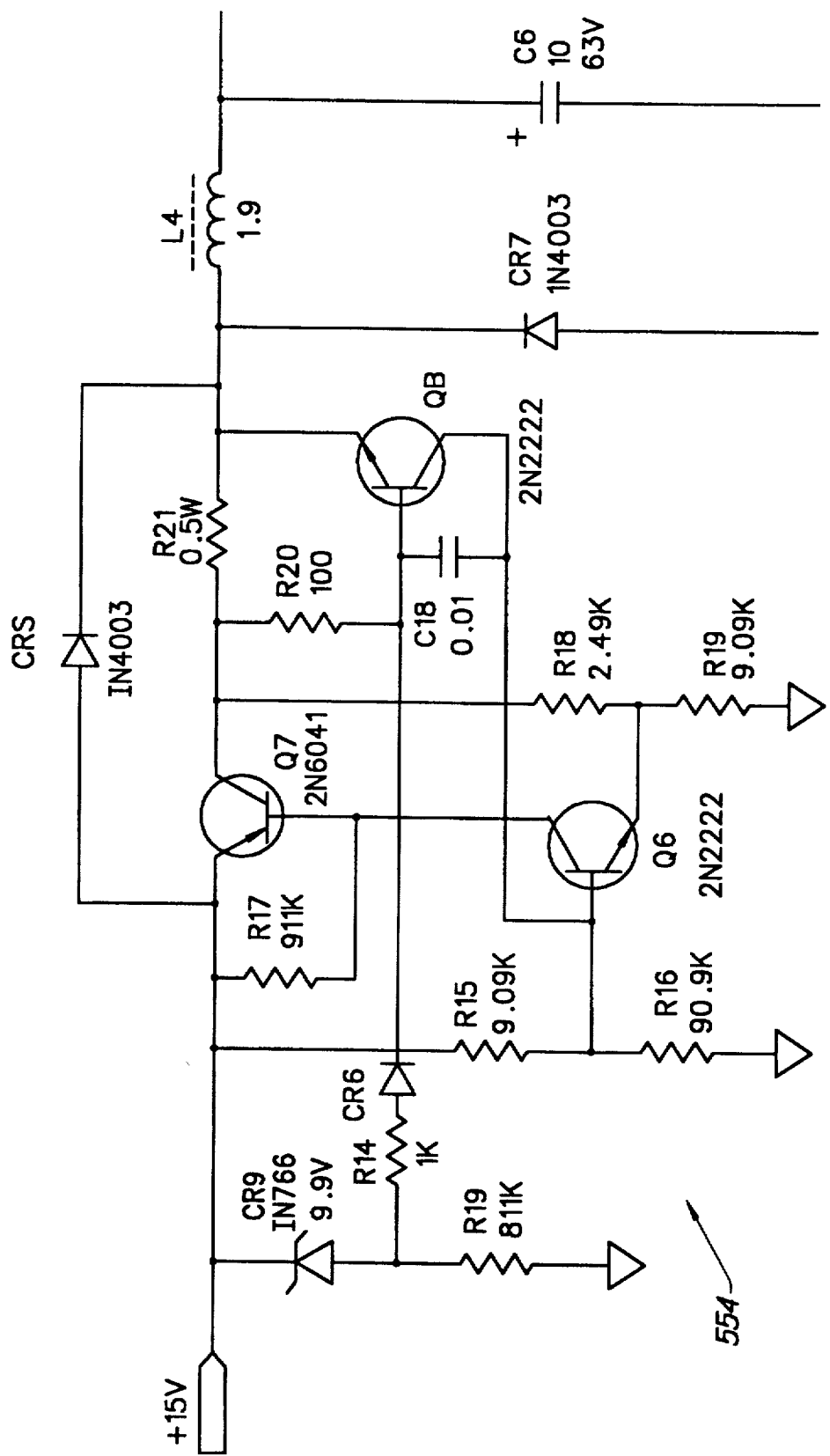
Figure 20B:
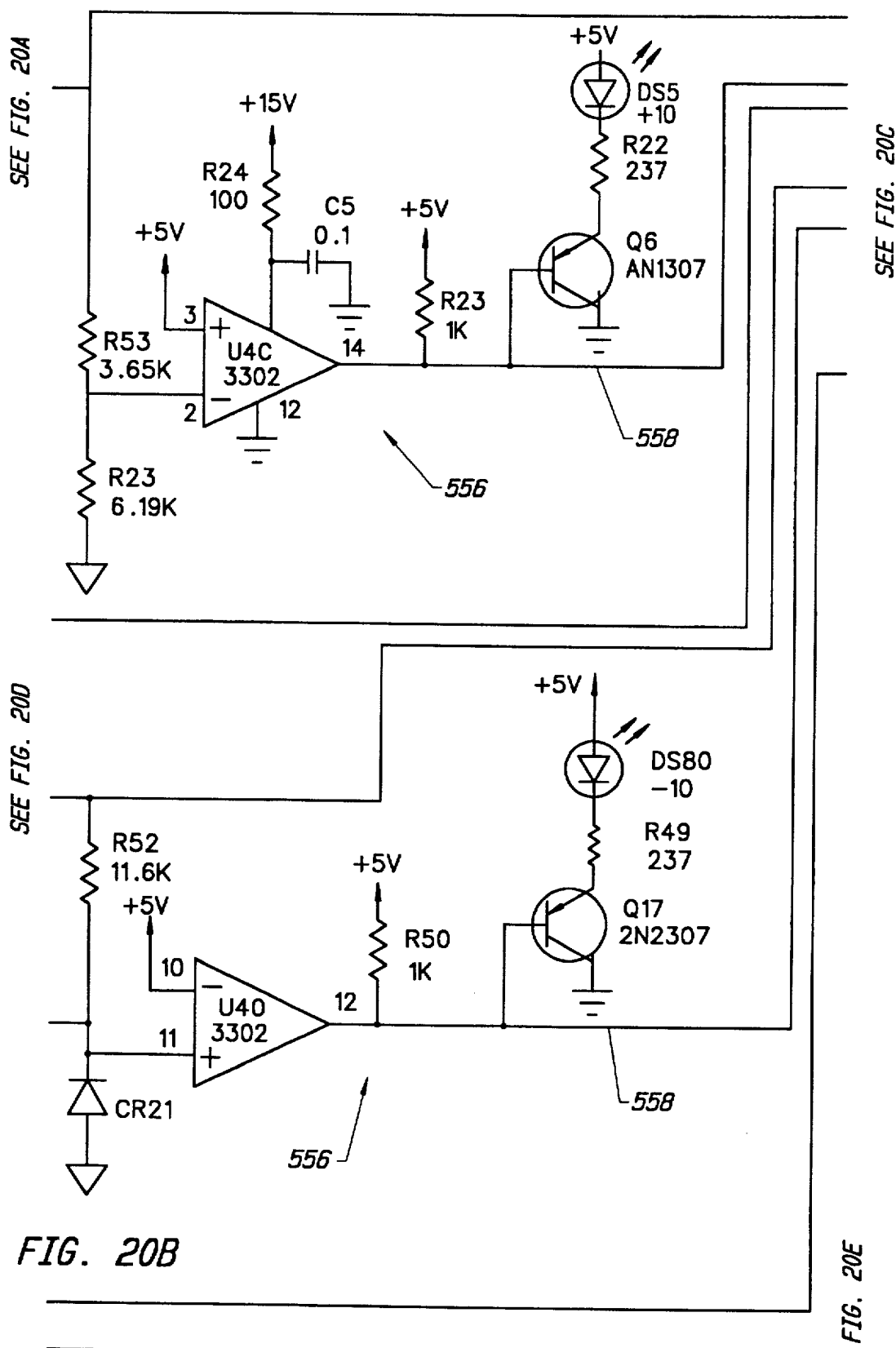
Figure 20C:
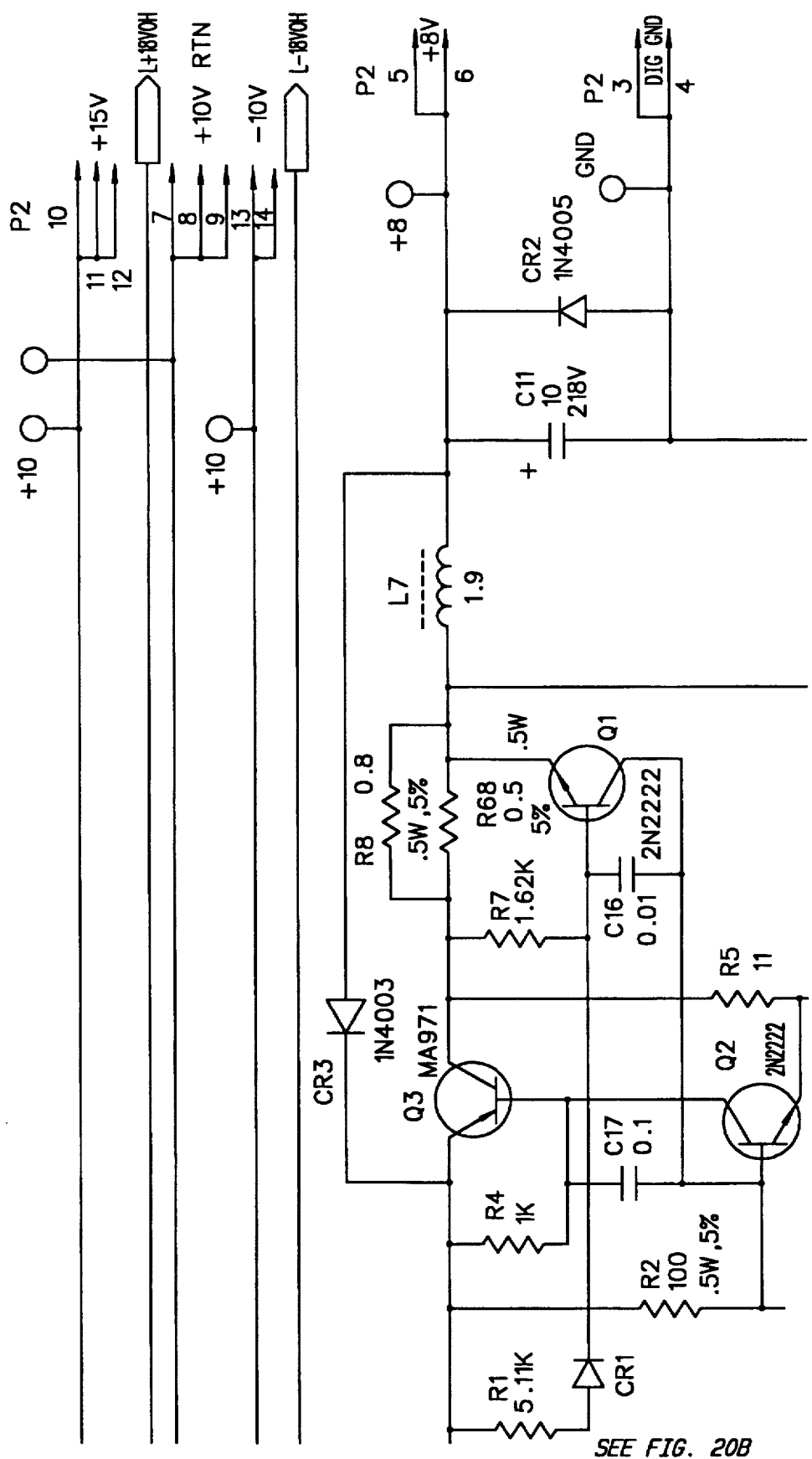
Figure 20D:
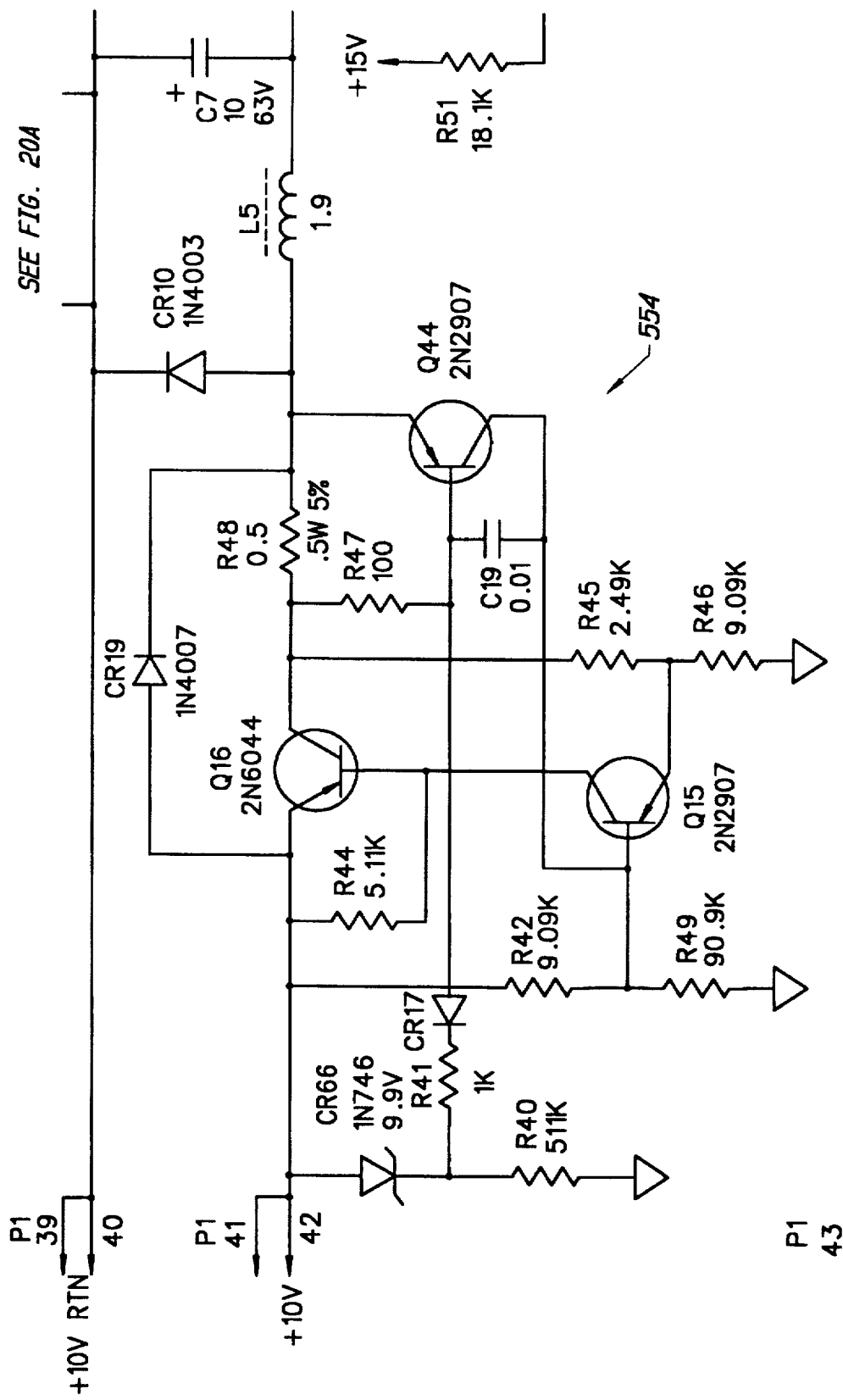
Figure 20E:
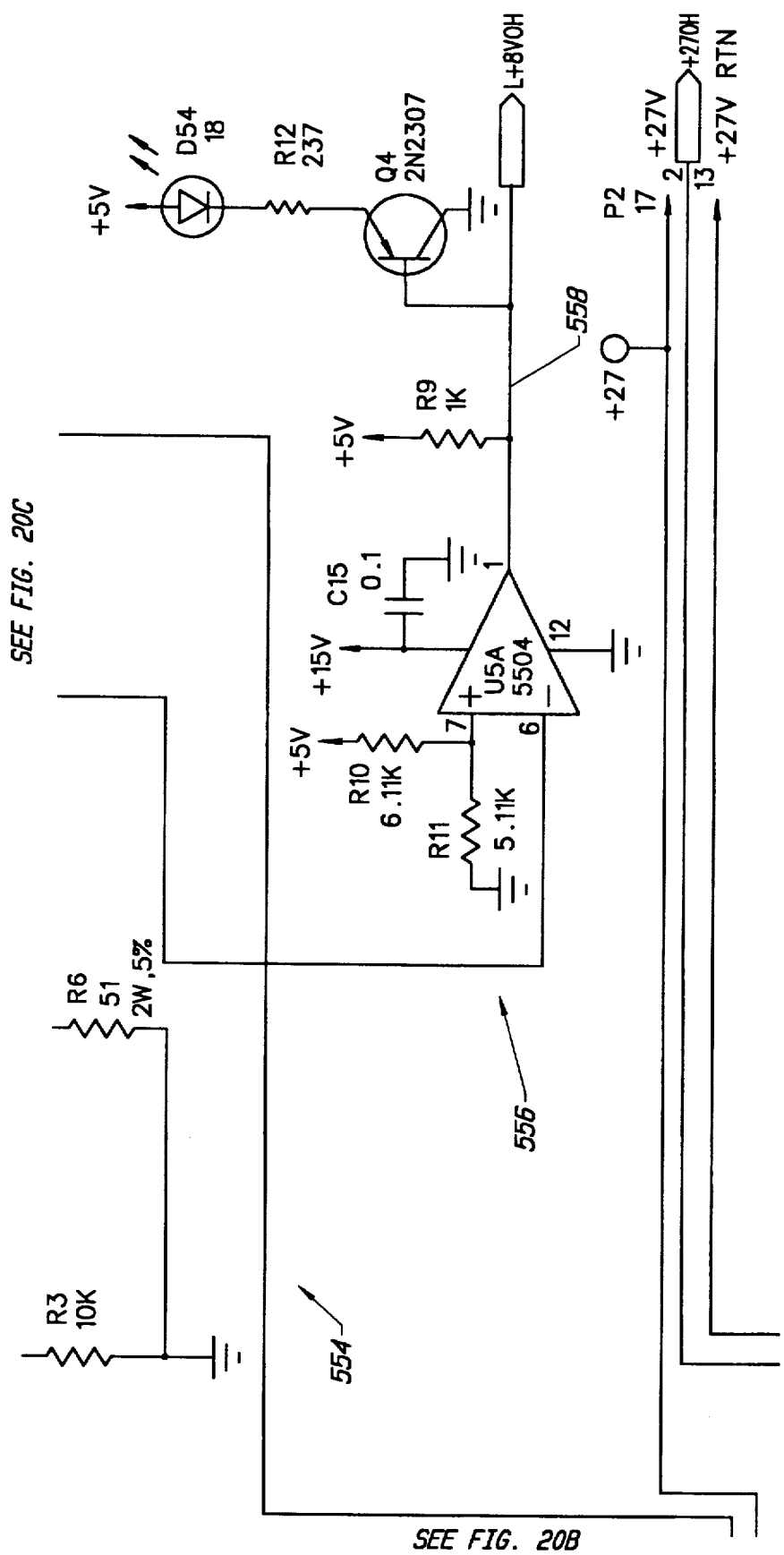
Figure 20F:
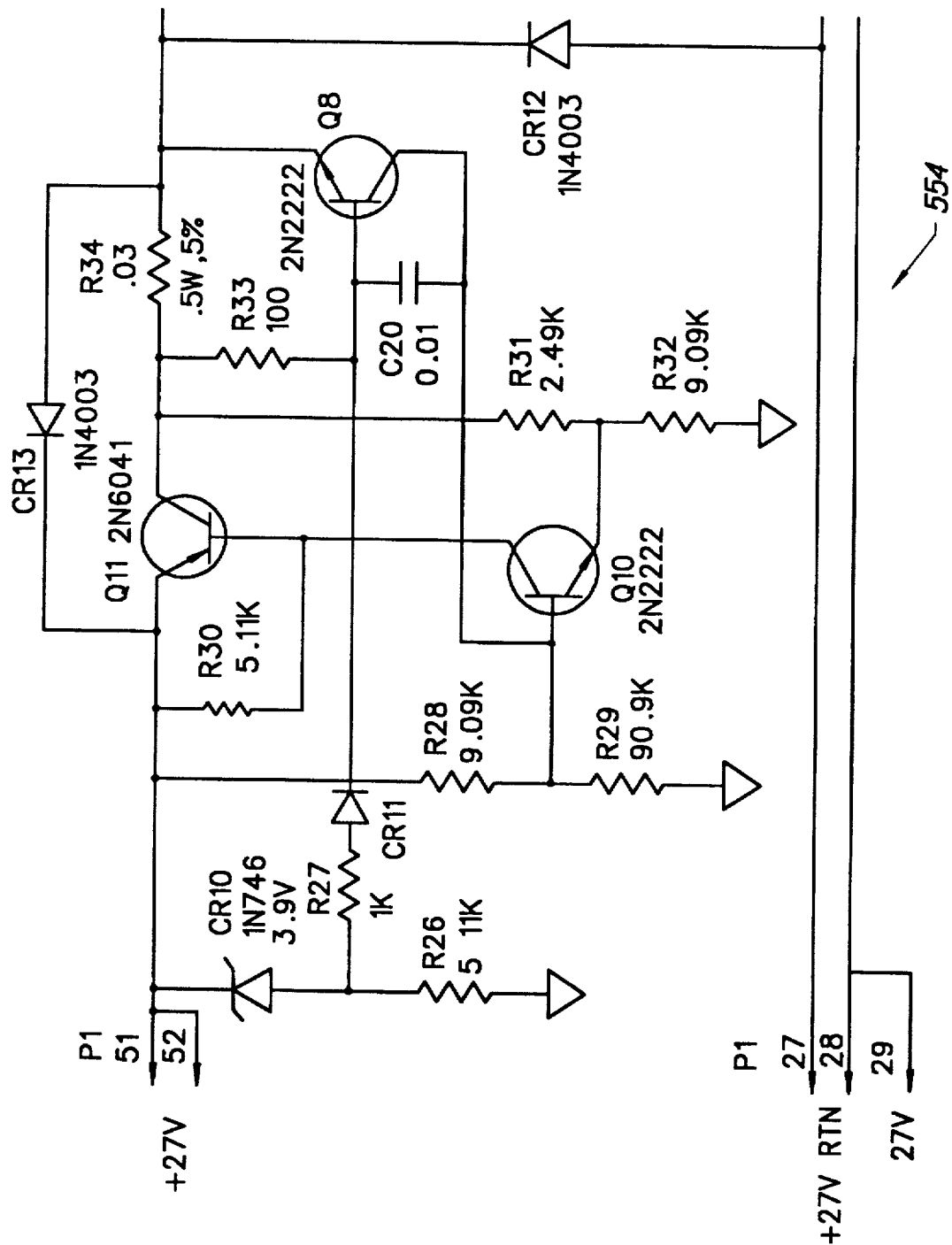
Figure 20H:
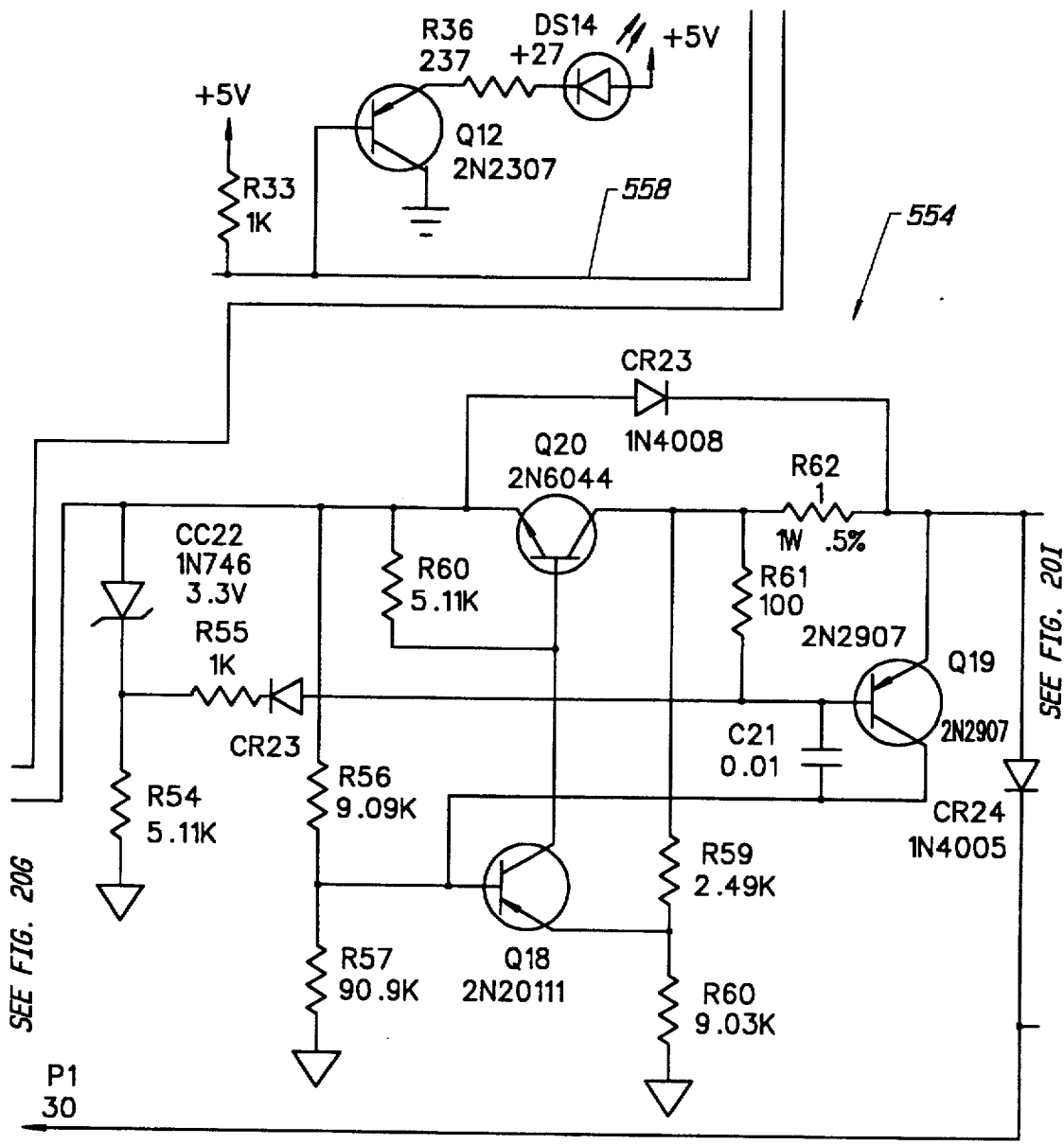
Figure 20I:
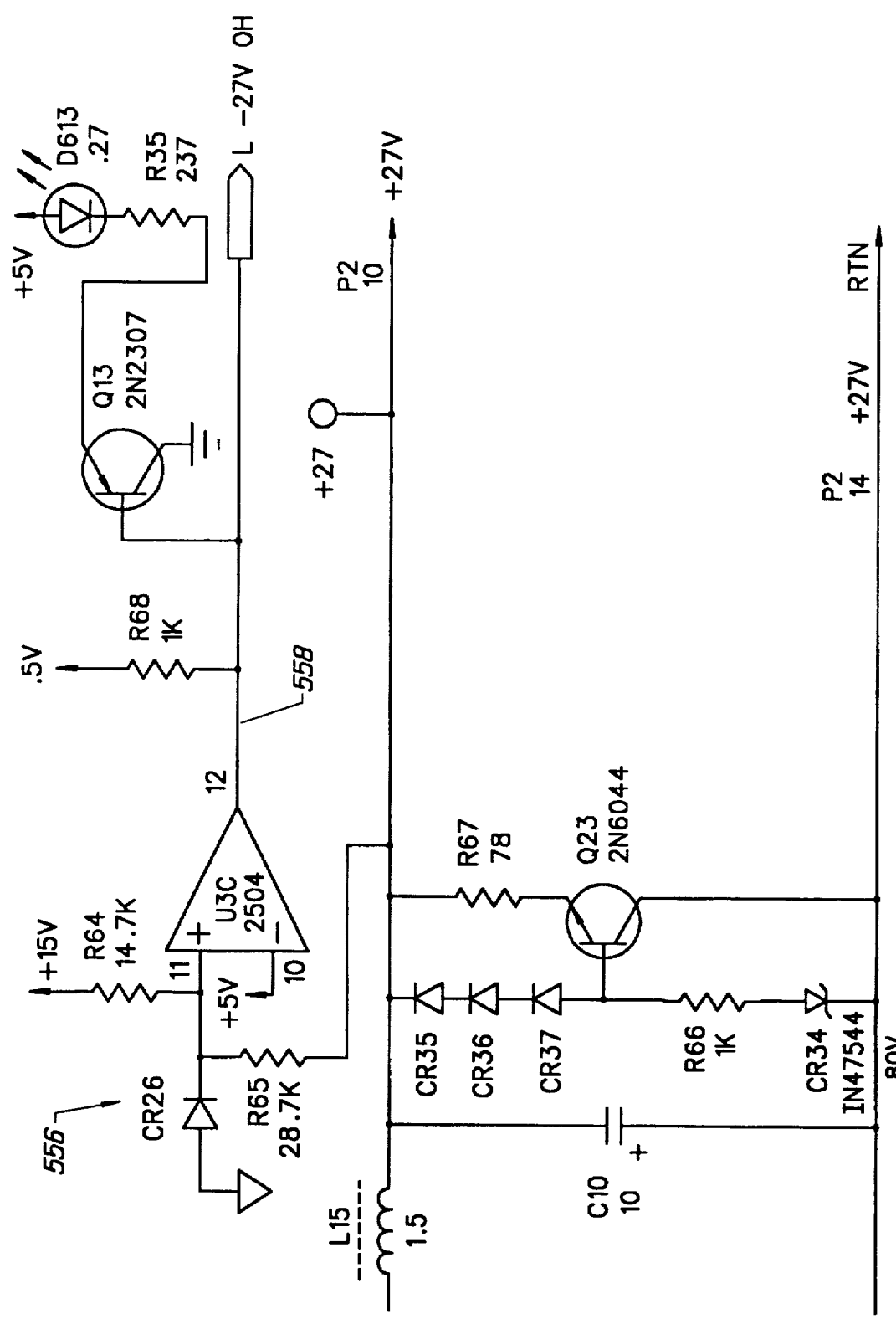

The algorithm illustrated in FIG. 18 interactively performs a check for combinations of harmonics of $F_{LO1}$ and $F_{LO2}$ that cause a spur, and adjusts the frequencies of the first and second local oscillators 122 and 124 to remove the spurs. The algorithm is employed to correct for spurs for each discrete stimulus signal frequency point selected by the user. It will be noted that the frequency range of the first local oscillator 122 is approximately 357–536.5 Mhz, and the frequency range of the second local oscillator 124 is approximately 91.65 ±1.875 MHz (harmonic mode).

Figure 21:
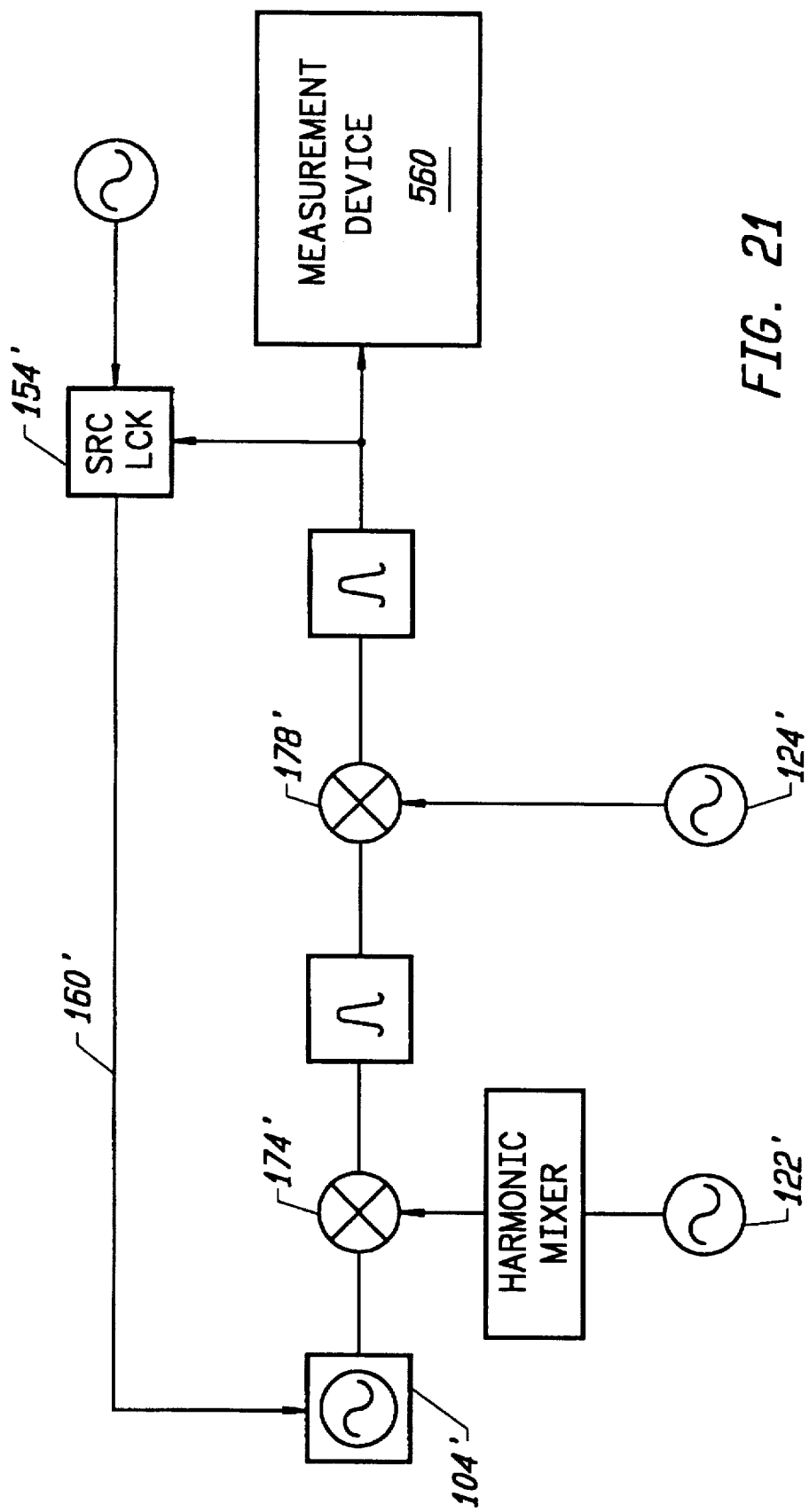
FIG. 21 provides a timing diagram illustrating the processor pipeline timing of the system of FIG. 1 for three sequential stimulus signal frequencies: $F_{N-1}$, $F_N$ and $F_{N+1}$.

FIG. 21 provides a timing diagram illustrating the processor pipeline timing of the system 100 of the presently preferred embodiment for three sequential stimulus signal frequencies: $F_{N-1}$, $F_N$ and $F_{N+1}$. The operation of the processor pipeline is explained in relation to stimulus signal frequency $F_N$.

During time periods $T_1$–$T_7$, the I/O processor 190-1 measures the Real and Imaginary signals provided by the synchronous detectors 130. Table 4 explains details of the measurement process for each time period.

TABLE 4

| Time | Measurement Activity |
|---|---|
| $T_1$ | Gain and Phase Ranging |
| $T_2$ | Delay Due to Settling Time of Filters 396, 452, 454 |
| $T_3$ | Initialization of ADC 150 |
| $T_4$ | Sample and Hold |
| $T_5$ | Analog-to-Digital Conversion and correction for errors in ADC 150 |
| $T_6$ | Send Signal Source 104 to $F_{N+1}$ |
| $T_7$ | Format Measurement Data for $F_N$ in Floating Point |

TABLE 4-continued

| Time | Measurement Activity |
| --- | --- |
| | Format for Transfer to Main Processor 190-2A on FIFO 528 |

During time periods $T_8$–$T_{10}$, the first main processor 190-2A and the first math co-processor 190-2B correct the measured data for stimulus frequency $F_N$ to remove system-induced errors. Table 5 explains details of the correction process for each time period.

TABLE 5

| Time | Measurement Activity |
| --- | --- |
| $T_8$ | Remove the Effects of Gain and Phase Ranging |
| $T_9$ | 12-Term Error Correction (or Subset of 12-Term Error Correction) |
| $T_{10}$ | Send Corrected Measurement Data for $F_N$ to the Second Main Processor 190-3A |

During time periods $T_{11}$–$T_{12}$, the second main processor 190-3A and the second math co-processor 190-3B display the measurement data for $F_N$. Table 6 explains details of the display process for time periods $T_{11}$–$T_{12}$.

TABLE 6

| Time | Measurement Activity |
| --- | --- |
| $T_{11}$ | Convert the Measurement Data for $F_N$ to a Coordinate Graph Type (Dependent Upon Graph Type Selected by User) |
| $T_{12}$ | Display coordinate Graph of Measurement Data on RGB Monitor 548 |

The following equations represent the uncorrected S-parameters. The processors 190-1, 190-2A–190-2B and 190-3A–190-3B cooperate to calculate these parameters in accordance with these equations to correct for system errors and to display the S-parameters as described above.

$$S_{21}\ Mag = \frac{(t_2Real)^2 + (t_2Imag)^2}{(r_1Real)^2 + (r_1Imag)^2} \quad (26)$$

$$S_{21}\ \phi = TAN^{-1}\frac{t_2Imag}{t_2Real} - TAN^{-1}\frac{r_1Imag}{r_1Real} \quad (27)$$

$$S_{11}\ Mag = \frac{(t_1Re)^2 + (t_1Im)^2}{(r_1Re)^2 + (r_1Im)^2} \quad (28)$$

$$S_{11}\ \phi = TAN^{-1}\frac{t_1Im}{t_1Re} - TAN^{-1}\frac{r_1Im}{r_1Re} \quad (29)$$

$$S_{12}\ Mag = \frac{(t_1Re)^2 + (t_1Im)^2}{(r_2Re)^2 + (r_2Im)^2} \quad (30)$$

$$S_{12}\ \phi = TAN^{-1}\frac{t_1Im}{t_1Re} - TAN^{-1}\frac{r_2Im}{r_2Re} \quad (31)$$

$$S_{22}\ Mag = \frac{(t_2Re)^2 + (t_2Im)^2}{(r_2Re)^2 + (r_2Im)^2} \quad (32)$$

$$S_{22}\ \phi = TAN^{-1}\frac{t_2Im}{t_2Re} - TAN^{-1}\frac{r_2Im}{r_2Re} \quad (33)$$

Details of Ports I and II are described as follows. The connector system illustrated in the drawings is particularly adapted for carrying signals above 20 Ghz and even as high as 46 Ghz, but is not, of course, limited in its utility to such high frequency operation. But at the higher frequencies, challenges exist because of the small size of the microwave components with which the connectors must interface. Further, the coaxial connectors themselves are necessarily very small in order to inhibit unwanted higher order modes when carrying such high frequency signals. The smaller connectors are thus generally more fragile and susceptible to damage. Further, their manufacture within the mechanical tolerances required for satisfactory electrical operation places additional constraints on the configuration and the methods of manufacture.

The connector system illustrated in the drawings satisfies these requirements. A microwave component 711 carries a microwave device 713 within a housing 715. The device 713 can be, for example, a microstrip, coplanar waveguide, or suspended substrate. A launcher 717 is provided as the first external element to the microwave device 711 for providing a coaxial connector for the device. The launcher 717 is threaded into the housing 15. A third piece of the connector system illustrated in the drawings is a connector 719 which terminates one end of a coaxial cable 721. The illustrated connector system electrically connects a signal from the microwave device 713 to the outside world through a center conductor 723 of the coaxial cable 721.

Details of each of the three primary components of the connector system will now be described. The first element shown in FIGS. 23 and 24 in connecting the microwave device 713 to the outside world is the connection of a conductor 725 thereto by a quantity of solder 727. The conductor 725 is held within a cylindrically shaped glass bead 729 having an outer cylindrical metal layer 731. The glass bead assembly 729 is held in the metal housing 715 by a quantity of solder 733 that is allowed to flow around the glass bead, thereby providing a secure hermetic seal and electrical connection. The opening in the housing wall is stepped so that a smaller opening portion 737 is provided for passage of the conductor 725 without contacting it. This stepped structure is designed to maintain a uniform impedance along the signal path.

In order to compensate for fringing capacitances that result from the stepped structure, an interface compensation gap 739 is provided between an end of the microwave device 713 and the vertical wall of the housing 715 that carries the bead 729. Additionally, the length of the conductor 725 from that wall to its end in contact with the microwave device 713 is carefully controlled. Further, another compensation gap 741 between the housing wall and the glass bead 729 is provided. The gaps 739 and 741 introduce a series inductance into the signal path that compensates for undesired fringing capacitances resulting from the diameter steps of the system.

A miniscus 743 surrounds the center conductor 725 on one side of the glass bead 729, as a result of the manufacturing process. In order to form a clean wall at the end of a cavity 745 in the housing 715, the bead 729 is oriented so that the miniscus 743 is positioned toward the microwave device 713, as best shown in FIG. 24. Prior connectors, because of the equipment used in installing the conductor 725 in the glass bead 729, place the miniscus on the side of the glass bead of the longest extending length of its inner conductor. The geometry of the fixtures holding the conductor in the glass bead while the glass was heated to melt it for insertion of the conductor resulted in this occurring. The present structure, however, is a result of assembling the conductor 725 through the glass bead 729 in a manner that the miniscus is always on the short pin side of the resulting structure. The result is to eliminate the miniscus from possible interference with fingers forming a female connector 747 at an end of a conductor pin 749 within the launcher 717. Damage to these fingers is avoided, and the fingers may be pushed onto the conductor 725 much closer to the bead 729. These are desirable features in a small, high frequency connector system.

As best illustrated in FIG. 25, the launcher 717 includes an outer, cylindrically shaped threaded housing 751. Alternative methods of attaching a launcher to the component 711 are certainly possible, such as by forming a flange on the launcher that is attached to a flat outer surface of the component, the threaded attachment illustrated herein being exemplary. At one end of the housing, a cylindrically shaped insert 753 snugly and precisely fits. A ledge 755 is formed internal of the housing 751 by a change of diameter of its inner opening between the portion in which the insert 753 exists and a smaller diameter portion 757. At another end of the housing 751 is yet another enlarged diameter opening 759, forming a ledge 761 between it and the interior, smaller diameter opening 757.

The conductor pin 749 is held in the center of the opening 757, thereby to form a very short coaxial transmission path having an air dielectric. The pin 749 is so held by a solid dielectric disc 763 having an outer diameter slightly larger than that of the opening 757 but smaller than that of the opening in the housing 751 in which the insert 753 is placed. An opening is provided at one end of the insert 753 for snugly receiving the dielectric disc 763. Therefore, the insert 753 causes the disc 763 to be urged tightly against the ledge 755 of the housing 751 to hold its attached center conductor pin 749 firmly in place. The insert 753 is so held by a wall of the microwave device 711 when the launcher is fully threaded into the opening 45 of the housing 715, as shown in FIG. 23.

The structure of the launcher 717 has a significant advantage of allowing for tightly controlled tolerance of the compensation steps in the inner conductor 749 and inner surface of the outer conductor formed by the housing 751 and insert 753. By positioning the support bead 763 in the insert 753, thereby allowing the insert 753 to directly contact the ledge 755 of the housing 751, the tolerances that must necessarily exist in each part do not accumulate as they do in the prior art structures. In prior devices, only the bead 763 contacts the ledge 755, the insert 753 being on an opposite side of the bead 763. It can be seen that this prior structure, therefore, has a wider possible tolerance range since any errors in dimensions of the support bead and the insert can add together to make an even larger dimensional error. However, the structure of the launcher 717 illustrated in the drawings avoids this potential undesirable accumulation of dimensional errors.

The structure of the launcher 717 has another important advantage. Should the connectors at the ends of the pin 749 become damaged, the unitary pin 747 and bead 763 structure can be removed and replaced by first removing the housing 751, and then the insert 753. Easy repair is thus possible without disturbing or damaging the microwave device 713, for it is mechanically protected by the glass bead 729.

Referring to FIGS. 26, 27 and 28, a preferred technique for attaching the insulating bead with the center conductor 749 is shown. Its position along the axial length of the conductor 749 is controlled by the position of a reduced diameter portion 765 having a length equal to the thickness of the support bead 763. An enlarged diameter portion 767 exists between the bead holding slot 765 and a smaller diameter female receptacle 747. The receptacle 747 includes four fingers extended and dimensioned to grip the pin 25 when pushed over it, thereby to form an electrical connection between them. On an opposite side of the recess 765 is an enlarged portion 769.

The bead 763 is initially formed into the desired shape, including a center aperture having a diameter substantially equal to that of the diameter of the slot 765 in the pin 749. Other holes illustrated in the support bead are provided to adjust its effective dielectric constant. The material for the bead 763 should be a thermoplastic having the characteristic of returning to its initial size when cooled after heating and stretching. An example of such a material is PPO brand polyphenylene oxide available from the General Electric Company. Grade EN265 of this material has been found to be satisfactory. The bead 763 is machined from such material to the dimensions desired for the bead when assembled onto the conductor 749. The bead 763 is then heated until softened, its center aperture 771 expanded by mechanical force, and the enlarged opening slid over the portion 767 of the pin 749. The bead 763 is then held over the slot 765 until it has cooled. In the cooling process, it shrinks back to its original shape and the opening 771 of the bead tightly grips the pin portion 765.

This method of attaching a support bead to a center conductor is much simpler and provides a better result than techniques currently used. One such prior technique is to glue the bead on a uniform diameter pin, but this does not provide the same degree of mechanical strength. Another technique is to form the pin in two segments which are threaded together at a reduced diameter slot, the pin being separated into its two components, a bead being slid onto the reduced diameter portion, and the pin reassembled. Not only is this complicated and expensive, but such a screw connection can also cause operational problems. Another technique is to injection mold the bead right onto the center pin, but this is an extremely expensive process and very difficult to accomplish for such small parts as are required for the high frequency connectors being described.

A larger end 773 of the pin 749 is shown in the drawings to be of the female type, having four extended spring fingers. Adapted for mating with this connector is a male pin 775 of the coaxial connector 719. The result of the connections on the microwave component 711 and the use of the launcher 717 provides a signal path from the very small microwave device 713 to a relatively large coaxial female center connector 773. It will be recognized, of course, that a male pin could be substituted for the female receptacle 773 and a mating female receptacle substituted for the pin 775 of a connector component to be connected to it.

Figure 29:
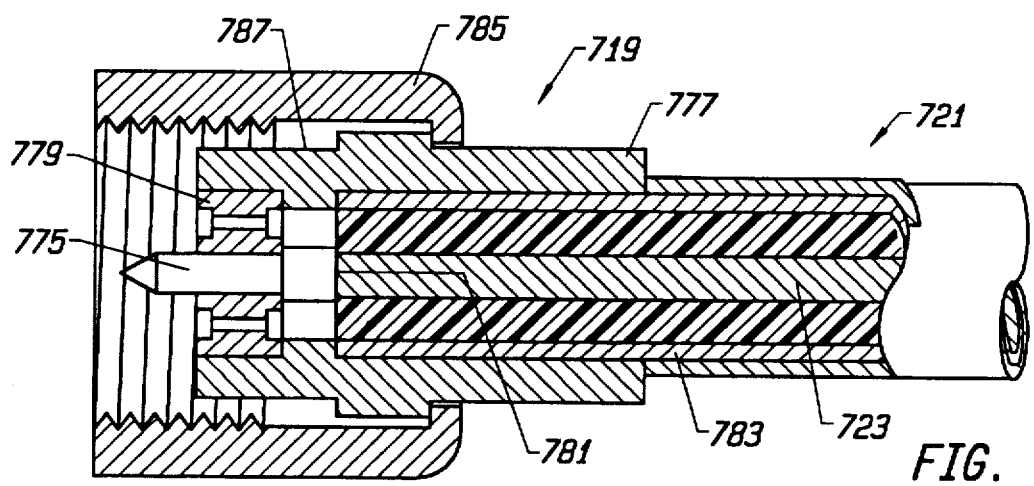

The connector component shown herein for attachment to the launcher 717 is the coaxial connector 719, but it will be understood that other standard connection components could be substituted. Referring to FIG. 29, the pin 775 is mechanically held into a metal outer conductor connector 777 by an insulating support bead 779. The center connector 723 of the coaxial cable 721 is soldered to a backside 781 of the pin 775. An outer conductor 783 of the coaxial cable 721 is mechanically and electrically attached to an inner surface of a cylindrical aperture in an end of the holder 777. A coupling nut 785 is also carried by the connector 777 and has internal threads attached to the threads of the launcher 717.

Figure 30:
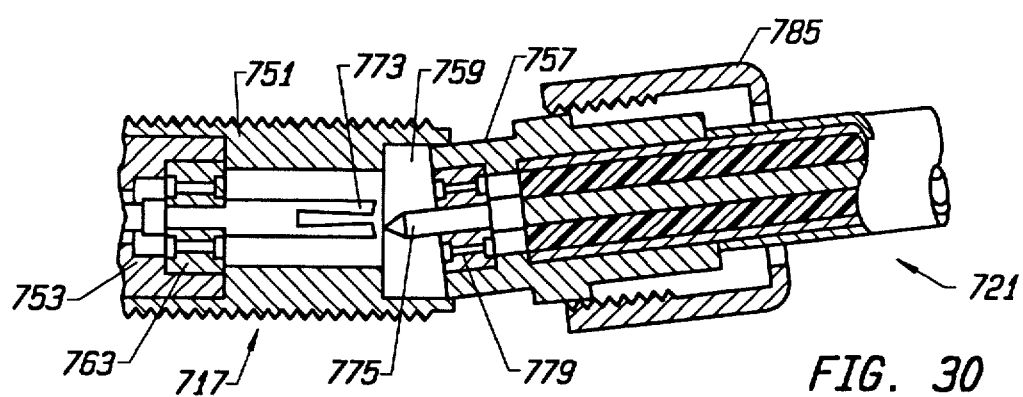
Figure 31:
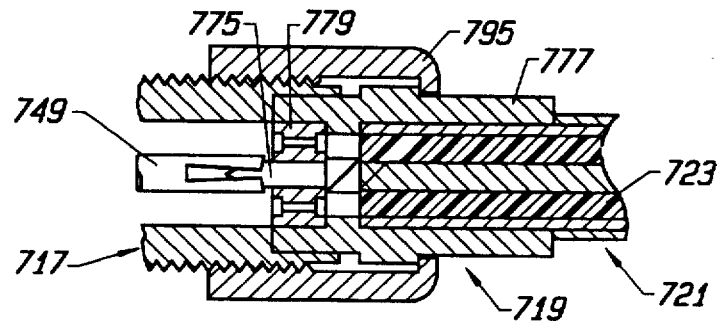

An end 787 of the connector piece 777 at its end of the male pin 775 is cylindrically shaped with a diameter to fit snugly inside the circular recess 759 of the launcher 717. When fully inserted, the pin 775 is inserted into the female connector portion 773, as shown in FIGS. 23 and 31. The attaching parts of the launcher 717 and the coaxial cable connector 719 are cooperatively dimensioned so that the pin 775 does not engage the receptacle 773 until after the connector portions are coaxially aligned. That is, the two inner conductor connector portions do not touch each other until the mating cylindrical portions 759 (launcher 717) and 787 (coaxial, cable connector 719) are aligned. This is accomplished by making the length of the pin 775 that extends beyond the end of the bead 779 be less than the distance from the end of the launcher 717 at the surface 759 to the closest point of the receptacle 773. As can be seen from FIG. 30, if the connector 719 is positioned at an angle with respect to the launcher 717, no damage will be done to the receptacle 773 or the pin 775 since they do not contact until the cable connector piece 777 and the launcher 717 are coaxially aligned. That is, so long as the angular relationship illustrated in FIG. 30 persists, no connection can be made. It is only when the two connector portions are coaxially aligned that they can be pushed together for the inner conductors to engage each other as shown in FIG. 31.

Figure 32:
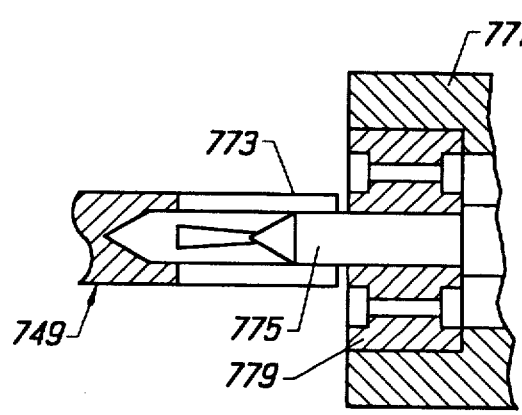

The short pin has a further advantage of eliminating a radio frequency resonance from the frequency band of the connector. This resonance can occur in existing connectors and is particularly a problem as the frequency increases since a resonance condition can be created with very small cavities or irregularities. As shown in FIG. 32, the short pin 775 is contacted only at the entry end of the receptacle 773 by the ends of the four fingers that form the receptacle 773. These fingers are mechanically desirable, but the slots required to form them can result in a small portion of the radio frequency field entering the coaxial section and undesirably resonating. However, with the short pin of the present system, the resonant frequency occurs above the frequency range for which the connector is designed.

Various improvements and modifications can be made to the system 100 of the preferred embodiment without departing from the spirit and scope of the invention. For example, instead of using a source lock in conjunction with an analyzer 108, a source lock can be used in conjunction with various other devices used to extract phase and/or magnitude information from signals.

Figure 22:
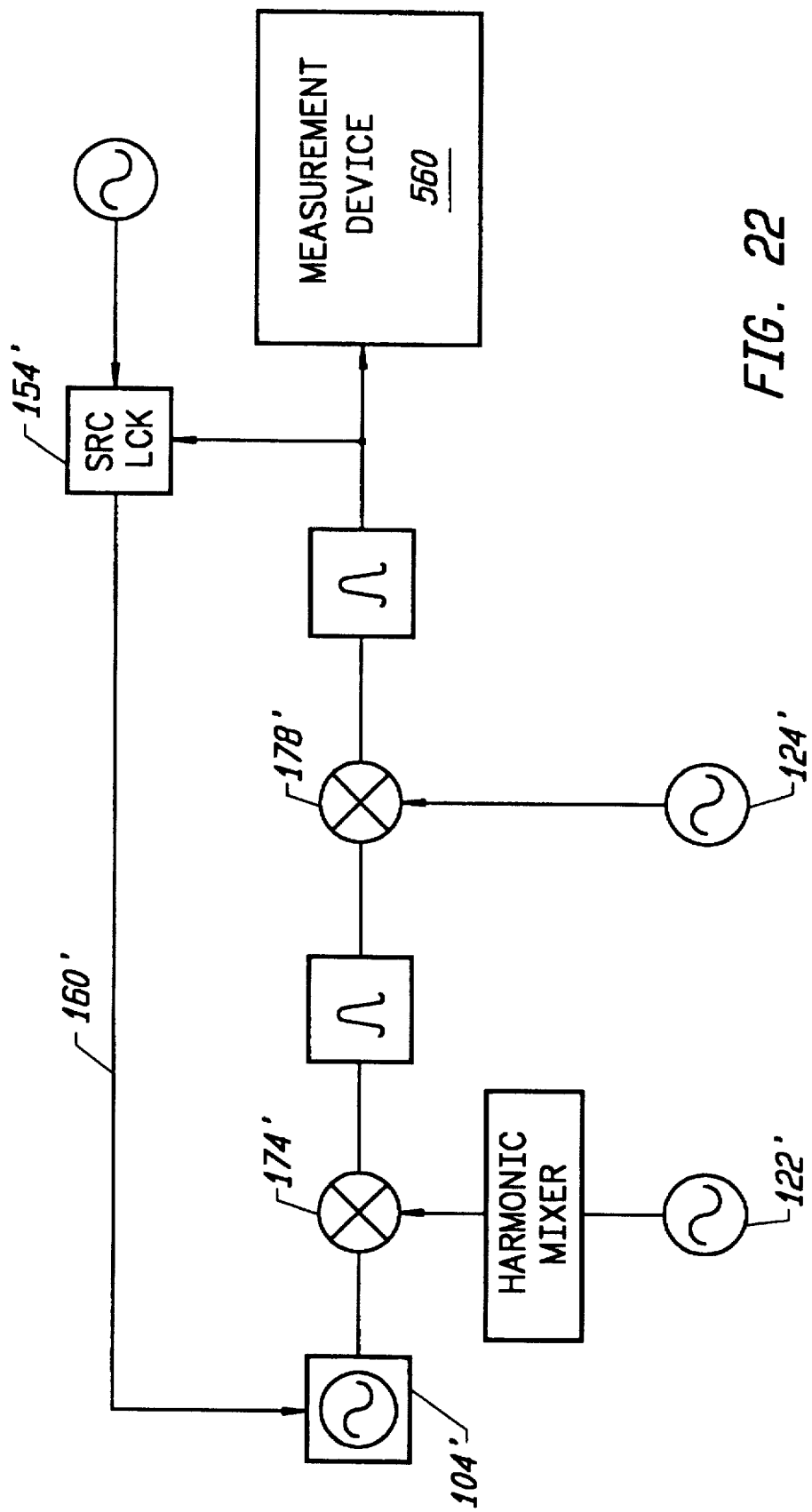
FIG. 22 shows exemplary components of a source locking circuit 154 of FIG. 1.

Referring to FIG. 22 there is shown exemplary components of a source locking circuit. Components which directly correspond to elements described above for the preferred embodiment are labelled with primed reference numerals identical to the reference numerals used to identify the corresponding elements of the system 100.

It will be appreciated that the measurement device identified by reference numeral 560 can be an analyzer such as that disclosed in the system 100. Alternatively, for example, it can be an amplitude detector, a log magnitude detector, a synchronous detector, an oscilloscope, a modulation meter or some other measurement device.

Furthermore, although the source lock components in FIG. 22 include two local oscillators 122' and 124' and two mixers 174' and 178', it will be appreciated that a source lock could be achieved using only a single local oscillator and only a single mixer. The advantage gained by using source locking still would be achieved: accurate stimulus signal frequency without the need to employ a costly synthesizer.

OPERATION OF THE MODEL 360 VECTOR NETWORK ANALYZER

General Description

The Model 360 Vector Network Analyzer System measures the magnitude and phase characteristics of networks, such as filters, amplifiers, attenuators, and antennas. It does so by comparing the incident signal leaving the analyzer with the signal transmitted through the test device or reflected from its input circuit. FIG. 33 illustrates the types of measurements that the 360 is capable of making.

The 360 is a self-contained, fully integrated measurement system that includes an optional time domain capability.

Vector Network Analyzer Basics

Figure 34:
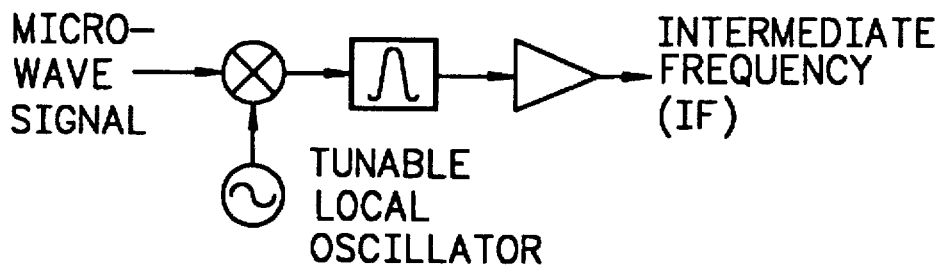
FIG. 34 shows the network analyzer is a tuned receiver.

The network analyzer is a tuned receiver (FIG. 34). The microwave signal is down converted into the passband of the IF. To measure the phase of this signal, we must have a reference to compare it with. If the phase of a signal is 90 degrees, it is 90 degrees different from the reference signal. The network analyzer would read this as −90 degrees, since the test signal is delayed by 90 degrees with respect to the reference signal.

Figure 35:
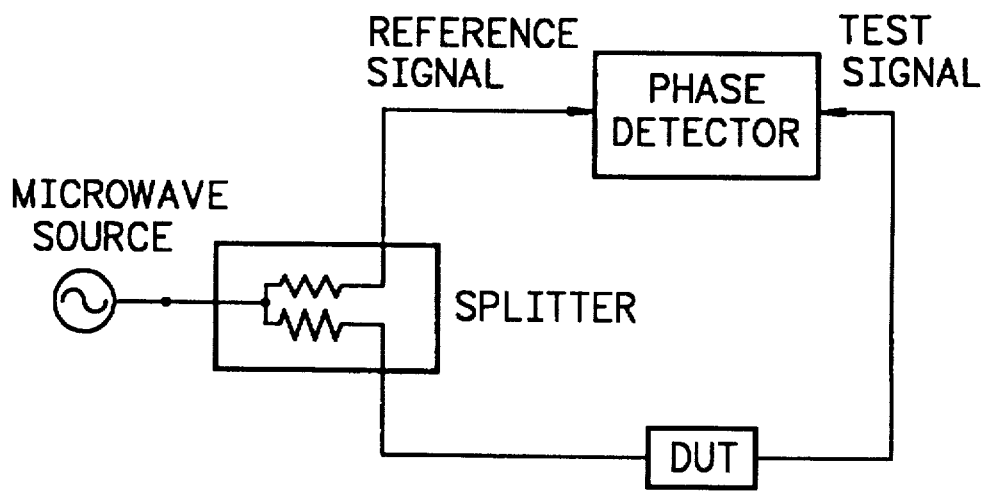
FIG. 35 shows a phase reference can be obtained by splitting the microwave source signal.

This phase reference can be obtained by splitting off some of the microwave signal before the measurement (FIG. 35). The phase of the microwave signal after it has passed through the device under test (DUT) is then compared with the reference signal. A network analyzer test set automatically samples the reference signal, so no external hardware is needed.

Figure 36:
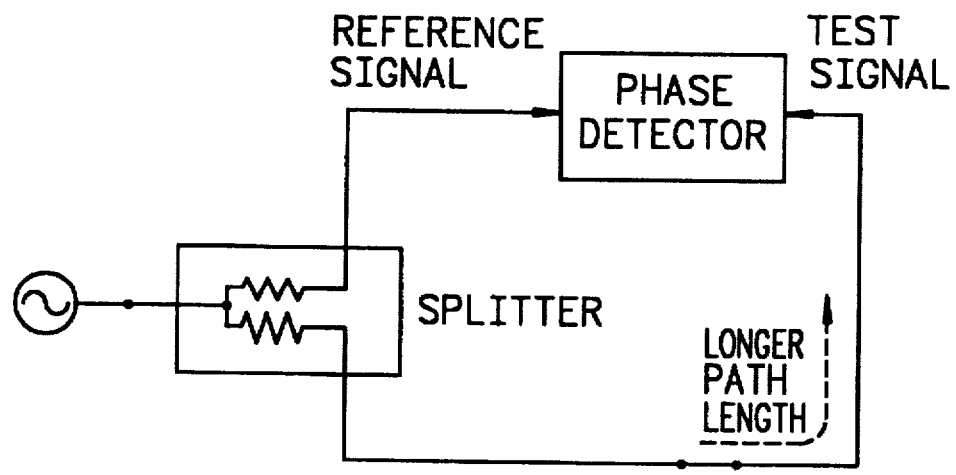
FIG. 36 illustrates phase measurement using a split microwave source signal and replacing a DUT with a length of transmission line.

Let us consider for a moment that you remove the DUT and substitute a length of transmission line (FIG. 36). Note that the path length of the test signal is longer than that of the reference signal. Now let us see how this affects our measurement.

Figure 37:
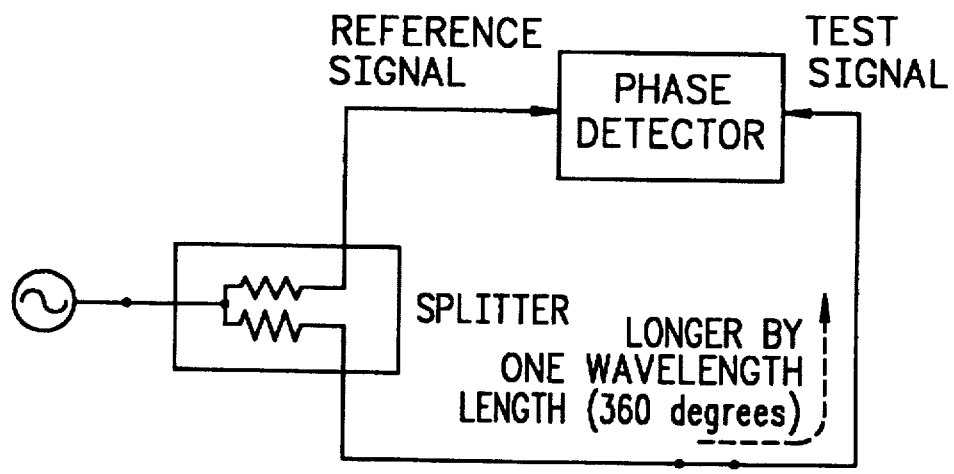
FIG. 37 illustrates a test signal lagging the reference signal by 360 degrees.

Assume that we are making a measurement at 1 Ghz and that the difference in path-length between the two signals is exactly 1 wavelength. This means that test signal is lagging the reference signal by 360 degrees (FIG. 37). We cannot really tell the difference between one sine wave maxima and the next (they are all identical), so the network analyzer would measure a phase difference of 0 degrees.

Figure 38:
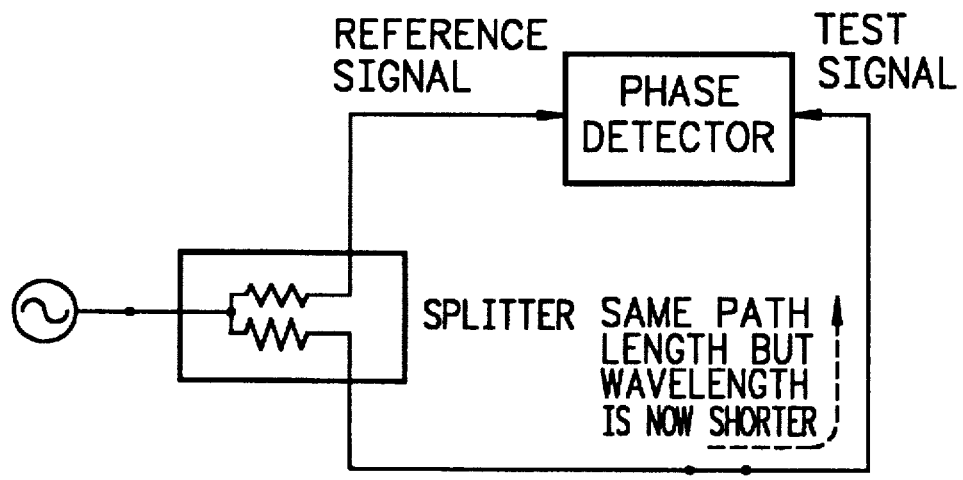
FIG. 38 illustrates a test signal path length 0.1 wavelength longer than that of the reference signal.

Now consider that we make this same measurement at 1.1 Ghz. The frequency is higher by 10 percent so therefore the wavelength is shorter by 10 percent. The test signal path length is now 0.1 wavelength longer than that of the reference signal (FIG. 38). This test signal is $$1.1 \times 360 = 396 \text{ degrees.}$$

This is 36 degrees different from the phase measurement at 1 Ghz. The network analyzer will display this phase difference as −36 degrees. The test signal at 1.1 GHz is delayed by 36 degrees more than the test signal at 1 Ghz.

Figure 39:
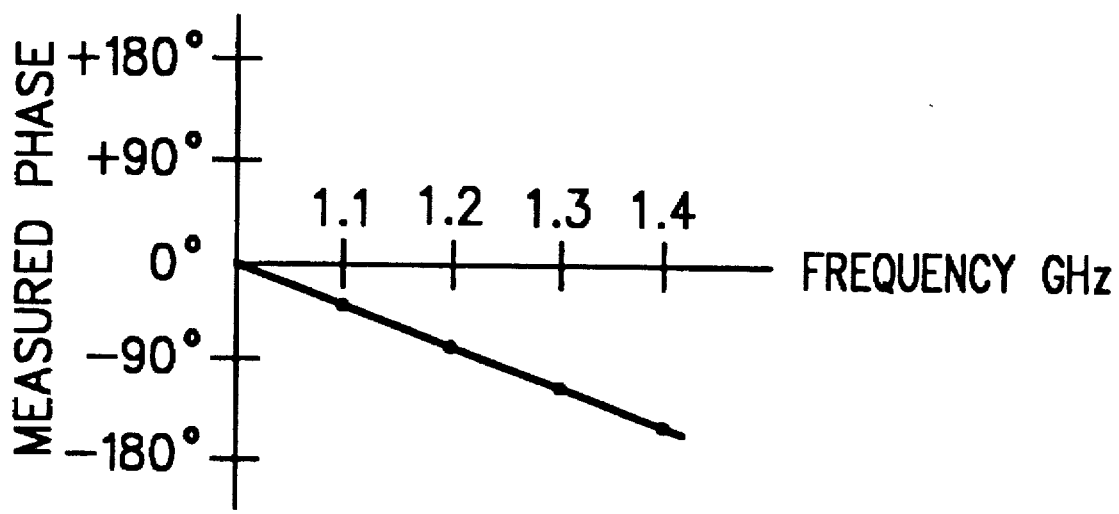
FIG. 39 shows a plot of measured phase vs. frequency due to length differences between a reference and test signal connection.

You can see that if the measurement frequency is 1.2 Ghz we will get a reading of −72 degrees, −108 degrees for 1.3 Ghz, etc. (FIG. 39). There is an electrical delay between the reference and test signals. For this delay we will use the common industry term of reference delay. You may also hear it referred to as phase delay. In older network analyzers you had to equalize the length of the reference arm with that of the test arm in order to make an appropriate measurement of phase vs. frequency.

To measure phase on a DUT, we want to remove this phase-change-vs-frequency-due-to changes in the electrical length. This will allow us to view the actual phase characteristics. These characteristics may be much smaller than the phase-change-due-to-electrical-length difference.

Figure 40:
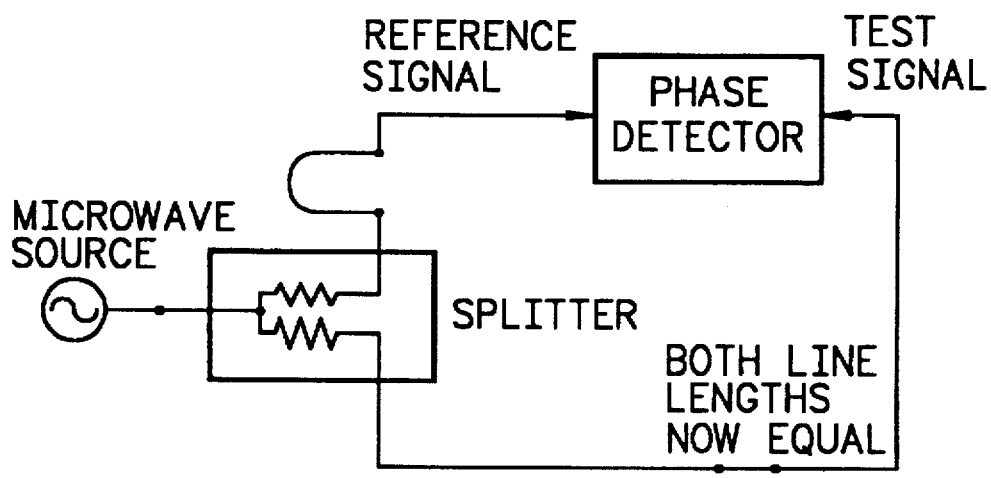
FIG. 40 illustrates insertion of a length of line to make reference and test signal paths equal.

There are two ways of accomplishing this. The most obvious way is to insert a length of line into the reference signal path to make both paths of equal length (FIG. 40). With perfect transmission lines and a perfect splitter, we would then measure a constant phase as we change the frequency. The problem using this approach is that we must change the line length with each measurement setup.

Figure 41:
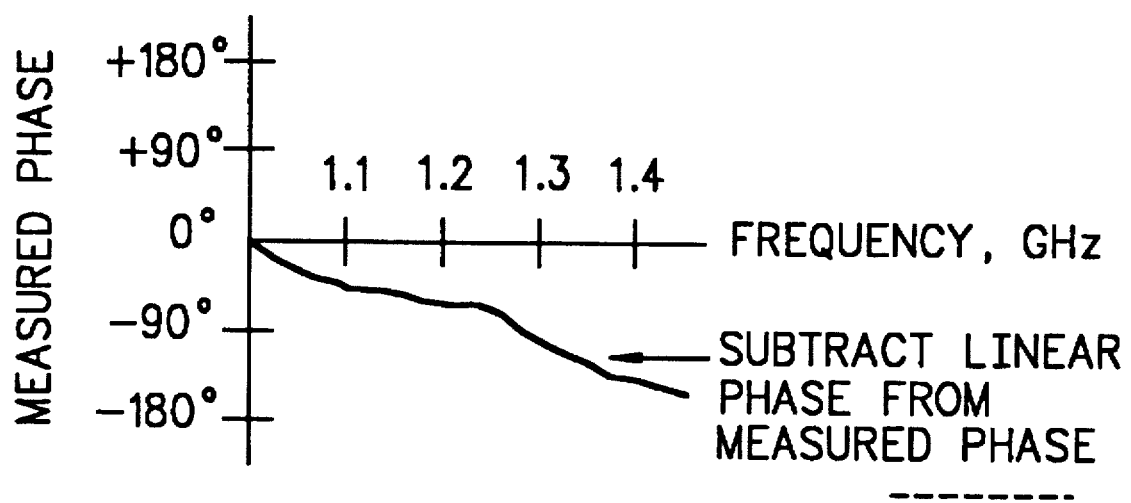
FIG. 41 displays the phase vs. frequency response of a device with a path length difference between reference and test signals.

Another approach is to handle the path length difference in software. FIG. 41 displays the phase-v-frequency of a device. This device has different effects on the output phase at different frequencies. Because of these differences, we do not have a perfectly linear phase response. We can easily detect this phase deviation by compensating for the linear phase. The size of the phase difference increases linearly with frequency so we can modify the phase display to eliminate this delay.

Figure 42:
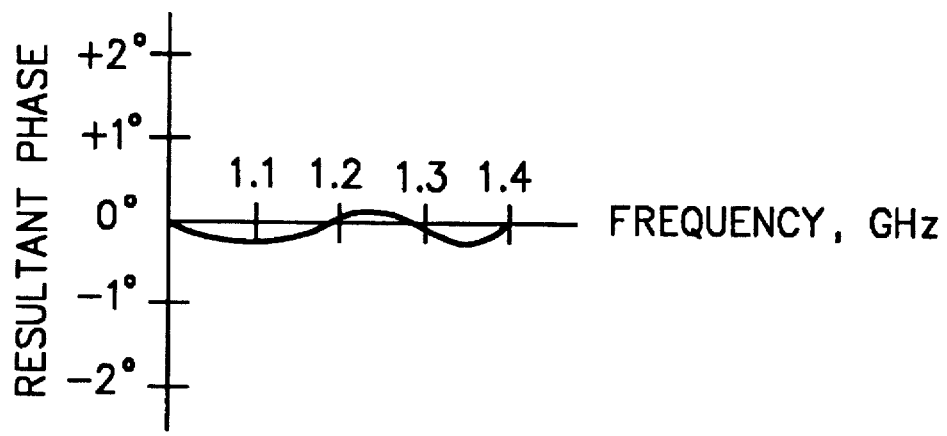
FIG. 42 shows the resultant measurement path length difference between reference and test signals with software compensation.

The 360 offers automatic reference delay compensation with the punch of a button. FIG. 42 shows the resultant measurement when we compensate path length. In a system application you can usually correct for length differences; however, the residual phase characteristics are critical.

The algorithm used to calculate the reference delay required to flatten a phase response sums the phase deltas between adjacent points for the entire sweep. This phase sum is used to calculate a reference delay value that equalizes the phase of the start and stop frequencies.

The algorithm is based on the "average" phase difference between points or the total phase difference between the start and stop frequency:

$$\phi_2 - \phi_1 = \text{phase difference between adjacent points}$$

$$= \frac{-dx}{\lambda_2} \cdot 2\pi - \frac{-dx}{\lambda_1} \cdot 2\pi$$

where dx=extra line length in system.

The value of dx depends upon whether coaxial cable, waveguide or microstrip is the medium for which automatic reference delay is calculated.

Coaxial Cable $$dx = \frac{-C \times \sum_{\text{Start}}^{\text{End}} \Delta\phi}{2\pi \epsilon_r (F_{End} F_{Start})}$$

$$\lambda = \frac{C}{F \epsilon_r}$$

$\epsilon_r$ = Relative dielectric constant of DUT

Wave Guide $$dx = \frac{-C \times \sum_{\text{Start}}^{\text{End}} \Delta\phi}{2\pi \sqrt{F_{End}^2 - F_{co}^2} \sqrt{F_{Start}^2 - F_{co}^2}}$$

$$\lambda_g = \frac{\lambda_o}{\sqrt{1 - \frac{F_{co}^2}{F}}}$$

$F_{co}$ = Waveguide cut-off frequency.

Microstrip $$dx = \frac{-C \times \sum_{\text{Start}}^{\text{End}} \Delta\phi}{2\pi \epsilon_1(F) (F_{End} F_{Start})}$$

$$\lambda = \frac{C}{F \epsilon_1(F)}$$

$\epsilon_1(F)$ = microstrip effective dielectric as a function of frequency.

Network Analyzer Measurements

Now let us consider measuring the DUT. Consider a two port device; that is, a device with a connector on each end. What measurements would be of interest?

Figure 43:
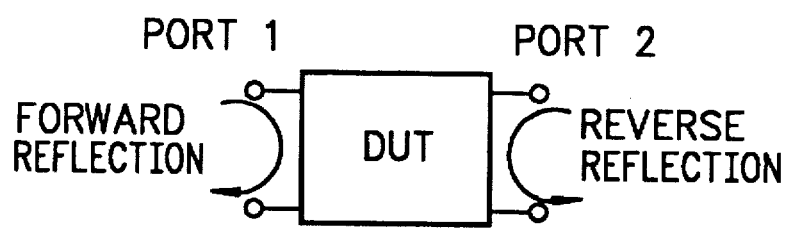
FIG. 43 shows definition of a reference enabling definition of reflection characteristics from forward and reference directions.

First, we could measure the reflection characteristics at either end with the other end terminated into 50 ohms. If we designate one end as the normal place for the input, that gives a reference. We can then define the reflection characteristics from the reference end as forward reflection, and those from the other end as reverse reflection (FIG. 43).

Figure 44:
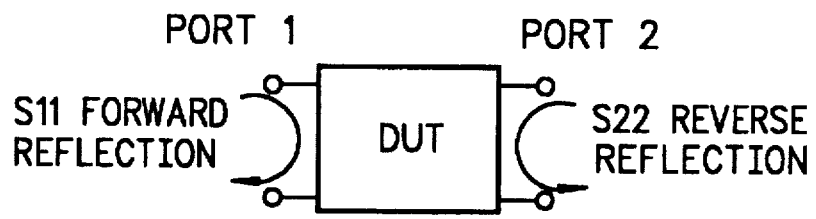
FIG. 44 illustrates the four scattering parameters.

Second, we can measure the forward and reverse transmission characteristics. However, instead of saying "forward", "reverse", "reflection", and "transmission" all of the time, we use a shorthand. That is all that S-Parameters are, a shorthand! That "S" stands for scattering. The first number is the port that the signal is leaving, while the second is the port to which the signal is being injected. $S_{11}$, therefore, is the signal leaving port 1 relative to the signal entering port 1. The four scattering parameters (FIG. 44):

$S_{11}$ Forward Reflection
$S_{21}$ Forward Transmission
$S_{22}$ Reverse Reflection
$S_{12}$ Reverse Transmission S-Parameters can be displayed in many ways. An S-Parameter consists of a magnitude and a phase. We can display the magnitude in dB, just like a scaler network analyzer. We often call this term log magnitude.

Figure 45:
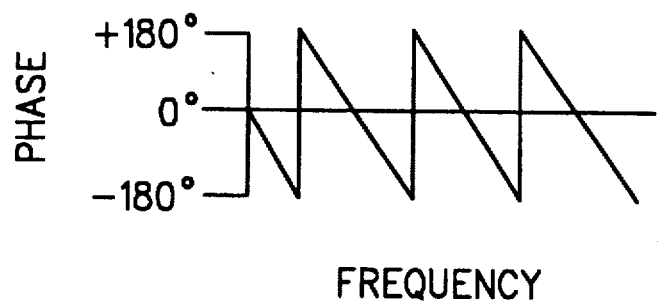
FIG. 45 illustrates display of linear phase vs. frequency.

We can display phase as "linear phase" (FIG. 45). As discussed earlier, we can't tell the difference between one cycle and the next. Therefore, after going through 360 degrees we are back to where we began. We can display the measurement from −180 to +180 degrees. The −180 to +180 approach is more common. It keeps the display discontinuity removed from the important 0 degree area used as the phase reference.

Figure 46:
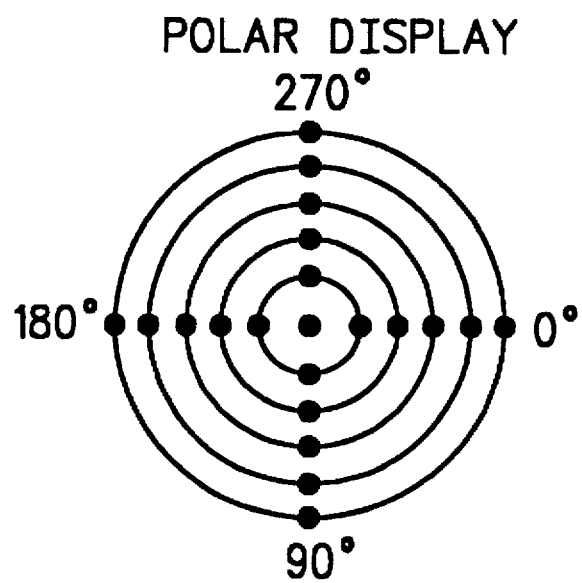
FIG. 46 illustrates polar display.

There are several ways in which all the information can be displayed on one trace. One method is a polar display (FIG. 46). The radial parameter (distance from the center) is magnitude. The rotation around the circle is a phase. We sometimes use polar displays to view transmission measurements, especially on cascaded devices (devices in series). The transmission result is the addition of the phase and log magnitude (dB) information of each device's polar display.

As we have discussed, the signal reflected from a DUT has both magnitude and phase. This is because the impedance of the device has both a resistive and a reactive term of the form r+jx. We refer to the "r" as the real or resistive term, while we call "x" the imaginary or reactive term. The "j", which we sometimes denote as "i", is an imaginary number. It is the square root of −1. If x is positive, the impedance is inductive, if x is negative the impedance is capacitive.

Figure 47:
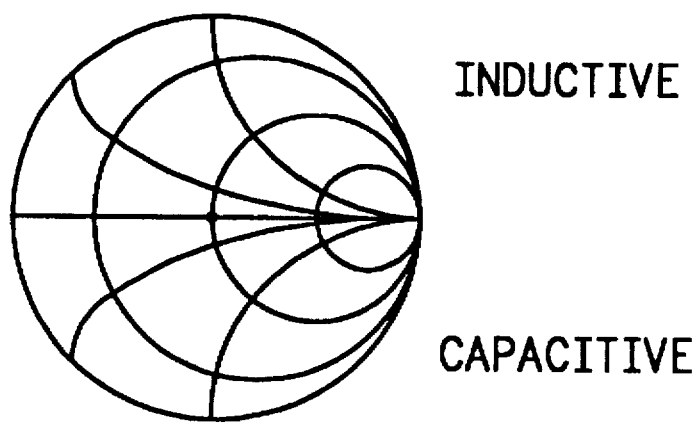
FIG. 47 illustrates a Smith Chart display.

The size and polarity of the reactive component x is important in impedance matching. The best match to a complex impedance is the complex conjugate. This complex-sounding term simply means an impedance with the same value of r and x, but with x of opposite polarity. This term is best analyzed using a Smith Chart (FIG. 47), which is a plot of r and x. We will discuss Smith Charts in greater detail below.

To display all the information on a single S-parameter requires one or two traces, depending upon format we want. A very common requirement is to view forward reflection on a Smith Chart (one trace) while observing forward transmission in Log Magnitude and Phase (two traces). Let us see how to accomplish this on the 360.

The 360 has four channels. Each channel can display a complete S-Parameter in any format on either one or two traces. All four S-Parameters can be seen simultaneously in any desired format. A total of eight traces can be viewed at the same time. While this is a lot of information to digest, the 360's large color display makes recognizing and analyzing the data surprisingly easy.

Another important parameter we can measure when phase information is available is group delay. In linear devices, the phase change through the DUT is linear-with-frequency. Thus, doubling the frequency also doubles the phase change. An important measurement, especially for communications system users, is the rate of change of phase-vs-frequency (group delay). If the rate of phase-change-vs-frequency is not constant, the DUT is nonlinear. This nonlinearity can create distortion in communications systems. We will discuss this in greater detail below.

Measurement Error Correction

Since we can measure microwave signals in both magnitude and phase, it is possible to correct for six major error terms:

Source Test Port Match

Load Test Port Math

Directivity

Isolation

Transmission Frequency Response

Reflection Frequency Response

We can correct for each of these six error terms in both the forward and reverse directions, hence the name 12-term error correction. Since 12-term error correction requires both forward and reverse measurement information, the test set must be reversing. "Reversing" means that it must be able to apply the measurement signal in either the forward or reverse direction.

Figure 48:
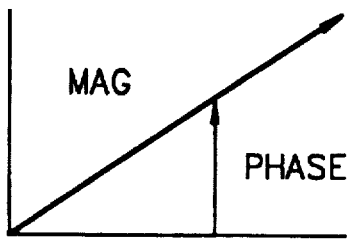
FIG. 48 illustrates vector error correction.

To accomplish this error correction, we measure the magnitude and phase of each error signal (FIG. 48). Magnitude and phase information appear as a vector that is mathematically applied to the measurement signal. This process is termed vector error correction. We will discuss this concept in greater detail below.

Test Sets

We have now learned about reference delay. We have discussed S-Parameters. We know what they are, how to measure them, and how to display them. We have also learned a little about vector error correction. Let us now turn to the 360 Test Sets. We will see how well they meet our measurement needs.

Figure 49:
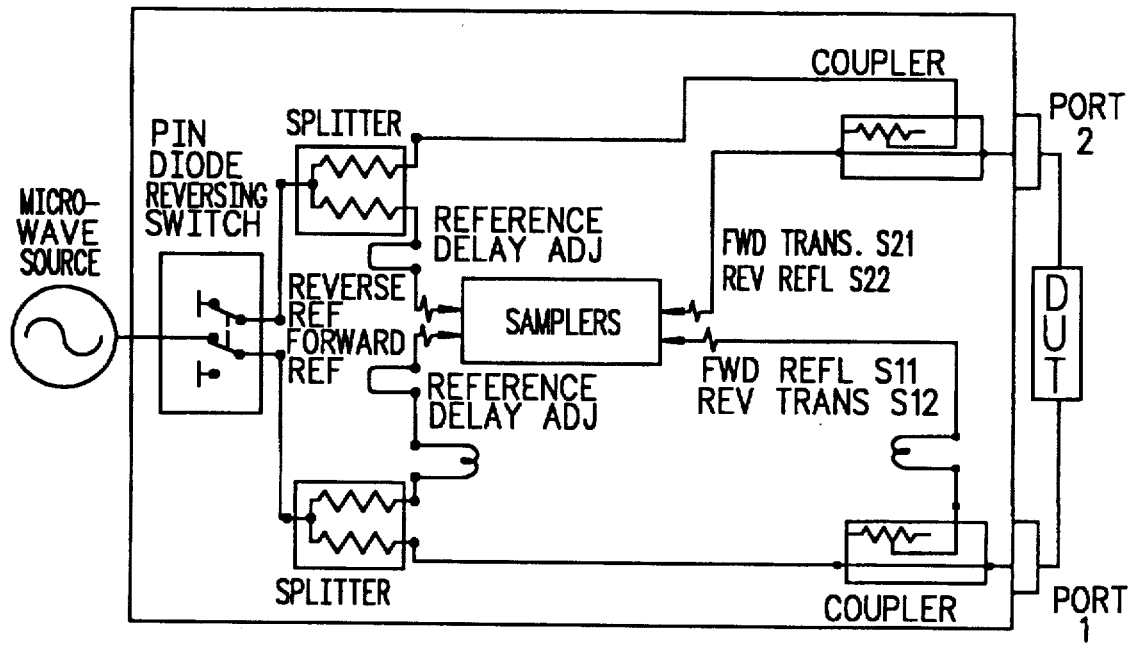
FIGS. 49–50 show WILTRON Test Sets.

The basic WILTRON Test Set is called a "Reversing Test Set" (FIG. 49). It contains an internal switch to select the direction of the microwave signal. Each port has a directional device. Any S-Parameter can be measured and 12-term error correction can be applied automatically. In fact, we can measure all four S-Parameters simultaneously and apply a 12-term error correction to each. Also, with the dedicated synthesized source, we update the display rapidly enough to allow real-time tuning of the DUT.

Note that the coupler on Port 2 is aligned different from the coupler on Port 1. The throughline of the Port 2 coupler goes directly into the forward transmission test sampler. There is no coupling-factor loss. This design approach optimizes the dynamic range of forward-transmission measurements. Coupling-factor loss is the most important requirement for large dynamic range measurements.

The two Reference Delay Lines (one for each port) are internal connections. Since the Wiltron system always uses a synthesized signal, we can accurately compensate reference delay in software. While the capability for changing the actual line length is still present, most people will rarely need to use it.

Figure 50:
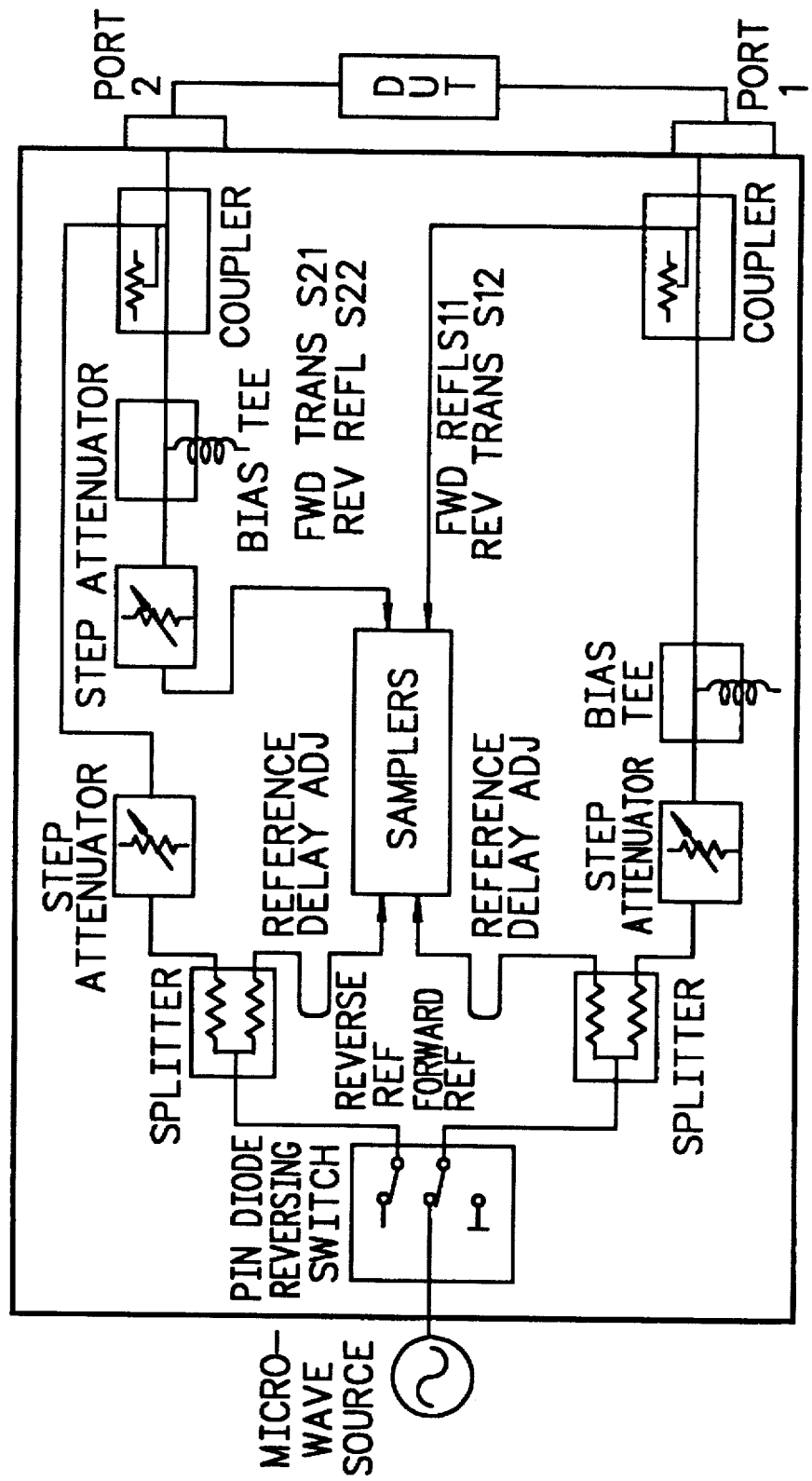

The Wiltron 40 Ghz Test Set (Model 3611) does not contain internally accessible reference delay loops. The additional line length would significantly affect dynamic range at high frequencies. You can change these internal line lengths. The Models 3620 and 3621 Active Device Test Sets (FIG. 50) are similar to the two reversing models. The exception is a third step attenuator located in the forward transmission line just ahead of the sampler. This step attenuator provides for measuring devices with output powers greater than $-10$ dBm. This additional step attenuator can be used to reduce the power into the forward transmission measurement sampler. Reverse transmission and output match measurements are unaffected by the step attenuator. The input match and attenuation of the step attenuator is measured and stored with the calibration data during the calibration process.

TUTORIAL

This tutorial introduces you to the 360 control panel and three basic measurement operations. It guides you through a typical calibration sequence and two basic network analyzer measurements: transmission and reflection.

| a. Equipment Needed | |
|---|---|
| 360 | Network Analyzer |
| 3610 | Test Set |
| 360SS47 | Source |
| 3650 | Cal Kit |
| 3670A50-2 | Through Cable | b. Initialize the System

Install the system disk and turn the power on. The 360 automatically performs a self test and comes on line with the same control panel setting as when exited last.

c. Backup the System Diskette

1. Remove the system diskette and install a blank diskette in its place.
2. Press the UTILITY MENU key (FIG. 52).
3. Using the MENU cursor and ENTER keys (FIG. 52), select the menu options. An appendix attached hereto shows menu option displays for the system of the present invention along with error codes provided from the measurement system and command codes acceptable to the measurement system.
4. Select GENERAL DISK UTILITIES when Menu U1, Utility Menu appears.
5. Select INITIALIZE DISK WITH PROGRAM when Menu U2, Disk Utilities Functions appears.
6. Follow the instructions displayed on the screen to complete the backup procedure.

d. Load Calibration Kit Data

1. Install the data diskette from the Model 3651, 3652, or 3653 Calibration Kit.
2. Press the UTILITY MENU key.
3. Select CALIBRATION COMPONENT UTILITIES when menu UI, Utilities Menu appears.
4. Select INSTALL CALIBRATION COMPONENT INFORMATION FROM DISK when Menu U4, Calibration Component Utilities appears.
5. To ensure that correct calibration data has been loaded, select DISPLAY INSTALLED CALIBRATION COMPONENT INFORMATION on Menu U4.
6. Select the appropriate component type (SMA[M], SMA [F], K-Conn[M], etc.) when Menu U5, Display Installed Calibration Components Information appears.

7. When the Readout Text associated with Menu U5 appears in the display area of the CRT, check that the serial number for your Open or Short device is correct for the component in your kit.

Full 12 Term Calibration, Precision

Broadband Termination

WILTRON'S precision broadband terminations are the ideal impedance reference for calibrating network analyzers. They are easier to use, more repeatable, and less expensive than sliding loads. However, sliding loads, when correctly used and perfectly aligned can be more accurate.

a. Connect the Thruline

Install the thru cable, WILTRON Co. Part No. PN3670A50, to Port 2 on the Test Set. We will refer to the unterminated end of this cable as Port 2 for all calibration and measurement steps.

b. Begin the Calibration

Figure 52A:
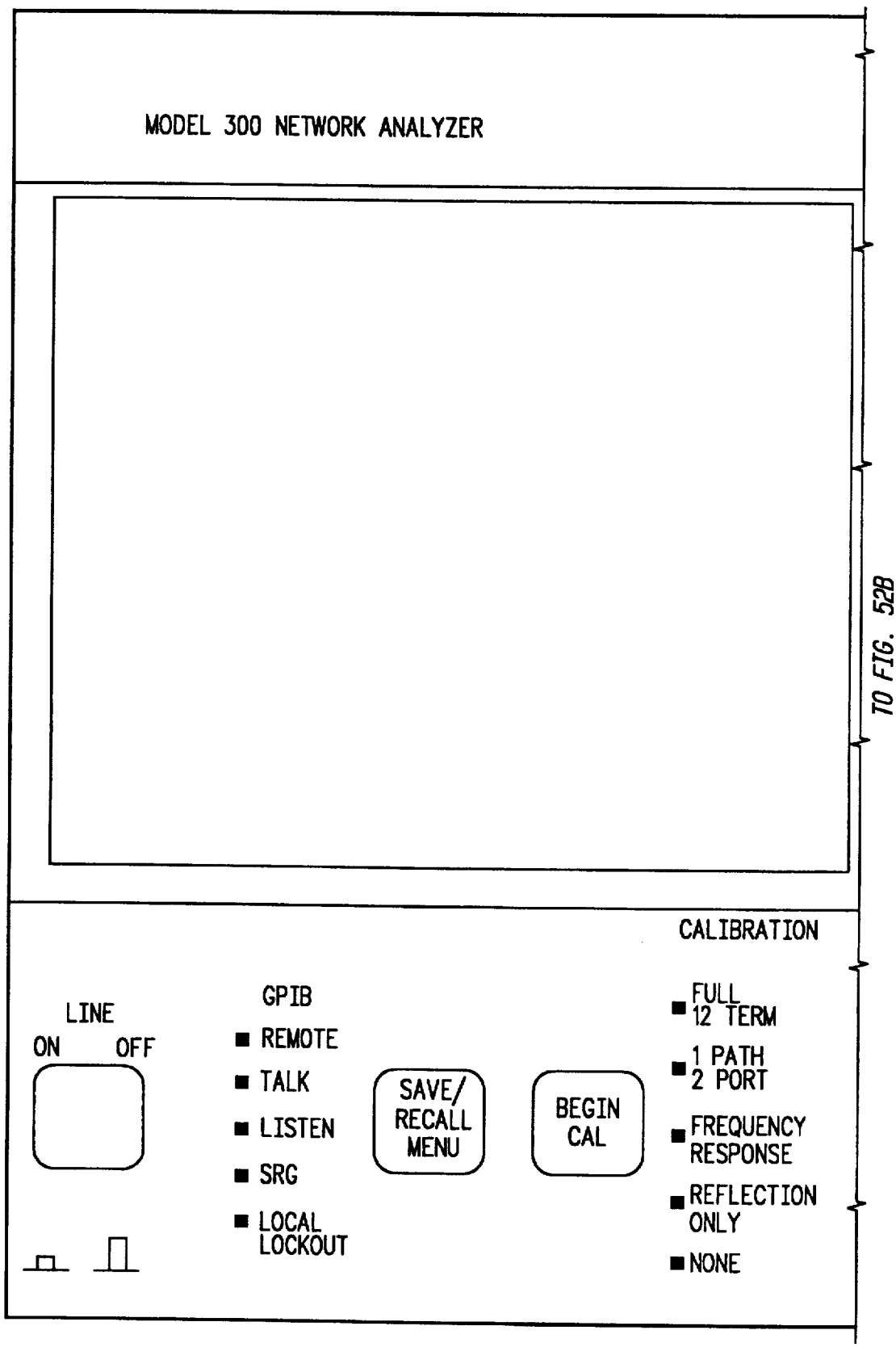
FIG. 52 illustrates the control panel layout.
Figure 52B:
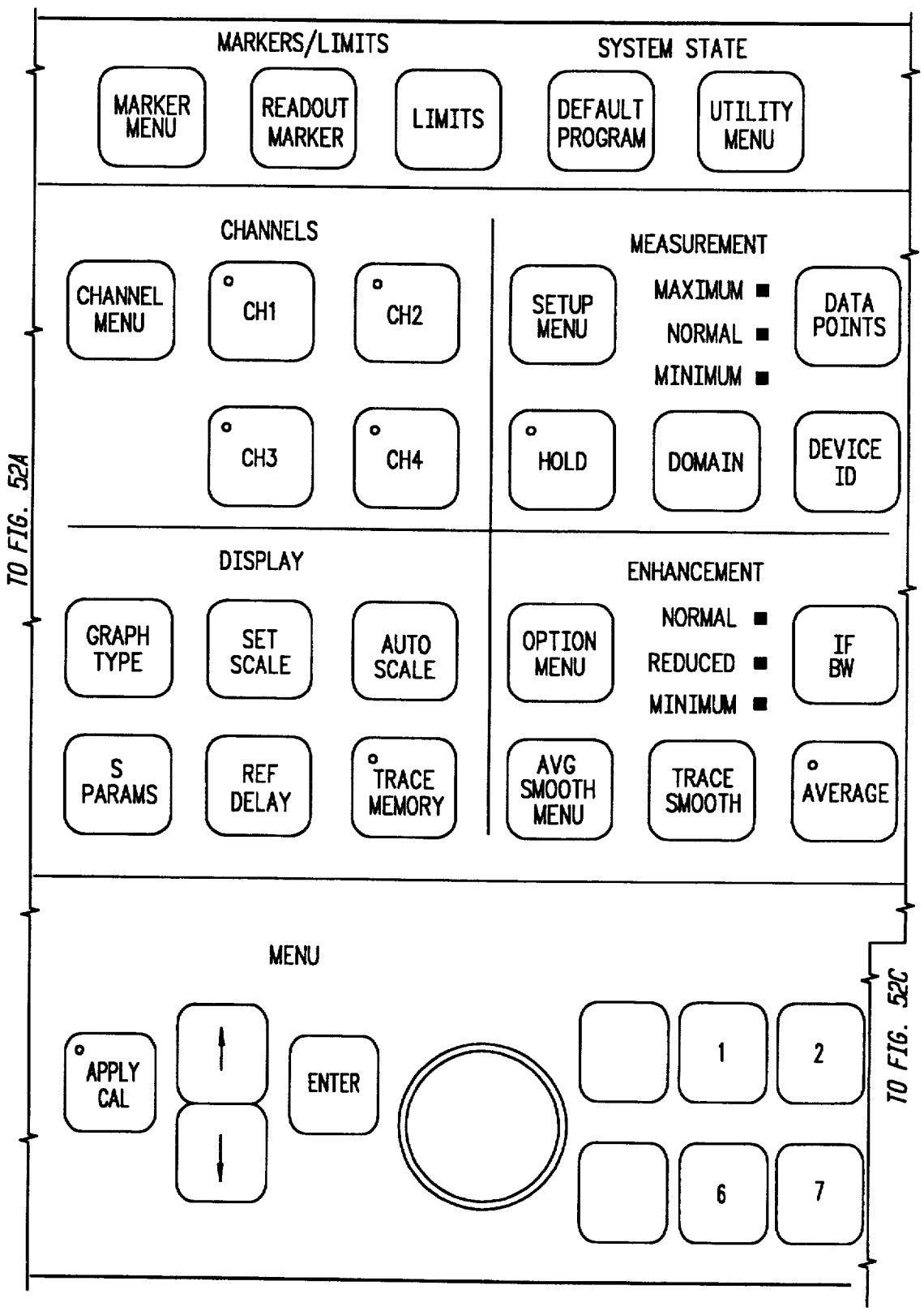
Figure 52C:
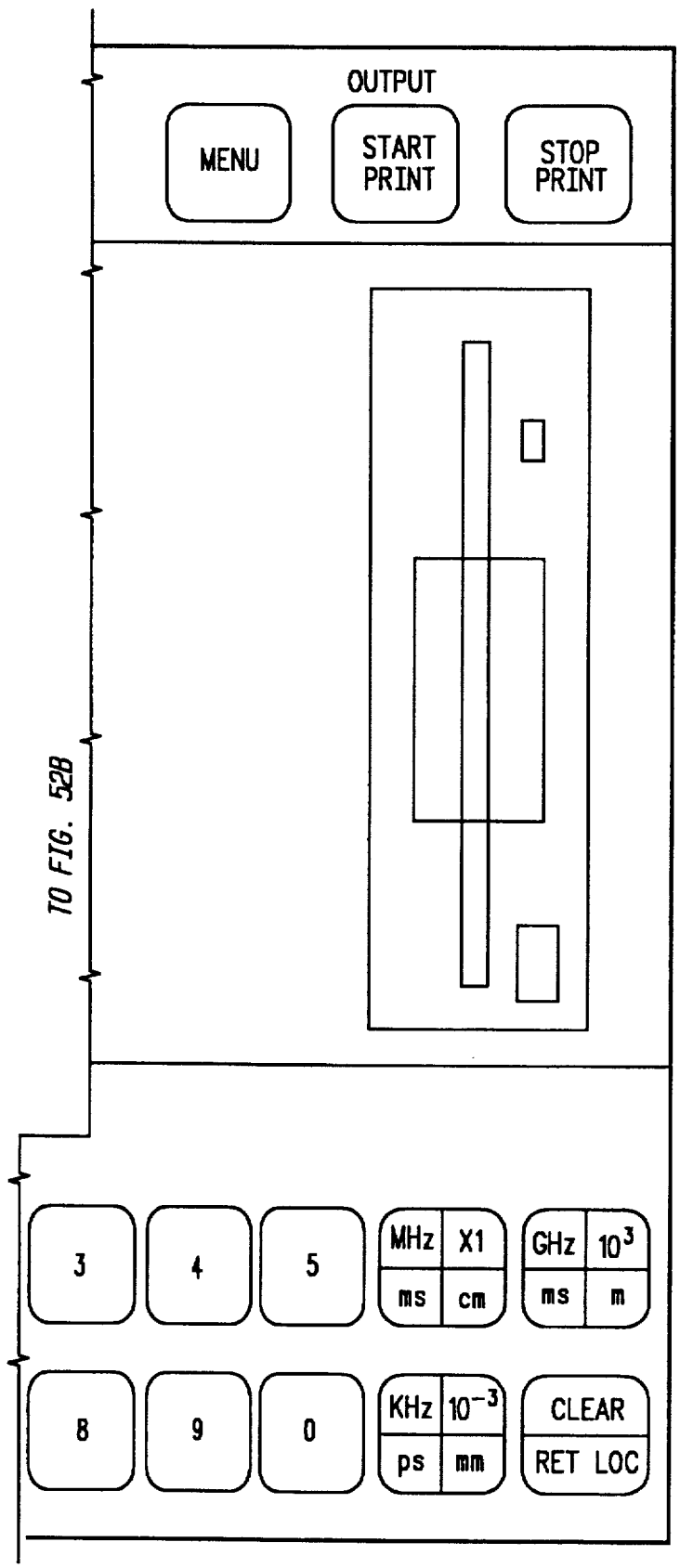

1. Press the DEFAULT PROGRAM key (FIG. 52).
2. Press the BEGIN CAL key (FIG. 52).

NOTE

Selecting these menu options automatically calls the next menu in the listed sequence.
3. Select FULL 12 TERM when Menu C5, Select Calibration appears.
4. Select NORMAL when Menu C1, Select Calibration Data Points appears.
5. Set 0.5–18 GHz when Menu C2, Frequency Range of Calibration appears.
6. Select CHANGE OF PORT 1 CONN when Menu C3, Confirm Calibration Parameters appears.
7. Select GPC-7 when menu C4, Select Connector Type appears.
8. Select CHANGE PORT 2 CONN when Menu C3 reappears.
9. Select GPC-7 when menu C4 reappears.
10. Select CHANGE LOAD TYPE when Menu C3, reappears.
11. Select BROADBAND LOAD when Menu C6, Select Load Type appears.
12. Select START CAL when Menu C3 reappears.
13. Follow the instruction in each of the upcoming Calibration Sequence menus. Each step allows you to view the calibration data being taken and then retake the data if desired. This saves you from having to repeat the complete calibration because of an undetected error—such as, a poorly mated connection.
14. When Menu C10, Calibration Sequence Completed appears, you can choose to store the calibration data on a disk. You should always choose to do this; steps 15 thru 19 show you how.
15. Press the SAVE/RECALL MENU key (FIG. 52).
16. Select SAVE when Menu SR1, Save/Recall Front Panel Information appears.
17. Select SAVE CAL DATA AND FRONT PANEL SETUP ON DISK, when Menu SR2, Recall or Save appears.
18. Select CREATE NEW FILE, when the GP1-3, Select File menu appears.
19. Enter CAL 1 and your initials using the knob, when the Menu GP5, Select Name appears. When finished, move to DONE and press the ENTER key. You can assign an 8 character file name and up to 15 additional spaces for other information.

c. Discussion

During calibration, the 360 automatically
1. Sets the number of points to maximum—501 points.
2. Sets averaging to 128 while the loads are being measured.
3. Sets the Video IF bandwidth to the REDUCED value (1 kHz).

NOTE

The above values are default values that can be changed through menu selection.

A lower noise floor can be achieved by reducing the Video IF bandwidth and averaging several measurements. However, the default values have been found to be optimum for providing a compromise between a low noise floor and data-taking speed. Reducing the Video IF bandwidth eliminates unwanted noise by more closely tracking the desired frequency. Averaging several measurements removes random variations and effectively improves noise floor performance. However, reducing video IF bandwidth and increasing the number of averages causes an increase in sweep time.

Smoothing is not necessary nor desirable during calibration, since it does not affect the actual measurement data and will mask any rapid response variations displayed. This can lead to a sense of false confidence, both when performing the calibration and when monitoring the displayed calibration data for measurement errors.

Measuring Transmission

Now let us consider the effect of calibration on transmission measurements. Press the APPLY CAL key, to tune off the calibration. Leave the throughline connected between Port 1 and Port 2.

Let us look only at $S_{21}$ (forward transmission). Set up the 360 for a single display with Log Mag and Phase using channel 3 and the graph menu, as follows:
1. Press the CHANNEL MENU key (FIG. 52).
2. Select SINGLE DISPLAY when Menu CM, Select Display Mode appears.
3. Press the CH3 key.
4. Press the S PARAMS key.
5. Select S21 FWD TRANS when Menu SP, Select S-Parameter appears.
6. Press the GRAPH TYPE key.
7. Select LOG MAGNITUDE AND PHRASE when Menu GT1, Select Graph Type appears.
8. Press the AUTOSCALE key.
9. Notice the sawtooth pattern of the phase display. This represents the phase shift resulting
10. Press the APPLY CAL key to apply the calibration.
11. Notice that both the magnitude and phase appear to be flat. The amplitude and phase uncertainties have been removed from the magnitude measurement. A software phase correction has been added. It makes the reference arm and the test arm appear to be the same length.

12. The test arm now includes the same cable used in the calibration. Therefore, any deviation from 0 dB magnitude and 0 degree phase constitute the uncertainty of the measurement. This uncertainty results from random errors such as connector repeatability. It is dependent on the quality of both the calibration and the calibration components.
13. Press the AUTOSCALE key.
14. Set the averaging for best performance, as follows:
    (a) Press the AVG/SMOOTH MENU key.
    (b) Enter 50 from the keypad for the AVERAGING XXXX MEAS PER POINT option.
    (c) Press the X1 terminator key (FIG. 52).

NOTE

Fifty averages typically provide a good balance between a smoother waveform and its tradeoff, increased total measurement time.

(d) Press the AVERAGE key to enable the averaging function.

Melting Reflection

Now let us consider the effect of calibration on reflection measurements.
1. Press the APPLY CAL key (FIG. 52) to disable the calibration.
2. Press the AVERAGE key (FIG. 52) to disable the Averaging Function.
3. Remove the throughline.
4. Connect the broadband load to Port 1.
5. Set the start frequency to 2 GHz, as follows:
    (a) Press the SETUP MENU key.
    (b) Change the START frequency to 2 GHz and press ENTER, when Menu SU1, Sweep Setup appears.
6. Set up the 360 to measure $S_{11}$ (return loss) as follows:
    (a) Press the CHANNEL MENU key.
    (b) Select SINGLE DISPLAY when Menu CM, Select Display Mode appears.
    (c) Press the S PARAMS key.
    (d) Select $S_{11}$FWD REFL when Menu SP, Select S-Parameter appears.
    (e) Press the CH1 key.
    (f) Press the GRAPH TYPE key.
    (g) Select LOG MAGNITUDE when Menu GT1, Select Graph Type appears.
7. Press the AUTOSCALE key.
8. Using Marker 1 and the Readout Marker feature, find the worst case return loss as follows:
    (a) Press the MARKER MENU key (FIG. 52).
    (b) Place the cursor on MARKER 1 and press the ENTER key, when Menu M1, Set Markers appears.
    (c) Press the READOUT MARKER key.
    (d) Choose MARKER TO MAX and press the ENTER key, when Marker M4, Readout Marker appears.

INSTRUMENT OPERATION-AN OVERVIEW

Power-Up Characteristics

When initially turned on (powered up), the 360 comes on line with the factory-selected default settings. On subsequent power-ups, it generally returns to the exact status and display that it was in when powered down last. (An exception is when the stored control panel setup data has been lost, then it comes on with the default settings.)

After coming on line, the 360 executes a self test. It then attempts to load its operating software from the installed disk. If unable to do so, it attempts to load from an internal ROM cartridge. If neither option is possible, it displays the message: "DISK NOT READY—PRESS ENTER TO TRY AGAIN." It then waits for you to take the appropriate action.

During the self test if the program detects a system fault, it shuts the system down and displays an error message. (A system fault is one that occurs in the 360, the test set, or the source.) If the program detects a fault in a peripheral device (such as the printer), it does not shut the system down. It only displays an error message.

Measurement Control

Measurement control is provided through selections of start, stop, and marker frequencies, as follows:

a. Start and Stop Frequencies

Start and stop frequencies must meet the following criteria:
1. Be within the range of the frequency source and test set.
2. Have a span that provides 100 kHz resolution for the 360 SSXX source.
3. Have a start frequency lower than the stop frequency.

NOTE

You may change the start and stop frequencies after calibration. However, your new frequencies must fall within the calibrated range when the calibration is applied.

b. Marker Frequencies

If there are markers at frequencies other than the equally spaced set of calibration frequencies, they will be readjusted to a calibration frequency.

Data Enhancement

Vector Error Correction

The 360 provides software correction for inherent measurement-setup error terms. Additionally, you can select software correction for any four measurements: Frequency Response, Reflection only, One Path-Two Port, or Full 12-Term.

b. Data Averaging

You can average measurements over time for a more accurate readout of noisy, rapidly changing amplitude data. In averaging, you select the number of points for which you wish averaging calculated. The sweep then stops at each frequency point and takes that number of readings. The program then averages the amplitude readings at the frequency point and writes the average value on the displayed graph-type. For calibration, the averaging function defaults to 128. You may reset it to any other value, however.

c. Smoothing

Figure 51:
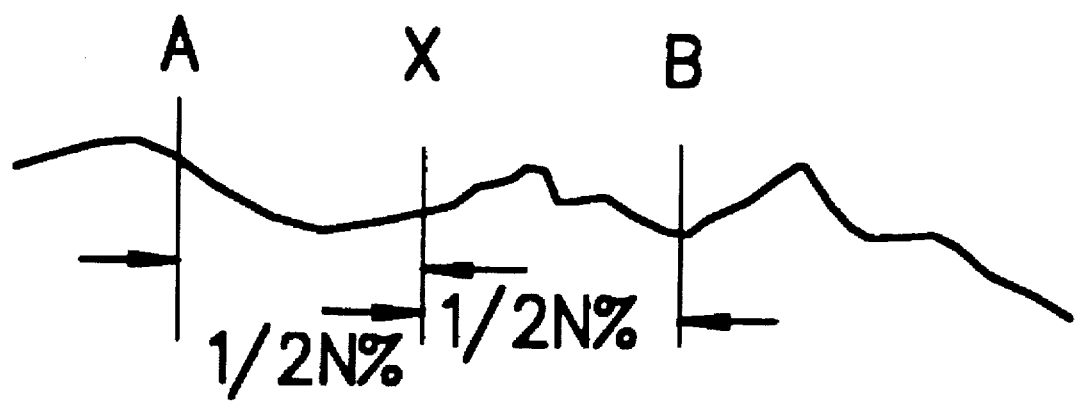
FIG. 51 illustrates smoothing.

You can smooth (amplitude only) measurement variations over a frequency span of from 0 to 20 percent of the sweep. The smoothing process uses a raise Hamming window to average the data from a span of frequencies. For example, in FIG. 51 if the program averages all data points from A to B to give point X then the average of all points from A+1 to B+1 is X+1.

d. Normalization (Trace Memory)

Normalization means taking data from a standard component (filter or attenuator, for example), then later comparing it with another like item. To normalize data means to add, subtract, multiply, or divide it by standard data taken earlier and stored in memory. When the measured data taken from the two components are the same, the 360 displays a straight line. If they differ, however, it displays the degree of departure of the new data from the stored data.

Human Interface

The 360 interfaces with the user through a system of informative menus coordinated with control panel keys. You are always prompted by the menus or complete an action by pressing one or more keys, If the key is one of the menu-allowed choices, then the 360 responds in one of the following ways:
It displays a different menu.
It enters a numeric value.
It allows a choice in the current menu.
If the key is not one of the above choices, the 360 beeps.

a. Channel Concert

The 360 has four measurement channels that you can display simultaneously, individually, or in pairs. You can display a different S-Parameter on each channel. Or, you can display the same S-Parameter on one or more channels. You can control the four channels separately for some functions and parameters, while others must be the same for all channels. The parameters that can be different for the different channels are as follows:
Graph-Type (Rectilinear, Polar, Or Smith Chart)
Amplitude Scales
Reference Delay Setting
Normalization Memory
S-Parameters The parameters that must be the same for all four channels are as follows:
Start and Stop Frequencies
Error Correction Type
Calibration Type and Range
Averaging
IF Bandwidth
Smoothing
Marker Frequencies, Times, Distances b. Display of Messages

The 360 displays on-screen text giving error and other messages. This text concisely states the condition causing the message, specifies an action needed, or both.

c. Active Parameter

The active parameter is the only one that you can change using the Data Entry keys or knob. We define a parameter as a frequency, time, degree, distance, or other numeric value that you can enter. (You enter a parameter using the keypad or knob and end it using one of the Terminator keys (See Appendix page 6 (App. 6)). You open such a parameter for modification by pointing a menu cursor at it. That makes it active. You close a parameter by moving the cursor away from it. Or, alternatively, you erase or replace the menu.

Stored Data

The 360 can store control panel setups along with normalization, measurement, and calibration data. The following is a list of the items saved. (The 360 saves these parameters for all active channels.)

a. Display Parameters

Offset
Resolution
Reference Line
Limits (Enabled, On/Off/Values)
Minimum and Maximum Values
Selected S-Parameter
Display Type
Active Channel
Display Mode
S-Parameter For Each Channel
Blank Frequency Display Active, Color Plane
Reference Delay
Dielectric Used
Dielectric Constant
Normalize Mode b. Measurement Parameters

Start of Sweep
End of Sweep
Source Power and Attenuator Settings
Frequency Resolution
Device-Under-Test ID c. Enhancement

Smoothing Enabled
Averaging Enabled
Smoothing % of Sweep
Number of Points Averaged
IF Bandwidth d. Output

Type of Output
Options Enabled (Model, Device ID, Date, Operator)
Resolution e. Calibration

Size
Frequencies
Port Connector Type
Calibration Type
Correction Type
Load Type
Capacitance Coefficient for Connector
Connector Offset Length for Each Port f. Miscellaneous

Markers (Enabled, On/Off, Values)
Delta Reference Mode
Marker Frequencies, Times, Distances
GPIB Addresses and Termination Unit g. Disk Identification

Calibration File Name h. Control Panel Setups

You can store the instrument state (measurement parameters and operating modes) in internal non-volatile memory or on the installed disk. You select the storage media using the SAVE/RECALL MENU key and its related menus. You can save up to four control panel setups, along with calibration data, in internal memory and more on the disk. Additionally, the 360 saves certain parameters each time you turn it off. It automatically saves (1) the current control panel setup, (2) all measurement, display, calibration, and other parameters and functions. This allows it to return to its exact same state when powered up next.

i. Normalization Memory

The 360 can store up to four channels of normalization data (S-Parameter measurements) in volatile RAM. To prevent loss of this data when you turn the system off, you may also save it to the disk.

j. Measured Data

You can also save measured data on the disk. The 360 stores it as ASCII-encoded test. The format is the same as that used for the tabular printout. This feature lets you make the computer analysis of the measured data, provided your computer has a compatible disk drive.

k. Calibration Data

The 12-term error correction coefficients for each data point covered by the calibration being saved are stored as 12 single precision (32-bit real, 32-bit imaginary) complex numbers. This results in 96 bytes per point, or 48 KBytes for a 51 point calibration.

External and Peripheral Interfaces a. Microfloppy Disks

The 360 employs an integrally mounted disk drive for 3½ inch microfloppy disks.

b. GPIB Interface

The 360 has two GPIB interfaces:Source Control (Master) and System Control (Slave). You can program each of these interfaces for address, delimiting character, etc. using a menu. The 360 provides GPIB status in a menu.

GPIB Specifications are as follows:
Interface
IEEE-488 standard GPIB
 System Interface: IEEE-488 port used exclusively by the 360 to control and extract information from a Model 360SSXX frequency source.
 Addressing: Controller is address=0 and source is address= 5. Addresses are settable by menu; for the 360SSXX, it is also settable from the rear panel.
 Speed: 200 µs/bus cycle (device dependent).
 Interface Function codes: SH1, AH1, T8, TE0, L4, LE0, SR0, RL0, PP0, DT0, DC0, C1, C2, C3, C27.
360 GPIB (System Control or Slave)
Interface: IEEE-488 standard GPIB
 System Interface: IEEE-488 port by which an external controller may take control of the 360. The controller can perform all control panel operations.
 Addressing: Defaults to address 6, settable by menu control.

c. Parallel Printer Port

The printer port is compatible with a standard "Centronics" interface. The 360 has the capability for an exact pixel-by-pixel dump of the CRT screen, when used with the WILTRON model 2225C inkjet printer. The output can be any of the following.
1. A full-screen dump.
2. A data-display dump that does not reproduce the menu.
3. A tabulated listing of the data.

d. Test Set Control Interface

The Power and Data interfaces use 37-pin "D" subminiature connectors. The Signal and RF interfaces use 17-pin, coaxial "D" subminiature connectors.

e. Video Interface

The 360 provides two video outputs, as follows:
1. Composite Monochrome Output. This output has rear-panel screwdrive adjustments for relative mix levels of red, green, and blue. You can adjust the mix to display shades of gray on an external monitor. 2. Separate R-G-B, TTL Level Outputs. You control the level using the same adjustment as for 1, above. Additionally, the 360 has positive-true and negative-true horizontal and vertical drive signals available. All video signals are nominally either TTL levels or 1-volt, zero-to-peak-into-75-ohm levels. The signals appear on a dedicated 15-pin "D" subminiature connector mounted on the rear panel. The composite video is also available on the RCA-type phono connector.

MODEL 360 CONTROL PANEL CONTROLS

FIG. 52 illustrates the control panel layout.

1. LINE ON/OFF

Turns the 360 on and off. When pressed ON, the program runs a self test then recalls the parameters and functions in effect when powered down last.

2. GPIB INDICATORS

REMOTE
 Lights when the 360 goes under GPIB control. IT remains lit until the unit returns to local control.
TALK
 Lights when you address the 360 to talk and remains lit until unaddressed.
LISTEN
 Lights when you address the 360 to listen and remains lit until unaddressed.
SRQ
 Lights when the 360 requests service from the controller (sends out a SRQ). The LED remains lit until the 360 receives a serial poll or until the controller resets the SRQ function.
LOCAL LOCKOUT
 Lights when a local lockout message is received. The LED remains lit until the message is rescinded. When lit, you cannot return the 360 to local control via the front panel.

3. SAVE/RECALL MENU

Displays the first of three-menus that let you save the current calibration or control panel setup or recall a previously saved calibration or setup.

4. BEGIN CAL

Calls up the first in a sequence of menus that guide you through a measurement calibration. See below for a detailed discussion of the calibration keys, indicators, and menus.

5. CALIBRATION Indicators

Shows the calibration state of the 360.

6. APPLY CAL

Turns on and off the applied error correction displayed by the calibration indicators.

7. MENU

The ↑ key moves the menu cursor up and the ↓ key moves it down to select between entries appearing in the menu area of the CRT.

8. ENTER

Implements the menu selection chosen using the MENU arrow keys.

9. ROTARY KNOB

Used to alter measurement values for the active parameter (Start Frequency, Stop Frequency, Offset, etc).

10. DISPLAY Keys

GRAPH TYPE: Displays either of two menus that let you choose the type of display and its S-parameter that appears for the active channel.
SET SCALE: Displays the appropriate scaling menu, based on the type of graph and its S-parameter being displayed for the active channel.
AUTO SCALE: Automatically scales the active channel for optimum viewing.
S-PARAMS: Displays Menu SP, which lets you choose between $S_{11}$, $S_{12}$, $S_{21}$, or $S_{22}$. You may display the same parameter on two or more channels.
REF DELAY: Displays the first of two menus that let you enter a reference-delay in time or distance. For a correct distance readout, you must set the dielectric constant to the correct value. Refer to the discussion in Menu RD2.
TRACE MEMORY: Displays a menu that lets you do one of the following. (1) Store the measured data in memory. (2) View the stored data. (3) Add, subtract, multiply, or divide the measured data from the stored data (normalize to the stored memory). (4) View both the measured and the stored data simultaneously on the active channel. Four memories exist—one for each channel. This lets you normalize the data in each channel independently. The LED on this button lights only when the active channel is displaying measurement data normalized to memory.

11. KEYPAD

Provides for entering values for the active parameter. The active parameter is the one to which the menu cursor is pointing.

12. ENHANCEMENT Keys and LED

IF BW: Cycles between NORMAL, REDUCED, and MINIMUM intermediate frequency (IF) bandwidths. The appropriate indicator lights to display the selected value.
AVG/SMOOTH MENU: Displays a menu that lets you enter values for AVERAGING and SMOOTHING.
OPTION MENU: Displays a menu showing the choice of options installed. (This key is not active unless you have options other than Time Domain installed).
TRACE SMOOTH: Turns the trace smoothing function on and off.
AVERAGE: Turns the averaging function on and off.

13. TERMINATOR Keys

Ghz/$10^3$/µs/m: Terminates a value entered on the keypad in the units shown—that is; gigahertz for frequency, $1\times10^{-3}$ power for dimensionless or angle entries, microseconds for time, or meters for length.
Mhz/X1 /ns/cm: Terminates a value entered on the keypad in the units shown—that is; megahertz for frequency, unity for dimensionless or angle entries, nanoseconds for time, or centimeters for length.
Khz/$10^{-3}$ /ps/mm: Terminates a value entered on the keypad in the units shown—that is; kilohertz for frequency, $1\times10^{-3}$ power for dimensionless or angle entries, picoseconds for time, or millimeters for length.

CLEAR/RET LOC a. Local (Non-GPIB) Mode: (1) The key clears entries not yet terminated by one of the terminator keys above, which allows the previously displayed values to redisplay. Or (2) the key turns off the displayed menu, if you have not made any keypad entries needing termination.
b. GPIB Mode: The key returns the instrument to local (control panel) control, unless the controller has sent a local lockout message (LLO) over the bus.

14. DISK DRIVE

Provides a drive for the 3½ inch floppy disk used to store both the operating system and the selected front panel setups and calibration. Refer to paragraphs 3–6 for a detailed description.

15. OUTPUT Keys

MENU: Displays option menus that let you define what will happen each time you press the START
PRINT key. The displayed menu also selects disk I/O operations.
START PRINT: Tells the printer or plotter to start output based on the current selections or plotting.
STOP PRINT: Immediately stops printing the data, clears the print buffer, and sends a form-feed command to the printer. However, if the printer is not then printing data, the key only sends a form-feed command.

16. MEASUREMENT Keys and LED

SETUP MENU: Displays the first of three menus that let you enter start/stop frequencies, source power, and attenuation values.
DEVICE ID: Displays a menu asking you to name the test device.
DATA POINTS: Cycles between maximum, normal, and minimum resolution values. The appropriate MAXIMUM, NORMAL, or MINIMUM switch indicator lights to display the selected value.
DOMAIN: Displays the first of the menus that let you set the Time Domain display parameters. (This key is only active if you have the Time Domain option).

(1) If already in the DOMAIN menus, pressing this key will return to the first menu in the sequence.

(2) If in the DOMAIN menus and another (non-time domain) menu is displayed by pushing a menu key, the last displayed time domain menu redisplays when the DOMAIN key is next pressed.

HOLD: Toggles the instrument in and out of the hold mode or triggers a sweep, depending on the function selected in menu SU4.

17. SYSTEM STATE Keys

DEFAULT PROGRAM: Resets the control panel to the factory-preset state and displays Menu SU1.

CAUTION

Use of this key will destroy control panel and calibration setup data, unless they have been saved to disk.

UTILITY MENU: Displays the first in a series of menus that let you perform diskette and other utility-type functions and operations.

18. MARKERS/LIMITS Keys

MARKER MENU: Displays the first in a series of menus that let you set and manipulate marker frequencies, times, and distances.

READOUT MARKER: Displays a menu that lists all of the active markers. If no markers are active, the message "NO ACTIVE MARKERS" displays for four seconds in the message area of the screen.

LIMITS: Displays one of the menus that let you manipulate the Limit 1 and Limit 2 lines displayed on the CRT.

19. CHANNELS Keys

CHANNEL MENU: Displays a menu that lets you display format for the channels,

CH 1: Makes Channel 1 the active channel. The active channel is the one acted on by the keys in the DISPLAY section. Only one channel can be active at any one time.
CH 2: Makes Channel 2 the active channel.
CH 3: Makes Channel 3 the active channel.
CH 4: Makes Channel 4 the active channel.

20. CRT Display

Displays any or all of the four measurement channels.

CALIBRATION Keys and Indicators

FIG. 53 illustrates the calibration keys.

a. BEGIN CAL Key

This key displays a menu that lets you initiate the calibration sequence. That is, to begin a sequence of steps that corrects for errors inherent in a 2-port measurement setup.

b. APPLY CAL Key

This key turns on and off the error correction that you may apply to the displayed channel (s) using the currently valid error-correction indicator.

C. CALIBRATION Indicators

FULL 12 TERM: You have corrected for all twelve error terms associated with a two-port measurement.

NOTE

Choosing this calibration in Menu C5 corrects for all possible measurement error terms.

1 PATH, 2 PORT: You have corrected for the four forward-direction error terms ($E_{DF}$, $E_{SF}$, $E_{RF}$, and $E_{TF}$).

FREQ RESPONSE: You have corrected for one or both of the forward-direction error terms associated with a measurement of $S_{11}$ and $S_{21}$. This is a subset of the 12-term calibration.

REFLECTION ONLY: You have corrected for the three error terms associated with an $S_{11}$ measurement ($E_{DF}$, $E_{SF}$, and $E_{RF}$). This is a subset of the 12-term calibration.

NONE: No calibration data currently exists.

Calibration Menus (The Calibration Sequence consists of several menus, similar in structure but different in content. The content differs only in the type of device (load, open, or short) the menus say to connect to ports 1 and 2. The menus automatically appear in a sequence based on choices made C7A through L. Each menu will specify a type of device to be connected to ports 1 and 2 (FIG. 55) and each will provide a procedural message (one of the three types shown in Table 93B).)

Figure 54:
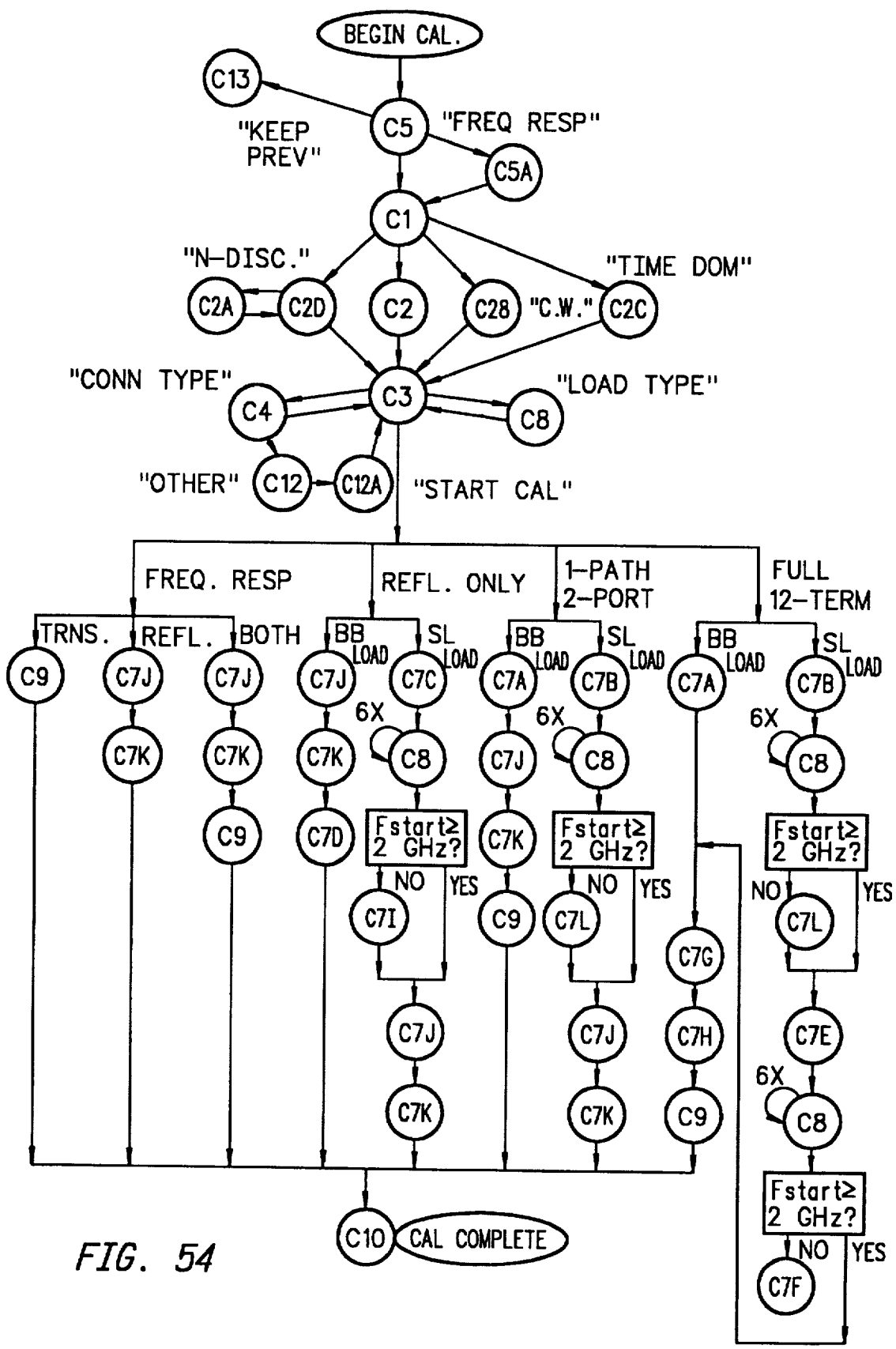
FIG. 54 provides a flowchart describing the calibration sequence.
Figure 57:
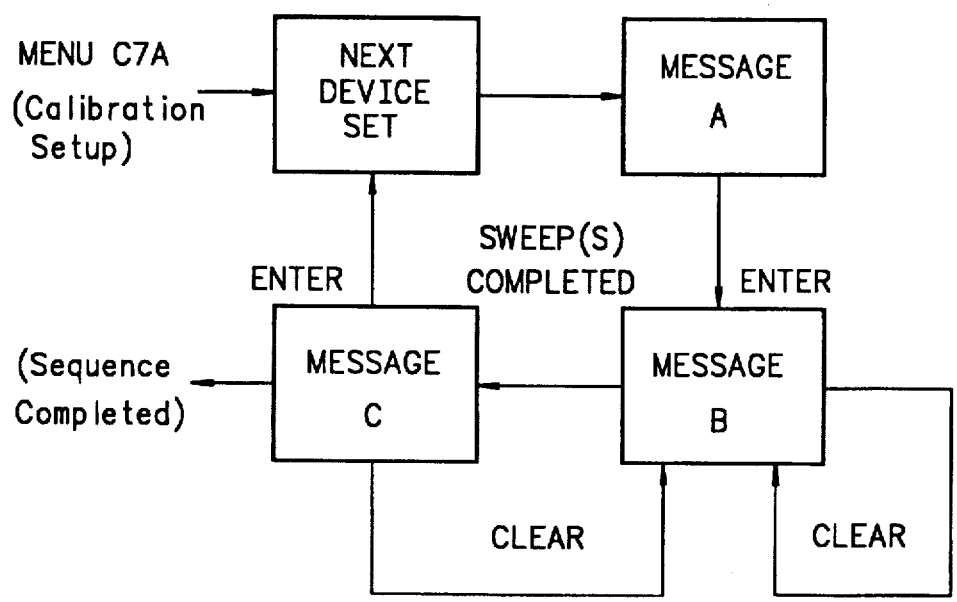

Measurement calibration is aided by the step-by-step procedures contained in the calibration menus. FIG. 54 provides a flowchart describing the calibration sequence. Apps. 1–18 and FIGS. 53–57 describe the calibration menus.

SAVE/RECALL MENU Key And Menus

Pressing the SAVE/RECALL MENU key shown in FIG. 52 displays the first of four menus (Apps. 19 and 22) that allow you to save or recall control panel setups and calibration data.

MEASUREMENT Keys and Menus

SETUP Key

Pressing the measurement keys shown in FIG. 52 calls Sweep Setup Menu SU1 (SU3). Depending upon which menu items you select, additional menus SU2 thru SU6 may also be called. Apps. 23–28 describe the six menus.

DEVICE ID Key

Pressing this key calls a menu that lets you name the test device. This key has the same effect as selecting "Device ID" in the PM2 menu.

c. HOLD Key

If the instrument is sweeping, pressing this key results in the immediate halt of the sweep at the current data point. The LED on the button lights, indicating that the Hold Mode is active.

The instrument may be taken out of the hold mode as follows:

1. By using any of the options described in Menu SU4, Select Function for Hold Button.
2. By pressing the Default Program button. This causes the 360 to revert to a predefined state.
3. By pressing the Begin Cal button. This causes the 360 to resume sweeping and begin the Calibration Menu sequence.

NOTE

See App. 26 (Menu SU4) for a description of the interaction between the Hold Mode and the selection of "Single Sweep" or "Restart Sweep".

If you restart the sweep after performing any disk operations in the Hold Mode (sweep stopped at some data point), the sweep restarts from the beginning.

d. DATA POINTS Key

Pressing this key toggles between MAXIMUM, NORMAL, and MINIMUM resolution, lighting the appropriate LED. If MAXIMUM resolution is X data points, MINIMUM resolution will be approximately X/6 data points and NORMAL resolution will be approximately X/3 data points. The nominal values are X=501, X/3=167 and X/6=85.

e. DOMAIN Key

See FIG. 52 for a full description. Additionally, if the Time Domain option is installed, making a selection other than "Frequency Domain" lets you display measured data in the time domain. It also calls a further sequence of Time Domain Menus. Menu TD1 and all other time domain menus, along with a discussion of the time domain measurement, are provided below.

CHANNEL Keys and Menu a. CH 1–4 Keys

The channel keys shown in FIG. 52 define the active channel. One (and only one) must always be active as indicated by the associated LED. Pressing a button makes the indicated channel active. If it is already the active channel, pressing the key has no effect.

The active channel will be the channel acted upon by the S PARAMS, GRAPH TYPE, REF DELAY, TRACE MEMORY, SET SCALE, AUTO SCALE and DOMAIN keys. When in the single channel display mode, the active channel will be the one displayed.

b. CHANNEL Menu

Pressing this key calls menu CM (App. 29). Here, you select the number of channels to be displayed. When in the single display mode, only the active channel will be displayed.

DISPLAY Keys and Menus (See FIG. 52)

a. S PARAMS Key

Pressing this key calls menu SP (App. 30). This menu allows you to select the S-Parameter to be displayed by the active channel for the selected S-parameter.

b. GRAPH TYPE Key

Pressing this key calls menu GT1 or GT2 (Apps. 31 or 32). These menus let you select the type of display to appear on the active channel for the selected S-parameter.

c. SET SCALE Key

Pressing this key calls the appropriate scaling menu (SSn) depending upon the graph type being displayed on the active channel for the selected S-parameter.

d. REF DELAY Key

Pressing this key calls menu RD1 (App. 36). This menu lets you input the reference delay in time or distance. You do this by selecting the appropriate menu item. For a correct distance readout, the dielectric constant must be set to the correct value. This is accomplished by selecting "SET DIELECTRIC", which calls menu RD2 (App. 37).

On menu RD1, selecting "AUTO" and pressing ENTER automatically adjusts the reference delay to unwind the phase. The values for time and distance turn red for one second when you activate "AUTO".

The 360 unwinds the phase as follows:

1. First, it sums the phase increments between each pair of measured data points, then it takes the average "$P_{delta}$" over the entire set of points.
2. Next, it corrects the phase data by applying the following formula:

$P_{correct} = P_{measured} - Nx_{delta}$ (where $P_{measured}$ is the measured phase of the Nth data point).

Assuming there are fewer than 360 degrees of phase rotation between each data point, the above-described operation removes any net phase offset. The endpoints of the phase display then fall at the same phase value.

e. AUTO SCALE Key

Pressing this key autoscales the trace or traces of the active channel. When in one of the scaling menus, the 360 indicates this is happening by turning the menu entries red for 1 second. The new scaling values are then displayed on the menu and graticule. The resolution will be selected from the normal sequence of values you have available using the knob.

f. TRACE MEMORY Key

Pressing this key brings up menu NO1 (App. 33). This menu—which relates to the active channel—allows you to store data to memory, view memory, perform operations with the stored memory, and view both data and memory simultaneously. Four memories exist, one for each channel. This allows each channel to be stored and normalized independent of the other channels. Data from the trace memory may be stored in the disk or recalled from it. The SELECT TRACE MATH choice brings up menu NO2 (App. 34).

9. DISPLAY Menus

Apps. 30–37 show the menus associated with the GRAPH TYPE, S PARAMS, and REF DELAY keys. Apps. 38 and 39 show two menus that are representative of the twelve associated with the SET SCALE key.

ENHANCEMENT Keys and Menus (See FIG. 52)

a. OPTION MENU Key

This key is reserved for future options.

b. AVG/SMOOTH MENU Key

Pressing this key brings up the EM Menu (App. 40). When pressed during calibration sequence, it brings up the EM Cal Menu (App. 41) instead.

c. TRACE SMOOTH and AVERAGE Keys

The AVERAGE and TRACE SMOOTH keys select their respective functions on and off with the appropriate LED indicating when the function is selected.

d. IF BW Key

Pressing this key cycles between three different IF bandwidths. The applicable NORMAL, REDUCED, or MINIMUM LED lights to indicate selection.

OUTPUT Keys and Menus (See FIG. 52)

a. MENU Key

Pressing this key brings up menu PM1 (App. 42). This menu allows you to define what will happen every time you press the START PRINT key. Apps. 42–45 describe the menu options.

b. START PRINT Key

Pressing this key starts outputting the measured data as defined by the setup defined by the selected MENU key.

c. STOP PRINT Key

Pressing this key can result in any of the following actions if the printer is selected:
If the 360 is not outputting data, the key sends a form feed command to the printer.
If the printer is active, the key aborts the printing and sends a form feed command to the printer. Aborting the printing clears the print buffer.
Pressing this key if the printer is not selected and another form of output is active, the key aborts it but does not send a form feed to the printer.

d. PLOTTING FUNCTIONS

The 360 can plot an image of either the entire screen or subsets of it. Plots can be either full sizes or they can be quarter size and located in any of the four quadrants. You can select different pens for plotting different parts of the screen. You cannot, however, plot tabular data. The menus for selecting plotter functions are shown in Apps. 46–48.

SYSTEM STATE Keys and Menus (See FIG. 52)

a. DEFAULT PROGRAM Key

Pressing this key brings up the default menu. If pressed again, it recalls the factory selected default values for the control panel controls. The values are defined in Table 3-1.

CAUTION

Use of this key will destroy control panel and calibration set up data, unless they have been saved to disk.

TABLE 3-1

| Function | Default Setting |
|---|---|
| | Default Settings |
| Instrument State | Measurement Setup Menu Displayed |
| Measurement | Maximum sweep range of source and test set |
| | Source Power 0.0 dBm |
| | Resolution: Normal |

TABLE 3-1-continued

| Function | Default Setting |
|---|---|
| | Default Settings |
| Channel | (Quad (four-channel) display |
| | Channel 1 active |
| Display | Channel 1: $S_{11}$, 1:1 Smith Chart |
| | Channel 2: $S_{12}$, Log Magnitude and Phase |
| | Channel 3: $S_{21}$, Log Magnitude and Phase |
| | Channel 4: $S_{22}$, 1:1 Smith Chart |
| | Scale: 10 dB/Division or 90°/Division |
| | Offset: 0.000 dB or 0.00 degree |
| | Reference Position: Midscale |
| | Electrical Delay: 0.00 seconds |
| | Dielectric: 1.00 (air) |
| | Normalization: Off |
| | Normalization Sets: Unchanged |
| Enhancement | Video IF Bandwidth: Reduced |
| | Averaging: Off |
| | Smoothing: Off |
| Calibration | Correction: Off |
| | Connector: SMA |
| | Load: Broadband |
| Markers Limits | Markers On/Off: All off |
| | Markers Enabled/Disabled: All enabled |
| | Marker Frequency: All set to the start-sweep frequency, or start-time distance |
| | ΔReference: Off |
| System State | Limits: All set to reference position value: all off, all enabled) |
| | GPIB Addresses and Terminators: Unchanged |
| | Frequency Blanking: Disengaged |
| | Error(s): All cleared |
| | Measurement: Restarted |
| Output | Output Type: Printer (full screen, clear headers) |
| | Marker and Sweep Data: Enabled | b. UTILITY MENU Key

Figure 58:
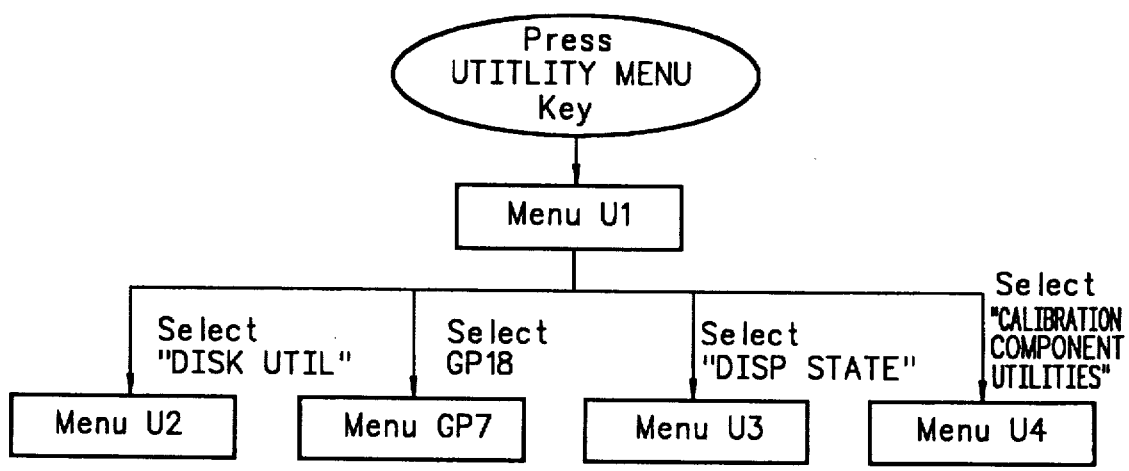
FIG. 58 is a utility menus key flow chart.

Pressing this key calls menu U1. This menu accesses subordinate menus to perform system, disk, and service utilities, as described by the flowchart in FIG. 58. The only functions performed directly from the U1 Menu are "Blank Frequency Information" and "Alternate Third Color Pen" (blue or cyan).

c. UTILITY MENU Key Menus

Apps. 50–55 describe the UTILITY MENU Key menus.

Disk Storage Interface and

General Purpose Menus a. The 360 has an integrally mounted disk drive of the 3½ inch removable media type. The format, files and directory are compatible with PC(MS)-DOS, Version 3.2.
1. Disk Format. Disks are MS-DOS compatible. The 360 formats them to have 80 data tracks per side on 2 sides, with 9 sectors of 512 bytes per sector. This yields a total of 720 K Bytes per disk. Any of the following file types, in any combination may be stored on the disk. Table 3-2 shows these file extensions.

TABLE 3-2

| File Type | File Extension |
|---|---|
| | File Extensions |
| Calibration, Normal | .CAL |
| Trace Memory | .NRM |

TABLE 3-2-continued

File Extensions

| File Type | File Extension |
|---|---|
| Measured Data | .DAT |
| Program | (no extension) |

2. Disk Files. You may find any of the following file-types on the 360 disk.
   a. Program Files. These are binary files used to load the operating program. Application-type programs cannot read them.
   b. Calibration Data Files: These are binary files used to store and retrieve calibration and other data. Application-type programs cannot read them. File size depends on calibration type. For example, 58 KBytes for 123 term and 501 points.
   c. Measured Data Files. These are ASCII files used to store actual measurement data. They can be read by application-type programs. File size depends on selected operations. For example, 25.6 KBytes for 501 points and 1 S-Parameter.
   d. Trace Memory Files. These are data stored in a display, rather than in a floating-point format. Application-type programs cannot read them. You use them to perform trace math operations on data. File sizes is 4 KBytes.

b. Disk User Interface

A disk is capable of holding up to 720K bytes of data. Using the data size assumptions above, a disk would be capable of holding:
12-Plus Calibration and Front Panel Setups or
180 Sets of Normalization Data or 28-Plus Sets of Measurement Data You can also store a downloaded operating program on the disk. However, this reduces the number of the above items that you could store. The disk format imposes a limitation of 112 on the total number of data items. This means the full 360 sets of normalization data could not be stored on the disk.

c. Disk and General Purpose Menus

1. Disk Menus. A set of DSK menus used to implement the disk functions are provided in Apps. 56–61.
2. General Purpose Menus. The menus shown in Apps. 62–64 appear as a result of choices made in certain of the Disk and Print menus.

Marker/Limits Keys and Menus (See FIG. 52)

a. Marker Menu Key

Pressing the MARKER MENU key calls Menu M1 (App. 65). This menu lets you toggle markers on and off and set marker frequencies, times or distances.

b. Marker Readout Key

1. Pressing this key calls menu M3 (App. 67) under the following conditions.
   (a) If the Δ Reference mode is off and
      (1) there is no selected marker, or
      (2) the selected marker is not in the sweep range.
   (b) If the Δ Reference mode is on and
      (1) the Δ Reference marker is not in the sweep range, or
      (2) no Delta ref marker has been selected.
2. Pressing this key calls menu M4 (App. 68) if the Δ Reference mode is off and the selected marker is in the current sweep rate (or time/distance).
3. Pressing this key calls menu M5 (App. 69) if the Δ Reference mode and marker are both on and the Δ Reference marker is in the selected sweep rate (or time/distance).

c. Markers Keys Menus

The menus associated with the two MARKERS keys are described in Apps. 65–69.

d. Limit Frequency Readout Function

The 360 is equipped with a Limit-Frequency Readout function. This function allows dB values to be read at a specified point (such as the 3 dB point) on the data trace. This function is only available for certain rectilinear graph-types. These graph-types are listed below.
1. Log Magnitude
2. Log Magnitude and Phase
3. Phase
4. Linear Magnitude And Phase
5. SWR
6. Group Delay App. 70 shows an example of a Limit Frequency (LF) menu.

e. Limits Key

Pressing this key calls the appropriate Limit (Ln) menu. The Limit menus are described in Apps. 71–81.

ERROR AND STATUS MESSAGES

Error and status messages are described below.

Message Types

The basic types of messages are categorized by the first digit of their code number, as follows:

| | |
|---|---|
| 000–099 | Power Up Self Diagnostic |
| | 000–091 Main #2 |
| | 020–039 Main #1 |
| | 040–049 IO Proc |
| | 050–099 Analog Hardware |
| 100–199 | System Status |
| | 100–109 Program Load |
| 110–129 | Program Initialization |
| | 130–149 Disk Related |
| | 150–169 Peripheral Related |
| 200–299 | Front Panel Operations |
| 300–399 | Measurement Related |
| 400–499 | GPIB |

Fatal Errors

Some errors are "fatal" in that they cause the instrument to terminate operations until you correct the condition causing the error. These errors are listed with an "X" in the column below marked "FATAL".

Message Definitions

Table 3-3 provides a listing of error message definitions.

TABLE 3.3

Error Codes and Status Messages

| Code | Message Text | Fatal | Meaning |
|---|---|---|---|
| | Self Test, Main Microprocessor #2 | | |
| 000 | FiFO RESET FAILURE | X | FiFO failed to reset, PCB A12 |
| 002 | PROM CHECKSUM FAILURE #2 | X | Prom failure, PCB A12 |
| 003 | BATTERY BACKED RAM FAILURE | X | Non volatile RAM failure, PCB A12 |
| 004 | EXTENDED MEMORY FAILURE | X | Failure in the extended memory, PCB A12 |
| 005 | DYNAMIC RAM FAILURE #2 | X | Dynamic RAM failure, PCB A12 |
| 006 | TIMER FAILURE #2 | X | Programmable timer failure, PCB A12 |
| 007 | INTERRUPT CONTROLLER FAILURE #2 | X | Interrupt controller failure PCB A12 |
| 008 | NUMERIC PROCESSOR FAILURE #2 | X | Numeric processor failure, PCB A12 |
| 009 | FRONT PANEL INTERFACE FAILURE | X | Interface failure, front panel, PCB A12 |
| 010 | PRINTER INTERFACE FAILURE | X | Printer interface failure PCB A12 |
| | Self Test, Main Microprocessor #1 | | |
| 020 | FiFO TO #2 FAILED RESET | X | Interface failure to FiFO, PCB A12 |
| 022 | FiFO TO I/O FAILED RESET | | Interface failure with FiFO PCB A13 |
| 023 | PTOM VHRVKDUM GSILUTR 31 | X | Checksum error, PROM PCB A13 |
| 024 | DYNAMIC RAM FAILURE #1 | X | Dynamic RAM failure, PCB A13 |
| 025 | TIMER FAILURE #1 | X | Programmable timer failure PCB A13 |
| 026 | INTERRUPT CONTROLLER FAILURE 31 | X | Interrupt Controller failure PCB A13 |
| 027 | DISK DRIVE CONTROLLER FAILURE | | Disk drive controller failure, PCB A13 |
| 028 | DISK DRIVE FAILURE | | Disk drive SEEK failure, PCB A13 |
| 029 | NUMERIC PROCESSOR FAILURE 31 | X | 8087 math coprocessor failure |
| 030 | PROM CARTRIDGE CHECKSUM ERROR | | PROM cartridge failure PCB A13 |
| 031 | DISK DRIVE NOT READY FOR TEST | | Diskette is not in disk drive |
| 040 | PROM CHECKSUM FAILURE I/O | X | PROM failure, PCB A11 |
| 041 | RAM FAILURE I/O | X | RAM failure, PCB A11 |
| 042 | TIMER/INTERRUPT LOOPBACK FAILURE | X | Programmable timer failure, PCB A11 |
| 043 | GPIB INTERFACE FAILURE I/O | | GPIB failure, PCB A11 |
| 044 | FiFO FAILURE I/O | X | FiFO failure, PCB A11 |
| 050 | A1 COMMUNICATIONS FAILURE | | L01 Phase Lock PCB Error |
| 051 | A2 COMMUNICATIONS FAILURE | | L02 Phase Lock PCB Failure |
| 052 | A3 COMMUNICATIONS FAILURE | | Cal/Third Local Oscillator PCB Failure |
| 053 | A4 COMMUNICATIONS FAILURE | | Analog to digital PCB failure |
| 054 | A5 COMMUNICATIONS FAILURE | | 10 MHz Reference PDB failure |
| 055 | A6 COMMUNICATIONS FAILURE | | Source lock PCB failure |
| 056 | A10 COMMUNICATIONS FAILURE | | Bandswitch blank/sync PCB |
| 057 | 8 BIT A/D CONVERTER FAILURE | | Failure A/D PCB A4 |
| 058 | STEERING DAC FAILURE | | Failure A/D PCB A4 |
| 059 | 12 BIT A/D OR STEERING DAC FAILURE | | Failure A/D PCB A4 |
| 060 | TEST SET NOT CONNECTED OR NOT WORKING | | General failure of test set |
| 061 | TEST SET CHAN A CAL PHASING FAILURE | | Test set CHAN A failure |
| 062 | TEST SET CHAN A CAL LEVEL FAILURE | | Test set CHAN A failure |
| 063 | TEST SET CHAN A GAIN FAILURE | | Test set CHAN A failure |
| 064 | TEST SET CHAN A PHASE RANGING FAILURE | | Test set CHAN a failure |
| 065 | TEST SET CHAN B CAL PHASING FAILURE | | Test set CHAN B failure |
| 067 | TEST SET CHAN B GAIN FAILURE | | Test set CHAN B failure |
| 068 | TEST SET CHAN B PHASE RANGING FAILURE | | Test set CHAN B failure |
| 069 | TEST SET REF CHAN CAL PHASING FAILURE | | Test set REF CHAN failure |
| 070 | TEST SET REF CHAN CAL LEVEL FAILURE | | Test set REF CHAN failure |
| 071 | TEST SET REF CHAN GAIN FAILURE | | Test set REF CHAN failure |
| 072 | TEST SET REF CHAN PHASE RANGING | | Test set REF CHAN failure |
| | System Status, Program Load | | |
| 100 | DISK DRIVE NOT READY | X | Program failed to load from disk, (disk installed) |
| 101 | PROGRAM DATA ERROR | X | Program failed to load from disk |
| 102 | PROGRAM FILE MISSING | | Loader cold not find system files |
| 103 | DISK ERROR | | The 360 is unable to read the diskette |
| 104 | UNKNOWN DISK ERROR | | loader failed a consistency check |
| 105 | PROGRAM DATA ERROR ON #2 | | Program for processor #2 failed to load |

TABLE 3.3-continued

Error Codes and Status Messages

| Code | Message Text | Fatal | Meaning |
|---|---|---|---|
| | Program initialization | | |
| 110 | SOURCE ID FAILURE | | No sweeper ID on GPIB; sweeper may not be connected |
| 111 | TEST SET NOT CONNECTED | X | Initialization detects a discrepancy. |
| 112 | TEST SET FREQ. RANGE DOES NOT MATCH SOURCE | X | Initialization detects a discrepancy. |
| 113 | CAL DATA NOT FOUND; CHANGE DISK AND PRESS <ENTER> | | File not found on disk with name matching that in battery pack RAM. |
| 114 | PROGRAM ERROR | X | Program corrupted. |
| 115 | PROCESSOR COM ERROR | X | FIFO Synch problem Disk Related. |
| | Program Initialization, Disk Related | | |
| 131 | DISK READ ERROR | | Hard error reading from disk |
| 132 | DISK WRITE ERROR | | Hard error writing to disk |
| 133 | FILE DELETION ERROR | | Write protect tab is in "read only" position. |
| 134 | DISK NOT READY | | Disk not in unit or not formatted |
| 135 | DISK WRITE PROTECTED | | Write protect tab is in "read only" position. |
| 136 | OUT OF DISK SPACE | | Disk file space full |
| 137 | FILE IS INCOMPATIBLE | | File is not a 360 data or program file. |
| 138 | NO SPACE FOR NEW DATA FILE | | Disk file space full |
| 139 | FILE MARKED READ ONLY | | Read-only attribute set on file |
| 140 | NO FILES REMAIN TO OVERWRITE | | All files of the type have been deleted. |
| 141 | NO FILES REMAIN TO DELETE | | All files of the type have been deleted. |
| | Program initialization, Peripheral | | |
| 170 | PRINTER NOT READY | | Printer "off line" or not connected. |
| 171 | PLOTTER NOT READY | | Plotter "off line" or not connected. |
| | Control Panel | | |
| 200 | SELECTED FREQUENCY OUT OF CAL RANGE | | Cal. range does not include selected frequency. |
| 201 | MARKERS SELECTED FOR READOUT NOT ACTIVE IN SWEEP RANGE | | Sweep range does not include selected frequency. |
| 208 | OUT OF RANGE | | Attempted to enter an out-of-range parameter. |
| 209 | START GREATER THAN STOP | | Attempted to a set start frequency that was greater than the stop frequency. |
| 210 | OUT OF RANGE .20 PERCENT MAX | | Attempted to enter a smoothing or group delay factor that was greater than 20%. |
| 213 | OUT OF H/W RANGE | | Attempted to enter a frequency that is outside of the system hardware range. |
| 216 | TOO MANY POINTS. | | Attempted to set too many discrete frequency points. |
| 217 | TOO FEW POINTS 2 MINIMUM | | Attempted to set too few discrete frequency points. |
| 219 | DISCRETE FREQS LOST | | Setup changed in N-discrete frequency mode. |
| 220 | OUT OF SWEEP RANGE | | Attempt to set marker outside sweep range. |
| 221 | OPTION NOT INSTALLED | | The selected option is not installed. |
| 222 | MEAS. DATA NOT AVAILABLE FOR STORAGE | | No measured data on channel to be stored. |
| 223 | NO STORED MEMORY DATA | | No data available in memory for channel. |
| 224 | SYSTEM BUS ADDRESSES MUST BE UNIQUE | | Attempt to set GPIB addresses to same value. |
| 225 | MEMORY LOCATION | | no cal exists. |
| 226 | MEMORY LOCATION CORRUPTED | | Saved state data is invalid |
| 227 | SETUP INCONSISTENT RECALL ABORTED | | Saved state not compatible with hardware or software versions |
| 228 | WINDOW TOO SMALL | | Attempt to set start greater than or equal to stop. |
| 229 | OUT OF WINDOW RANGE | | Attempt to set marker outside start to stop range. |
| 230 | ATTENUATOR UNAVAILABLE | | Selected attenuators not available in test set |
| 231 | START MUST BE LESS THAN STOP | | Attempt to set start greater than or equal to stop in marker sweep. |
| 232 | ILLEGAL IN C.W. MODE | | Attempt to readout limit frequency. |
| 233 | ILLEGAL IN TIME DOMAIN | | Attempt to readout limit frequency. |
| 234 | BOTH LIMITS MUST BE ON | | Attempt to readout limit frequency. |
| 235 | Stop is Over Range | | Discrete fill parameters cause stop to go over hardware range. |
| 238 | Out of Range 10% Minimum | | Attempt to set pen speed to below 10% |
| 270 | UNCALIBRATED | | Channel has S parameter for which calibration does not exist. |

TABLE 3.3-continued

Error Codes and Status Messages

| Code | Message Text | Fatal | Meaning |
|---|---|---|---|
| 271 | PRINTER NOT READY | | Printer not connected or paper out. |
| 272 | TOO MUCH PRINT DATA | | Print buffer is full. Reduce number of channels or data points. |
| 273 | PLOTTER NOT READY | | Plotter not connected. |
| 280 | CAL INVALID | | Calibration is incorrect for S parameter displayed. |
| 281 | TIME DOMAIN INVALID | | time domain cannot be used in current setup |
| 282 | GROUP DELAY INVALID | | Group delay cannot be used in current setup |
| 283 | GATE MUST BE ON | | Time Gate with gate off. |
| 284 | SMOOTHING INVALID | | Attempt to use smoothing while in C.W. mode |
| 285 | MEMORY DATA INVALID | | Setup has changed since data was stored. |
| *Measurement Related* | | | |
| 300 | LOW IF | | Insufficient signal level detected: Device under test may not be connected. |
| 301 | LOCK FAILURE | | RF source failed to lock to reference oscillator in 360 testset |
| 302 | A/D FAILURE | | Analog to Digital convertor not functioning in 360 mainframe. |
| 303 | RF OVERLOAD | | Test signal level is too high: reduce source level or add attenuation |
| 310 | SWPR ID FAILURE | | Communications lost with RF source |
| 311 | SWPR SELF TEST FAILURE | | RF source failed power on self test program |
| 312 | NO TEST SET | | Test set not connected. Reconnect and cycle power to clear |
| *GPIB Related* | | | |
| 400 | GPIB ERROR | | Data transmission error on GPIB |

Ill CONTROL PANEL OPERATION

DATA DISPLAYS

Display Modes and Examples

The 360 displays measurement data using a "Channel Concept." This means that each channel can display a different S-Parameter and a different graph type for each S-Parameter. As you select each channel the graph type, scaling, reference delay, S-Parameter, etc. associated with that channel appear on the screen. You can display the same S-Parameter on two or more channels. FIG. 59 shows the possible displays.

Graph Types

Several graph-types are possible: polar, rectilinear, Smith chart. The rectilinear graph-type may be magnitude, phase, magnitude and phase, SWR, group delay, real, imaginary, and real and imaginary. The Smith chart graph-type is one specifically designed to plot complex impedances.

a. Graph Data Types

The data types (real, imaginary, magnitude, phase) used in the displayed graph-types reflect the possible ways in which S-Parameter data can be represented in polar, Smith, or rectilinear graphs. For example: Complex data—that is, data in which both phase and magnitude are graphed—may be represented and displayed in any of the ways shown below.
1. Complex Impedance; displayed on a Smith chart graph.
2. Real and imaginary; displayed on a real and imaginary graph.
3. Phase and magnitude components; displayed on a rectilinear (Cartesian) or polar graph.

In addition to the above, the 360 can display the data as a group delay plot. In this graph-type, the group-delay measurement units are time. Those of the associated aperture are frequency and SWR. The quantity group delay is displayed using a modified rectilinear-magnitude format. In this format the vertical scale is in linear units of time (ps-ns-µs). With one exception, the reference-value and -line functions operate the same as they do with a normal magnitude display. The exception is that they appear in units of time instead of magnitude.

Frequency Markers a. Marker Annotation

Figure 60:
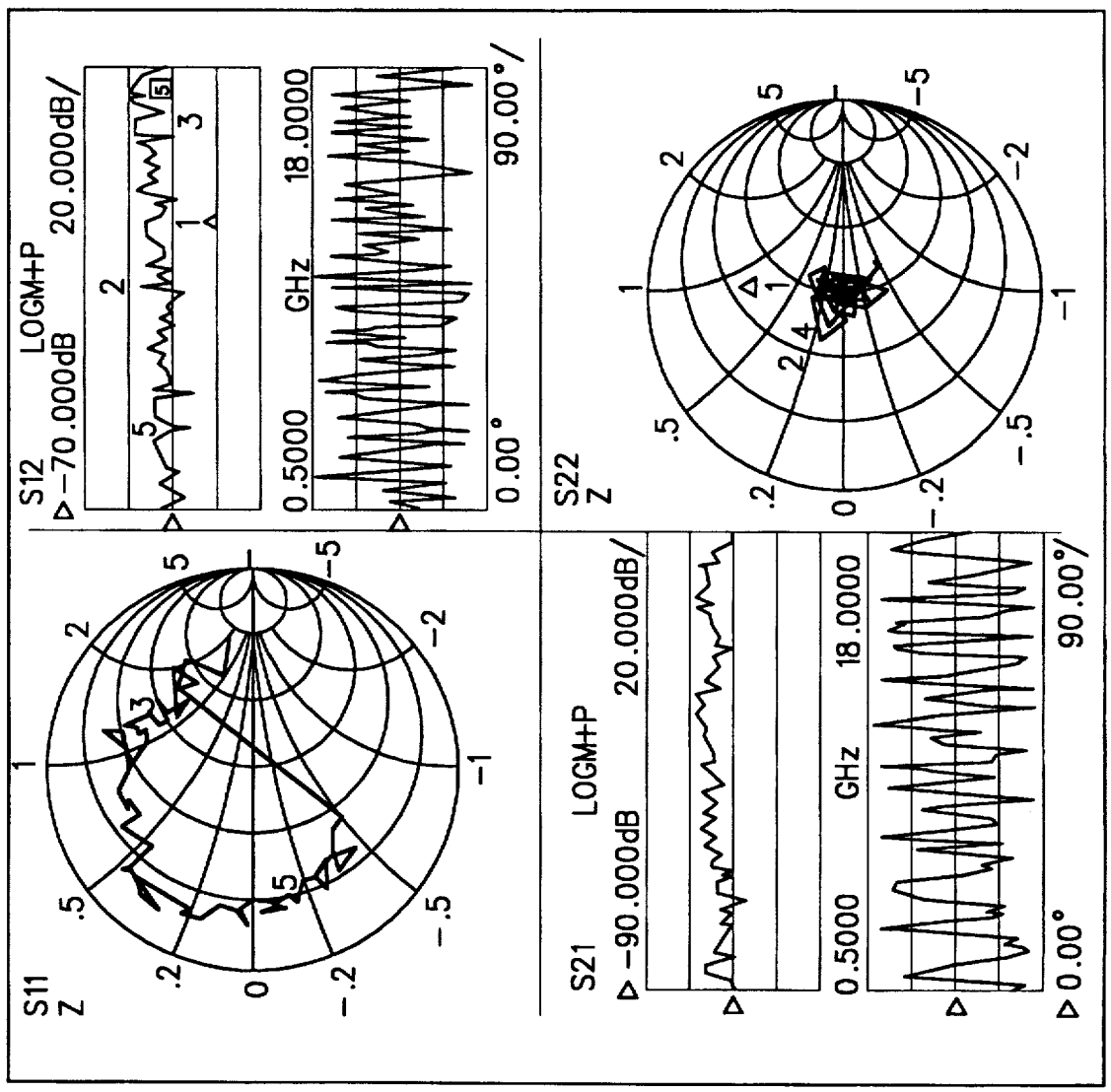
FIG. 60 illustrates marker annotation for different graph-types.

FIG. 60 shows how the 360 annotates markers for the different graph-types. Each marker is identified with its own number. When a marker reaches the top of its graticule, it will flip over and its number will appear below the symbol.

When markers approach the same frequency, they will overlap. Their number will appear as close to the marker as possible without overlapping.

Details of the method whereby the system 100 of the present invention displays Markers is described in the commonly assigned co-pending Patent Application entitled, METHOD OF DISPLAYING GRAPHS WITH MARKERS, invented by David Peter Finch, having Ser. No. 176,097, filed on the same date as this Application and which is hereby expressly incorporated herein in its entirety.

b. Marker Designation

Depending on menu selection, you may designate a marker as the "active" or the "delta reference" marker. If you choose a marker to be active—indicated by its number being enclosed in a square box—you may change its frequency or time (distance) with the Data Entry keypad or knob. If you have chosen it to be the delta-reference marker, a delta symbol (Δ) appears one character space above the marker number (or one character space below a "flipped" marker). If the marker is both active and the delta reference marker, the number and the delta symbol appear above (below) the marker. The delta symbol appears above (below) the number.

Limits

Limit lines function as settable maximum and minimum indicators for the value of displayed data. These lines are settable in the basic units of the measurement on a channel-by-channel basis. If the display is rescaled the limit line(s) will move automatically and thereby maintain their correct value(s).

Each channel has two limit lines (four for dual displays), each of which may take on any value. Limit lines are either horizontal lines in rectilinear displays or concentric circles around the origin in Smith and polar displays.

Status Display

In addition to the graticules, data, markers, and marker annotation, the 360 displays certain instrument status information in the data display area. This information is described below.

a. Reference Position Marker

The Reference Position Marker indicates the location of the reference value. It is displayed at the left edge of each rectilinear graph-type. It consists of a triangular symbol identical to the cursor displayed in the menu area. You can center this symbol on one of the vertical graticule divisions and move it up or down using the "Reference Position" option. When you do this, the data trace will follow this marker. If you also select the value option; the marker will remain stationary and the trace will move with the maximum allowable resolution. When changing from a full-screen display or a half- or quarter-screen display, the marker will stay as close to the same position as possible.

b. Analog Instrument Status

Figure 61:
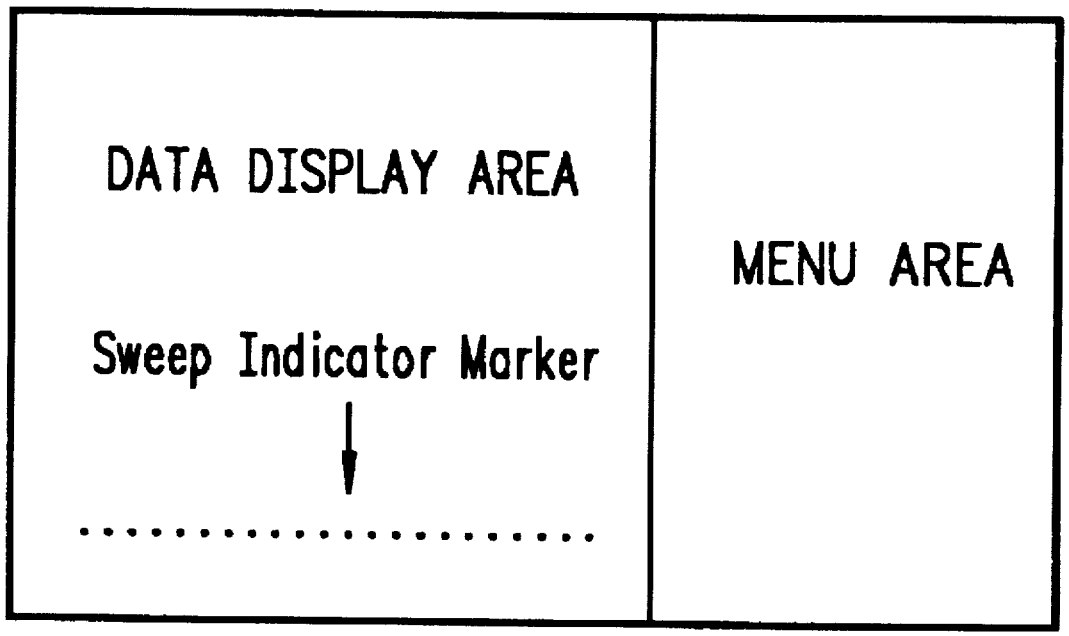
FIG. 61 shows the data, menu and sweep indicator areas of the display.

The 360 displays analog-instrument-status messages (in red when appropriate) in the upper right corner of the data-display area (FIG. 61). They appear in the same vertical position as line 2 of the menu area. If more than one message appears, they stack up below that line.

c. Measurement Status

The 360 displays measurement-status messages (in red when appropriate) in the upper-right corner of the graticule (channel) to which they apply.

d. Sweep Indicator Marker

The sweep indicator marker (FIG. 61) indicates the progress of the current sweep. When measuring quiet data, that is, data having few or no perturbations, this indicator assures that the instrument is indeed sweeping.

The indicator, a blue horizontal line segment 15 pixels long by 1 pixel high, appears along the bottom edge of the data display area. Its position is proportional to the number of data points measured in the current sweep. When this sweep completes, the line segment will have traveled the full width of the data display area. If the sweep should stop for some reason, the position of the indicator will stop changing until the sweep resumes.

Data Display Control a. Active Channel Selection

Figure 62:
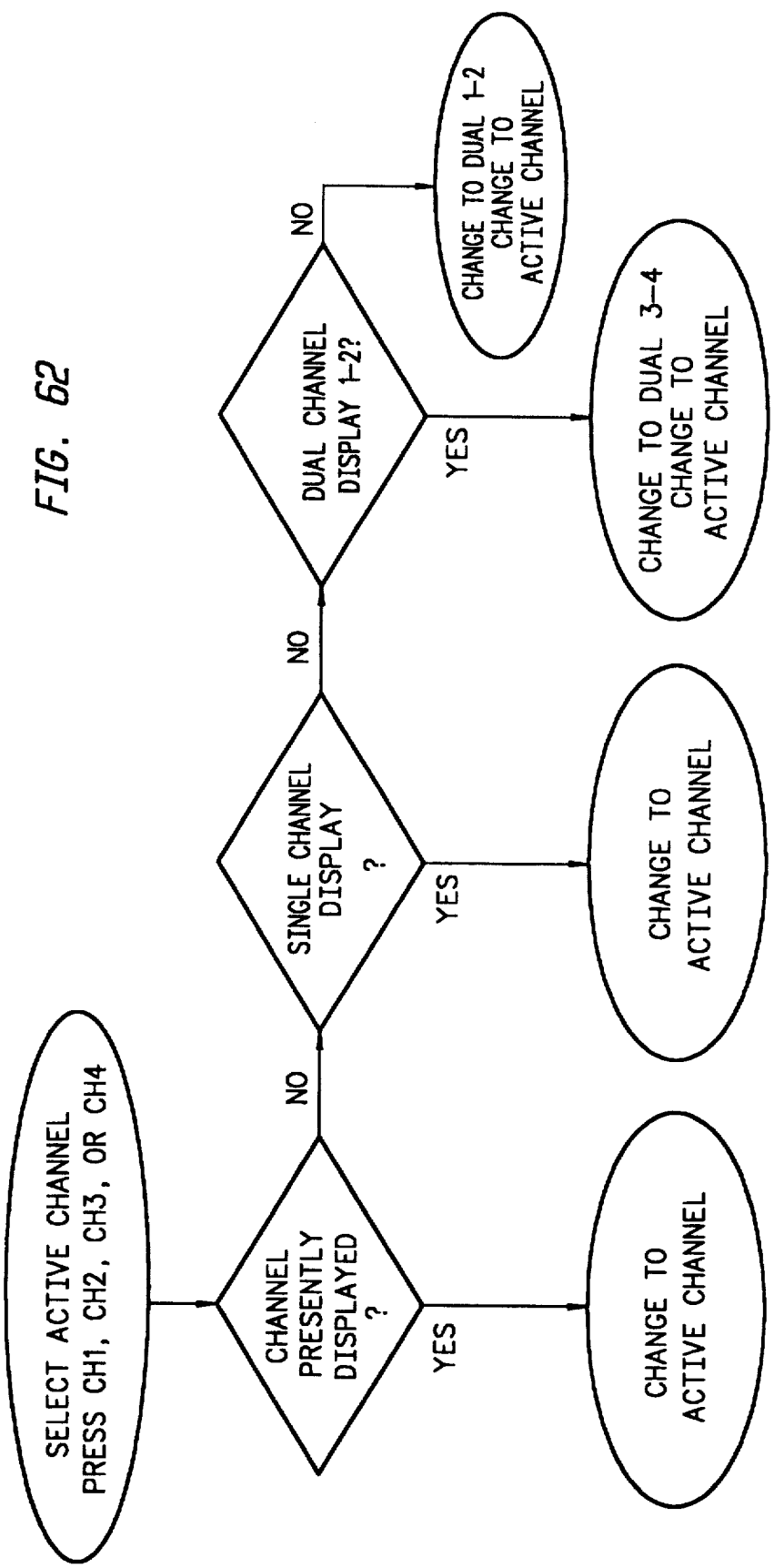
FIG. 62 is a flow chart of a display control algorithm for selection of an active channel.

FIG. 62 shows the algorithm that the 360 uses to display the active channel.

b. S-Parameter Selection

If you select a new S-Parameter using Menu SP (App. 30), it appears on the then-active channel in the same graph-type it was displayed-in last. Table 3-4 shows the displayable S-Parameters based on the type of correction you have in place. If you attempt to display other S-Parameters, an error message displays. In cases when there is no last-displayed S-Parameter stored, the display will default as shown in the Table 3-4.

TABLE 3-4

| Display Types and Defaults by Correction Type | | | | | |
|---|---|---|---|---|---|
| | Displayable | Defaults | | | |
| Correction Type | S-Parameters | CH1 | CH2 | CH3 | CH4 |
| None | All | $S_{11}$ | $S_{12}$ | $S_{21}$ | $S_{22}$ |
| Frequency Response | | | | | |
| Transmission | S21 | $S_{21}$ | $S_{21}$ | $S_{21}$ | $S_{21}$ |
| Reflection | S11 | $S_{11}$ | $S_{11}$ | $S_{11}$ | $S_{11}$ |
| Both | S11, S21 | $S_{11}$ | $S_{11}$ | $S_{21}$ | $S_{21}$ |
| 1-Path, 2-Port | S11, S21 | $S_{11}$ | $S_{11}$ | $S_{21}$ | $S_{21}$ |
| 12-Term | All | $S_{11}$ | $S_{12}$ | $S_{21}$ | $S_{22}$ |
| Reflection Only | S11 | $S_{11}$ | $S_{11}$ | $S_{11}$ | $S_{11}$ |

If you select an S-Parameter (or if the 360 defaults to one) for which there was no last-displayed graph-type, the display defaults to the following:

$S_{21}$ and $S_{12}$: Log Magnitude and Phase
$S_{11}$ and $S_{22}$: Smith.

c. Data Display Update

When you change a control panel parameter that affects the appearance of the display, the entire display changes immediately to reflect that change. For example, if you press AUTOSCALE, the entire display rescales immediately. You do not have to wait for the next sweep to see the results of the change.

The following parameters are supported for this feature: Reference Delay, Offset, Scaling, Auto Scale, Auto Reference Delay, Trace Math, IF BW, and Smoothing. In the case of Averaging, the sweep restarts.

If the knob is used to vary any of the above parameters, the change occurs as the measurement progresses, that is, the continuing trace will reflect the new setting(s).

When you change a marker frequency or time (distance), the readout parameters will change. The changes reflect by the marker's new frequency, using data stored from the previous sweep.

d. Display of Markers

Once you have selected a marker display, it will always display. It does not matter what resolution you have selected. When you set a marker to another calibrated frequency the marker will continue to display. It will display even if its frequency is not consistent with the data points in the lower-resolution sweep.

e. Hard Copy and Disk Output

In addition to the CRT display, the Model 360 is capable of outputting measured data as a
1. tabular printout,
2. screen-image printout,
3. pen plot,
4. disk image of the tabular data values.

The selection and initiation of this output is controlled by the OUTPUT keys.

f. Tabular Printout

The tabular printout formats are used as follows:
1. Tabular Printout Format (FIG. 63): Used when printing three or four channels.
2. Alternate Data Format (FIG. 64): Used when printing one or two channels.

In tabular printouts, the 360 shifts the data columns to the left when an S-Parameter is omitted. Leading zeroes are always suppressed. The heading (Model, Device I/O, Date, Operator, Page) appears on each page. When using the 360SS sweeper, frequencies are in the format "XX.XXXX."

g. Screen-Image Printout

In a ScreenImage Printout, the exact data displayed on the screen is dumped to the printer. The dump is in the graphics mode, on a pixel by pixel basis. A header (FIG. 65) prints before the screen data prints.

h. Plotter Output

The protocol used to control plotters is "HP-GL" (Hewlett-Packard Graphics Language). HP-GL contains a comprehensive set of "vector graphics" type commands. These commands are explained in the Interfacing and Programming Manual for any current model Hewlett-Packard plotter, such as the 7470A.

When the plotter is selected as the output device, it is capable of drawing the graph shown on the screen or of drawing only the data traces(s), so that multiple traces may be drawn on a single sheet of paper (in different colors, if needed).

i. Disk Output

The 360 can write-to or read-from the disk all measured data. This data is stored as an ASCII file in the exact same format as shown in FIG. 63. If read back from the disk, the data is output to the printer. There, it prints as tabular data.

TRANSMISSION AND REFLECTION MEASUREMENTS

This discussion provides information on general measurement considerations and transmission and reflection measurements using the 360.

Setup and Calibration Procedures and

Measurement Options

To get started, apply power to the system. Do this by first turning on the 360SS45 or 69 source power switch then the analyzer power—the order is important. If the analyzer is powered-up before the source, it will not be able to find the source and will probably fail the self test.

After turning on the power, allow the system to warm up for at least 30 minutes before operation.

In normal operation, the system comes on line in the state that it was in when last turned off. If you want to return the system to its default state, you can do so by pressing the DEFAULT PROGRAM key twice.

The default parameters provide a known starting point. For example, they reset the start and stop frequencies to their maximum values, the source power to 0 dBm, and the display resolution to 501 data points.

The Sweep Setup menu should now appear on the display (it also can be displayed using the SETUP MENU key). If you like, you can select a new start frequency, stop frequency, or source power.

The actual power level at Port 1 is about 10 dB less than the source power level due to internal losses in the test set.

If the 360 system has an Active Device Test Set, you can further reduce the power level at Ports 1 and 2 with the built-in attenuators. Using the Reduced Test Signals option in the Sweep Setup menu, you can change the settings of the Ports 1 and 2 source attenuators over a range of from 0 to 70 dB. The Port 2 test attenuator has a range of from 0 to 40 dB (in 10 dB steps). Selecting the BEGIN CAL key starts the calibration process. The Calibration menus step you through the calibration process, as follows:
1. Select the type of calibration desired.
2. Select the frequency range of calibration. You can choose the normal 501 points, CW (one point), or N-discrete frequencies (from 2 to 501 points).
3. Install the calibration kit devices to the test ports as instructed by the menu. Both the capacitance coefficients for the open and the offset lengths for the Open and Short can be modified or defined.

When the calibration is completed, you can store the calibration data in the internal memory or on a disk. You are now ready to install the test device and proceed with the measurement. At this point you have a number of measurement options to consider such as displays, markers, limits, outputs, sweeps, and enhancements.

You can select any of the available graph types and display them for any calibrated parameter on any of the four channels.

Up to six markers are available. Using the Marker Menu, you can set the frequency of each one, you can set each one in the delta marker mode, and you can set each marker's level to maximum or minimum.

In some cases—such as in a production environment—limit lines are desirable. Options within the menu called up using the LIMITS key, provide two limit lines for each channel. These limit lines function with all of the graph types, including Smith and admittance. The color of the limit lines differs from that of the measurement trace. This allows for easy analysis of results.

The Output Menu (App. 42) gives you a choice between a printer and a colored-pen plotter. It also lets you choose the data-output type, output head, and disk output functions.

To output the display, press the START PRINT key. The default setting provides for a full display printout from the associated printer.

To label the output, select Setup Output Headers in the Output Menu or press the DEVICE ID key.

On the output to the printer, plotter, or disk, a menu then appears that lets you specify the device name/serial number, the dater and the operator's name (App. 43).

Sweep frequencies can be changed with the calibration applied as long as the frequencies are between the calibration start and stop frequencies.

Additionally, a marker sweep can be selected from the Setup Menu. This allows you to sweep between any two active markers so long as the frequency of each falls between the calibrated start and stop frequencies.

Using the DATA POINTS key, you can select the number of data points for optimal resolution-vs-speed.

Finally, you can enhance the measurement data by reducing the IF bandwidth and using averaging and/or smoothing (see below).

Change the IF bandwidth by selecting the IF BW key.

Set the averaging and smoothing values by selecting the AVG/SMOOTH MENU key.

Turn on the averaging and smoothing using the TRACE SMOOTH and AVERAGE keys, which have LED's to let you know that the enhancement is being applied.

Transmission and Reflection Measurements

Before going any further, let us take a few moments to review some basic principles of network measurements. First, we apply incident energy to the input of a test device. If the device's input impedance differs from the measurement system's impedance, some of that energy is reflected. The remainder is transmitted through the device. We call the ratio of reflected-to-incident energy the reflection coefficient. The ratio of transmitted-to-incident energy we call the transmission coefficient.

These ratios are complex quantities that have magnitude and phase components. Using vector representation, the vector magnitude is the ratio of reflected-to-incident magnitude (or transmitted-to-incident magnitude), while the vector phase is the difference in phase between the incident energy and the reflected/transmitted energy.

The measurement reference for the incident energy is the point at which the device connects to the measurement system. We call this point the reference plane. The incident energy at the reference plane is defined as having a magnitude of 1 and a phase of 0 degrees. We establish this during the calibration.

The ratio of reflected and transmitted energy to the incident energy can be represented by a number of different measurements and units, as shown below.

The default display for reflection measurements is the Smith chart. The default display for transmission measurements is the Log Magnitude and Phase graph.

The Smith chart is a convenient way to display device impedance and is a useful aid for the graphical design and analysis of microwave circuits.

Let us assume both that our system is already calibrated and that we have equalized the system for the test port in use. We would then 1. Connect the Short. A Short always appears as a dot at the left-most edge of the Smith chart's horizontal axis.
2. Connect a Termination. Now you will see another dot located at the center (1+j0) of the chart (this assumes a 50-ohm load).
3. Connect the Open. An Open appears as an arc on the chart's right edge. This is due to the fringing capacitance of the Open standard.

Now let us perform a reflection measurement on a 20 dB attenuator over the 1-to-18 Ghz range.

We need to determine the setup, calibration, and measurement requirements.

A known good starting point is to reset with DEFAULT PARAMETERS. Since our measurement lies between 1 and 18 GHz, set the Start and Stop frequencies using the Sweep Setup menu that appears on the display following system reset.

Let us perform a simple calibration, REFLECTION ONLY, which uses an open, a shorts and a broadband load. To do this, press the BEGIN CAL key and follow the directions in the menu area.

When you complete the calibration, the "CHANNEL 1 WITH S11" Smith chart appears on the display. Now 1. Select the Log Magnitude display and install the attenuator.
2. Select AUTOSCALE to optimize the display data.
3. Use Markers 1 and 2 to find the maximum and minimum impedance.

Now let us perform transmission measurement on the same 20 dB attenuator over the same frequency range. We will follow the same steps as before, but this time we will use additional features.

Once again, reset the system using the DEFAULT PARAMETERS key.

In this calibration we will select the N-Discrete Frequencies menu option and step all frequencies in increments of 50 MHz.

When the calibration is complete, Channel 1 will display "S12 FORWARD TRANSMISSION WITH LOG MAGNITUDE AND PHASE." You can use Markers 1 and 2 to find the maximum and minimum values of the attenuators insertion loss.

LOW LEVEL AND GAIN MEASUREMENTS

This discussion provides methods and techniques for making gain and low-signal-level measurements. It is divided into 360 system considerations and test device considerations.

360 System Considerations

The 360 system is limited in its ability to test low-signal levels by its dynamic range and low signal-to-noise-power ratio. First we will discuss dynamic range, which is the difference between the maximum and minimum acceptable signal levels (Dynamic Range=$P_{max}-P_{min}$).

a. Dynamic Range

The dynamic range of the 360 is limited by the 0.1 dB compression level of the samplers at high signal levels. It is further limited at low signal levels by leakage signals and noise.

The 0.1 dB compression level is on the order of −10 dBm. The 360 is designed such that all other conversions compress at a much greater level, which leaves the samplers as the main source of non-linearity.

The small signal response is limited by errors due to noise and leakage signals. The leakage signals are both from within the 360 and at the device-under-test (DUT) connectors.

The detected signal is the vector sum of the desired signals, the noise signals, and the leakage signals. These signals introduce an error or uncertainty.

Some of the possible leakage paths for the 360 are the transfer switch, the frequency conversion module, and leakage from the DUT. The system limits these leakages to greater than 100 dB. The 12-term error correction can reduce this leakage to better than 110 dB at 18 Ghz and 90 dB at 40 Ghz.

The DUT connectors should have internally captivated center pins. Those connectors which use external pins to captivate the center conductor should have silver loaded epoxy on the pins to reduce radiation to better than 90 dB.

b. Signal-to-Noise Power Ratio

The signal-to-noise power ratio for each of the test or reference channels is given by the formula S/N Ratio=Signal Power/Noise Power Where "signal power" is the power level of the 83.33 Khz IF signal at the internal synchronous detectors, and "noise power" is total power contained within the bandwidth of the bandpass filter at 83.33 Khz.

The uncertainty, or error, in a measurement is a function of the amplitude of leakage signals and of the noise level. The uncertainty in the measurement of magnitude and phase of the S-parameters are calculable.

The most difficult types of measurements 1 are those that exercise the full dynamic range of the 360, such as filters. Filter measurements are examples of where one must observe both low-insertion loss (in the passband) and high attenuation (in the stop band).

There are two techniques that you can use to optimize the signal-to-noise ratio. They are (1) maximizing the RF signal level and (2) using signal enhancement.

To maximize the RF signal level, use the default settings of the signal source. The 360SS45 or 69 defaults to 0 dBm—a power level that both maximizes dynamic range and optimizes linearity.

The 360 provides two enhancements for improving the signal-to-noise ratio: IF bandwidth reduction and averaging.

Reducing the IF bandwidth is a primary method for enhancing accuracy. The 360 has a choice of three bandwidths available from the front panel: Normal (10 Khz), Reduced (1 Khz), and Minimum (100 Hz). The noise level should decrease by a factor equal to the square root of the IF bandwidth. Using IF Bandwidth reduction makes for faster measurements than with the use of an equivalent amount of averaging.

Averaging is another way to improve accuracy. The improvement is proportional to the square root of the number of averages. The improvement from averaging, however, comes at the expense of increased sweep time.

EXAMPLE

Using 1 Khz BW reduction and 10 averages, you would increase the signal-to-noise ratio by 7.6 dB but would lengthen the time required for the measurement by a factor of 4.3. This example assumes a constant signal power.

Test Device (DUT) Considerations

In order to test a device, the required input RF level and the expected device output RF level must be determined.

The RF level at Port 1 must be set for the device input RF power level required. The power level at Port 1 is about 10 dB less than the RF source power level, or about −10 dBm. Attenuation can be added in steps of 10 dB up to 70 dB using the built-in source attenuator in the Models 3620 and 3621 Active Device Test Sets available for WILTRON Co.

The RF level into Port 2 should be kept to −10 dBm or less to ensure optimum linearity and to protect internal components from damage. The never-to-exceed RF level into either Port 1 or Port 2 is +20 dBm. You can add up to 40 dB of attenuation (in 10 dB steps) into Port 2 using the built-in test attenuator in the active device test sets.

If you are using a test set that does not have built-in attenuators, you should use external attenuators on Port 1 and Port 2 as needed. However, the use of external attenuators invalidates input and output match measurements; whereas, the built-in attenuators are compensated by the calibration and do not affect reflection measurements.

Before calibration, ensure that the test setup is correct by setting the power level and adding attenuation as needed.

The 360 uses enhancements in the calibration to ensure a wide dynamic range. It automatically selects the REDUCED IF bandwidth front panel setting and varies the number of averages with the calibration device. Terminations require the most averages.

If desired, the IF bandwidth and number of averages can be specified for the calibration measurements. Using 100 average (AVG=100) appears to be sufficient for most measurements.

To obtain the maximum performance from the 360 for measurements of attenuation, you can use the capability of the N discrete frequency calibration to spot check measurements in the frequency band of interest.

As described above, the measurement procedure is straightforward.

Wide Dynamic Range Device—Filter

Since you do both low-insertion-loss and high-attenuation measurements simultaneously, use the maximum RF signal level and no attenuation. Selecting the REDUCED IF BW setting and 100 averages will likely suffice for this kind of measurements.

High Gain Device—FET

This device has a typical 15 dB gain and requires an input level of about −30 dBm. Set the Port 1 Source Attenuator to 20 dB. Since the device RF output level is −15 dBm (−30 dBm 15 dB[gain]=−15 dBm) no attenuation is needed at Port 2.

Medium Power Device—Amplifier

Measure the small signal parameters of a 10 dB gain device that requires an input power level of −10 dBm. Here, Port 1 will have no attenuation. The device RF output level is −10 dBm. This level equals 0 dBm (−10 dBm+10 dB[gain]=0 dBm) into Port 2 and will cause compression in the measurement. At least 10 dB of test attenuation will be needed at Port 2, which will reduce the Port 2 RF level to −10 dB.

GROUP DELAY MEASUREMENTS

Figure 66:
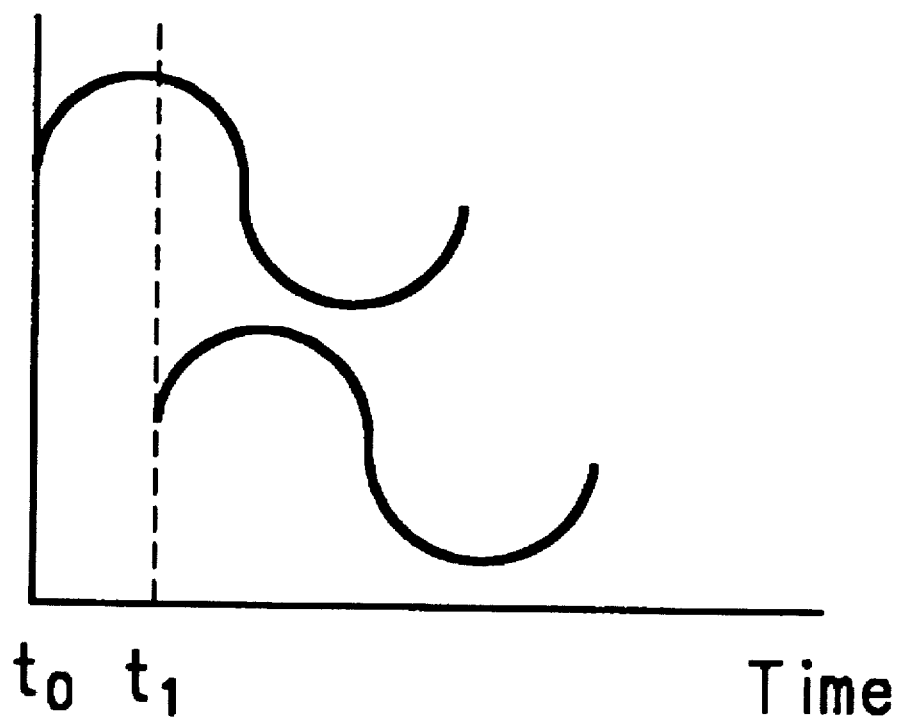
FIGS. 66–68 illustrate measurement of group delay.

Group delay is the measure of transit time through a device at a particular frequency. Ideally, we want to measure a constant—or relatively constant—transit time over frequency. The top waveform shown in FIG. 66 is measured at one frequency. The bottom waveform is identical to the first, simply delayed in time.

Figure 67:
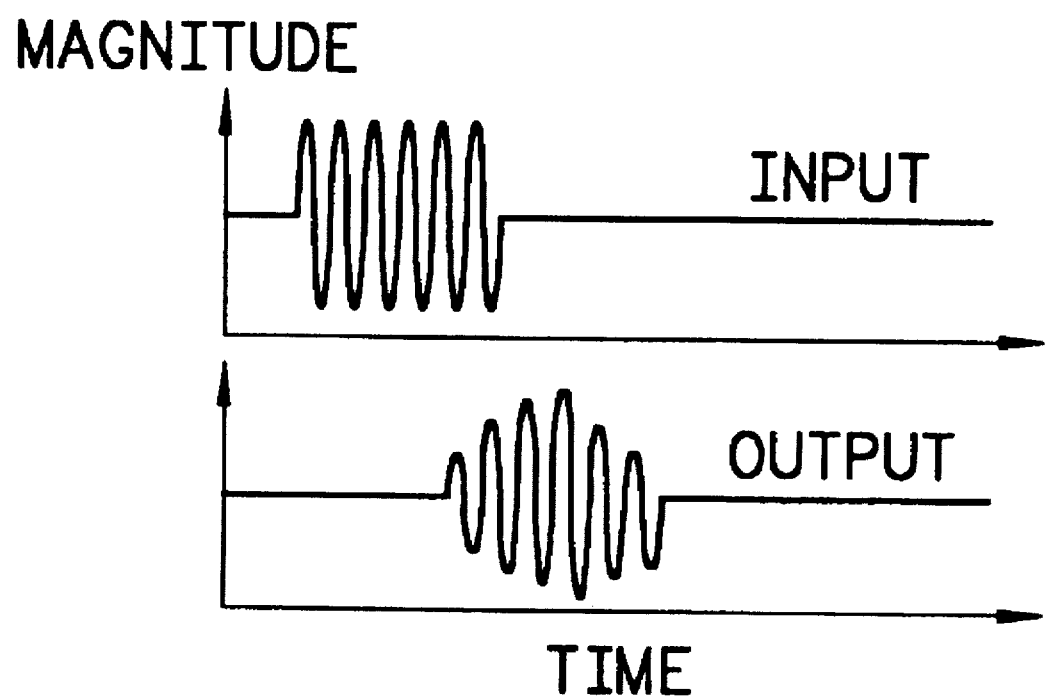

Referring to FIG. 67, the first waveform shown is the original waveform. It is made up of many frequency components. After traveling through a device the signal is delayed in time. Some frequencies are delayed more than others and thus our waveform does not have exactly the same shape as before.

When delay is nonlinear, as shown above, distortion occurs. By measuring group delay with a network analyzer we can characterize the distortion that occurs from a signal traveling through our test device.

When designing components it is important to measure group delay so that you can compensate for any distortion caused by the component.

You may be able to tune the device so as to optimize the performance of group delay over the frequency range of interest. Outside of the specified frequency range, the group delay may or may not be linear.

So how is group delay measured? Signals travel too fast to enable measuring the input and output times of each frequency component. Consequently, we must use mathematical calculations to derive the group delay from the phase slope.

Group delay is mathematically represented by the following equations:

$$\pi = \frac{d\theta}{d\omega} = \frac{-1}{2\pi} \cdot \frac{d\theta}{df} = \frac{-1}{360} \cdot \frac{d\theta}{df} = \frac{1}{2\pi} \cdot \frac{\Delta\theta}{\Delta f}$$

What this equation shows is that group delay is a measure of the change in phase with relation to the change in frequency.

The change in frequency is referred to as an aperture. In other words, the aperture is equal to the frequency range divided by the number of data points.

To measure group delay the frequency aperture must be selected. Depending on the size of aperture, different levels of precision can result for the measurement of group delay.

Figure 68:
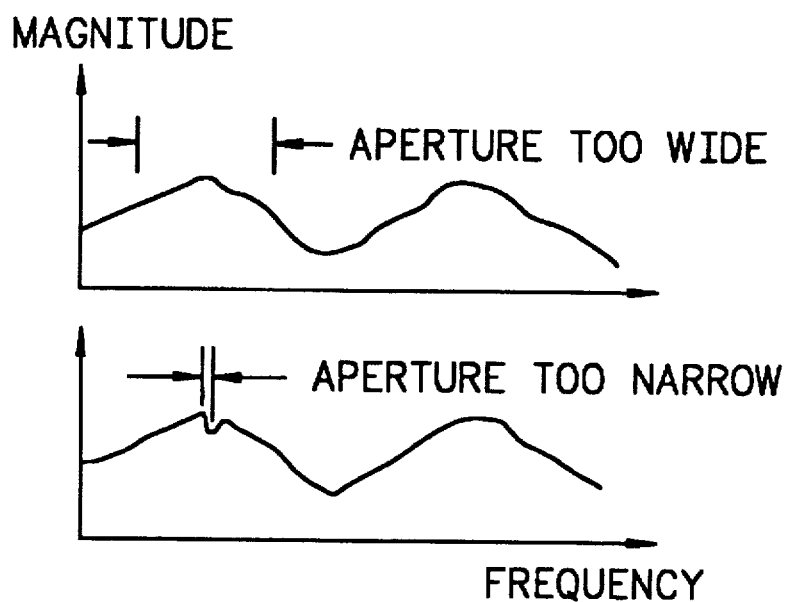

A wide aperture results in a loss of fine-grain variations but gives more sensitivity in the measurement of time delay. A small aperture gives better frequency resolution, but at the cost of lost sensitivity. Thus, for any comparison of group delay data you must know the aperture used to make the measurement (FIG. 68).

Let us take a look at a group delay measurement made on the WILTRON 360 Vector Network Analyzer. Group delay, as a measurement option, can be found in the Graph Type menu. After selecting the option, the 360 displays the data in a time-vs-frequency graph, or to be more exact, a group-delay-vs-frequency graph.

The 360 automatically selects the frequency spacing between data points—that is, the aperture. This value is displayed on the screen with the measurement.

The aperture defaults to the smallest setting for the frequency range and number of data points selected. This value is displayed in the SET SCALING menu when measuring group delay.

Group delay applications are found throughout the microwave industry, although the majority of such measurements are made in the telecommunications area.

One occurrence of group delay that you may have experienced is with a long-distance telephone call. Occasionally a phone call can be disturbing because of the delay in time from when you speak and when the other person responds. If there is simply a delay, then time delay—or linear group delay—has occurred. But if the voices are also distorted, then non-linear group delay has occurred. It is this distortion that we must avoid. We can avoid linear group delay by measuring group delay both during the design and development stages and during recalibration in the field.

One final group-delay application is found in the development of components. In this application, group delay is measured for the transit time of a signal through the device. When time is of the essence in a fast switching system, as in a modern computer, the travel time through a device is critical.

ACTIVE DEVICE MEASUREMENTS

Active devices, for example FETs, amplifiers and MMICs, are key components in microwave systems. The microwave future is in smaller integrated microwave packages.

Actually, the measurements that are made are the same measurements made on passive devices.

Active devices come in many shapes and sizes. In most cases we are going to have to develop a fixture in which to mount the device, since it may have tabs, leads or pads instead of connectors.

Active devices require bias voltages, and in many cases they are easily damaged. High gain amplifiers may saturate with input signals of −50 dBm! With active devices, we have a new set of measurement requirements.

Figure 69:
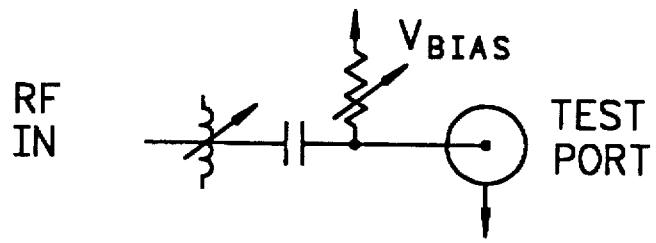
FIG. 69 illustrates a set up for testing active devices.

WILTRON has developed two models of active device test sets (Models 3620 and 3621) to help you make these types of measurements. These test sets include both step attenuators (70 dB) used to adjust operating power levels, and bias tees used to bias the device via the test port center conductor. This approach to bias is useful for testing transistors; however, MMIC's usually require bias injection at other points (FIG. 69).

Test fixtures are necessary for mounting the device so that it can be measured in a coaxial (or waveguide) measuring system.

Figure 70:
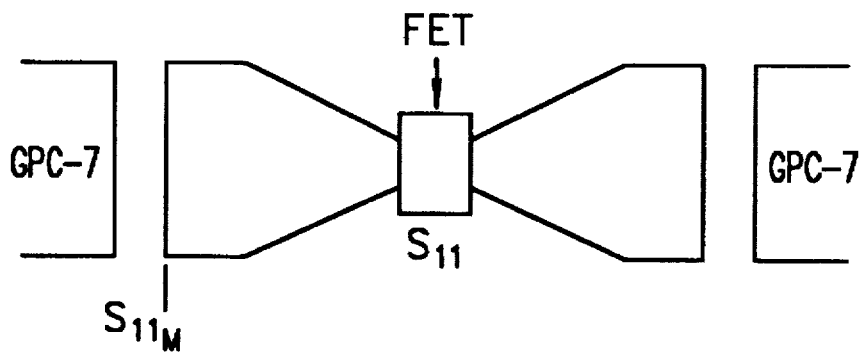
FIG. 70 illustrates that measurements of active devices are made with a reference plane outside the device.

Now we have an interesting situation. While we can measure the performance at the connector—which is the calibration plane—what we really want to know is how our device performs (FIG. 70).

You can consider the device embedded in the fixture and can measure the S-parameters of the fixture with the device installed.

Figure 71:
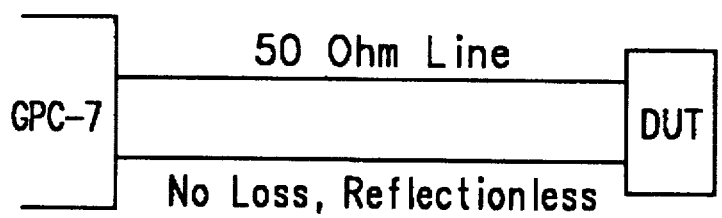
FIG. 71 illustrates testing an ideal device.

The most elementary situation is a system in which the test fixture is electrically ideal or transparent. In this case the solution is simple—merely move the reference plane out to the device (FIG. 71).

In some cases—depending on the fixture or the device being measured—this is satisfactory. But when it is not, we need to employ other techniques.

Figure 72:
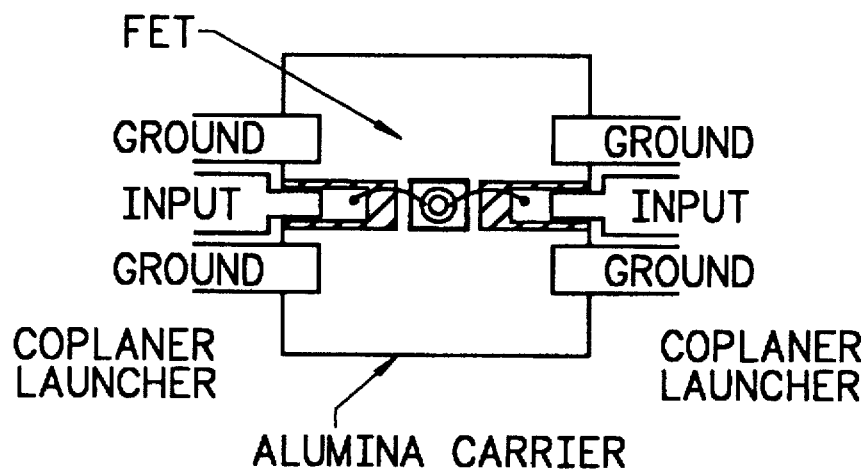
FIG. 72 illustrates the nonideal transition from a coax structure which affects freely moving the reference plane.

One of the reasons that moving the reference plane out to the device does not always work, is that the test fixture includes a transition from coax to a structure such as microstrip, coplanar waveguide, or stripline (FIG. 72).

Engineers have come to grips with the general problem. However, there is no established standard approach. Two of the more common approaches are to calibrate the fixture as a part of the analyzer, and to characterize the fixture and compute the desired result.

In the discussion on calibration (above) we saw that the calibration components establish the reference plane and determine the quality of the measurement. If we have a good Open, Short and $Z_0$ load to place at the end of a microstrip line, we can calibrate the system at the point of measurement.

Figure 73:
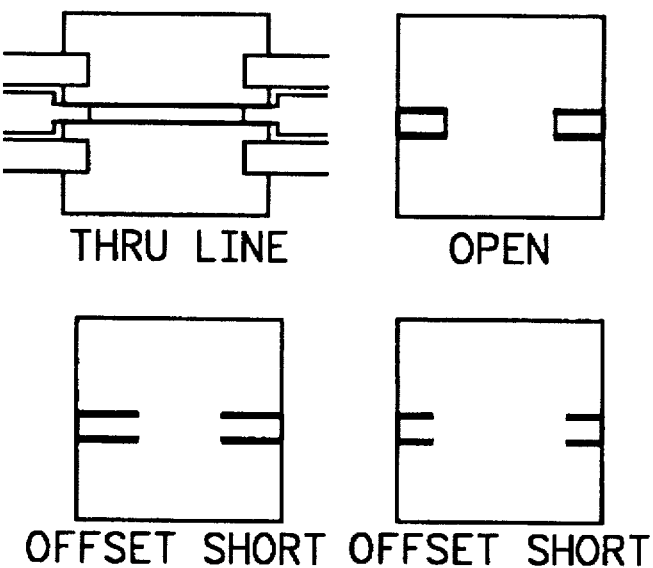
FIG. 73 shows some of the special test-fixture calibration standards that are available.

FIG. 73 shows some of the special test-fixture calibration standards that are available.

These special calibration kits are far from perfect. For instance opens are difficult due to radiation effects, and good terminations are hard to find, 20–30 db being often the best, terminations also determining "effective directivity". Although the special calibration kits are far from perfect, they are superior to our perfect transmission line assumption.

You may have heard of the probe system built to permit on-wafer measurements by Cascade Microtech. It is a good example of a system conducive to this approach.

The Open, Short, termination approach provides three known standards that permit the analyzer to solve for three unknowns (FIG. 74).

CAUTION

You should turn off or disconnect the bias supplies during the calibration, since you are using a Short as the calibration standard.

Figure 75:
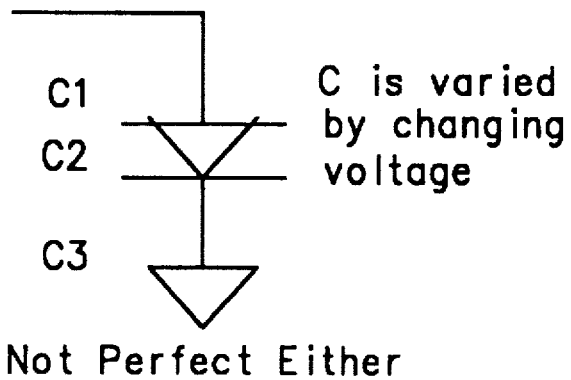
FIG. 75 illustrates a calibration device including a varactor with three known impedances.

It is also possible to use three known impedances. For instance, a varactor with three voltages applied (FIG. 75).

The second approach is to model the fixture. Modeling is elegant but of limited use due to the non-ideal characteristics of the fixture. Modeling can be accomplished in a CAD system like Touchstone or Compass.

In summary, there are quite a variety of approaches—all with their own characteristic pitfalls. Engineers try to choose the most appropriate technique for their application.

TIME DOMAIN MEASUREMENTS

Time Domain Measurements, Discussion

The Option 360-2 Time Domain feature for the WIL-TRON 360 analyzer is a useful measurement tool for determining the location of impedance discontinuities. Some typical applications are identifying and analyzing circuit elements, isolating and analyzing a desired response, locating faults in cables, and measuring antennas.

The relationship between the frequency-domain response and the time-domain response of a network is described mathematically by the Fourier transform. The 360 makes measurements in the frequency domain then calculates the inverse Fourier transform to give the time-domain response. The time-domain response is displayed as a function of time (or distance). This computational technique benefits from the wide dynamic range and the error correction of the frequency-domain data. Let us examine the time-domain capabilities of the Model 360 Vector Network Analyzer. Two measurement modes are available: lowpass and bandpass.

We use the lowpass mode with devices that have a dc or a low-frequency response. In the lowpass mode two responses to the device-undertest (DUT) are available: impulse or step stimulus. The frequencies used for the test must be harmonically related to the start frequency.

The lowpass impulse response displays the location of discontinuities as well as information useful in determining the impedance (R, L, or C) of each discontinuity.

Figure 76:
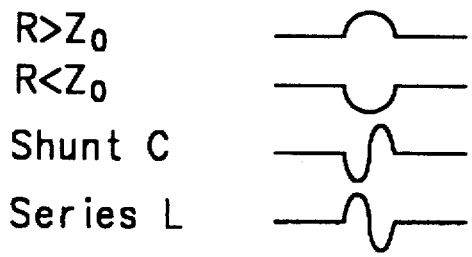
FIG. 76 illustrates an impulse response for different circuit elements.

The impulse response is a peak that goes positive for $R>Z_0$ and negative for $R<Z_O$. The height of the response is equal to the reflection coefficient ($rho=(R-Z_0)/(R+Z_0)$). The impulse response for a shunt capacitance is a negative-then-positive peak and for a series inductance is a positive-then-negative peak (FIG. 76).

An example of using impulse response is circuit impedance analysis. With an impulse response, we can observe the circuit response of a passive device, such as a power splitter, and make final adjustments during the test (FIG. 77). The lowpass step response displays the location of discontinuities as well as information useful in determining the impedance (R, L, or C) of each discontinuity. If you are familiar with time-domain reflectometry (TDR) you may feel more comfortable with step response, as the displays are similar.

The lowpass step response for a resistive impedance is a positive level shift for $R>Z_0$ and a negative level shift for $R<Z_0$. The height of the response is equal to the reflection coefficient ($rho=(R-Z_0)/(R+Z_0)$). The step response for a shunt capacitance is a negative peak, and for a series inductance it is a positive peak (FIG. 78).

Figure 79:
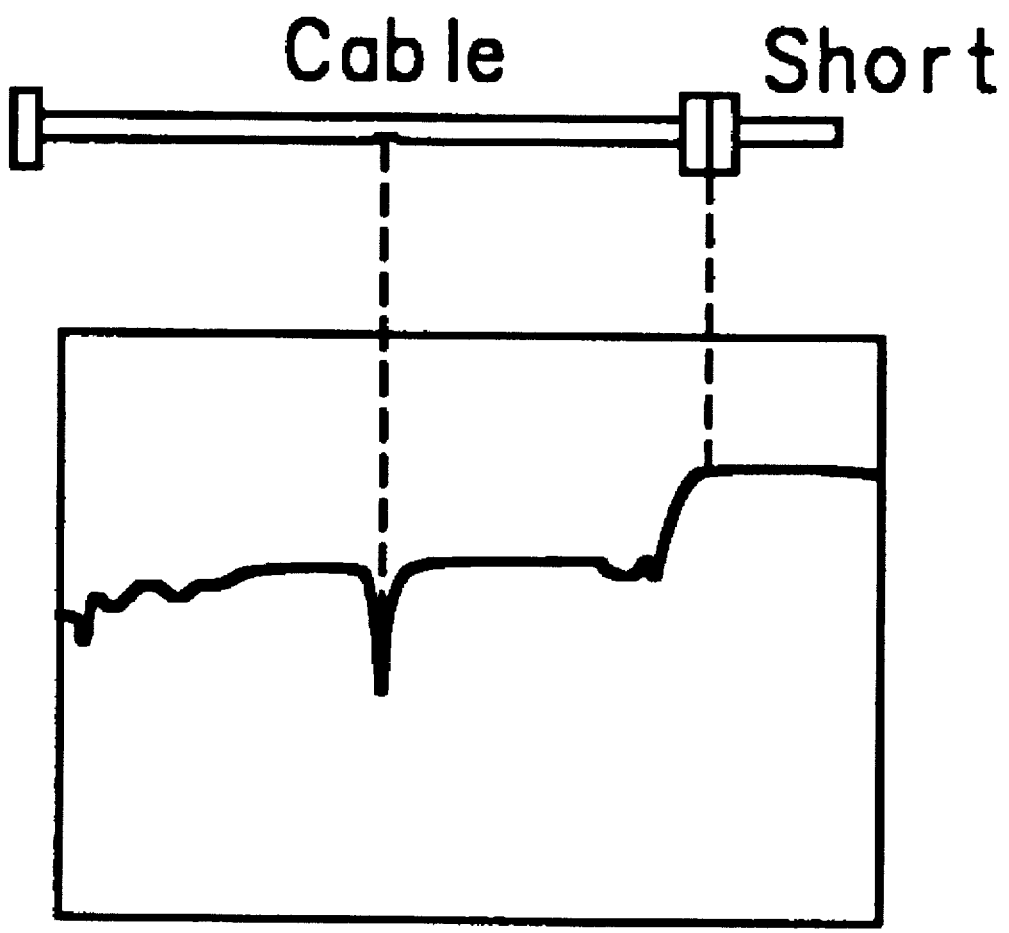
FIG. 79 illustrates use of the impulse response to locate a discontinuity in a cable.

An example of using the lowpass step response is cable fault location. In the frequency domain a cable with a fault exhibits much worse match than a good cable. Using lowpass step response, both the location of the discontinuity and information about its type are available (FIG. 79).

The 360 bandpass mode gives the response of the DUT to an RF-burst stimulus. Two types of response are available: impulse and phaser-impulse. An advantage of the bandpass mode is that any frequency range can be used. Use this mode with devices that do not have a dc or low-frequency path.

Use the bandpass-impulse response to show the location of a discontinuity in time or distance, as indicated by changes in its magnitude. Unlike the low-pass mode, no information as to the type of the discontinuity is available. A typical use for this mode is to measure devices—such as filters, waveguide, high-pass networks, bandpass networks—where a low-frequency response is not available.

The bandpass-impulse response for various impedance discontinuities is shown in FIG. 80. As we can see, no information about the type of discontinuity is available.

An example of using the bandpass-impulse response, is the pulse height, ringing, and pulse envelope of a bandpass filter.

Use the phaser-impulse response with bandpass response to determine the type of an isolated impedance discontinuity.

Figure 82:
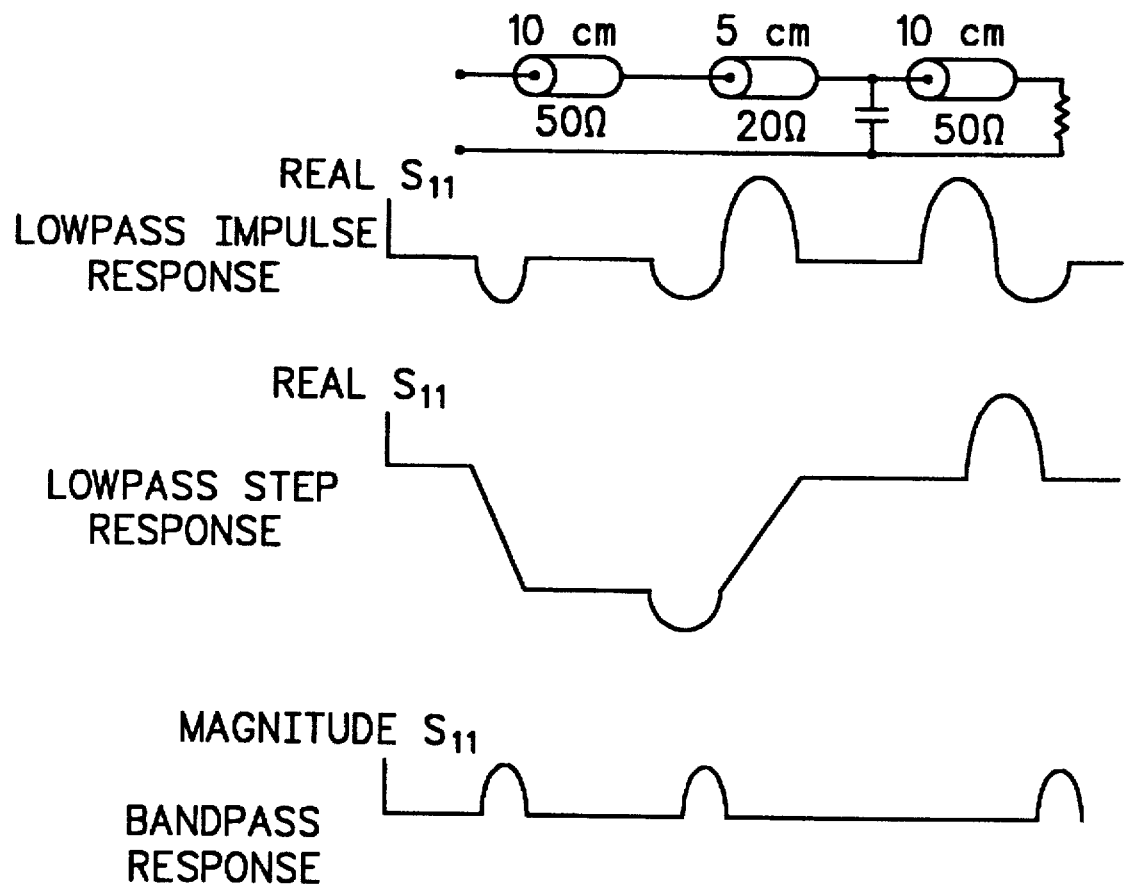
FIG. 82 ilustrates utilization of lowpass impulse, lowpass step and bandpass responses for a complex impedance device.

After the bandpass-impulse response has been isolated, the phaser-impulse response for a resistive-impedance-level change is a peak that goes positive ($R>Z_0$) for the real part of $S_{11}$ and negative for $R<Z_0$. The imaginary part remains relatively constant. In each case the peak is proportional to the reflection coefficient. The phaser-impulse response for a shunt capacitance is a negative-going peak in the imaginary part of $S_{11}$. For a series inductance, it is a positive going peak (FIG. 81). Next, let us look at a complex circuit comprising a resistor in series with an inductor shunted by a capacitor wherein $R<Z_0$. These impedance changes are shown in the time domain for the lowpass-impulse response, lowpass-step response, and bandpass-impulse response (FIG. 82).

Figure 83:
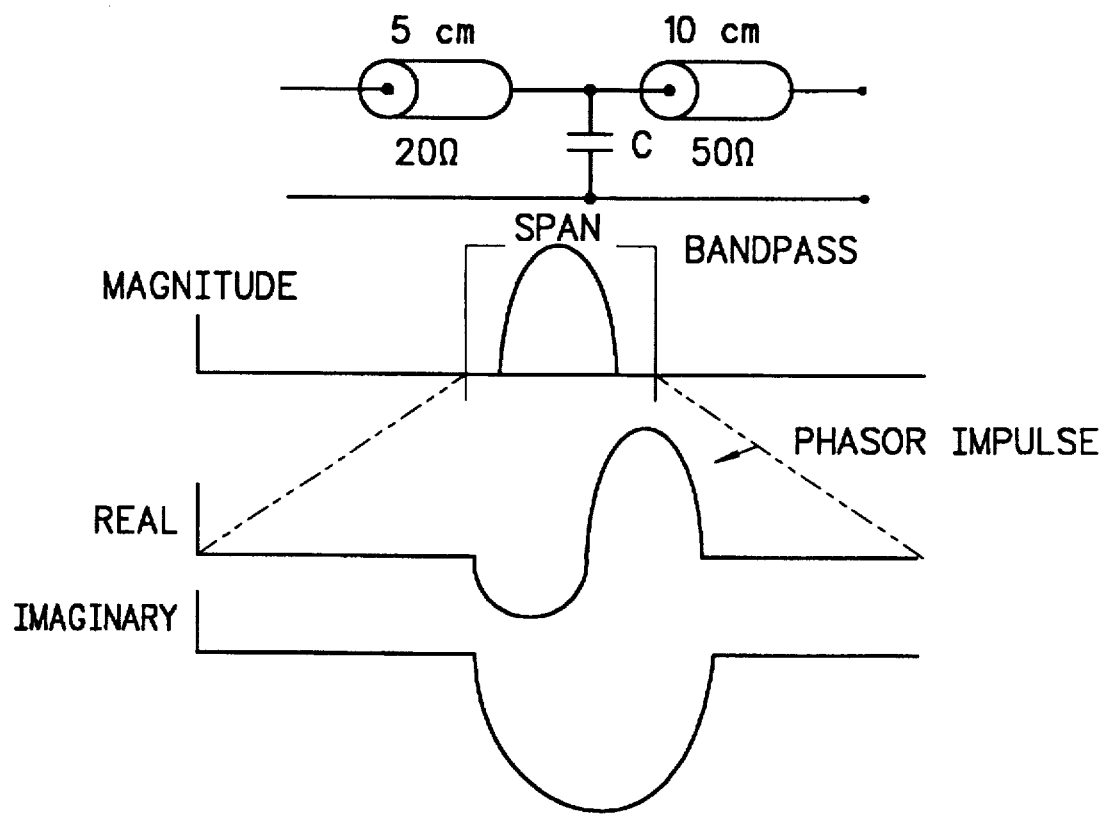
FIG. 83 shows phasor-impulse response displays one discontinuity at a time.

The 360 processes bandpass-impulse-response data to obtain phasor-impulse response. This becomes most advantageous where both a reactive reflection and an impedance change occur at the same location. The real part of the time-domain response shows the location of impedance level changes, while the imaginary part shows the type of reactive discontinuity. Phasor-impulse response displays one discontinuity at a time (FIG. 83).

Details of the method and apparatus whereby the system 100 of the present invention produces Phasor-impulse response displays is described in the commonly assigned co-pending Patent Application entitled APPARATUS AND METHOD FOR LOW-PASS EQUIVALENT PROCESSING, S.N. 175,762, invented by Robert Huenemenn, filed on the same date as this Application and which is hereby expressly incorporated herein in its entirety.

a. Operating Time Domain

To operate in the time domain mode, press the DOMAIN key. A domain menu (App. 86) allows us to select the frequency- or time-domain modes by simple cursor selection. The 360 defaults to the frequency domain.

Select time or distance for the horizontal axis. The 360 defaults to time axis.

NOTE

If we select distance, be sure to set the dielectric constant in the reference Delay menu (App. 87).

Select SET RANGE and use the START/STOP or GATE/SPAN selections to set the range (App. 88). For the lowpass mode select either IMPULSE or STEP Response and set the DC term. The 360 defaults to the IMPULSE Response and the AUTO EXTRAPOLATE mode for the DC term (App. 89).

NOTE

The bandpass mode displays Bandpass Impulse Response unless we select Phasor Impulse Response.

The Marker Range menu allows us to zoom in and display the range between two selected markers (App. 90).

b. Windowing

Figure 84:
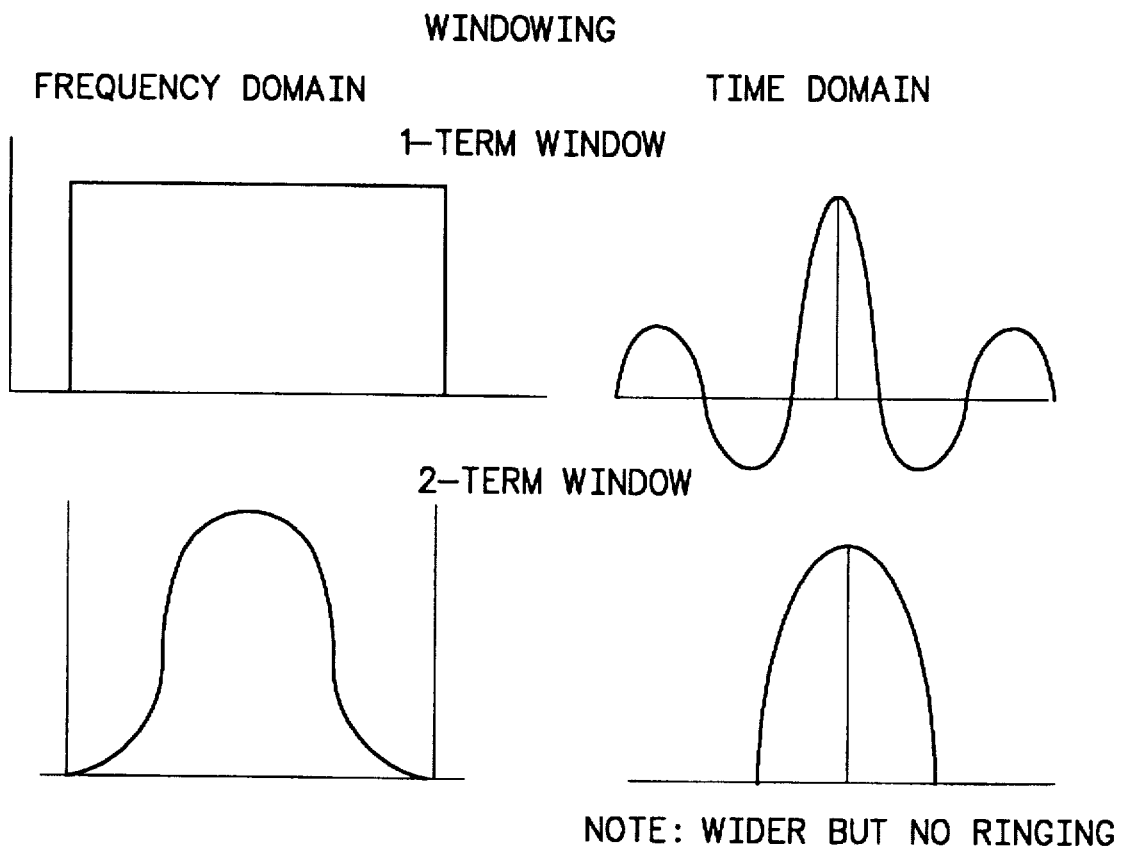
FIG. 84 illustrates windowing.

Windowing is a frequency filter that we apply to the frequency-domain data when we convert it to time-domain data. This filtering rolls off the abrupt transition at F1 and F2. This effectively produces a time-domain response with lower sidelobes. Windowing allows a limited degree of control over the pulse shape, trading off ringing (sidelobes) for pulse width (FIG. 84).

We select windowing from the Time Domain Setup menu. Four different windows are available: RECTANGLE, NOMINAL, LOW SIDELOBE, and MINIMUM SIDELOBE. The RECTANGLE option provides the narrowest pulse width, while the MINIMUM SIDELOBE option provides the least ringing (fewest sidelobes). The 360 defaults to the NOMINAL option, which is acceptable for most measurements (App. 91).

c. Gating

Figure 85:
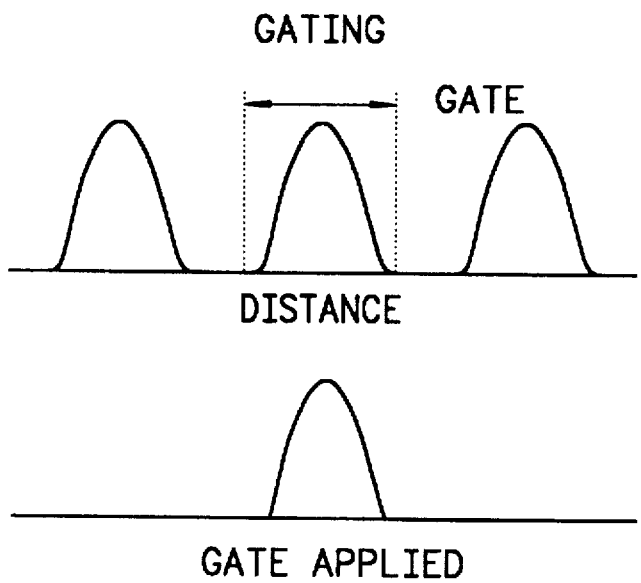
FIG. 85 illustrates gating.

Gating is a time filter that allows for removing unwanted time-domain responses by gating the desired response. We can view the isolated response in both the time domain—using the PHASOR IMPULSE RESPONSE option —and in the frequency domain—using the FREQUENCY WITH TIME GATE selection (FIG. 85).

There are four different gate shapes available: RECTANGLE, NOMINAL, LOW SIDELOBE, and MINIMUM SIDELOBE. The 360 defaults to the NOMINAL gate. To specify a different shape simply enter the Gate menu and select the desired gating shape. The RECTANGLE has the largest ripple, while MINIMUM SIDELOBE has the least (App. 92).

d. Gating Example

Let us look at a reflection measurement. A device at the end of a coax cable is measured in the frequency domain. We would like to measure the return loss of this device and characterize its impedance, but to do so we have to eliminate the response of the cable and connectors. Steps 1 thru 5 below describe a method for making this measurement.

1. Convert the frequency domain data into the time domain using TIME BANDPASS MODE.
2. Select SET GATE in the Domain menu then GATE DISP in the Gate menu. This allows us to put the gate around the discontinuity of interest using the START, STOP, or CENTER/SPAN selections.
3. Select GATE ON in the Gate menu and the unwanted responses are removed.
4. Select PHASER IMPULSE ON in the Bandpass menu. The real and imaginary responses of the Phaser Impulse Response are displayed. Based on the display, the device has a series inductance as well as resistance >50 ohms.
5. Select FREQUENCY WITH TIME GATE in the Domain menu to display the frequency domain $S_{11}$ forward reflection of the gated time domain response.

Figure 86:
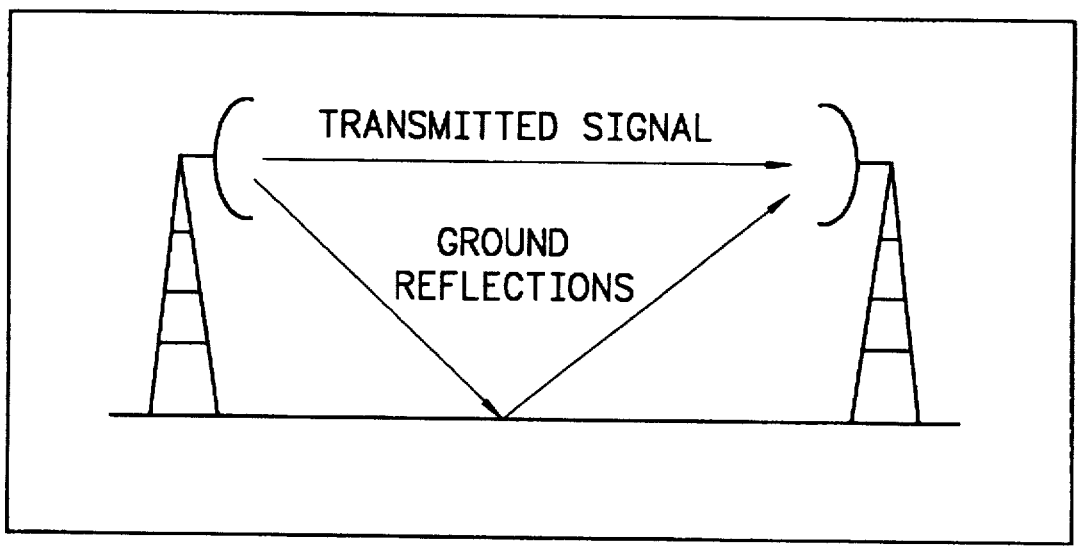
FIG. 86 illustrates gating of an antenna transmission measurement to remove unwanted ground reflections.

An example of gating a transmission measurement is making an antenna measurement. Gating can remove unwanted ground or chamber reflections that interfere with characterizing an antenna's pattern (FIG. 86).

Finally, let's look at some measurement considerations and ways to optimize their time-domain results.

Small impedance changes cause small responses that can be lost in the noise floor. This is also true of long cable and waveguide runs with high insertion loss.

To optimize for small responses:

Use averaging and reduced IF bandwidth to lower the noise floor.

Use maximum power to provide maximum dynamic range.

Use the window with the lowest sidelobes to reduce ringing.

Elements that are physically close or have similar length transmission paths can have minimal or overlapping time domain responses.

To optimize for close-response measurements and attain the best resolution:

Use the widest sweep.

Use the window with the narrowest pulse shape.

To maximize the distance measurement capability without causing aliasing (false information), use the minimum-frequency-step size by selecting 501 points and the minimum-required-frequency range.

In summary, the 360 Time Domain capability is a powerful and versatile tool in performing network analyzer measurements.

During Time Domain Measurement, the system 100 of the present invention advantageously reduces the amount of processing necessary to make measurements by using the apparatus and method described in the commonly assigned co-pending Patent Application entitled CROSS-PATH OPTIMIZATION IN MULTI-TASK PROCESSING, invented by Douglas R. Thornton, Ser. No. 176,096, filed on the same date as this Application and which is expressly incorporated herein in its entirety by this reference.

Time Domain Menus

The menus associated with the Time Domain Option are described in Appso 93–104,

GPIB OPERATION—BASIC PROGRAMMING

This section provides a description of the GPIB and the network analyzer command codes. It also provides several examples of bus programming.

DESCRIPTION OF THE IEEE-488

(IEC-625) INTERFACE BUS

The IEEE-488 General Purpose Interface Bus (GPIB) is an instrumentation interface for integrating instruments, calculators, and computers into systems. The bus uses 16 signal lines to effect transfer of data and commands to as many as 15 instruments.

Figure 87:
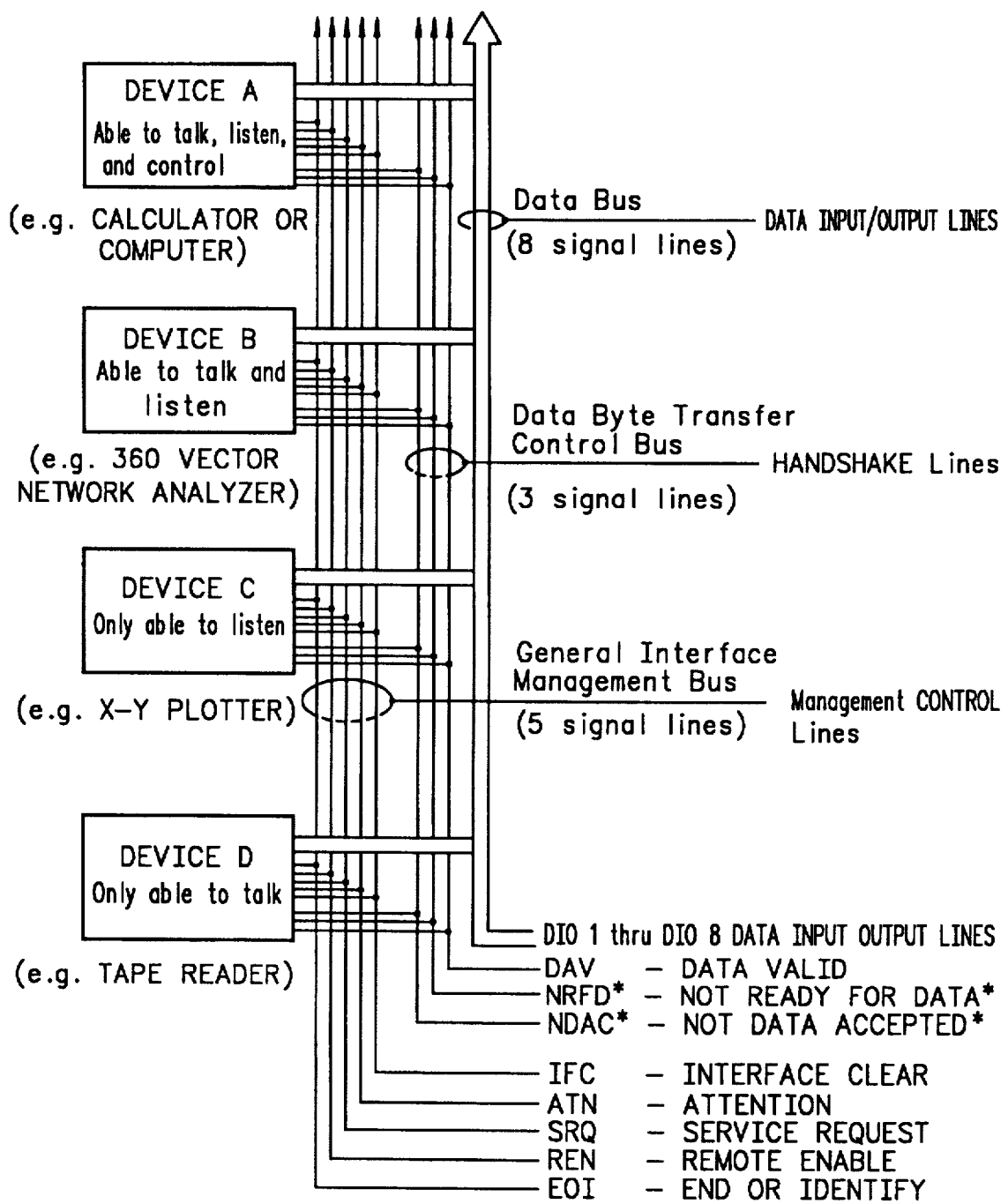
FIG. 87 illustrates bus interface connections.

The instruments on the bus are connected in parallel, as shown in FIG. 87. Eight of the signal lines (DIO 1 thru DIO8) are used to the transfer of data and other messages in a byte-serial, bit-parallel form. The remaining eight lines are used for communications timing (handshake), control, and status information. Data are transmitted on the eight GPIB data lines as a series of eight-bit characters, referred to as bytes. Data transferral is by means of an interlocked handshake technique.

This technique permits asynchronous communications over a wide range of data rates. The following paragraphs provide an overview of the data, and handshake buses, and describe how these buses interface with the network analyzer.

Data Bus Description

The data bus is the conduit for transmitting information and data between the controller and the network analyzer. It contains eight bi-directional, active-low signal lines. DIO 1 thru DIO 8. One byte of information (eight bits) is transferred over the bus at a time. DIO1 represents the least-significant bit (LSB) in this byte and DIO 8 represents the most-significant bit (MSB). Each byte represents a peripheral address (either primary or secondary), a control word, or a data byte.

Management Bus Description

The management bus is a group of five lines used to control the operation of the bus system. Functional information regarding the individual control lines is provided below.

a. ATN (Attention):

When this line is TRUE, the network analyzer responds to appropriate interface messages such as, device clear and serial poll and to its own listen/talk address.

b. EOI (End Or Identify)

When this line is TRUE, the last byte of a multi-byte message has been placed on the line. The line is also used in conjunction with ATN to indicate a parallel poll.

c. (IFC Interface Clear)

When this line is TRUE, the network analyzer's interface functions are placed in a known state such as, unaddressed to talk, unaddressed to listen, and service request idle.

d. REN (Remote Enable)

When this line is TRUE the network analyzer is enabled upon receipt of its listen, address for entry into the remote state. This mode is exited either when the REN line goes FALSE (high) or when the network analyzer receives a go-to-local (GTL) message or an RTL (return to local) command.

e. SRQ (Service Request)

This line is pulled LOW (true) by the network analyzer to indicate that certain preprogrammed conditions exist.

Data Byte Transfer Control (Handshake)

Bus Description

Figure 88:
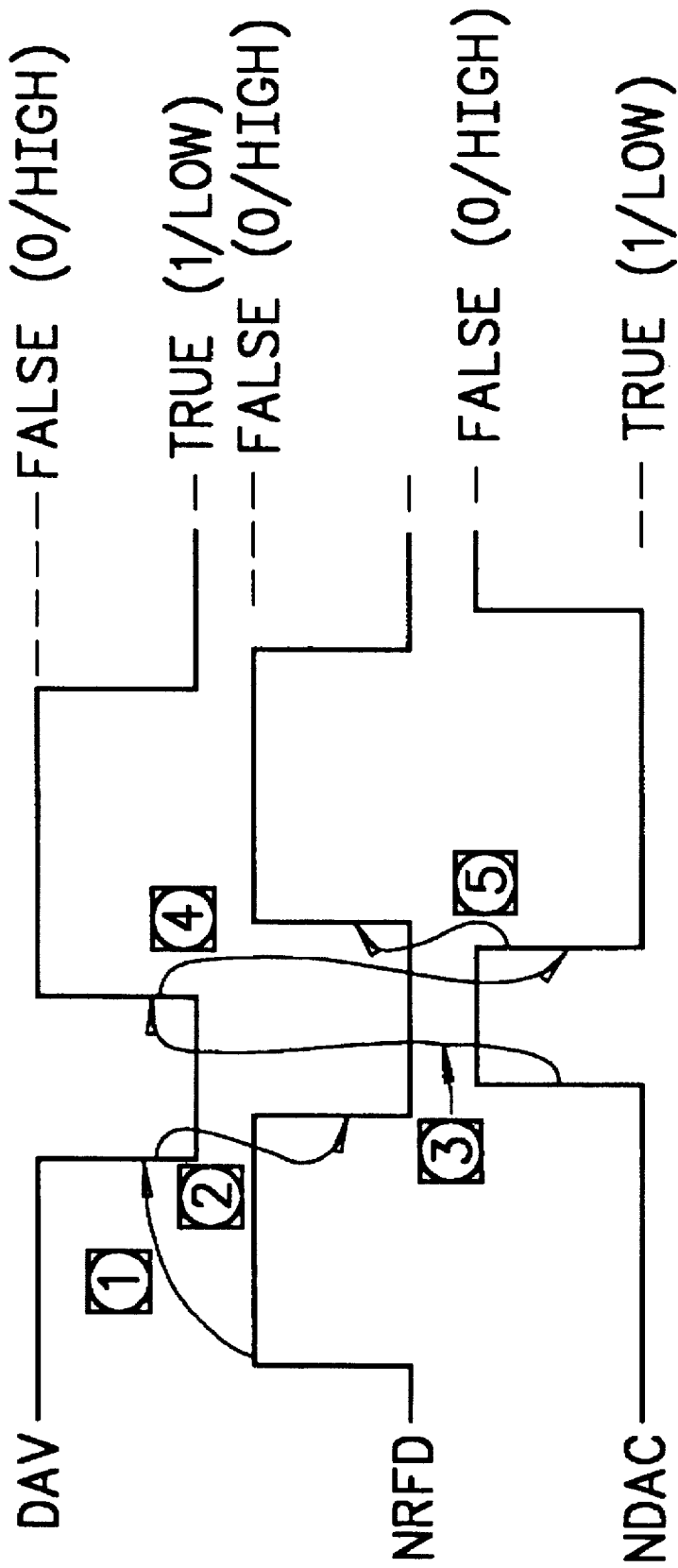
FIG. 88 illustrates typical handshake operation.

Information is transferred on the data lines by a technique called the three-wire handshake. The three handshake-bus signal lines (FIG. 88) are described below.

a. DAV (Data Valid)

This line goes TRUE (arrow 1) when the talker has (1) sensed that NRFD is FALSE, (2) placed a byte of data on the bus, and (3) waited an appropriate length of time for the data to settle.

b. NFRD (NOT READY FOR DATA)

This line goes TRUE (arrow 2) when a listener indicates that valid data has not yet been accepted. The time between the events shown by arrows 1 and 2 is variable and depends upon the speed with which a listener can accept the information.

c. NDAC (NOT DATA ACCEPTED).

This line goes FALSE to indicate that a listener has accepted the current data byte for internal processing. When the data byte has been accepted, the listener releases its hold on NDAC and allows the line to go FALSE. However, since the GPIB is constructed in a wired-OR configuration, NDAC will not go FALSE until all listeners participating in the interchange have also released the line. As shown by arrow 3, when NDAC goes FALSE, DAV follows suit a short time later. The FALSE state of DAV indicates that valid data has been removed; consequently, NDAC goes LOW in preparation for the next data interchange (arrow 4).

Arrow 5 shows the next action in time: NRFD going FALSE after NDAC has returned TRUE. The FALSE state of NRFD indicates that all listeners are ready for the next information interchange. The time between these last two events is variable and depends on how long it takes a listener to process the data byte. In summation, the wired-OR construction forces a talker to wait for the slowest instrument to accept the current data byte before placing a new data byte on the bus.

GPIB OPERATION

All front panel keys, except for LINE ON/OFF, are bus controllable. When used on the GPIB, the network analyzer functions as both listener and a talker. Table 4-1 provides a listing of the GPIB subset functions and gives the capability for each.

TABLE 4-1

360 IEEE-488 Bus Subset Capability

| GPIB SUBSET | FUNCTION | DESCRIPTION |
|---|---|---|
| AH1 | Acceptor Handshake | Complete Capability |
| SH1 | Source Handshake | Complete Capability |
| T6 | Talker | No Talk Only (TON) |
| TE0 | Talker with Address Extension | No Capability |
| L4 | Listener | No Listen Only (LON) |
| LE0 | Listener with Address Extension | No Capability |
| SR1 | Service Request | Complete Capability |
| RL1 | Remote/Local | Complete Capability |
| PP1 | Parallel Poll | Complete Capability |
| DC1 | Device Clear | Complete Capability |
| DT1 | Device Trigger | Complete Capability |

COMMAND CODES, DESCRIPTION

The following paragraphs and tables describe the various GPIB command codes used by the 360.

COMMAND CODES: Classifications

The GPIB interface for the 360 uses more than 300 commands to implement the various functions. For descriptive purposes, the commands are organized into functional classifications.

COMMAND CODES: Syntax And Programming Tips a. Syntax

All mnemonics are three characters long and may be entered in either upper or lower case. Mnemonics which require data must have a valid terminator mnemonic after the data. Separators between mnemonics and either data or other mnemonics are optional.

b. Programming Tips

The 360 is a "channel-based" instrument, which means that most commands apply only to the current active channel. Therefore, to set up a desired state on multiple channels, a CH1–CH4 mnemonic should precede the setup. For example:

"D14 CH1 S11 SM1 CH2 S12 MPH CH3 S21 MAG CH4 S22 ISM"

This string sets up a quad display (D14) and then sets the s-parameter and graph type desired for each Channel (Channel 1: $S_{11}$, Smith chart; Channel 2: $S_{12}$, log magnitude and phase; Channel 3: $S_{21}$, log magnitude; Channel 4: $S_{22}$, inverted Smith chart).

Other command codes are "global" in their extent, meaning they apply to all channels. Examples of these mnemonics: start/stop frequency (SRT,STP), averaging (AVG,AOF), and source power (PWR).

COMMAND CODES: Response To Errors

The following describes how the 360 responds to error conditions.

a. SYNTAX ERROR

The 360 beeps and sends a Service Request (SRQ), if enabled. It also ignores any further commands until it is programmed to talk or be unlistened.

b. PARAMETER OUT OF RANGE ERROR

The 360 moves the cursor to be adjacent to the erroneous entry, beeps, displays the entry in red and sends an SRQ (if enabled). The error is cleared upon execution of the next instruction.

C. ACTION REQUESTED NOT POSSIBLE

The 360 sends an SRQ (if enabled) and ignores the command.

COMMAND CODES: Channel Control

The commands described in Table 4-4 set up the current display mode and active channel on the 360. The active channel specifies the channel to which channel-based changes apply.

TABLE 4-4

Channel Control Command Codes

| Command Code | Description |
|---|---|
| DSP | Single Channel Display of Active Channel |
| D13 | Dual Channel Display, Channels 1 and 3 |
| D24 | Dual Channel Display, Channels 2 and 4 |
| D14 | Quad Display, All Four Channels |
| CH1 | Channel 1 Selected as Active Channel |
| CH2 | Channel 2 Selected as Active Channel |
| CH3 | Channel 3 Selected as Active Channel |
| CH4 | Channel 4 Selected as Active Channel |

COMMAND CODES: Data Entry

The command codes listed in Table 4-5 are used for mnemonics which must have numeric values. For mnemonics that take numeric values, an appropriate terminator is required, in addition to a numeric value.

TABLE 4-5

Data Entry Command Codes

| Command Code | Description |
|---|---|
| 0,1,2,3,4,5, 6,7,8,9 | Numerals for Numeric Entry |
| – | Minus Sign |
| . | Decimal Point |
| GHZ | Gigahertz Data Terminator |
| MHZ | Megahertz Data Terminator |
| KHZ | Kilohertz Data Terminator |
| PSC | Picoseconds Data Terminator |
| NSC | Nanoseconds Data Terminator |
| USC | Microseconds Data Terminator |
| DBL | dB Log Data Terminator |
| DBM | dBm Data Terminator |
| DEG | Degrees Data Terminator |
| MMT | Millimeter Data Terminator |
| CMT | Centimeter Data Terminator |
| MTR | Meter Data Terminator |
| XX1 | Unitless Data Terminator, ×1 |
| XX3 | Unitless Data Terminator, ×$10^{-3}$ |
| XM3 | Unitless Data Terminator, ×$10^{-3}$ |
| REU | Real Units Data Terminator |
| IMU | Imaginary Units Data Terminator |

Command Codes: Measurement Control

The command codes listed in Table 4-6 control the parameter being measured on the active channel ($S_{11}$, $S_{21}$, $S_{22}$ & $S_{12}$) and the basic measurement setup. All command codes except $S_{11}$, $S_{21}$, $S_{22}$, and $S_{12}$ are global, that is, they apply to the entire instrument. The SA1, SA2, and TA2 command codes can only be used with the Models 3630 and 3621 Test Sets with attenuators. Note that the two source attenuators have ranges of 0 to 70 dB while the test attenuator has a range of 0 to 40 dB. The HLD code holds the sweep at the current point and the CTN code continues sweeping from the current point. The TRS command code either restarts the sweep (continuous sweep mode) or triggers a single sweep (in hold mode). The WFS code causes the 360 to wait a full sweep so that any data on the display is valid. This is useful for scaling the display. It is required when outputting data from the 360, so as to ensure that the data being output is valid. The SWP code puts the 360 into continuous swept mode.

TABLE 4-6

Measurement Control Command Codes

| COMMAND CODE | DESCRIPTION | VALUES | TERMINATORS |
|---|---|---|---|
| S11 | Selects S11 as S-Parameter On Active Channel | N/A | N/A |
| S21 | Selects S21 as S-Parameter On Active Channel | N/A | N/A |
| S22 | Selects S22 as S-Parameter On Active Channel | N/A | N/A |
| SRT | Sets Start Frequency | Depends on Frequency Range of Instrument | GHZ, MHZ, KHZ |
| STP | Sets Stop Frequency | Depends on Frequency Range of Instrument | GHZ, MHZ, KHZ |
| CWF | Sets CW Frequency | Depends on Frequency Range of Instrument | GHZ, MHZ, KHZ |
| PWR | Sets Source Power | Depends on Power Range of Source | DBM, XX1, XX3, XM3 |
| FHI | Sets Data Points to Maximum | N/A | N/A |
| FME | Sets Data Points to Normal | N/A | N/A |
| FLO | Sets Data Points to Minimum | N/A | N/A |
| SA1 | Sets Source Attenuator for Port 1 | 0 dB to 70 dB | DBL, DBM, XX1, XX3, XM3 |
| SA2 | Sets Source Attenuator for Port 2 | 0 dB to 70 dB | DBL, DBM, XX1, XX3, XM3 |
| TA2 | Sets Test Attenuator For Port 2 | 0 dB to 40 dB | DBL, DBM, XX1, XX3, XM3 |
| HLD | Holds Sweep At Current Point | N/A | N/A |
| CTN | Continue Sweep After Hold | N/A | N/A |
| TRS | Triggers or Restarts a Sweep | N/A | N/A |
| WFS | Wait full sweep | N/A | N/A |
| SWP | Selects Continuous Sweep Mode | N/A | N/A |

Command Codes: Display

The command codes listed in Table 4-7 are for setting up the graph type on the active channel. Most of the commands are straightforward with the exception of the SME, ISE, SMC and ISC codes. Both SME and ISE require values and only allow values of 10, 20 and 30.

TABLE 4-7

Display Control Command Codes

| COMMAND | DESCRIPTION | VALUES | TERMINATORS |
|---|---|---|---|
| MAG | Selects Log Magnitude and Phase Display for Active Channel | N/A | N/A |
| PHA | Selects Phase Display for Active Channel | N/A | N/A |
| MPH | Selects Log Magnitude and Phase Display for Active Channel | N/A | N/A |
| SMI | Selects Normal Smith Chart Display for Active Channel | N/A | N/A |
| SWR | Selects SWR Display for Active Channel | N/A | N/A |
| ISM | Selects Inverted Normal Smith Chart Display for Active Channel | N/A | N/A |
| DLA | Selects Group Delay Display for Active Channel | N/A | N/A |
| PLR | Selects Log Polar Display for Active Display | N/A | N/A |
| LIN | Selects Linear Magnitude Display for Active Channel | N/A | N/A |
| LPH | Selects Linear Magnitude Display for Active Channel | N/A | N/A |
| REL | Selects Real Display for Active Channel | N/A | N/A |
| IMG | Selects Imaginary Display for Active Channel | N/A | N/A |
| RIM | Selects Real and Imaginary Display for Active Channel | N/A | N/A |
| SME | Selects Expanded Smith Chart Display for Active Channel | 10, 20, 30 | DBL, XX1 |
| ISE | Selects Inverted Expanded Smith Chart Display for Active Channel | 10, 20, 30 | DBL, XX1 |
| SMC | Selects Compressed Smith Chart Display for Active Channel | 3 | DBL, XX1 |
| ISC | Selects Inverted Compressed Smith Chart Display Active Channel | 3 | DBL, XX1 |
| SCL | Sets Scaling of Display On Active Channel | Depends on Graph Type: | Depends on Graph Type: |
|  | Log Mag and Log Polar: | 0.001 to 50 db/div | DBL XX1, XX3, XM3 |
|  | Phase: | 0.01 to 90 degrees/div | DEG(,XX1, XX3, XM3 for PHA display) |
|  | Group Delay: | 1 femtosecond/div to 999.999 s/div | PSC, NSC, USC |
|  | Linear Mag & Linear Polar: | 1 nanounit/div to 999.999 units/div | XX1, XX3, SM3 |
|  | Imag: | 1 nanounit/div to 999.999 units/div | IMU (,XX1, XX3, XM3 for IMG display) |
|  | Smith/Inverted Smith | N/A | N/A |
| OFF | Set Offset of Display on Active Channel | Depends on Graph Type: | Depends on Graph Type: |
|  | (This code moves the graph's reference position to the offset value) |  |  |
|  | Log Mag & Log Polar: | −999.999 to 999.999 dB | DBL, XX1, XX3, XM 3 |
|  | PHASE: | −180 to 180 degrees | DEG(,XX1, XX3, XM3 for PHA display) |
|  | Group Delay: | −999.999 to 999.999 s | PSC, NSC, USC |
|  | Linear Mag & Linear Polar: | 0 to 999.999 units | XX1, XX3, line 20, XM3 |
|  | Imaginary | −999.999 to 99999.999 units | IMU(,XX1, XX3, XM3 for IMG display |
|  | Smith/Inverted Smith: | N/A | N/A |
| REF | Set Reference Line of Display on Active Channel | Depends on Graph Type: | Depends on Graph Type: |
|  | Log Magnitude, MAG Display: | 0 to 8 | DBL, XX1, XX3, XM3 |
|  | Log Magnitude, MPH Display: | 0 to 4 | DBL, XX1, XX3, XM3 |
|  | Phase, PHA Display: | 0 to 8 | DEG, XX1, XX3, XM3 |
|  | Phase, MPH Display: | 0 to 4 | DEG |
|  | Group Delay: | 0 to 8 | PSC, NSC, USC, XX1, XX3, XM3 |
|  | Linear Magnitude, LIN Display: | 0 to 8 | XX1, XX3, please XM3 |
|  | Linear Magnitude, LPH Display | 0 to 4 | XX1, XX3, XM3 |
|  | Real, REL Display | 0 to 8 | REU, XX1, XX3, XM3 |
|  | Real, RIM Display | 0 to 4 | REU, XX1, XX3, XM3 |
|  | Imaginary, IMG Display: | 0 to 8 | IMU, XX1, XX3, |

TABLE 4-7-continued

| COMMAND | DESCRIPTION | VALUES | TERMINATORS |
|---|---|---|---|
| | Imaginary, RIM Display: | 0 to 4 | XM3 IMU |
| | Smith/Inverted Smith: | N/A | N/A |
| | Linear Polar/Log Polar: | N/A | N/A |
| ASC | Autoscale Display On Active Channel | N/A | N/A |
| APR | Set Group Delay Aperture Percentage | 0 to 20 | XX1, XX3, XM3 |

EXAMPLE

"SME 20 DBL" This code selects a 20 dB expanded Smith chart on the active Channel.

Command Codes SMC and ISC also require values and only allow the value 3.

EXAMPLE

"SMC 3 DBL" This code selects a 3 dB compressed Smith chart on the active channel.

In addition to the brief description in Table 4-7, codes SCL and REF require additional description as provided in sub-paragraphs a and b, below.

a. SCL COMMAND CODE:

The SCL code sets the scaling per division of the graph on the active channel. Notice that for graph types with two types of information, the unitless terminators always apply to the first type of information.

EXAMPLE

"MPH SCL 10 XXi" This code will select a log magnitude and phase display on the active channel and set the magnitude scaling to 10 dB/div. The only way to scale the degrees part of the graph is by explicit use of the DEG terminator:

EXAMPLE

"MPH SCL 45 DEG" This code selects a log magnitude and phase display on the active channel and sets the phase scaling to 45 degrees/div.

NOTE: Smith charts and inverted Smith charts cannot be scaled using the SCL instruction. The different charts are selected using the SME, ISE, SMC and ISC mnemonics.

b. REF Command Code

The REF mnemonic selects which graticule line will be considered the "reference". Notice that for graphs with one type of information such as MAG or PHA—the allowable reference line values are 0 to 8, while for graphs with two types of information the reference line value can only be 0 to 4. As described for the SCL code, for graphs having two types of information present, the unitless terminators apply to the first type of information. There is no reference line defined for Smith charts, inverted Smith charts, linear polar, or log polar displays.

Command Codes: Enhancement

The command codes listed in Table 4-8 control the data enhancement functions of IF bandwidth, averaging, and smoothing. Note that the maximum averaging number is 4095 and that the maximum smoothing number is 20%.

TABLE 4-8

| COMMAND CODE | DESCRIPTION | VALUE | TERMINATORS |
|---|---|---|---|
| IFN | Selects Normal IF Bandwidth | N/A | N/A |
| IFR | Selects Reduced IF Bandwidth | N/A | N/A |
| IFM | Selects Minimum IF Bandwidth | N/A | N/A |
| AVG | Turns On Averaging and Sets to Value | 1 to 4095 | XX1, XX3, XM3 |
| AOF | Turns Off Averaging | N/A | N/A |
| SON | Turns On Smoothing and Sets to Value | 0 to 20 | XX1, XX3, XM3 |
| SOF | Turns Off Smoothing | N/A | N/A |

Command Codes: Reference Delay

The command codes listed in Table 4-9 are used to set up the reference delay applied to a channel and the relative dielectric constant of the system. Note that RDD, RDT and RDA change the active channel's reference delay while DIA, DIT, DIP, DIM, and DIE change the system's dielectric constant—a global change. The code RDA should only be used if a valid sweep is present.

TABLE 4-9

| COMMAND CODE | DESCRIPTION | VALUES | TERMINATORS |
|---|---|---|---|
| RDD | Sets Reference Delay As a Distance Value for the Active Channel | −999.999 to 999.999 | MMT, CMT, MTR |
| RDT | Sets Reference Delay As a Time Value for the Active Channel | −999.999 to 999.999,s | PSC, NSC, USC |

TABLE 4-9-continued

Reference Delay Command Codes

| COMMAND CODE | DESCRIPTION | VALUES | TERMINATORS |
|---|---|---|---|
| RDA | Selects Automatic Reference Delay for the Active Channel | N/A | N/A |
| DIA | Selects Air Dielectric (1.00) | N/A | N/A |
| DIT | Selects Teflon Dielectric (2.10) | N/A | N/A |
| DIP | Selects Polyethylene Dielectric (2.26) | N/A | N/A |
| DIM | Selects Microporous Teflon Dielectric (1.69) | N/A | N/A |
| DIE | Sets Dielectric to Value | 1 to 999.999999 | XX1, XX3, XM3 |

Command Codes: Trace Memory

The command codes listed in Table 4-10 control the trace memory function on the active channel and the trace math to be applied to it. These codes also do provide for storing and retrieving the active channel's trace memory to and from the disk.

TABLE 4-10

Trace Memory Command Codes

| COMMAND CODE | DESCRIPTION |
|---|---|
| DAT | Displays Data Trace on Active Channel |
| MEM | Displays Memory Trace on Active Channel |
| DTM | Displays Data and Memory Traces on Active Channel |
| DNM | Displays Measured Data Normalized to Memory on Active Channel |
| MIN | Selects Complex Subtraction As Trace Math on Active Channel |
| DIV | Selects Complex Division As Trace Math on Active Channel |
| ADD | Selects Complex Addition As Trace Math on Active Channel |
| MUL | Selects Complex Multiplication As Trace Math on Active Channel |
| STD | Stores Active Channel's Data Trace to Memory |
| SDK | Stores Active Channel's Trace Memory to Disk Under The Specified File Name |
| RCK | Retrieves Active Channel's Trace Memory From Disk File Specified |

In order to view a display that involves trace memory (MEM, DTM and DNM) or to store trace memory to disk, the data for the channel must have been stored to memory first using the STD code.

EXAMPLE

"WFS STD DIV DNM"

This code causes the 360 to:

Wait a full sweep until data is valid (WFS).

Store that to memory (STD).

Select complex division as the trace math (DVI).

Display the data normalized to memory using this trace math(DNM).

Command Codes: Markers

The command codes listed in Table 4-11 control the location and display of the markers and the functions related to the markers. The MK1-MK6 codes are used to set a marker to a desired frequency, time or distance. The terminator mnemonics used must match the active channel's domain (frequency, time, or distance) Otherwise, an action-not-possible error will result.

TABLE 4-11

Marker Command Codes

| COMMAND CODE TERMINATORS | DESCRIPTION | VALUES | |
|---|---|---|---|
| MK1–MK6 | Turns On Marker 1–6 and Sets Them to Value As Shown Below: | | |
| | Frequency Markers | Limited to Current Sweep Range | GHZ, MHZ, KHZ |
| | Time Markers: | Limited to Current Zoom Range | PSC, NSC, USC |
| | Distance Markers: | Limited to Current Zoom Range | MMT, CMT, MTR |
| MOF | Disables Markers | N/A | N/A |
| MON | Enables Markers | N/A | N/A |
| M01–M06 | Turns Off Marker 1–6 | N/A | N/A |
| DR1–DR6 | Turns on Marker 1–6 As Delta Reference Marker | N/A | N/A |
| DRF | Turns On Delta Reference Marker Mode | N/A | N/A |
| DR0 | Turns Off Delta Reference Marker Mode | N/A | N/A |
| MR1– | Selects Marker 1–6 As Readout Marker | N/A | N/A |

TABLE 4-11-continued

Marker Command Codes

| COMMAND CODE TERMINATORS | DESCRIPTION | VALUES | |
|---|---|---|---|
| MR6 | | | |
| MMX | Moves Active Marker to Maximum Trace Value | N/A | N/A |
| M1S–M6S | Marker Sweep With Marker 1–6 As Start Frequency | N/A | N/A |
| M1E–M6E | Marker Sweep With Marker 1–6 As Stop Frequency | N/A | N/A |
| M1C–M6C | CW Marker Sweep With Marker 1–6 As CW Frequency | N/A | N/A |

EXAMPLE "MK1 1.0000 NSC" on a frequency domain channel generates an action-not-possible error Markers can be individually turned off using the MO1–MO6 codes or markers can be disabled using the MOF code. A marker is turned on whenever any of the following conditions occur:

When the marker is set to a value, for example: "MK2 4.5632 Ghz.

When the marker is selected for readout, for example: "MR2".

When the marker is selected as the delta reference marker, for example: "DR2".

The MMN and MMX codes move the active marker to the minimum and maximum trace values on the active channel, respectively. There must be an active marker selected for these mnemonics to execute. The M1–M6S, M1E–M6E and M1C–M6C mnemonics are used to define a marker sweep using the specified marker for either the start, stop, or CW frequency.

EXAMPLE "WFS MR1 MMX M1S"

This code sequence causes the 360 to
Wait for a full sweep of data to be present (WFS).
Turn on marker 1 and select it for readout (MR1).
Move marker 1 to the maximum value of the trace on the active channel (MMX).
Set the start frequency equal to the marker frequency (M1S).

Command Codes: Limits

The command codes listed in Table 4-12 are used to (1) set up the upper and lower limit values on the active channel and (2) set the limit delta for the limit frequency readout function.

TABLE 4-12

Limits Command Codes

| COMMAND CODE | DESCRIPTION | VALUES | TERMINATORS |
|---|---|---|---|
| LUP | Turns On Limit 1 On the Active Channel and sets it to value, as Shown Below | Depends on Graph Type: | Depends on Graph Type: |
| LLO | Turn On Limit 2 On the Active channel And set it to Value, as Shown Below | Depends on Graph Type: | Depends on Graph Type: |
| LFD | Set Limit Delta On Active Channel for Limit Frequency Readout, as Shown Below | Depends On Graph Type: | Depends On Graph Type: |
| | Log Mag & Log Polar: | −999.999 to 999.999 dB | DBL, XX1, XX3, XM3 |
| | Phase: | −180 to 180 degrees | DEG(,XX1, XX3, XM3 for PHA display) |
| | Group Delay: | −999.999 to 999.999 s | PSC, NSC, USC |
| | Linear Mag & Linear Polar: | 0 to 999.999 U | XX1, XX3, XM3 |
| | Real: | −999.999 to 999.999 U | REU, XX1, XX3, XM3 |
| | Imaginary: | −999.999 to 999.999 U | IMU(,XX1, XX3, XM3 for IMG display) |
| | Smith/Inverted Smith: | 0 to 1.413 units | XX1, XX3, XM3 |
| LOF | Disables Limits On Active Channel | N/A | N/A |
| LON | Enables Limits On Active Channel | N/A | N/A |
| LFR | Selects Limit Frequency Readout for Active Channel | N/A | N/A |
| LFP | Selects Phase Limit Frequency Readout for Active Channel for Log Magnitude/linear Magnitude and Phase Displays | N/A | N/A |

The range of values and allowable terminator mnemonics are dependent on the graph type of the active channel much like the SCL, and REF codes described above. As described for these codes, for graphs with two types of information present, the unitless terminators apply to the first type of information. The second type of limit line value is accessed by explicit use of the appropriate data terminator mnemonic.

EXAMPLES

1. "LUP 20 XXi" on a log magnitude and phase display: sets the upper limit on the magnitude display to 20 dB.
2. "LUP 45 DEG" must be used to set the upper limit on the phase graph.

NOTE

The LFR, LFP, and LFD mnemonic codes, which deal with limit frequency readouts, are only available on the following graph types: log magnitude (M/G), log magnitude and phase (MPH), phase (PHA), linear magnitude (LIN), linear magnitude and phase (LPH), standing wave ratio (SWR), and group delay (DLA). The active channel must be a frequency domain channel. The LFP code can be used to select phase limit frequency readouts on log magnitude and phase and linear magnitude and phase graph types. If the LFR code is used on either of these graph types, the magnitude limit frequency readout menu for the channel is displayed.

Command Codes: Hard Copy

The command codes concerned with hard copy are listed in Table 4-13.

TABLE 4.13

Hard Copy Command Codes

| COMMAND CODE | DESCRIPTION | VALUES | TERMINATORS |
|---|---|---|---|
| PFS | Prints Full Screen | N/A | N/A |
| PGR | Prints Graph Area Only | N/A | N/A |
| PMK | Prints Tabular Marker Data | N/A | N/A |
| PTB | Prints Tabular Trace Data | N/A | N/A |
| PMT | Prints Tabular Marker and Trace Data | N/A | N/A |
| PT0–PT9 | Selects Tabular Printout Point Density | N/A | N/A |
| PST | Stops Print/Plot | N/A | N/A |
| FFD | Printer Form Feed | N/A | N/A |
| PLS | Plots Entire Screen | N/A | N/A |
| PLD | Plots Graph Area | N/A | N/A |
| PLT | Plots Data Trace(s) | N/A | N/A |
| PMN | Plots Men | N/A | N/A |
| PLM | Plots Markers and Limits | N/A | N/A |
| PLH | Plots Header | N/A | N/A |
| PGT | Plots Graticule | N/A | |
| PFL | Selects Full Size Plot | N/A | N/A |
| PTL | Selects ¼ Size Plot, Top Left | N/A | N/A |
| PTR | Selects ¼ Size Plot, Top Right | N/A | N/A |
| PBL | Selects ¼ Size Plot, Bottom Left | N/A | N/A |
| PBR | Selects ¼ Size Plot, Bottom Right | N/A | N/A |
| DPN | Sets Pen Number for Plotting Data | 1 to 8 | XX1 |
| GPN | Sets Pen Number for Plotting Graticule | 1 to 8 | XX1 |
| MPN | Sets Pen Number for Plotting Markers and Limits | 1 to 8 | XX1 |
| HPN | Sets Pen Number for Plotting Header | 1 to 8 | XX1 |
| LMS | Labels Model and Serial Number of Device | String of Characters Up To 12 Characters Long | N/A |
| LDT | Labels Date of Test | String of Characters Up to 12 Characters Long | N/A |
| LID | Labels Device ID | String of Characters Up to 12 Characters Long | N/A |
| LNM | Labels Operator's Name | String of Characters Up to 12 Characters Long | N/A |
| TDD | Stores Tabular Data to Disk in File Specified (See File Naming Conventions in Paragraph 5-5.5) | N/A | N/A |
| RTB | Recalls Tabular Data From Disk File Specified to Printer | N/A | N/A |
| SPD | Sets Plotter Pen Speed Percentage | 10 to 100 | XX1, XX3, XM3 |

These commands are straightforward with the exception of PT0–PT9. These ten codes set up (1) the density of tabular data points output to the printer for PTB and PMT and (2) the number of data points included in the output file for TDD (tabular data to disk). The number in the PT0–PT9 mnemonic codes specifies the number of points that are skipped during the print. Therefore, PT0 selects the densest printing mode while PT9 gives the fewest number of data points.

The command codes for plotting fall into two categories: setup and action. The setup codes are those that specify the desired size and location of the plot (PFL, PTL, PTR, PBL, PBR) and the pen numbers for each element of the plot (DPN, GPN, MPN, HPN). The action mnemonics actually initiate a plot for the subset of the display desired (PLS, PLD, PLT, PMN, PLM, PLH, PGT).

The LMS, LID, LDT and LNM codes require a string of characters to be sent over the GPIB along with the mnemonic. A string input to the 360 must have the quote characters ("") surrounding the desired character for the string and cannot exceed the maximum number of characters specified for the mnemonics. An example of embedding quote characters in a string sent to the 360 is shown in App. 126. This example is in HP 85 BASIC.

The TDD code allows for outputting tubular data under the current print density mode (PT0–PT9) to an ASCII file. The RTB code causes the 360 to read an ASCII file assumed to be print data and output it to the printer.

NOTE

The maximum file size that can be handled with the RTB code is 58,000 bytes. Some miscellaneous commands are given in Table 4-14 as follows:

TABLE 4-14

| | Miscellaneous Command Codes | |
|---|---|---|
| RST | Resets 360 to its Default State | Similar to pressing the "DEFAULT PROGRAM" key. |
| FOF | Implements Frequency Blanking | Instructs the 360 to blank any frequency information from the screen and any hard copy output. This code is useful for security reasons. |
| FON | Disables Frequency Blanking | Frequency blanking can be turned off using this code. |
| BCO | Implements Display Blanking | Allows for the ultimate in security — a totally blank screen. In this mode, the 360 is fully operational over the GPIB but nothing appears on the display. |
| BC1 | Disables Display Blanking | Screen blanking is turned off using the BC1 mnemonic. |
| BLU | Selects Blue As 3rd Color Plane Color | Allows selection of the third color used by the 360 for markers, limits, and some menu annotation. |
| CYN | Selects Cyan As 3rd Color Plane Color | Allows selection of the third color used by the 360 for markers, limits, and some menu annotations. |
| TEST | Runs A Self Test | Instructs the 360 to perform a self test. An error in the self test would be reported in the primary status byte, bit 7 (see paragraph 5-5.7). |
| RTL | Returns to Local Control | Performs the same function as the control panel. RETURN TO LOCAL key. This code has no effect if the 360 is in local lockout. |
| DFP | Displays Global Operating Parameters | Displays Global Operating Parameters in the data area or the screen. |
| DGS | Displays GPIB System Parameters | Displays GPIB System Parameters in the data area of the screen. |
| DCP | Displays Calibration Parameters | Displays Calibration Pararmters in the data area of the screen. |
| DC1 | Displays Channel 1 and 2 Operating Parameters | Displays Channels 1 and 2 Operating Parameters in the data area of the screen. |
| DC3 | Displays Channel 3 and 4 Operating Parameters | Displays Channels 1 and 2 Operating Parameters in the data of the screen. |

Some more advanced command codes are described in Tables 5-1 through 5-4 as follows:

TABLE 5.1

Calibration Command Codes

| | | | |
|---|---|---|---|
| RPC | Repeat Previous Calibration | N/A | N/A |
| LTC | Specify Coaxial Lim | N/A | N/A |
| LTU | Specify Microstrip Line Type | N/A | N/A |
| LTW | Specify Wavestrip Line Type | N/A | N/A |
| SCM | Specify Standard Calibration Method | N/A | N/A |
| OCM | Specify Offset Short Calibration Method | N/A | N/A |
| LCM | Specify LRL Calibration Method | N/A | N/A |
| C12 | Begin 12-term Calibration | N/A | N/A |
| C8T | Begin 8-term (I Port) Calibration | N/A | N/A |
| CRF | Begin Reflection Only (1 Port) Calibration | N/A | N/A |
| CFR | Begin Frequency Response Calibration | N/A | N/A |
| CFT | Begin Reflection Only Frequency Response Calibration | N/A | N/A |
| CRL | Begin Reflection Only Frequency Response Calibration | N/A | N/A |
| NOC | Specify Normal 501-point Calibration | N/A | N/A |
| DFC | Specify Discrete Frequency Calibration | N/A | N/A |
| CWC | Specify CW Calibration | N/A | N/A |
| TDC | Specify Time Domain Harmonic Calibration | N/A | N/A |
| SRT | Enter Start Frequency for Normal or Harmonic Calibration | Depends on Frequency Range of Instrument | GHZ, MHZ, KHZ |
| STP | Enter Stop Frequency for Normal or Harmonic Calibration | Depends on Frequemy Range of Instrument | GHZ, MHZ, KHZ |
| DFQ | Enter Discrate Frequency for Calibration Range of Instrument | Depends an Frequency | GHZ, MHZ, KHZ |
| CWF | Enter CE Frequency for Calibration | Depends on Frequency Range of Instrument | GHZ, MHZ, KHZ- |

App. 134 shows a sample program for controlling the calibration data collection, and FIG. 89 shows the binary data transfer message format.

Table 5—5 shows the output values versus various graph types, and App. 138 shows the response string from the OID comment as follows.

TABLE 5.5

Output Values Versus Various Graph Types

| Display Type | Output Values |
|---|---|
| Log Magnitude | dB, Degrees |
| Phase | dB. Degrees |
| Log Mag & Phase | dB, Degrees |
| Linear Magnitude | Lin Mag (Rho or Tau), Degrees |
| Linear Mag & Phase | Lin Mag (Rho or Tau), Degrees |
| Smith Chart | Ohms, Ohms (r + jx) |
| Inverted Smith | Siements, Siemens (G + o) |
| Group Delay | Seconds, Degrees |
| Log Polar | dB, Degrees |
| Linear Polar | Lin.Mag (Rho or Tau), Degrees |
| Real | Real, imag |
| Imaginary | Real, imag |
| Real & Imaginary | Real, imag |
| SWR | SWR, Degrees |

Table 5-6 shows the calibration coefficient order for various calibration types, and tables 5-7 and 5-8 describe additional command codes.

TABLE 5-6

Calibration Coefficient Ordering Calbration Type

| Co-efficient # | 12-term C12 | 8-term C8T | Refl Only CRF | Freq Resp CFR | Transmssn Freq Resp CFT | Refl Freq Resp CRL | None |
|---|---|---|---|---|---|---|---|
| 1 | EDF | EDF | EDF | ERF | ETF | ERF | — |
| 2 | ESF | ESF | ESF | ETF | — | — | — |
| 3 | ERF | ERF | ERF | — | — | — | — |
| 4 | EXF | ETF | — | — | — | — | — |

TABLE 5-6-continued

Calibration Coefficient Ordering Calbration Type

| Co-efficient # | 12-term C12 | 8-term C8T | Refl Only CRF | Freq Resp CFR | Transmssn Freq Resp CFT | Refl Freq Resp CRL | None |
|---|---|---|---|---|---|---|---|
| 5 | ELF | — | — | — | — | — | — |
| 6 | ETF | — | — | — | — | — | — |
| 7 | EDR | — | — | — | — | — | — |
| 8 | ESR | — | — | — | — | — | — |
| 9 | ERR | — | — | — | — | — | — |
| A | EXR | — | — | — | — | — | — |
| B | ELR | — | — | — | — | — | — |
| C | ETR | — | — | — | — | — | — |

TABLE 5-7

Group Execute Trigger Command Codes

| Command Code | Description | Values |
|---|---|---|
| DEF | Begin Definition of Group Execute Trigger Response | N/A |
| END | End Definition of Group Execute Trigger Response | N/A |

TABLE 5-8

Disk Functions Command Codes

| Command Code | Description | Values |
|---|---|---|
| SDK | Store Active Channel's Trace Memory to Disk File | String up to 8 Characters Long for File Name |
| RCK | Recall Active Channel's Trace Memory From Disk File | String up to 8 Characters Long for File Name |
| STO | Store Calibration Data and Front Panel Setup Information to Disk File | String up to 8 Characters Long for File Name |
| RLD | Recall Calibration Data and Front Panel Setup Information From Disk File | String up to 8 Characters Long for File Name |
| TDD | Store Tabular Printout Data to ASCII Disk File | String up to 8 Characters Long for File Name |
| RTB | Recall Tabular Data File From Disk for Output to Printer | String up to 8 Characters Long for File Name |
| DEC | Delete Calibration and Front Panel Setup File From Disk | String up to 8 Characters Long for File Name |
| DED | Delete Tabular Printout Data File From Disk | String up to 8 Characters Long for File Name |
| DEN | Delete Trace Memory File From Disk | String up to 8 Characters Long for File Name |
| INT | Initialize (Format) Disk in Drive as a Data-Only Disk | N/A |
| LKT | Load Calibration Kit Information From Disk | N/A |

App. 141 is an example program illustrating the use of disk function command codes. Apps. 142 and 143 illustrate the two status bytes which describe the status of the 360, Table 5-9 describes the status byte command codes.

TABLE 5-9.

Status Byte Command Codes

| Command Code | Description | Values |
|---|---|---|
| OPB | Output Primary Status Byte | One Binary Byte |
| OEB | Output Extended (Secondary) Status Byte | One Binary Byte |
| IPM | Input Primary Status Mask | One Binary Byte |
| IEM | Input Extended (Secondary) Status Mask | One Binary Byte |
| SQ0 | Disable Service Requests | N/A |
| SQ1 | Enable any Unmasked Service Requests | N/A |
| CSB | Clear Primary and Secondary Status Bytes | N/A |

App. 145 shows a sample program for status byte enable mask setup and service request handling. Table 5-10 describes the Time Domain command codes.

TABLE 5-10

Time Domain Command Codes

| Command Code | Description | Values | Terminators |
|---|---|---|---|
| FQD | Select Frequency Domain for Active Channel | N/A | N/A |
| TBP | Select Bandpass Mode With Time Readouts for active Channel | N/A | N/A |
| DBP | Select Bandpass Mode With Distance Readouts for Active Channel | N/A | N/A |
| TPI | Select Phasor Impulse Mado With Time Readouts for Active Channel | N/A | N/A |
| DPI | Select Phasor Impulse Mode With Distance Readouts for Active Channel | N/A | N/A |
| TLP | Select Lowpass Mode With Time Readouts for Active Channel | N/A | N/A |
| DLP | Select Lowpass Mode With Distance Readouts fot Active Channel | N/A | N/A |
| FGT | Select Frequency With Time Gate Made | N/A | N/A |
| LPI | Select Lowpass Impulse Response for Active Channel | N/A | N/A |
| LPS | Select Lowpass Stop Response for Active Channel | N/A | N/A |
| GON | Turn Gate On on Active Channel | N/A | N/A |
| GON | Turn Gate Off on Active Channel | N/A | N/A |
| GDS | Display Gate Symbols on Active Channel With Gate Off | N/A | N/A |
| ZST | Sat Start of Time Domain Zoom Range for All Channels in Time Domain | N/A | N/A |
|  | Time Mode: | .999.999 to 999.999 us | PSC, NSC, USC |
|  | Distance Mode: | .999.999 to 999.999 m | MMT, CMT, MTR |
| ZSP | Set Stop of Time Domain Zoom Range for All Channels in Time Domain |  |  |
|  | Time Mode: | .999.999 to 999.999 us | PSC, NSC, USC |
|  | Distance Mode: | .999.999 to 999.999 m | MMT, CMT, MTR |
| ZCT | Set Center of Time domain Zoom Range for All Channels in Time Domain |  |  |
|  | Time Mode: | .999.999 to 999.999 us | PSC, NSC, USC |
|  | Distance Mode | .999.999 to 999.999 m | MMT, CMT, MTR |
| ZSN | Sat Span of Time Domain Zoom Rangs for All Channels in Time Domain |  |  |
|  | Time Mode: | 0 to 999.999 us | PSC, NSC, USC |
|  | Distance Mode | 0 to 999.999 m | MMT, CMT, MTR |
| GST | Set Gate Start Value for All Channels in Time Domain |  |  |
|  | Time Mode: | −999.999 to 999.999 us | PSC, NSC, USC |
|  | Distance Made: | −999.999 to 999.999 m | MMT, CMT, MTR |
| GSP | Set Gate Stop Value for all Channels in Time Domain |  |  |
|  | Time Mode: | −999.999 to 999.999 us | PSC, NSC, USC |
|  | Distance Mode: | −999.999 to 999.999 m | MMT, CMT, MTR |
| GCT | Set Gate Center Value for All Channels in Time Domain |  |  |
|  | Time Mode: | 0.0000 to 999.999 us | PSC, NSC, USC |
|  | Distance Mads: | 0.0000 to 999.999 m | MMT, CMT, MTR |
| GSN | Sat Gate Span Value for all Channels in Time Domain |  |  |
|  | Time Mode: | 0.0000 to 999.999 us | PSC, NSC, USC |
|  | Distance Mode | 0.0000 to 999.999 m | MMT, CMT, MTR |
| GRT | Select Rectangular Gate Shape for all Time Domain Channels | N/A | N/A |
| GNM | Select Nominal Gate Shape for all Time Domain Channels | N/A | N/A |
| GLS | Select Low Sidelobe Gate Shape for all Time Domain Channels | N/A | N/A |
| GMS | Select Minimum Sidelobe Gate Shape for all Time Domain Channels | N/A | N/A |
| WRT | Select Rectangular Window Shape for all Time Domain Channels | N/A | N/A |
| WNM | Select Nominal Window Shape for all Time Domain Channels | n/a | n/a |
| WLS | Select Low Sidelobe Windows Shape for all Time Domain Channels | N/A | N/A |
| WMS | Select Minimum Sidelobe Window Shape for all Time Domain Channels | N/A | N/A |
| MRR | Restore Original Range After a Marker Zoom Operation | N/A | N/A |
| DCA | Select Auto d.c. term for Low Pass | N/A | N/A |
| DCZ | Select Line impedance d.c. term for Low pass | N/A | N/A |

TABLE 5-10-continued

Time Domain Command Codes

| Command Code | Description | Values | Terminators |
|---|---|---|---|
| DCO | Select Open d.c. Term for Low Pass | N/A | N/A |
| DCS | Select Short d.c. Term for Low Pass | N/A | N/A |
| DCV* | Sect Low Pass d.c. Term to Value | −100MΩ to 1000 MΩ | XX1, XX3, XM# |

An extensive source code listing has been attached hereto as an Appendix and shall be construed as being incorporated herein in its entirety at the end of the description and prior to the claims.

The MODEL 360 VECTOR NETWORK ANALYZER OPERATION MANUAL, copyright 1987, printed December 1987, available from WILTRON Company, the assignor herein, is hereby incorporated herein in its entirety by this reference.

Thus, the scope of the invention is not intended to be limited except by the appended claims in which:

Appendix

-including-

MENU DISPLAYS FOR FUNCTIONS

AVAILABLE ON

THE MEASUREMENT SYSTEM

AND

ERROR CODES

PROVIDED FROM

THE MEASUREMENT SYSTEM

AND

COMMAND CODES

ACCEPTABLE TO

THE MEASUREMENT SYSTEM

| MENU | DESCRIPTION |
|---|---|
| SELECT CALIBRATION DATA POINTS | |
| NORMAL (501 POINTS MAXIMUM) | Selects the standard calibration from a start to a stop frequency that provides for up to 501 equally spaced (except the last) points of data for the defined frequency range. A flowchart of the calibration sequence is shown in FIG. 3-40. |
| C.W. (1 POINT) | Selects the single frequency (C.W.) calibration sequence that provides for 1 data point at a selected frequency. |
| N-DISCRETE FREQUENCIES (2 TO 501 POINTS) | Selects the discrete frequency calibration mode that lets you input a list of up to 501 individual data point frequencies. |
| TIME DOMAIN (HARMONIC) PRESS <ENTER> | Selects the calibration mode for low-pass time-domain processing. Pressing the ENTER key implements |

-continued

| MENU | DESCRIPTION |
|---|---|
| TO SELECT | your selection. |

| MENU | |
|---|---|
| FREQ RANGE OF CALIBRATION | |
| START XX.XXXX GHz | Enter the sweep-start frequency for calibration. If you desire, you can change this frequency for your meaurement when you reach Menu SU1, which follows the final calibration menu. The only restriction is that your start measurement frequency be greater than or equal to your start calibration frequency. |
| STOP XX.XXXX GHz | Enter the sweep-stop frequency for calibration. Like the start frequency, this too can be changed for your measurement. The stop frequency must be lower than or equal to your stop calibration frequency. In other words, your measurement frequency span must be equal to or smaller than your calibration frequency span. |
| XXX DATA PTS USING ABOVE START AND STOP XXX.X MHz STEP SIZE | The program automatically sets the step size, based on the selected start and stop frequencies. The step size will be the smallest possible (largest number of points up to a maximum of 501), based on the chosen frequency span. |
| NEXT CAL STEP | Displays the next menu in the calibration sequence. |
| PRESS <ENTER> TO SELECT | Pressing the ENTER key implements your menu selection. |

| MENU | DESCRIPTION |
|---|---|
| INSERT INDIVIDUAL FREQUENCIES | |
| INPUT A FREQ PRESS <ENTER> TO INSERT NEXT FREQ. XX.XXXXXX GHz | Move the cursor here and enter the next frequency for which you wish calibration data taken. If the AUTO INCR option is ON, pressing ENTER automatically increments the calibration frequency by the interval in GHz that appears the option. |
| XXX FREQS. ENTERED, LAST FREQ WAS XX.XXXXXX GHz | Shows the number of frequencies that you have entered and reports the value of the last frequency entered. |
| AUTO INCR ON (OFF) XX.XXXXXX GHz | Move the cursor here and press ENTER to switch the Auto-Increment mode on or off. If AUTO INCR is on, you may enter the frequency spacing. |
| PREVIOUS MENU | Displays C2D Menu. |

| MENU | DESCRIPTION |
|---|---|
| PRESS <ENTER> TO SELECT OR TURN ON/OFF | Pressing ENTER will cause actions as described above. |

| MENU | DESCRIPTION |
|---|---|
| SINGLE POINT CALIBRATION | |
| C.W. FREQ XX.XXXXXX GHz | Move cursor here and enter the frequency for which calibration is to be done. |
| FINISHED ENTRY, NEXT CAL STEP | Move cursor here and press ENTER when finished. |
| INPUT FREQ AND PRESS <ENTER> TO SELECT | Input the frequency value and press the ENTER key. |

| MENU | DESCRIPTION |
|---|---|
| CALIBRATION RANGE HARMONIC CAL FOR TIME DOMAIN | |
| START (STEP) XX.XXXXXX GHz | Move cursor here to enter the desired start frequency. This frequency also will be used as the frequency increment. |
| APPROX STOP XX.XXXXXX GHz | Move the cursor here to enter the approximate desired stop frequency. The frequency will be adjusted to the nearest harmonic multiple of the start frequency. |
| USING ABOVE START AND STOP WILL RESULT IN XXX DATA POINTS AND XX.XXXXXX GHz TRUE STOP | The program automatically indicates the number of data points and the true (harmonic) stop frequency. |
| NEXT CAL STEP PRESS <ENTER> TO SELECT | Move the cursor here and press ENTER when finished. |

| MENU | DESCRIPTION |
|---|---|
| FILL FREQUENCY RANGES | |
| INPUT START. INCR. POINTS, THEN SELECT "FILL RANGE" | This menu is used to create one or more ranges of discrete equally spaced frequency points for calibration. |
| START FREQ 0.5000 GHz | Enter the first frequency of the range. |
| INCREMENT 0.1004 GHz | Enter the increment (step size) between one frequency and the next. |
| NUM OF PTS 82 POINTS | Enter the number of frequency points in the range. |
| STOP FREQ XX-XXXX GHz | |
| FILL RANGE (ENTERED 82 FREQS) | Moving the cursor here and pressing ENTER fills the range and shows the number of frequencies selected (in NUM OF PTS above). |
| INSERT INDIVIDUAL FREQUENCIES | Calls Menu C2A, which allows you to set the individual frequencies. |
| FINISHED ENTRIES. NEXT CAL STEP | Calls Menu C3, the next menu in the calibration sequence. |
| PRESS <ENTER> | Pressing the ENTER key implements |

| MENU | DESCRIPTION |
|---|---|
| TO SELECT | your menu selection. |

| MENU | DESCRIPTION |
|---|---|
| CONFIRM CALIBRATION PARAMETERS | |
| PORT 1 CONN: SMA (M) | Displays the connector type for which the calibration is set to correct. This should agree with the connector type on both your calibration components and the test device. |
| PORT 2 CONN: SMA (F) | |
| LOAD TYPE (BROADBAND) | Displays the type of load (termination) that you will use in the calibration. If you wish a different type, press the ENTER key to display Menu C4). |
| CHANGE PORT 1 CONN | Move cursor to appropriate line and press ENTER to change connector type. |
| CHANGE PORT 2 CONN | Move cursor to appropriate line and press ENTER to change connector type. |
| CHANGE LOAD TYPE | Move cursor to appropriate line and press ENTER to change load type. |
| START CAL | Starts the calibration sequence. |
| PRESS <ENTER> TO SELECT | Pressing the ENTER key implements your menu selection. |

| MENU | DESCRIPTION |
|---|---|
| SELECT PORT 1 or 2 CONNECTOR TYPE | |
| SMA (M) SMA (F) | Applies the four capacitance-coefficient values to the Open that are needed to correct for an SMA connector being installed on the test device. Refer to paragraph 3-11.4, "Using Calibration Standards," for a discussion on this topic. |
| K-CONNECTOR (M) K-CONNECTOR (F) | Same as above, except for K Connector. |
| TYPE N (M) TYPE N (F) | Same as above, except for Type-N connector. |
| GPC-7 | Same as above, except for GPC-7 connector. |
| OTHER | Calls Menu C12, which allow you to specify the connector coefficients. |
| PRESS <ENTER> TO SELECT | Pressing the ENTER key implements your menu selection. |

| MENU | DESCRIPTION |
|---|---|
| SELECT CALIBRATION TYPE | |
| KEEP EXISTING CAL DATA | Keeps the existing calibration data, then exits the calibration sequence by calling up Menu C13. |
| FULL 12-TERM | Corrects for error terms $E_{TF}$, $E_{TR}$, $E_{RF}$, $E_{RR}$, $E_{DF}$, $E_{DR}$, $E_{XF}$, $E_{XR}$, $E_{SF}$, $E_{SR}$, $E_{LF}$, and $E_{LR}$ (FIG. 3-39), which are all of the error-terms associated with a two-port measurement. Refer to paragraph 3-11.1, "Explaining Measurement Accuracy," for a detailed decussion of these error terms. |
| 1 PATH 2 PORT | Corrects for forward-direction error terms $E_{TF}$, $E_{RF}$, $E_{DF}$, and $E_{SF}$. |
| FREQUENCY RESPONSE ONLY | Corrects for forward-direction error terms $E_{RF}$, and $E_{DF}$. These provide a frequency-response-only correction for |

101
-continued

| MENU | DESCRIPTION |
|---|---|
| REFLECTION ONLY (PORT 1) PRESS <ENTER> TO SELECT | Port 1. Corrects for forward-direction error terms $E_{RF}$, $E_{DF}$, and $E_{SF}$. These provide a reflection-only correction for Port 1. Pressing the ENTER key implements your menu selection. |

| MENU | DESCRIPTION |
|---|---|
| SELECT FREQUENCY RESPONSE TYPE TRANSMISSION | For the calibration-correction of the transmission-only frequency-response error term. |
| REFLECTION | For the calibration-correction of the reflection-only frequency-response error term. |
| BOTH | For the calibration-correction of both transmission and reflection frequency-response error terms. |
| PRESS <ENTER> TO SELECT | Pressing the ENTER key implements your selection. |

| MENU | DESCRIPTION |
|---|---|
| SELECT TYPE OF LOAD BROADBAND FIXED LOAD | Selects calibration based on the broadband load being used. |
| SLIDING LOAD (FREQS BELOW 2 GHz ALSO REQUIRE FIXED BROADBAND LOAD) | Selects calibration based on the sliding load being used. If your low-end frequency is below 2 GHz, a fixed broadband load is also required. |
| PRESS <ENTER> TO SELECT | Pressing the ENTER key implements your menu selection. |

| MENU | DESCRIPTION |
|---|---|
| CALIBRATION SEQUENCE CONNECT CALIBRATION DEVICES: | |
| PORT 1: XXXXXXXXXXXX | Connect the required components to Port 1. |
| PORT 2: XXXXXXXXXXXX | Connect the required components to Port 2. |
| MESSAGE AREA (See FIG. 3-47 | |

| MENU | DESCRIPTION |
|---|---|
| CALIBRATION SEQUENCE SLIDE LOAD TO POSITION X | Slide the load to the next position, then press the ENTER key. Moving the slide to six different positions provides sufficient data for the program to accurately calculate the effective directory of the system |

102

| MENU | DESCRIPTION |
|---|---|
| CALIBRATION SEQUENCE CONNECT THROUGHLINE BETWEEN TEST PORTS | Connect Ports 1 and 2 together using the Throughline cable |

| MENU | DESCRIPTION |
|---|---|
| CALIBRATION SEQUENCE COMPLETED PRESS <SAVE/RECALL> TO STORE CAL DATA ON DISK | Pressing the SAVE/RECALL MENU Key displays Menu SR that lets you save your calibration data onto a disk or recall previously saved calibration data from a disk. While this menu provides a convenient point at which to save the calibration data, it is not the only point allowed. You can use the SAVE/RECALL MENU key at any point in the measurement program. |
| OR PRESS <ENTER> TO PROCEED | Pressing the ENTER key implements your menu selection. |

| MENU | DESCRIPTION |
|---|---|
| PORT 1 OR 2 OPEN DEVICE ENTER THE CAPACITANCE COEFFICIENTS | Enter the capacitance-coefficient values needed to correct for your Open device. |
| TERM 1-CO ±XXX.XXe-15 | Enter the term 1 coefficient value. |
| TERM 2-C1 ±XXX.XXe-27 | Enter the term 2 coefficient value. |
| TERM 3-C2 ±XXX.XXe-36 | Enter the term 3 coefficient value. |
| TERM 3-C3 ±XXX.XXe-45 | Enter the term 3 coefficient value. |
| ENTER THE OFFSET LENGTH OFFSET LENGTH ±XXX.XX mm | Enter the offset length value needed to correct for your Open device |
| PRESS <ENTER> WHEN COMPLETE | Pressing the ENTER key implements your menu selection |

| MENU | DESCRIPTION |
|---|---|
| PORT 2 SHORT DEVICE ENTER THE OFFSET LENGTH OFFSET LENGTH ±XXX.XXX mm | Enter the length that the Short is offset from the reference plane. |
| PRESS <ENTER> WHEN COMPLETE | Pressing the ENTER key implements your menu selection. |

| MENU | DESCRIPTION |
|---|---|
| EXISTING CALIBRATION KEPT | Retains the existing calibration data in memory. At the end of three seconds, the appropriate measurement setuop menu appears. |

| MENU TEXT | DESCRIPTION |
|---|---|
| SAVE/RECALL FRONT PANEL INFORMAITON | |
| SAVE RECALL | Displays Menu SR2, which asks you to select a storage location- internal memeory or disk. |
| PRESS <ENTER> TO SELECT FUNCTION | Pressing the ENTER key implements your menu selection. The menu remains on the screen until another menu is selected for display or until the CLEAR/RET LOC key is pressed. |

| MENU TEXT | DESCRIPTION |
|---|---|
| RECALL (or SAVE) FRONT PANEL SETUP IN INTERNAL MEMORY | Calls Menu SR3, which lets you save the control panel setup into or recalls it from internal memory. |
| CAL DATA AND FRONT PANEL SETUP ON DISK | Saves the calibration data and control panel setup onto the disk or recalls them from the disk. This selection displays Menu DSK9(recall) or DSK11, and GP1-3(save) which asks you to select a disk file. |
| PRESS <ENTER> TO SELECT | Pressing the ENTER key implements your menu selection. The menu remains on the screen until another menu is selected-for display or until the CLEAR/RET LOC key is pressed. |

| MENU | DESCRIPTION |
|---|---|
| SAVE TO INTERNAL MEMORY | |
| MEMORY 1 | Causes the current control (front) panel setup to be saved to memory location 1. |
| MEMORY 2 | Same as above, except the setup saves to memory location 2. |
| MEMORY 3 | Same as above, except the setup saves to memory location 3 |
| MEMORY 4 | Same as above, except the setup saves to memory location 4 |
| PRESS <ENTER> TO SELECT OR USE KEYPAD | You may press the ENTER key or use the keypad to impelement your menu selection. The menu remains on the screen until another menu is selected for display or until the CLEAR/RET LOC key is pressed. |

| MENU | DESCRIPTION |
|---|---|
| WARNING INTERNAL MEMORY DOES NOT MATCH CURRENT CAL SETUP | Warns that the setup you are attempting to recall is not compatible with the calibration data stored in memory. |
| CONTINUING RECALL WILL DESTROY CURRENT CAL | Recalling the setup in question will destroy the calibration data stored in memory. |
| PRESS <ENTER> TO RECALL OR PRESS <CLEAR> TO ABORT | Pressing the ENTER key recalls the selected setup, while pressing the CLEAR key aborts the selection. |

| MENU | DESCRIPTION |
|---|---|
| SWEEP SETUP | |
| START XX.XXXXXX GHz | Enter the sweep-start frequency in GHz. The start frequency must be lower than the stop frequency. |
| STOP XX.XXXXXX GHz | Enter the sweep-stop frequency in GHz. The stop frequency must be higher than the start frequency. |
| XXX DATA PTS USING ABOVE START AND STOP XXX.X MHz STEP SIZE | Displays the number of frequency points and the spacing between points for the start and stop frequencies selected above. The number of points shown provides the finest frequency resolution possible, based on your DATA POINTS key MAXIMUM-NORMAL- MINIMUM selection. |
| C.W. MODE ON XX.XXXXXX GHz | Move cursor here and press ENTER to enable the CW mode. Enter CW frequency for measurements. |
| MARKER SWEEP | Move cursor here and press ENTER to set the start and stop frequencies (SU5) or the CW frequency (SU6) to the values of any marker |
| HOLD BUTTON FUNCTION | Displays Menu SU4, which lets you set the action of the HOLD key. |
| REDUCED TEST SIGNALS | Displays Menu SU2, which lets you set the source power and the values for the attenuators in the Model 3620 Series Test Set. |
| PRESS <ENTER> TO SELECT OR TURN ON/OFF | Pressing the ENTER key implements your menu selection. The menu remains on the screen until another menu is selected for display or until the CLEAR/RET LOC key is pressed. |

| MENU | DESCRIPTION |
|---|---|
| SWEEP SETUP REDUCED TEST SIGNALS | |
| SOURCE POWER ±XX.XdBm | Enter the output-power level for the sweep generator (frequency source) in dBm. |
| PORT 1 SOURCE X0 dB (0–70) | Attenuates the microwave source power from 0 to 70 dB, in 10 dB steps. The power is attenuated before being applied to Port 1 for a forward transmission or reflection test ($S_{21}$ or $S_{11}$, respectively). |
| PORT 2 SOURCE X0 dB (0–70) | Attenuates the microwave source power from 0 to 70 dB, in 10 dB steps. The power is attenuated before being applied to Port 2 for a reverse transmission or reflection test ($S_{12}$ or $S_{22}$, respectively). |
| PORT 2 TEST X0 dB (0–40) (THIS REDUCES SIGNAL FROM AMPLIFIER UNDER TEST) | Attenuates from 0 to 40 dB (10 dB steps) the microwave power being input to Port 2 from the device-under-test (DUT). |

| MENU | DESCRIPTION |
|---|---|
| SINGLE POINT MEASUREMENT SETUP | |
| C.W. FREQ XX.XXXXXX GHz | Enter the measurement frequency in GHz for continuous wave (CW) operation. |
| HOLD BUTTON FUNCTION | Displayes Menu SU4, which lets you set the action of the HOLD key. |
| REDUCED TEST SIGNALS | Displays Menu SU2, which lets you set values for the source power and attenuators in the Model 3620 |

| MENU | DESCRIPTION |
|---|---|
| RETURN TO SWEEP MODE | Series Test Set. Move cursor here and press ENTER to return to the F1-F2 sweep mode. (Menu SU1) |
| PRESS <ENTER> TO SELECT | Pressing the ENTER key implements your menu selection. The menu remains on the screen until another menu is selected for display or until the CLEAR/RET LOC key is pressed. |

| MENU | DESCRIPTION |
|---|---|
| SELECT FUNCTION FOR HOLD BUTTON | |
| HOLD/CONTINUE | Causes the hold key (button) to stop and start the sweep. |
| HOLD/RESTART | Causes the hold key to stop and restart the sweep. |
| SINGLE SWEEP AND HOLD | Causes the hold key to trigger a single sweep and hold when finished. (Two sweeps, one from Port 1 to 2 and another from Port 2 to 1, are accomplished for a 12-Term measurement.) |
| PRESS <ENTER> TO SELECT | Pressing the ENTER key implements your menu selection. The menu remains on the screen until another menu is selected for display or until the CLEAR/RET LOC key is pressed. |

| MENU | DESCRIPTION |
|---|---|
| FREQUENCY MARKER SWEEP | |
| START SWEEP MARKER (n) XX.XXXX GHz | Pressing a number on the keypad causes the associated marker to be the start frequency of the sweep. |
| STOP SWEEP MARKER (n) XX.XXXX GHz | Pressing a number on the keypad causes the associated marker to be the stop frequency of the sweep. |
| USE KEYPAD TO SELECT MARKER (1-6) | Use the keypad to select markers 1, 2, 3, 4, 5, or 6. |

| MENU | DESCRIPTION |
|---|---|
| FREQUENCY MARKER C.W. | |
| C.W. FREQ MARKER (n) XX.XXXX GHz | Pressing a number on the keypad causes the associated marker to be the C.W. frequency. |
| USE KEYPAD TO SELECT MARKER (1-6) | Use the keypad to select markers 1, 2, 3, 4, 5, or 6. |

| MENU | DESCRIPTION |
|---|---|
| SELECT DISPLAY MODE | |
| SINGLE DISPLAY | Selects a single channel for display, which can be log magnitude, phase, log magnitude and phase, or Smith chart. You select the type of display in Menu GT. |
| DUAL DISPLAY CHANNEL 1-3 | Selects Channels 1 and 3 for display. You select the type of display in Menu GT. |
| DUAL DISPLAY CHANNEL 2-4 | Selects Channels 2 and 4 for display. You select the type of display in Menu GT. |
| ALL FOUR CHANNELS | Selects all four channels for display. You select the type of display in Menu GT. |
| PRESS <ENTER> TO SELECT | Pressing the ENTER key implements your menu selection. The menu remains on the screen until another menu is selected for display or until the CLEAR/RET LOC key is pressed. |

| MENU | DESCRIPTION |
|---|---|
| SELECT S-PARAMETER | |
| S21 FWD TRANS | Selects the $S_{21}$ parameter to be displayed on the active channel. The parameter can be displayed in any of the available formats. |
| S11 FWD REFL | Selects the $S_{11}$ parameter to be displayed on the active channel. The parameter can be displayed in any of the available formats. |
| S12 REV TRANS | Selects the $S_{12}$ parameter to be displayed on the active channel. The parameter can be displayed in any of the available formats. |
| S22 REV REFL | Selects the $S_{22}$ parameter to be displayed on the active channel. The parameter can be displayed in any of the available formats. |
| PRESS <ENTER> TO SELECT | Pressing the ENTER key implements your menu selection. The menu remains on the screen until another menu is selected for display or until the CLEAR/LOC key is pressed. |

| MENU | DESCRIPTION |
|---|---|
| SELECT GRAPH TYPE | |
| LOG MAGNITUDE | Selects a log magnitude graph for display on the active channel's selected s-parameter. The active channel is indicated by its key (CH1, CH2, CH3, CH4) being lit. |
| PHASE | Selects a phase graph for display on the active channel. |
| LOG MAGNITUDE AND PHASE | Selects log magnitude and phase graphs for display on the active channel. |
| SMITH CHART (IMPEDANCES) | Selects a Smith chart for display on the active channel. |
| SWR | Selects an SWR display for the active channel. |
| GROUP DELAY | Selects a Group Delay display for the active channel. |
| MORE | Takes you to additional graph type selections on Menu GT2. |
| PRESS <ENTER> TO SELECT AND RESUME CALIBRATION | Pressing the ENTER key implements your menu selection and resumes the calibration from where it left off, if in the calibration mode. The menu remains on the screen until another menu is selected for display or until the CLEAR/RET LOC key is pressed. |

| MENU | DESCRIPTION |
|---|---|
| SELECT GRAPH TYPE | |
| ADMITTANCE SMITH CHART | Selects an Admittance Smith chart for display on the active channel's s-parameter. |
| LINEAR POLAR | Selects a Linear Polar graph for display on the active channel's s-parameter. |
| LOG POLAR | Selects a Log Polar graph for display of the active channel's s-parameter. |
| LINEAR MAG | Selects a Linear Magnitude graph for display on the active channel's s-parameter. |
| LINEAR MAG AND PHASE | Selectes Linear Magnitude and Phase graphs for display on the channel's s-parameter. |
| REAL | Selects Real data for display on the active channel's s-parameter. |
| IMAGINARY | Selects Imaginary data for display on the active channel's s-parameter. |
| REAL AND IMAGINARY | Selects both Real and Imaginary data for display on the active channel's s-parameter. |
| MORE | Takes you to additional graph type selections |
| PRESS <ENTER> TO SELECT AND RESUME CALIBRATION | Pressing the ENTER key implements your menu selection and resumes the calibration from where it left off, if in the calibration mode. The menu remains on the screen until another menu is selected for display or until the CLEAR/RET LOC key is pressed. |

| MENU | DESCRIPTION |
|---|---|
| TRACE MEMORY FUNCTIONS | |
| VIEW DATA | Displays measured data; that is, the data presently being taken. |
| VIEW MEMORY | Displays stored data; that is, data that was previously taken and stored in memory. |
| VIEW DATA AND MEMORY | Displays measured data superimposed over stored data. |
| VIEW DATA + MEMORY | Displays measured data divided by stored data. |
| SELECT TRACE MATH | Takes you to Menu NO2 for selection of the type of math operation to be performed. |
| STORE DATA TO MEMORY | Stores the measured data to internal memory. |
| DISK FUNCTIONS | Brings up Menu NO3, which allows data to be stored to or recalled from the disk. |
| MEMORY DATA REF. DELAY XXX.XXX CM | Indicates the reference delay applied to the memory data being displayed. |
| PRESS <ENTER> TO SELECT | Pressing the ENTER key implements your menu selection and remains on the screen until another menu is selected for display or until the CLEAR/RET LOC key is pressed. |

| MENU | DESCRIPTION |
|---|---|
| SELECT TRACE MATH | |
| ADD (+) | Selects DATA + MEMORY as the math function. |
| SUBTRACT (−) | Selects DATA − MEMORY as the math function. |
| MULTIPLY (×) | Selects DATA × MEMORY as the math function. |
| DIVIDE (÷) | Selects DATA ÷ MEMORY as the math function. |

| MENU | DESCRIPTION |
|---|---|
| PRESS <ENTER> TO SELECT | Pressing the ENTER key implements your menu selection. The menu returns to the NO1 menu. |

| MENU | DESCRIPTION |
|---|---|
| TRACE MEMORY DISK FUNCTIONS | |
| CHANNEL X | Indicates the channel to be used (active channel). |
| STORE TO DISK | Displays GP1-3 or DSK11 menu to select file store data from selected channel on disk |
| RECALL FROM DISK | Displays DSK9 menu to select file to recall from disk. |
| PRESS <ENTER> TO SELECT | Pressing the ENTER key implements your menu selection. The menu remains on the screen until another menu is selected for display or until the CLEAR/RET LOC key is pressed. |

| MENU | DESCRIPTION |
|---|---|
| SET REFERENCE DELAY | |
| AUTO | Automatically sets the reference delay so that the cumulative phase shift is zero. This selection unwinds the phase in a Smith chart display or reduces the phase revolutions in a rectilinear display to less than one. |
| DISTANCE XXX.XXX mm | Electrically repositions the measurement reference plane, as displayed on the active channel, by a distance value entered in millimeters. This selection lets you compensate for the phase reversals inherent in a length of transmission line connected between the test set's Port 1 connector and the device-under-test (DUT). |
| TIME XXX.XXX ms | Electrically repositions the measurement reference plane by a distance value that corresponds to the time in milliseconds. |
| SET DIELECTRIC | Displays Menu RD2, which lets you enter a value for the dielectric constant of your transmission line. |
| PRESS <ENTER> TO SELECT | Pressing the ENTER key implements your menu selection. The menu remains on the screen until another menu is selected for display or until the CLEAR/RET LOC key is pressed. |

| MENU | DESCRIPTION |
|---|---|
| SET DIELECTRIC CONSTANT | |
| AIR (1.000) | Calculates reference delay based on dielectric constant of air (1). |
| POLYETHYLENE (2.260) | Calculates reference delay based on the dielectric constant of polyethylene (2.26). |
| TEFLON (2.100) | Calculates reference delay based on the dielectric constant of teflon (2.1). |
| MICROPOROUS (1.69) | Calculates reference delay based on the dielectric constant of microporous teflon (1.687). |

| MENU | DESCRIPTION |
|---|---|
| OTHER<br>XXXX.XX | Calculates reference delay based on the value you enter. Terminate your entry using any terminator and select with the ENTER key. |
| PRESS <ENTER><br>TO SELECT | Pressing the ENTER key implements your menu selection and returns you to the RD1 menu. |

| MENU | DESCRIPTION |
|---|---|
| SET SCALING<br>OR PRESS<br><AUTOSCALE><br>-LOG MAG-<br>RESOLUTION<br>XX.XXX dB/DIV | Sets the resolution for the vertical axis of the active channel's displayed log magnitude graph. Resolution can by set incrementally using the keypad or rotary knob. For the linear polar graph, the center is fixed at 0 units; therefore, changing the resolution also changes the reference value and vice versa |
| REF VALUE<br>XXX.XXX dB | Sets the value by which the active channel's amplitude measurement is offset on the log-magnitude graph. The offset can be set in increments of 0.001 dB using the keypad or rotary knob. |
| REFERENCE<br>LINE | Sets the reference line for the active channel's amplitude measurement on the log-magnitude graph. This is the line about which the amplitude expands with different resolution values. The reference line can be set to any vertical division using the rotary knob. |
| -PHASE-<br>RESOLUTION<br>XX.XX DEG/DIV | Sets the resolution for the vertical axis of the active channel's displayed phase graph. Resolution can by set incrementally using the keypad or rotary knob. |
| REF VALUE<br>XXX.XX DEG | Sets the value by which the active channel's phase measurement is offset on the phase graph. The offset can be set in increments of 0.01 degrees using the keypad or rotary knob. |
| REFERENCE<br>LINE | Sets the reference line for the active channel's phase measurements on the phase graph. This is the line about which the phase expands with different resolution values. The reference line can be set to any vertical division using the rotary knob. |

| MENU | DESCRIPTION |
|---|---|
| SET SCALING<br>OR PRESS<br><AUTOSCALE> | |
| IMPEDANCE<br>(ADMITTANCE)<br>SMITH CHART | Scales an Impedance Smith chart for display in the active channel. |
| NORMAL SMITH<br>(REFL = 1.000<br>FULL SCALE) | Selects a normal Smith chart for display in the active channel. |
| EXPAND 10 dB<br>(REFL = 0.316<br>FULL SCALE) | Selects a dB expansion of the Smith chart being displayed for the active channel. |
| EXPAND 20 dB<br>(REFL = 0.099<br>FULL SCALE) | Selects a 20 dB expansion of the Smith chart being displayed for the active channel. |
| EXPAND 30 dB<br>(REFL = 0.031<br>FULL SCALE) | Selects a 30 dB expansion of the Smith chart being displayed for the active channel. |

| MENU | DESCRIPTION |
|---|---|
| COMPRESS 3 dB<br>(REFL = 1.413<br>FULL SCALE)<br>PRESS <ENTER><br>TO SELECT AND<br>RESUME<br>CALIBRATION | Selects a 3 dB compression of the Smith Chart being displayed for the active channel.<br>Pressing the ENTER key implements your menu selection and resumes the calibration from where it left off, if in the calibration mode.<br>The menu remains on the screen until another menu is selected for display or until the CLEAR/RET LOC key is pressed. |

| MENU | DESCRIPTION |
|---|---|
| DATA<br>ENHANCEMENT<br>AVERAGING<br>XXXX MEAS.<br>PER POINT | Averages the measured data over time, as follows:<br>1. The sweep stops at the first frequency point and takes a number of readings, based on the selected numbvr of points.<br>2. The program averages the readings and writes the average value for that frequency point in the displayed graph.<br>3. The sweep then advances to the next sequential frequency point and repeats the process. |
| SMOOTHING<br>XX.X PERCENT<br>OF SPAN | Smoothes the measured data over frequency, as follows:<br>1. The program divides the overall sweep into smaller segments, based on the selected percent-of-span. (Refer to paragraphs 3–5.3 and FIG. 3-29 for a description and example of smoothing.)<br>2. It takes a data reading at each frequency point within that percent-of-span segment.<br>3. It averages the readings with a raised Hamming window and writes that magnitude value at the mid-frequency point of the segment in the displayed graph or Smith chart.<br>4. It then advances the percent-of-span segment to encompass the next sequential group of frequency points and repeats the process. |

| MENU | DESCRIPTION |
|---|---|
| DATA<br>ENHANCEMENT<br>AVERAGING<br>XXXX MEAS.<br>PER POINT | Averages the measured data over time, as follows:<br>1. The sweep stops at the first frequency point and takes a number of readings, based on the selected number of points.<br>2. The program averages the readings and writes the average value for that frequency point in the displayed graph.<br>3. The sweep then advances to the next sequential frequency point and repeats the process. |
| SMOOTHING<br>XX.X PERCENT<br>OF SPAN | Smoothes the measured data over frequency, as follows:<br>1. The program divides the overall sweep into smaller segments, based on the selected percent-of-span. (Refer to paragraphs 3–5.3 and FIG. 3-29 for a description and example of smoothing.)<br>2. It takes a data reading at each frequency point within that percent- |

| MENU | DESCRIPTION |
|---|---|
| | of-span segment. |
| | 3. It averages the readings with a raised Hamming window and writes that magnitude value at the mid-frequency point of the segment in the displayed graph or Smith chart. |
| | 4. It then advances the percent-of-span segment to encompass the next sequential group of frequency points and repeats the process. |

| MENU | DESCRIPTION |
|---|---|
| SELECT OUTPUT DEVICE | |
| PRINTER | Selects the printer as your output device. |
| PLOTTER | Selects the plotter as your output device. |
| SELECT PRINTER OUTPUT TYPE | |
| FULL SCREEN | Prints full-screen data, including the menu entries. |
| GRAPH ONLY | Prints only the graph or Smith chart, including any and all data it contains. |
| TABULAR DATA | Prints a tabulation of the measured data. |
| OUTPUT OPTIONS | |
| SET UP OUTPUT HEADERS | Calls Menu PM2, which allows you to enter the header information. |
| DISK OPERATION | Calls Menu PM4, which allows you to select disk operations. |
| PLOT OPTIONS | Calls Menu PL1, which allows you to select between several plot options. |
| PRESS <ENTER> TO SELECT | Pressing the ENTER key implements your menu selection. The menu remains on the screen until another menu is selected for display or until the CLEAR/RET LOC key is pressed. |

| MENU | DESCRIPTION |
|---|---|
| DATA OUTPUT HEADERS | |
| MODEL ON (OFF) XXXXXXXXXXXXXX | Selecting <1> displays Menu GP5, which lets you select the letters and/or numbers in your model identifier. |
| DEVICE ID ON (OFF) XXXXXXXXXXXX | Selecting <1> displays Menu GP5, which lets you select the letters and/or numbers in your Device I.D. identifier. |
| DATE ON (OFF) XX/XX/XX | Selecting <1> displays Menu GP5, which lets you select the letters and/or numbers in the date. |
| OPERATOR ON (OFF) XXXXXXXXXXXXXXX | Selecting <1> displays Menu GP5, which lets you select the letters identifying the operator. |
| PRESS <ENTER> TO TURN ON/OFF OR PRESS <1> TO CHANGE | Pressing the ENTER key selects between menu selections. Pressing the CLEAR/RET LOC key lets you change the between ON and OFF states |
| | Pressing <1> lets you enter the desired label in Menu GP5. |

| MENU | DESCRIPTIONS |
|---|---|
| TABULAR OUTPUT FORMAT | |
| MARKER ON (OFF) | Provides for the printing or |

| MENU | DESCRIPTIONS |
|---|---|
| DATA | not of markers. |
| SWEEP ON (OFF) DATA | Provides for the printing or not of frequency sweep data. If you elect to print the sweep data, you can choose how many frequency points to print out. |
| XXX POINTS | Outputs one point every X points |
| PRESS <ENTER> TO TURN ON/OFF OR TURN KNOB TO CHANGE NUMBER OF POINTS | Pressing the ENTER key implements your menu selection. The menu remains on the screen until another menu is selected for display or until the CLEAR/RET LOC key is pressed. Turning the knob on number of points changes the value of X to define the number of points printed. |

| MENU | DESCRIPTION |
|---|---|
| DISK OUTPUT OPERATIONS | |
| TABULAR DATA TO DISK | Outputs tabular data to the disk and takes you to GP1-3 or DSK 11 for selection of a file name. |
| TABULAR DATA FROM DISK TO PRINTER | Brings up DSK9 for selection of a measurement data file to be output to the printer. |
| PRESS <ENTER> TO SELECT | Pressing the ENTER key implements your menu selection. The menu remains on the screen until another menu is selected for display or until the CLEAR/RET LOC key is pressed. |

| MENU | DESCRIPTION |
|---|---|
| PLOT OPTIONS PLOT | |
| FULL PLOT | The plotter will plot everything displayed on the screen (data traces, graticule, menu text) when START PRINT is pressed. |
| OPTIONS | |
| HEADER ON (OFF) | The plot will include on information header if this option is on and START PRINT is pressed. |
| MENU ON (OFF) | The plot will include the menu text if this option is on and START PRINT is pressed. |
| MARKERS ON (OFF) AND LIMITS | The plot will include any marker or limit lines if this option is on and START PRINT is pressed. |
| GRATICULE ON (OFF) | The plot will include the graticule and annotation if this option is on and START PRINT is pressed. The plotter plots the graticule. |
| DATA ON (OFF) TRACE(S) | The plot will include the data if this option is on and START PRINT is pressed. The plotter plots the graticule. |
| FORMAT | |
| PLOT SIZE | Calls Menu PL2, which lets you select the size and location of the plot. |
| PEN COLORS | Calls Menu PL3, which lets you select pen colors for the various elements of the plot: graticule, data traces, menu text and header. Also lets you select the relative pen speed. |
| PRESS <ENTER> TO SELECT OR TURN ON/OFF | Pressing the ENTER key implements your menu selection. The menu remains on the screen until another menu is selected for display or until the CLEAR/RET LOC key is pressed. |

| MENU | DESCRIPTION |
|---|---|
| SELECT PLOT SIZE | |
| FULL SIZE | Selects a full size (page) plot. |
| -QUARTER SIZE PLOTS- | |
| UPPER LEFT | Selects a quarter-size plot, upper-left quadrant. |
| UPPER RIGHT | Selects a quarter-size plot, upper-right quadrant. |
| LOWER LEFT | Selects a quarter-size plot, lower-left quadrant. |
| LOWER RIGHT | Selects a quarter-size plot, lower-right quadrant. |
| PRESS <ENTER> TO SELECT | Pressing the ENTER key implements your menu selection. The menu remains on the screen until another menu is selected for display or until the CLEAR/RET LOC key is pressed. |

| MENU | DESCRIPTION |
|---|---|
| SELECT PEN COLORS | |
| DATA PEN n | Selects the color in which the data will be plotted. The number of the pen displays where the "n" is shown. |
| GRATICLE PEN n | Selects the color in which the graticule will be plotted. The number of the pen displays where the "n" is shown. |
| MARKERS AND LIMITS PEN n | Selects the color in which the markers and limits will be plotted. The number of the pen displays where the "n" is shown. |
| HEADER PEN n | Selects the color in which the header information will be plotted. The number of the pen displays where the "n" is shown. |
| PEN SPEED 100 PERCENT OF MAXIMUM | Selects the pen's speed as a percentage of the plotter's maximum speed. (Used to optimize plots on transparencies or with worn pens.) |
| PREVIOUS MENU | Recalls Menu PL1. |
| PRESS <ENTER> TO SELECT | Pressing the ENTER key implements your menu selection. The menu remains on the screen until another menu is selected for display or until the CLEAR/RET LOC key is pressed. |

| Function | Default Setting |
|---|---|
| INSTRUMENT STATE | Measurement Setup Menu Displayed |
| MEASUREMENT | Maximum sweep range of source and test set<br>Source Power: 0.0 dBm<br>Resolution: Normal |
| CHANNEL | Quad (four-channel) display<br>Channel 1 active |
| DISPLAY | Channel 1: $S_{11}$, 1:1 Smith Chart<br>Channel 2: $S_{12}$, Log Magnitude and Phase<br>Channel 3: $S_{21}$, Log Magnitude and Phase<br>Channel 4: $S_{22}$, 1:1 Smith Chart<br>Scale: 10 dB/Division or 90°/Division<br>Offset: 0.000dB or 0.00 degree<br>Reference Position: Midscale<br>Electrical Delay: 0.00 seconds<br>Dielectric: 1.00 (air)<br>Normalization: Off<br>Normalization Sets: Unchanged |
| ENHANCEMENT | Video IF Bandwidth: Reduced<br>Averaging: Off<br>Smoothing: OFF |

-continued

| Function | Default Setting |
|---|---|
| CALIBRATION | Correction: Off<br>Connector: SMA<br>Load: Broadband |
| MARKERS LIMITS | Markers On/Off: All off<br>Markers Enabled/Disabled: All enabled<br>Marker Frequency: All set to the start-sweep frequency or start-time distance<br>ΔReference: Off |
| SYSTEM STATE | Limits: All set to reference position value; all off (all enabled)<br>GP/B Addresses and Terminators: Unchanged<br>Frequency Blanking: Disengaged,<br>Error(s): All cleared<br>Measurement: Restarted |
| OUTPUT | Output Type: Printer (full screen, clear headers)<br>Marker and Sweep Data: Enabled |

| MENU | DESCRIPTION |
|---|---|
| SELECT UTILITY FUNCTION TYPE | |
| GENERAL DISK UTILITIES | Calls Menu U2, which lets you select between several disk utilities. |
| CALIBRATION COMPONENT UTILITIES | Calls Menu U4, which lets you select between several calibration-component utilities. |
| GPIB ADDRESSES | Displays the current GPIB addresses of the various system instruments. |
| DISPLAY INSTRUMENT STATE | Calls Menu U3, which lets you display the various instrument state parameters. |
| BLANK FREQUENCY INFORMATION | Blanks all frequency-identifier information from the 360 displays, if such information is presently being displayed. |
| ALTERNATE 3RD COLOR PLANE | Switches between blue and cyan colors |
| PRESS <ENTER> TO SELECT | Switches between blue and cyan colors Pressing the ENTER key implements your menu selection. The menu remains on the screen until another menu is selected for display or until the CLEAR/RET LOC key is pressed. |

| MENU | DESCRIPTION |
|---|---|
| DISK UTILITY FUNCTIONS | |
| RESTORE DISPLAY | |
| DISPLAY DISK DIRECTORY | Displays disk directory in data area |
| DELETE FILES FROM DISK | Calls Menu DSK2, which lets you delete files from the disk. |
| LOAD PROGRAM FROM DISK TO 360 | Reloads the operating program from the disk. |
| | ⌈CAUTION⌉<br>Choosing the above option may destroy all of the data in memory. |
| INITIALIZE DISK WITH PROGRAM | Prepares (formats or initializes) the disk for use with the 360, including the operating program. |
| INITIALIZE DATA-ONLY DISK | Prepares the disk for use with the 360 but does not copy the operating program to the disk |
| | ⌈CAUTION⌉<br>Choosing either of the two options above will destroy all of the data on the disk |

115

| MENU | DESCRIPTION |
|---|---|
| COPY DISK TO DISK | Lets you copy one disk to another. |

| MENU U3 | | DESCRIPTION |
|---|---|---|
| DISPLAY INSTRUMENT STATE | | |
| | RESTORE DISPLAY | Restores the normal data display. |
| A | SYSTEM PARAMETERS | Displays all of the system parameters (Readout Text U4 a thru e. FIG. 3-101). |
| B | CALIBRATION PARAMETERS | Displays the calibration parameters. |
| C | GLOBAL OPERATING PARAMETERS | Displays the global operating parameters. |
| D | CHANNEL 1-2 OPERATING PARAMETERS | Displays the Channel 1-2 operating parameters. |
| E | CHANNEL 3-4 OPERATING PARAMETERS | Displays the Channel 3-4 operating parameters. |
| | NEXT PAGE | Alternately displays Readout Text U4 a thru e. |
| | PRESS <ENTER> TO SELECT | Pressing the ENTER key implements your menu selection. The menu remains on the screen until another menu is selected for display or until the CLEAR/RET LOC key is pressed. |

Readout Text U3e, Calibration Parameters

| Parameter | Display Format | |
|---|---|---|
| Number Of Points | XXX | |
| Source Power | XXX dBm | |
| Cal Type | xxxx | |
| Start Frequency | XX.XXX GHz | |
| Stop Frequency | XX.XXX GHz | |
| Load Type | XXXXXXXX | |
| Connector | -PORT1- XXXXXXXX | -PORT2- XXXXXXXX |
| Open Device | *NOT INSTALLED | *NOT INSTALLED |
| C0 (c-15) | -XXX.XXX | -XXX.XXX |
| C1 (e-27) | -XXX.XXX | -XXX.XXX |
| C2 (e-36) | -XXX.XXX | -XXX.XXX |
| C3 (e-45) | -XXX.XXX | -XXX.XXX |
| Offset Length | -XXX.XXX mm • | -XXX.XXX mm |
| Serial Number | XXXXXXXX | XXXXXXXX |
| Short Device | *NOT INSTALLED | *NOT INSTALLED |
| Offset Length | -XXX.XXX mm | -XXX.XXX mm |
| Serial Number | XXXXXXXX | XXXXXXXX |
| Atten Settings | | |
| Source | XXdB | XX. dB |
| Test | | XX dB |

*If not installed, displays "NOT INSTALLEED"

| MENU U4 | DESCRIPTION |
|---|---|
| CALIBRATION COMPONENT UTILITIES | |
| INSTALL CALIBRATION | Reads into memory the coefficient data from the calibration-components disk |

116

| MENU U4 | DESCRIPTION |
|---|---|
| COMPONENT INFORMATION FROM DISK | supplied with the calibration kits. |
| DISPLAY INSTALLED CALIBRATION COMPONENT INFORMATION | Calls Menu U5, which lets you display the connector information for the various connectors supported. |
| PRESS <ENTER> TO SELECT | Pressing the ENTER key implements your menu selection. The menu remains on the screen until another menu is selected for display or until the CLEAR/RET LOC key is pressed. |

| MENU U5 | DESCRIPTION |
|---|---|
| DISPLAY INSTALLED CALIBRATION COMPONENT INFORMATION | This menu lets you view coefficient data on the components listed (FIG. 3-104). The data appears in the display area of the screen. |
| SMA (M) | Select coefficient data to display for the SMA male components. |
| SMA (F) | Select coefficient data to display for the SMA female components. |
| K - CONN (M) | Select coefficient data to display for the K Connector ™ male components. |
| K - CONN (F) | Select coefficient data to display for the K Connector female components. |
| TYPE N (M) | Select coefficient data to display for the Type N male components. |
| TYPE N (F) | Select coefficient data to display for the Type N female components. |
| GPC - 7 | Select coefficient data to display for the sexless GPC-7 components. |
| NEXT COMPONENT | Cycles through selections SMA (M) to GPG7. |
| PREVIOUS MENU | Displays menu U4. |
| PRESS <ENTER> TO SELECT | Pressing the ENTER key implements your menu selection. The menu remains on the screen until another menu is selected for display or until the CLEAR/RET LOC key is pressed. |

| MENU DSK3 | DESCRIPTION |
|---|---|
| NO ROOM FOR NEW DATA FILES | |
| OVERWRITE EXISTING FILES | Allows you to overwrite an existing file on the current data disk. |
| DELETE EXISTING FILES | Allows you to delete an existing file on the current data disk. |
| PRESS <ENTER> TO SELECT | Pressing ENTER implements your menu selection. You will be returned to the previous menu when your selection is made. |

| MENU DSK4 | DESCRIPTION |
|---|---|
| DISK UTILITY FUNCTIONS | |
| DELETE CAL & FRONT PANEL SETUPS FROM DISK | Allows you to delete specific calibration and control (front) panel setup files from the current data disk. |
| DELETE | Allows you to delete specific |

| MENU DSK4 | DESCRIPTION |
|---|---|
| NORMALIZATION FILES FROM DISK | normalization (trace memory) files from the current data disk. |
| DELETE MEASUREMENT FILES FROM DISK | Allows you to delete specific measurement data files from the current data disk. |
| PREVIOUS MENU | Returns you to the previous menu |
| PRESS <ENTER> TO SELECT | Pressing the ENTER key implements your menu selection. The menu remains on the screen until another menu is selected for display or until the CLEARE/LOC key is pressed. |

| MENU DSK5 | DESCRIPTION |
|---|---|
| SELECT CAL & FRONT PANEL SETUP TO DELETE | |
| FILENAME 2 | Selects the file named on this line to be deleted. (The actual name of the file, not "FILENAME 2" will appear.) |
| FILENAME 3 | Same as for Filename 2 above. |
| FILENAME 4 | Same as for Filename 2 above. |
| FILENAME 5 | Same as for Filename 2 above. |
| FILENAME 6 | Same as for Filename 2 above. |
| FILENAME 7 | Same as for Filename 2 above. |
| FILENAME 8 | Same as for Filename 2 above. |
| FILENAME 9 | Same as for Filename 2 above. |
| MORE | The "More" option only displays if there are more than nine files. |
| PREVIOUS MENU | Returns to the previous menu in this series. |
| PRESS <ENTER> TO SELECT | Pressing the ENTER key implements your menu selection. You are returned to the previous menu. |

| MENU DSK6 | DESCRIPTION |
|---|---|
| SELECT NORMALIZATION FILE TO DELETE | |
| FILENAME 1 | Selects the file named on this line to be deleted. (The actual name of the file, not "FILENAME 1" will appear.) |
| FILENAME 2 | Same as for Filename 1 above. |
| FILENAME 3 | Same as for Filename 1 above. |
| FILENAME 4 | Same as for Filename 1 above. |
| FILENAME 5 | Same as for Filename 1 above. |
| FILENAME 6 | Same as for Filename 1 above. |
| FILENAME 7 | Same as for Filename 1 above. |
| FILENAME 8 | Same as for Filename 1 above. |
| MORE | The "More" option only displays if there are more than nine files. |
| PREVIOUS MENU | Returns to the previous menu in this series. |
| PRESS <ENTER> TO SELECT | Pressing the ENTER key implements your menu selection. You are returned to the previous menu. |

| MENU DSK7 | DESCRIPTION |
|---|---|
| SELECT MEASUREMENT FILE TO DELETE | |
| FILENAME 1 | Selects the file named on this line to be deleted. (The actual name of the file, not "FILENAME 1" will appear.) |
| FILENAME 2 | Same as for Filename 1 above. |
| FILENAME 3 | Same as for Filename 1 above. |
| FILENAME 4 | Same as for Filename 1 above. |
| FILENAME 5 | Same as for Filename 1 above. |
| FILENAME 6 | Same as for Filename 1 above. |
| FILENAME 7 | Same as for Filename 1 above. |
| FILENAME 8 | Same as for Filename 1 above. |
| MORE | The "More" option only displays if there are more than nine files. |
| PREVIOUS MENU | Returns to the previous menu in this series. |
| PRESS <ENTER> TO SELECT | Pressing the ENTER key implements your menu selection. You are returned to the previous menu |

| MENU DSK9 | DESCRIPTION |
|---|---|
| SELECT FILE TO READ | |
| FILENAME 1 | Selects the file named on this line to be read. (The actual name of the file, not "FILENAME 1" will appear.) |
| FILENAME 2 | Same as for Filename 1 above. |
| FILENAME 3 | Same as for Filename 1 above. |
| FILENAME 4 | Same as for Filename 1 above. |
| FILENAME 5 | Same as for Filename 1 above. |
| FILENAME 6 | Same as for Filename 1 above. |
| FILENAME 7 | Same as for Filename 1 above. |
| FILENAME 8 | Same as for Filename 1 above. |
| MORE | The "More" option only displays if there are more than nine files. |
| PREVIOUS MENU | Returns to the previous menu in this series |
| PRESS <ENTER> TO SELECT | Pressing the ENTER key implements your menu selection. You are returned to the previous menu. |

| MENU GP1–3 | DESCRIPTION |
|---|---|
| SELECT FILE TO OVERWRITE OR CREATE NEW FILE | |
| FILENAME 1 | Selects disk File 1 for storing the calibration data or front (control) panel setup. Name the file using Menu GP5. |
| FILENAME 2 | Selects disk File 2 for storage of data. |
| FILENAME 3 | Selects disk File 3 for storage of data. |
| FILENAME 4 | Selects disk File 4 for storage of data. |
| FILENAME 5 | Selects disk File 5 for storage of data. |
| FILENAME 6 | Selects disk File 6 for storage of data. |
| FILENAME 7 | Selects disk File 7 for storage of data. |
| FILENAME 8 | Selects disk File 8 for storage of data. |
| MORE | Displays additional menus. |
| PREVIOUS MENU | Displays the previous menu. |
| PRESS <ENTER> TO SELECT | Pressing the ENTER key implements your menu selection. The menu remains on the screen until another menu is selected for display or until the CLEAR/RET LOC key is pressed. |

| MENU GP5 | DESCRIPTION |
|---|---|
| SELECT NAME | Name your file using the rotary knob to select letters, numbers, or both. A letter or number turns red to indicate that the letter/number has been chosen for selection. Pressing the ENTER key selects the letter or number. The name you spell out displays in the area below "SELECT NAME." |
| -------- | |
| ABCDEFGHIJKLM | |
| NOPQRSTUVWXYZ | You are allowed up to eight characters for a file name and twelve characters for a label. |
| 0123456789-/# | |
| DEL CLEAR DONE | Selecting "DEL" deletes the last letter in the name displayed above. Selecting "CLEAR" deletes the entire name. Selecting "DONE" signals that you have finished writing the name. |
| TURN KNOB TO INDICATE CHARACTER OR FUNCTION | Use the rotary knob to indicate the letter or number you wish to select. You can use the up-arrow and down-arrow keys to move between rows. |
| PRESS <ENTER> TO MAKE SELECTION | Pressing the ENTER key implements your menu selection. The menu remains on the screen until another menu is selected for display or until the CLEAR/RET LOC key is pressed. |
| NUMBERS MAY ALSO BE SELECTED USING KEYPAD | You may also select numbers using the keypad. |

| MENU GP7 | DESCRIPTION |
|---|---|
| GPIB SETUP | |
| -360 GPIB- | |
| CR/CR-LF | Selects either the CR (carriage return) character or the CR-LF (Carriage Return-Line Feed) characters as the data terminator for GPIB transmissions. |
| ADDRESS: 6 | Selects the GPIB address for the 360 analyzer. The 360 is set to address 6 before leaving the factory. |
| -SYSTEM BUS- | |
| CR/CR-LF | Selects either the CR (carriage return) character or the CR-LF (Carriage Return-Line Feed) characters as the data terminator for System Bus transmissions. |
| INSTR ADDR 0 | Selects the address for the System Bus controller. This is the address the 360 uses to address the Source. The 360 is set to address 0 before leaving the factory. |
| SOURCE ADDR 5 | Selects the address for the Source. The Source is set to address 5 before leaving the factory. |
| PLOTTER ADDR 7 | Selects the address for a compatible plotter. |
| PRESS <ENTER> TOSELECT | Pressing the ENTER key implements your menu selection. The menu remains on the screen until another menu is selected for displayor until the CLEAR/RET LOC key is pressed. |

| MENU M1 | DESCRIPTION |
|---|---|
| SET MARKERS | |
| MARKER 1 ON (OFF) XX.XXXXXX GHz | Turns Marker 1 on or off (activates or deactivates). When on (active), the frequency, time, or distance may be set using the keypad or rotary knob. NOTE In this text, markers will be referred to as being active and as being selected. Any marker that has been turned on and assigned a frequency is considered to be active. The marker to which the cursor presently points is considered to be selected. The selected marker is the only one for which you can change the frequency. |
| MARKER 2 ΔREF XX.XXXXXX GHz | |
| MARKER 3 ON (OFF) XX.XXXXXX GHz | Turns Marker 3 on or off (activates or deactivates). When on (active), the frequency, time, or distance may be set using the keypad or rotary knob. |
| MARKER 4ON (OFF) | Turns Marker 4 on or off (activates or deactivates). When on (active), the frequency, time, or distance may be set using the keypad or rotary knob. |
| MARKER 5ON (OFF) | Turns Marker 5 on or off (activates or deactivates). When on (active), the frequency, time, or distance may be set using the keypad or rotary knob. |
| MARKER 6ON (OFF) XX.XXXXXX GHz | Turns Marker 6 on or off (activates or deactivates). When on (active), the frequency, time, or distance may be set using the keypad or rotary knob. |
| MARKERS DISABLED | Disables all markers. |
| ΔREF MODE ON (OFF) | Selects and deselects the ΔReference Mode |
| SELECT ΔREF MARKER | Calls Menu M2, which lets you select the ΔREF Marker. |

-continued

| MENU M1 | DESCRIPTION |
|---|---|
| PRESS <ENTER> OR TURN ON/OFF TO SELECT | Pressing the ENTER key implements your menu selection. The menu remains on the screen until another menu is selected for display or until the CLEAR/RET LOC key is pressed. |

| MENU M2 | DESCRIPTION |
|---|---|
| SELECT ΔREF MARKER | |
| MARKER 1 XX.XXXXXX GHz | Marker 1 only appears if it has been activated in Menu M1. Placing the cursor on Marker 1 and pressing the ENTER key here selects it as the ΔREF marker. The ΔREF marker is the one from which the other active markers are compared and their difference frequency measured and displayed in Menu M3. The marker frequency may be set using the keypad or rotary knob. |
| MARKER 3 XX.XXXXXX GHz | Same as above, but for Marker 3 |
| MARKER 4 XX.XXXXXX GHz | Same as above, but for Marker 4 |
| PRESS <ENTER> TO SELECT | Pressing the ENTER key implements your menu selection. The menu remains on the screen until another menu is selected for display or until the CLEAR/RET LOC key is pressed. |

| MENU M3 | DESCRIPTION |
|---|---|
| SELECT READOUT MARKER | |
| MARKER 1 XX.XXXXXX GHz | Displays the frequency and S-Parameter value(s) of Marker 1 on all CRT-displayed graphs and Smith Charts. The frequency of Marker 1 also displays here. If Marker 1 was activated in Menu M2 as the REF marker, REF appears as shown for Marker M5 below. |
| MARKER 2 XX.XXXXXX GHz | Same as for above, but for Marker 2. |
| MARKER 5 XX.XXXXXX GHz | Same as for above, but for Marker 5. |
| ΔREF MODE IS ON | Indicates the status of the ΔREF mode. |
| PRESS <ENTER> TO SELECT | Pressing the ENTER key implements your menu selection. The menu remains on the screen until another menu is selected for display or until the CLEAR/RET LOC key is pressed. |

| MENU M4 | DESCRIPTION |
|---|---|
| C H 1-S 1 1 XX.XXX PS DLY | Selects channel for readout |
| MARKER 1 XX.XXXXXX GHz XX.XXX dB XXX.XXX DEG | The selected marker-that is, the one to which the cursor points in Menu M1-and its frequency, time, or distance display here. This could be any one of the six available markers: Marker 1 thru Marker 6. |
| MARKER TO MAX | Causes the active marker to go to the frequency with the greatest S-Parameter value on the active channel. |
| MARKER TO MIN | Causes the selected marker to go to the frequency with the smallest S-Parameter value on the active channel. |
| 2 XX.XXXX GHz XX.XXX dB XXX.XXX DEG | Displays the frequency, magnitude, and phase of the active S Parameter at marker 2, if the marker is enabled. |
| 3 XX.XXXX GHz XX.XXX dB XXX.XXX DEG | Displays the frequency, magnitude, and phase of the active S Parameter at marker 3, if the marker is enabled. |
| 4 XX.XXXX GHz XX.XXX dB XXX.XXX DEG | Displays the frequency, magnitude, and phase of the active S Parameter at marker 4, if the marker is enabled. |
| 5 XX.XXXX GHz XX.XXX dB XXX.XXX DEG | Displays the frequency, magnitude, and phase of the active S Parameter at marker 5, if the marker is enabled. |
| 6 XX.XXXX GHz XX.XXX dB XXX.XXX DEG | Displays the frequency, magnitude, and phase of the active S Parameter at marker 6, if the marker is enabled. |

| MENU M5 | DESCRIPTION |
|---|---|
| CH 1 - S11<br>XXX.XXX ns DLY<br>MARKER 1 ΔREF<br>XX.XXXXXX GHz<br>MARKER TO MAX<br>MARKER TO MIN | The REF marker, as activated in Menu M2, its frequency, its reference delay, and the channel on which it appears display here. The REF marker could be any one of the six available markers: M1–M6. The frequency of the REF marker can be changed using the keypad or rotary knob. |
| Δ(1 - 2)<br>XX.XXXXX GHz<br>XX.XXX dB<br>(XXX.XX DEG) | The marker numbers of the REF marker and the next lowest-numbered active marker appear between the parentheses. This example assumes Marker 1 as the Ref marker and Marker 2 as the next lowest-numbered active marker. The lines below display the difference frequency, (or time/distance ) and trace value(s) between these two markers on the active channel. |
| Δ(1 - 3)<br>XX.XXXXX GHz<br>XX.XXX dB<br>(XXX.XX DEG) | The marker numbers of the REF marker and the next lowest-numbered active marker appear between the parentheses. This example assumes Marker 1 as the Ref marker and Marker 3 as the next lowest-numbered active marker. The lines below display the difference frequency, (or time/distance ) and trace value(s) between these two markers on the active channel. |
| Δ(1 - 4)<br>XX.XXXXX GHz<br>XX.XXX dB<br>(XXX.XX DEG) | The marker numbers of the REF marker and the next lowest-numbered active marker appear between the parentheses. This example assumes Marker 1 as the Ref marker and Marker 4 as the next lowest-numbered active marker. The lines below display the difference frequency, (or time/distance ) and trace value(s) between these two markers on the active channel. |
| Δ(1 - 5)<br>XX.XXXXX GHz<br>XX.XXX dB<br>(XXX.XX DEG) | The marker numbers of the REF marker and the next lowest-numbered active marker appear between the parentheses. This example assumes Marker 1 as the Ref marker and Marker5 as the next lowest-numbered active marker. The lines below display the difference frequency, (or time/distance ) and trace value(s) between these two markers on the active channel. |
| Δ(1 - 6)<br>XX.XXXXX GHz<br>XX.XXX dB<br>(XXX.XX DEG) | The marker numbers of the REF marker and the next lowest-numbered active marker appear between the parentheses. This example assumes Marker 1 as the Ref marker and Marker 6 as the next lowest-numbered active marker. The lines below display the difference frequency, (or time/distance ) and trace value(s) between these two markers on the active channel. |

| MENU LFX | DESCRIPTION |
|---|---|
| READOUT LIMIT<br>FREQUENCIES | This menu shows all of the frequencies where the active S-Parameter value is equal to either Limit 1 or Limit 2. |
| -LOG MAG-<br>LIMIT 1 (REF)<br>x.xxx dB | Displays the value of Limit 1. |
| LIMIT 2<br>x.xxx dB | Displays the value of Limit 2. |
| LIMIT Δ(1/2)<br>x.xxx dB | Displays the difference in value between Limit 1 and Limit 2. |

-continued

| MENU LFX | DESCRIPTION |
|---|---|
| FREQUENCIES<br>AT LIMIT 2<br>2.9843 GHz<br>5.7210 GHz<br>7.4412 GHz<br>9.8764 GHz<br>10.3901 GHz<br>15.5648 GHz | Displays all points where the S Parameter is equal to Limit 2. |

| MENU L1 | DESCRIPTION |
|---|---|
| SET LIMITS<br>-LOG MAG-<br>LIMIT 1 ON (OFF)<br>XXX.XXX dB | Turns the Limit 1 line on or off for the active channel. For your convenience, the arbitrarily set limit lines allow you to delineate a go/no gl line on your log-magnitude graph beyond which the measured values are unacceptable. |
| LIMIT 2 ON (OFF)<br>XXX.XXX dB | Turns the Limit 2 line on or off for the active channel on the log-magnitude graph. |
| READOUT LIMIT<br>FREQUENCIES | Displays Menu LF1, which shows all points where the current s-parameter equals the limit values. |
| -PHASE-<br>LIMIT 1 ON (OFF)<br>XXX.XX DEG | Turns the Limit 1 line on or off for the active channel on the phase graph. |
| LIMIT 2 ON (OFF)<br>XXX.XX DEG | Turns the Limit 2 line on or off for the active channel on the phase graph. |
| READOUT LIMIT<br>FREQUENCIES | Displays Menu LF1, which shows all points where the current s-parameter equals the limit values. |
| LIMITS<br>ENABLED | Enables both limit lines for the active channel on both the log-magnitude and phase graphs. |

-continued

| MENU L1 | DESCRIPTION |
|---|---|
| (DISABLED) PRESS <ENTER> TO SELECT OR TURN ON/OFF | Pressing the ENTER key implements your menu selection. The menu remains on the screen until another menu is selected for display or until the CLEAR/RET LOC key is pressed. |

| MENU | DESCRIPTION |
|---|---|
| SET LIMITS -LINEAR POLAR- (-SMITH CHART-) LIMIT 1 ON (OFF) (XXX.XXX Mv | Turns the Limit 1 line on or off for the active channel. For your convenience, the arbitrarily set limit lines allow you to delineate a go/no go line on your Smith chart or polar display beyond which the measured values are unacceptable. |
| LIMIT 2 ON (OFF) XXX.XXX mV | Turns the Limit 2 line on or off for the active channel on your Smith chart or polar display. |
| LIMITS ENABLED | Enables both previously set limit lines to appear for the active channel on your Smith chart or polar display. |
| PRESS <ENTER> TO SELECT OR TURN ON/OFF | Pressing the ENTER key implements your menu selection. The menu remains on the screen until another menu is selected for display or until the CLEAR/RET LOC key is pressed. |

| MENU | DESCRIPTION |
|---|---|
| SET LIMITS -LOG MAG- LIMIT 1 ON (OFF) XXX.XXX dB | Turns the Limit 1 line on or off for the active channel. For your convenience, the arbitrarily set limit lines allow you to delineate a go/no go line on your Log Mag display beyond which the measured values are unacceptable. |
| LIMIT 2 ON (OFF) XXX.XXX dB | Turns the Limit 2 line on or off for the active channel on your Log Mag display. |
| READOUT LIMIT FREQUENCIES | Displays Menu LF1, which shows all points where the current s-parameter equals the limit values. |
| LIMITS ENABLED | Enables both previously set limit lines to appear for the active channel on your Log Mag display. |
| PRESS <ENTER> TO SELECT OR TURN ON/OFF | Pressing the ENTER key implements your menu selection. The menu remains on the screen until another menu is selected for display or until the CLEAR/RET LOC key is pressed. |

| MENU | DESCRIPTION |
|---|---|
| SET LIMITS -PHASE- LIMIT 1 ON (OFF) XXX.XX DEG | Turns the Limit 1 line on or off for the active channel on the phase graph. |
| LIMIT 2 ON (OFF) XXX.XX DEG | Turns the Limit 2 line on or off for the active channel on the phase graph. |
| READOUT LIMIT FREQUENCIES | Displays Menu LF1, which shows all points where the current s-parameter equals the limit values. |
| LIMITS ENABLED | Enables both limit lines for the active channel on a phase graph. |
| PRESS <ENTER> TO ELECT OR TURN ON/OFF | Pressing the ENTER key implements your menu selection. The menu remains on the screen until another menu is selected for display or until the CLEAR/RET LOC key is pressed. |

| MENU | DESCRIPTION |
|---|---|
| SET LIMITS -LOG POLAR- LIMIT 1 ON (OFF) XXX.XXX dB | Turns the Limit 1 line on or off for the active channel. For your convenience, the arbitrarily set-limit lines allow you to delineate a go/no go line on your Log Polar display beyond which the measured values are unacceptable. |
| LIMIT 2 ON (OFF) XXX.XXX dB | Turns the Limit 2 line on or off for the active channel on your Log Polar display. |
| LIMITS ENABLED | Enables both previously set limit lines to appear for the active channel on your Log Polar display. |
| PRESS<ENTER> TO SELECT | Pressing the ENTER key implements your menu selection. The menu remains on the screen until another menu is selected for display or until |

-continued

| MENU | DESCRIPTION |
|---|---|
| OR TURN ON/OFF | the CLEAR/RET LOC key is pressed. |

| MENU | DESCRIPTION |
|---|---|
| SET LIMITS -GROUP DELAY- | |
| LIMIT 1 ON (OFF) XXX.XXX dB | Turns the limit 1 line on or off for the active channel. For your convenience, the arbitrarily set limit lines allow you to delineate a go/no go line on your Group Delay display beyond which the measured values are unacceptable. |
| LIMIT 2 ON (OFF) XXX.XXX dB | Turns the Limit 2 line on or off for the active channel on your Group Delay display. |
| READOUT LIMIT FREQUENCIES | Displays Menu LF1, which shows all points where the current s-parameter equals the limit values. |
| LIMITS ENABLED | Enables both previously set limit lines to appear for the active channel on your Group Delay display. |
| PRESS <ENTER> TO SELECT OR TURN ON/OFF | Pressing the ENTER key implements your menu selection. The menu remains on the screen until another menu is selected for display or until the CLEAR/RET LOC key is pressed. |

| MENU | DESCRIPTION |
|---|---|
| SET LIMITS -LINEAR MAG- | |
| LIMIT 1 ON (OFF) XXX.XXX dB | Turns the Limit 1 line on or off for the active channel. For your convenience, the arbitrarily set limit lines allow you to delineate a go/no go line on your Linear Mag display beyond which the measured values are unacceptable. |
| LIMIT 2 ON (OFF) XXX.XXX dB | Turns the Limit 2 line on or off for the active channel on your Linear Mag display. |
| READOUT LIMIT FREQUENCIES | Displays Menu LF1, which shows all points where the current s-parameter equals the limit values. |
| LIMITS ENABLED | Enables both previously set limit lines to appear for the active channel on your Linear Mag display. |
| PRESS <ENTER> TO SELECT OR TURN ON/OFF | Pressing the ENTER key implements your menu selection. The menu remains on the screen until another menu is selected for display or until the CLEAR/RET LOC key is pressed. |

| MENU | DESCRIPTION |
|---|---|
| SET LIMITS -LINEAR MAG- | |
| LIMIT 1 ON (OFF) XXX.XXX dB | Turns the Limit 1 line on or off for the active channel. For your convenience, the arbitrarily set limit lines allow you to delineate a go/no go line on your Linear Mag display beyond which the measured values are unacceptable. |
| LIMIT 2 ON (OFF) XXX.XXX dB | Turns the Limit 2 line on or off for the active channel on your Linear Mag display. |
| READOUT LIMIT FREQUENCY | Displays Menu LF1, which shows all points where the current s-arameter equals the limit values. |
| -PHASE- LIMIT ON (OFF) XXX.XXX dB | Turns the Limit 1 line on or off for the active channel. For your convenience, the arbitrarily set limit lines allow you to delineate a go/no go line on your Phase display beyond which the measured values are unacceptable. |
| LIMIT 2 ON (OFF) XXX.XXX dB | Turns the Limit 2 line on or off for the active channel on your Phase display. |
| READOUT LIMIT FREQUENCIES | Displays Menu LF1, which shows all points where the current s-parameter equals the limit values. |
| LIMITS ENABLED | Enables both previously set limit lines to appear for the active channel on your Phase display. |
| PRESS <ENTER> TO SELECT OR TURN ON/OFF | Pressing the ENTER key implements your menu selection. The menu remains on the screen until another menu is selected for display or until the CLEAR/RET LOC key is pressed. |

| MENU | DESCRIPTION |
|---|---|
| SET LIMITS -REAL- | |
| LIMIT 1 ON (OFF) XXX.XXX pU | Turns the Limit 1 line on or off for the active channel. For your convenience, the arbitrarily set limit lines allow you to delineate a go/no go line on your Real values display beyond which the measured values are unacceptable. |

| MENU | DESCRIPTION |
|---|---|
| LIMIT 2 ON (OFF) XXX.XXX pU | Turns the Limit 2 line on or off for the active channel on your Real values display. |
| LIMITS ENABLED | Enables both previously set limit lines to appear for the active channel on your Real values display. |
| PRESS<ENTER> TO SELECT OR TURN ON/OFF | Pressing the ENTER key implements your menu selection. The menu remains on the screen until another menu is selected for display or until the CLEAR/RET LOC key is pressed. |

| MENU | DESCRIPTION |
|---|---|
| SET LIMITS -IMAGINARY- | |
| LIMIT 1 ON (OFF) XXX.XXX mU | Turns the Limit 1 line on or off for the active channel. For your convenience, the arbitrarily set limit lines allow you to delineate a go/no go line on your Imaginary values display beyond which the measured values are unacceptable. |
| LIMIT 2 ON (OFF) XXX.XXX mU | Turns the Limit 2 line on or off for the active channel on your Imaginary values display. |
| LIMITS ENABLED | Enables both previously set limit lines to appear for the active channel on your Imaginary values display. |
| PRESS <ENTER> TO SELECT OR TURN ON/OFF | Pressing the ENTER key implements your menu selection. The menu remains on the screen until another menu is selected for display or until the CLEAR/RET LOC key is pressed. |

| MENU | DESCRIPTION |
|---|---|
| SET LIMITS -REAL- | |
| LIMIT 1 ON (OFF) XXX.XXX mU | Turns the Limit 1 line on or off for the active channel. For your convenience, the arbitrarily set limit lines allow you to delineate a go/no go line on your Real values display beyond which the measured values are unacceptable. |
| LIMIT 2 ON (OFF) XXX.XXX mU | Turns the Limit 2 line on or off for the active channel on your Real values display. |
| -IMAGINARY- | |
| LIMIT 1 ON (OFF) XXX.XXX pU | Turns the Limit 1 line on or off for the active channel. For your convenience, the arbitrarily set limit lines allow you to delineate a go/no go line on your Imaginiary values display beyond which the measured values are unacceptable. |
| LIMIT 2 ON (OFF) XXX.XXX pU | Turns the Limit 2 line on or off for the active channel on your Imaginiary values display. |
| LIMITS ENABLED | Enables both previously set limit lines to appear for the active channel on your Imaginary values display. |
| PRESS TO SELECT OR TURN ON/OFF | Pressing the ENTER key implements your menu selection. The menu remains on the screen until another menu is selected for display or until the CLEAR/RET LOC key is pressed. |

TABLE 3-3

Error Codes and Status Messages

| CODE | MESSAGE TEXT | FATAL | MEANING |
|---|---|---|---|
| | Self Test, Main Microprocessor #2 | | |
| 000 | FIFO RESET FAILURE | X | FiFO failed to reset, PCB A12 |
| 002 | PROM CHECKSUM FAILURE #2 | X | Prom failure, PCB A12 |
| 003 | BATTERY BACKED RAM FAILURE | X | Non volitile RAM failure, PCB A12 |
| 004 | EXTENDED MEMORY FAILURE | X | Failure in the extended memory, PCB A12 |
| 005 | DYNAMIC RAM FAILURE #2 | X | Dynamic RAM failure, PCB A12 |
| 006 | TIMER FAILURE #2 | X | Programmable timer failure, PCB A12 |
| 007 | INTERRUPT CONTROLLER FAILURE #2 | X | Interrupt comtroller failure PCB, A12 |
| 008 | NUMERIC PROCESSOR FAILURE #2 | X | Numeric processor failure, PCB A12 |
| 009 | FRONT PANEL INTERFACE FAILURE | X | Interface failure, front panel, PCB A12 |
| 010 | PRINTER INTERFACE FAILURE | X | Printer or interface failure PCB A12 |
| | Self Test, Main Microprocessor #1 | | |
| 020 | FIFO TO # 2 FAILED RESET | X | Interface failure with FIFO, PCB A12 |
| 022 | FIFO TO I/O FAILED RESET | | Interface failure with FIFO PCB A13 |
| 023 | PROM CHECKSUM FAILURE #1 | X | Checksum error, PROM PCB A13 |
| 024 | DYNAMIC RAM FAILURE #1 | X | Dynamic RAM failure, PCB A13 |
| 025 | TIMER FAILURE #1 | X | Programmable timer failure PCB A13 |

TABLE 3-3-continued

Error Codes and Status Messages

| CODE | MESSAGE TEXT | FATAL | MEANING |
|------|--------------|-------|---------|
| 026 | INTERRUPT CONTROLLOER FAILURE #1 | X | Interrupt controller failure PCB A13 |
| 027 | DISK DRIVE CONTROLLER FAILURE | | Disk drive controller failure, PCB A13 |
| 028 | DISK DRIVE FAILURE | | Disk drive SEEK failure, PCB A13 |
| 029 | NUMERIC PROCESSOR FAILURE #1 | X | 8087 math coprocessor failure |
| 030 | PROM CARTRIDGEE CHECKSUM ERROR | | PROM cartridge failure PCB A13 |
| 031 | DISK DRIVE NOT READY FOR TEST | | Diskette is not in disk drive |

Self Test, I/O Processor

| CODE | MESSAGE TEXT | FATAL | MEANING |
|------|--------------|-------|---------|
| 040 | PROM CHECKSUM FAILURE I/O | X | PROM failure, PCB A11 |
| 041 | RAM FAILURE I/O | X | RAM failure, PCB A11 |
| 042 | TIMER/INTERRUPT LOOPBACK FAILURE | X | Programmable timer failure, PCB A11 |
| 043 | GPIB INTERFACE FAILURE I/O | | GPIB failure, PCB A11 |
| 044 | FIFO FAILURE I/O | X | FIFO failure, PCB A11 |
| 050 | A1 COMMUNICATIONS FAILURE | | LO 1 Phase Lock PCB Error |
| 051 | A2 COMMUNICATIONS FAILURE | | LO 2 Phase Lock PCB Failure |
| 052 | A3 COMMUNICATIONS FAILURE | | Cal/Third Local O scillator PCB Failure |
| 053 | A4 COMMUNICATIONS FAILURE | | Analog to digital PCB failure |
| 054 | A5 COMMUNICATIONS FAILURE | | 10 Mhz References PCB failure |
| 055 | A6 COMMUNICATIONS FAILURE | | Source lock PCB failure |
| 056 | A10 COMMUNICATIONS FAILURE | | Bandswitch blank/sync PCB |
| 057 | 8 BIT A/D CONVERTER FAILURE | | Failure A/D PCB A4 |
| 058 | STEERING DAC FAILURE | | Failure A/D PCB A4 |
| 059 | 12 BIT A/D OR STEERING DAC FAILURE | | Failure A/D PCB A4 |
| 060 | TEST SET NOT CONNECTED OR NOT WORKING | | General failure of test set |
| 061 | TEST SET CHAN A CAL PHASING FAILURE | | Test set CHAN A failure |
| 062 | TEST SET CHAN A CAL LEVEL FAILURE | | Test set CHAN A failure |
| 063 | TEST SET CHAN A GAIN FAILURE | | Test set CHAN A failure |
| 064 | TEST SET CHAN A PHASE RANGING FAILURE | | Test set CHAN A failure |
| 065 | TEST SET CHAN B CAL PHASING FAILURE | | Test set CHAN B failure |
| 067 | TEST SET CHAN B GAIN FAILURE | | Test set CHAN B failure |
| 068 | TEST SET CHAN B PHASE RANGING FAILURE | | Test set CHAN B failure |
| 069 | TEST SET REF CHAN CAL PHASING FAILURE | | Test set REF CHAN failure |
| 070 | TEST SET REF CHAN CAL LEVEL FAILURE | | Test set REF CHAN failure |
| 071 | TEST SET REF CHAN GAIN FAILURE | | Test set REF CHAN failure |
| 072 | TEST SET REF CHAN PHASE RANGING | | Test set REF CHAN failure |

System Status, Program Load

| CODE | MESSAGE TEXT | FATAL | MEANING |
|------|--------------|-------|---------|
| 100 | DISK DRIVE NOT READY | X | Program failed to load from disk, (disk installed?) |
| 101 | PROGRAM DATA ERROR | X | Program failed to load from disk |
| 102 | PROGRAM FILE MISSING | | Loader could not find system files |
| 103 | DISK ERROR | | The 360 is unable to read the diskette |
| 104 | UNKNOWN DISK ERROR | | Loader failed a consistency check |
| 105 | PROGRAM DATA ERROR ON # 2 | | Program for processor #2 failed to load |

Program Initialization

| CODE | MESSAGE TEXT | FATAL | MEANING |
|------|--------------|-------|---------|
| 110 | SOURCE ID FAILURE | | No sweeper ID on GPIB; sweeper may not be connected. |
| 111 | TEST SET NOT CONNECTED | X | Initialization detects a descrepancy. |
| 112 | TEST SET FREQ. RANGE DOES NOT MATCH SOURCE | X | Initialization detects a descrepancy. |
| 113 | CAL DATA NOT FOUND: CHANGE DISK AND PRESS <ENTER> | | File not found on disk with name matching that in battery backed RAM. |
| 114 | PROGRAM ERROR | X | Program corrupted. |
| 115 | PROCESSOR COM ERROR | X | FIFO Synch problem Disk Releated. |

Program Initialization, Disk Related

| CODE | MESSAGE TEXT | FATAL | MEANING |
|------|--------------|-------|---------|
| 131 | DISK READ ERROR | | Hard error reading from disk. |
| 132 | DISK WRITE ERROR | | Hard error writing to disk. |
| 133 | FILE DELETION ERROR | | Write protect tab is in "read only" position. |
| 134 | DISK NOT READY | | Disk not in unit or not formatted |
| 135 | DISK WRITE PROTECTED | | Write protect tab is in "read only" position. |
| 136 | OUT OF DISK SPACE | | Disk file space full |
| 137 | FILE IS INCOMPATIBLE | | File is not a 360 data or program file. |
| 138 | NO SPACE FOR NEW DATA FILE | | Disk file space full. |
| 139 | FILE MARKED READ ONLY | | Read-only attribute set on file. |
| 140 | NO FILES REMAIN TO OVERWRITE | | All files of the type have been deleted. |
| 141 | NO FILES REMAIN TO DELETE | | All files of the type have been deleted. |

Program Initialization, Peripheral

| CODE | MESSAGE TEXT | FATAL | MEANING |
|------|--------------|-------|---------|
| 170 | PRINTER NOT READY | | Printer "off line" or not connected. |
| 171 | PLOTTER NOT READY | | Plotter "off line" or not connected. |

Control Panel

| CODE | MESSAGE TEXT | FATAL | MEANING |
|------|--------------|-------|---------|
| 200 | SELECTED FREQUENCY OUT OF CAL RANGE | | Cal. range does not include selected frequency. |

TABLE 3-3-continued

Error Codes and Status Messages

| CODE | MESSAGE TEXT | FATAL | MEANING |
|------|--------------|-------|---------|
| 201 | MARKERS SELECTED FOR READOUT NOT ACTIVE IN SWEEP RANGE | | Sweep range does not include selected frequency |
| 208 | OUT OF RANGE | | Attempted to enter an out-of-range parameter. |
| 209 | START GREATER THAT STOP | | Attempted to a set start frequency that was greater than the stop frequency. |
| 210 | OUT OF RANGE.20 PERCENT MAX | | Attempted to enter a smoothing or group delay factor that was greater than 20%. |
| 213 | OUT OF H/W RANGE | | Attempted to enter a frequency that is outside of the system hardware range. |
| 216 | TOO MANY POINTS. 501 MAXIMUM | | Attempted to set too many discrete frequency points. |
| 217 | TOO FEW POINTS. 2 MINIMUM | | Attempted to set too few discrete frequency points. |
| 219 | DISCRETE FREQS LOST | | Setup changed in N-discrete frequency mode. |
| 220 | OUT OF SWEEP RANGE | | Attempt to set marker outside sweep range. |
| 221 | OPTION NOT INSTALLED | | The selected option is not installed |
| 222 | MEAS. DATA NOT AVAILABLE FOR STORAGE | | No measured data on channel to be stored. |
| 223 | NO STORED MEMORY DATA | | No data available in memory for channel. |
| 224 | SYSTEM BUS ADDRESSES MUST BE UNIQUE | | Attempt to set GPIB addresses to same value. |
| 225 | SYSTEM UNCALIBRATED | | no cal exists. |
| 226 | MEMORY LOCATION CORRUPTED | | Saved state data is invalid. |
| 227 | SETUP INCONSISTENT RECALL ABORTED | | Saved state not compatible with hardware or software version |
| 228 | WINDOW TOO SMALL | | Attempt to set start greater than or equal to stop. |
| 229 | OUT OF WINDOW RANGE | | Attempt to set marker outside start to stop range. |
| 230 | ATTENUATOR UNAVAILABLE | | Selected attenuators not available in test set |
| 231 | START MUST BE LESS THAN STOP | | Attempt to set start greater than or equal to stop in marker sweep |
| 232 | ILLEGAL IN C.W. MODE | | Attempt to readout limit frequency. |
| 233 | ILLEGAL IN TIME DOMAIN | | Attempt to readout limit frequency. |
| 234 | BOTH LIMITS MUST BE ON | | Attempt to readout limit frequency. |
| 235 | Stop is Over Range | | Discrete fill parameters cause stop to go over hardware range |
| 238 | Out of Ramge 10% Minimum | | Attempt to set pen speed to below 10% |
| 270 | UNCALIBRATED | | Channel has S parameter for which calibration does not exist. |
| 271 | PRINTER NOT READY | | Printer not connected or paper out. |
| 272 | TOO MUCH PRINT DATA | | Print buffer is full. Reduce number of channels or data points. |
| 273 | PLOTTER NOT READY | | Plotter not connected. |
| 280 | CAL INVALID | | Calibration is incorrect for S parameter displayed. |
| 281 | TIME DOMAIN INVALID | | Time domain cannot be used in current setup |
| 282 | GROUP DELAY INVALID | | Group delay cannot be used in current setup |
| 283 | GATE MUST BE ON | | Attempt to select Frequency With Time Gate with gate off. |
| 284 | SMOOTHING INVALID | | Attempt to use smoothing while in C.W. mode. |
| 285 | MEMORY DATA INVALID | | Setup has changed since data was stored. |
| | Measurement Related | | |
| 300 | LOW IF | | Insufficient signal level detected: Device under test may not be connected. |
| 301 | LOCK FAILURE | | RF source failed to lock to reference oscillator in 360 testset. |
| 302 | A/D FAILURE | | Analog to Digital convertor not functioning in 360 mainframe. |
| 303 | RF OVERLOAD | | Test signal level is too high: reduce source level or add attenuation. |
| 310 | SWPR ID FAILURE | | Communications lost with RF source. |
| 311 | SWPR SELF TEST FAILURE | | RF source failed power on self-test program. |
| 312 | NO TEST SET | | Test set not connected. Reconnect and cycle power to clear |
| | GPIB Related | | |
| 400 | GPIB ERROR | | Data transmission error on GPIB |

| DOMAIN | DOMAIN | DOMAIN |
|---|---|---|
| ►FREQUENCY | FREQUENCY | FREQUENCY |
| FREQUENCY | FREQUENCY | FREQUENCY |
| WITH TIME | WITH TIME | WITH TIME |
| GATE | GATE | GATE |
| TIME | ►TIME | TIME |
| LOWPASS MODE | LOWPASS MODE | LOWPASS MODE |
| TIME | TIME | ►TIME |
| BANDPASS MODE | BANDPASS MODE | BANDPASS MODE |
| DISPLAY | DISPLAY | DISPLAY |
| TIME/DISTANCE | TIME/DISTANCE | TIME/DISTANCE |
| SET RANGE | SET RANGE | SET RANGE |
| SET GATE | SET GATE | SET GATE |
| GATE ON/OFF | GATE ON/OFF | GATE ON/OFF |
| HELP | HELP | HELP |
| PRESS <ENTER> | PRESS <ENTER> | PRESS <ENTER> |
| TO SELECT | TO SELECT | TO SELECT |
| OR SWITCH | OR SWITCH | OR SWITCH |

```
DOMAIN
FREQUENCY
FREQUENCY
WITH TIME
GATE
TIME
LOWPASS MODE
TIME
BANDPASS MODE
DISPLAY
►TIME/DISTANCE
SET RANGE
SET GATE
GATE ON/OFF
HELP
PRESS <ENTER>
TO SELECT
OR SWITCH
```

| DOMAIN | LOWPASS TIME | BANDPASS TIME |
|---|---|---|
| FREQUENCY | DOMAIN SETUP | DOMAIN SETUP |
| FREQUENCY | ►START | ►START |
| WITH TIME | XXXXXXps | XXXXXXps |
| GATE | STOP | STOP |
| TIME | XXXXXXps | XXXXXXps |
| LOWPASS MODE | CENTER | CENTER |
| TIME | XXXXXXps | XXXXXXps |
| BANDPASS MODE | SPAN | SPAN |
| DISPLAY | XXXXXXps | XXXXXXps |
| TIME/DISTANCE | MARKER RANGE | MARKER RANGE |
| ►SET RANGE | RESPONSE | PHASOR ON/OFF |
| SET GATE | IMPULSE/STEP | IMPULSE |
| GATE ON/OFF | MORE | SET RANGE TO |
| HELP | PRESS <ENTER> | ISOLATE ONE |
| PRESS <ENTER> | TO SELECT | DISCONTINUITY |
| TO SELECT | | MORE |
| OR SWITCH | | PRESS <ENTER> |
| | | TO SELECT |

|                                   |                                   |                                   |
|-----------------------------------|-----------------------------------|-----------------------------------|
| LOWPASS TIME DOMAIN SETUP<br><br>START<br>XXX.XXX ps<br>STOP<br>XXX.XXX ps<br>CENTER<br>XXX.XXX ps<br>SPAN<br>XXX.XXX ps<br>MARKER RANGE<br>► RESPONSE<br>IMPULSE/STEP<br>MORE<br><br>PRESS <ENTER><br>   TO SELECT | SET DC TERM FOR LOW PASS PROCESSING<br><br>► AUTO EXTRAPOLATE<br>LINE IMPEDANCE<br>OPEN<br>SHORT<br>OTHER<br>–XXX.XXX s<br>ABOVE VALUE REPRESENTS A REFLECTION COEFF. OF<br>XX.XXX mU<br><br>PRESS <ENTER><br>   TO SELECT | BANDPASS TIME DOMAIN SETUP<br><br>START<br>XXX.XXX ps<br>STOP<br>XXX.XXX ps<br>CENTER<br>XXX.XXX ps<br>SPAN<br>XXX.XXX ps<br>MARKER RANGE<br>► PHASOR ON/OFF IMPULSE<br>SET RANGE TO ISOLATE ONE DISCONTINUITY<br>MORE<br><br>PRESS <ENTER><br>   TO SELECT |

|                                   |                                   |
|-----------------------------------|-----------------------------------|
| LOWPASS TIME DOMAIN SETUP<br>START<br>XXX.XXX ps<br>STOP<br>XXX.XXX ps<br>SPAN<br>XXX.XXX ps<br>► MARKER RANGE<br>RESPONSE<br>IMPULSE STEP<br>MORE<br><br>PRESS <ENTER><br>   TO SELECT | TIME MARKER RANGE<br>► START TIME MARKER( )<br>XXX.XXX nS<br>STOP TIME MARKER( )<br>XXX.XXX nS<br>RESTORE ORIGINAL RANGE<br>PREVIOUS MENU<br><br>USE KEYPAD TO CHOOSE MARKER (1.6)<br>OR<br>PRESS <ENTER><br>   TO SELECT |

|                                   |                                   |                                   |
|-----------------------------------|-----------------------------------|-----------------------------------|
| LOWPASS TIME DOMAIN SETUP<br>START<br>XXX.XXXps<br>STOP<br>XXX.XXXps<br>CENTER<br>XXX.XXXps<br>SPAN<br>XXX.XXXps<br>MARKER RANGE<br>RESPONSE IMPULSE/STEP<br>► MORE<br><br>PRESS <ENTER><br>   TO SELECT | LOWPASS TIME DOMAIN SETUP<br>► WINDOW NOMINAL<br>SET GATE<br>SET D.C. TERM<br>XXX.XXX<br>PREVIOUS MENU<br><br>PRESS <ENTER><br>   TO SELECT | SHAPE<br><br>► RECTANGULAR NOMINAL<br>LOW SIDELOBE<br>MIN SIDELOBE<br>HELP<br><br>PRESS <ENTER><br>   TO SELECT |

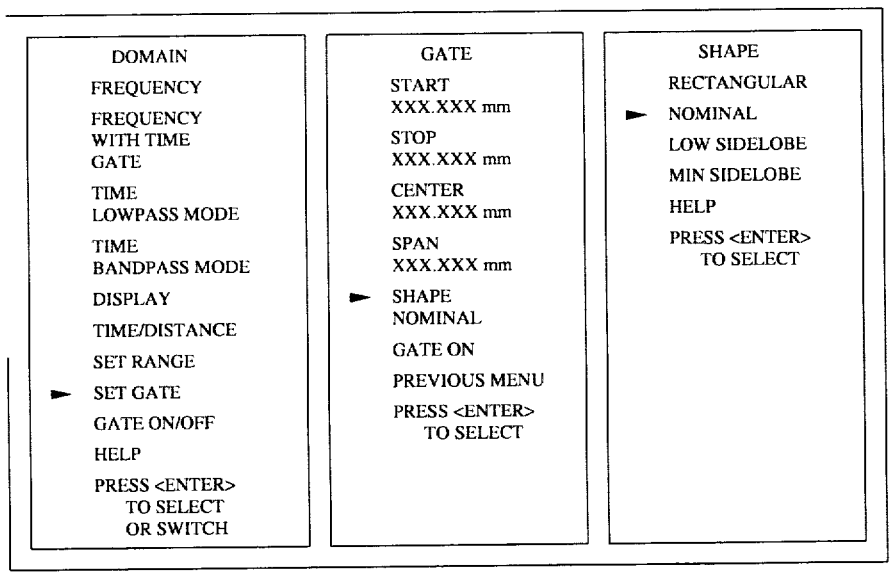

| MENU TD1 | DESCRIPTION |
|---|---|
| DOMAIN FREQUENCY | Displays the data in normal frequency domain format. |
| FREQUENCY WITH TIME GATE | Displays the data in the frequency domain after a specific time range has been sampled by the gate function. |
| TIME LOWPASS MODE | Displays the data in the time (distance) domain, using true lowpass processing. Data must be taken using a harmonic series calibration and sweep in order to use this mode. |
| TIME BANDPASS MODE | Displays the data in the time (distance) domain using bandpass processing. Any data sweep range using normal calibration can be used. |
| DISPLAY TIME/DISTANCE | Switches the mode of display between time and distance. This does not affect the actual displayed data, but only the annotation. |
| SET RANGE | Takes you to Menu TD2, which lets you set range and other display parameters. |
| SET GATE | Takes you to menu TD4, which lets you set gate parameters. |
| GATE ON/OFF | Switches the gate on or off each time ENTER is pressed. |
| HELP | Displays an informational help menu. |
| PRESS <ENTER> TO SELECT OR SWITCH | Pressing the ENTER key implements your menu selection. The menu remains on the screen until another menu is selected for display or until the CLEAR/RET LOC key is pressed. |

| MENU TD2tl | DESCRIPTION |
|---|---|
| LOWPASS TIME DOMAIN SETUP START XXX.XXX ps | Sets the start time of the display. |
| STOP XXX.XXX ps | Sets the stop time of the display. |
| CENTER XXX.XXX ps | Sets the center time of the display. |
| SPAN XXX.XXX ps | Sets the span (Stop - Start) of the display. |
| MARKER RANGE | Takes you to Menu TD7d/71, which lets you set the display to a range determined by two of the markers. |
| RESPONSE IMPULSE/STEP | Switches between Impulse and Step response each time ENTER is pressed. |
| MORE | Takes you to Menu TD3, which contains additional selections for display steup. |
| PRESS <ENTER> TO SELECT | Pressing the ENTER key implements your menu selection. The menu remains on the screen until another menu is selected for display or until the CLEAR/RET LOC key is pressed. |

| MENU TD2dl | DESCRIPTION |
|---|---|
| LOWPASS DISTANCE DISPLAY SETUP START XXX.XXX mm | Sets the start time of the display. |
| STOP XXX.XXX mm | Sets the stop time of the display. |
| CENTER XXX.XXX mm | Sets the center time of the display. |
| SPAN XXX.XXX mm | Sets the span (Stop - Start) of the display. |
| MARKER RANGE | Takes you to Menu TD7d/71, which lets you set the display to a range determined by two of the markers. |
| RESPONSE IMPULSE/STEP | Switches between Impulse and Step response each time ENTER is pressed. |
| MORE | Takes you to Menu TD3, which contains additional selections for display setup. |
| REL. VELOCITY X.X | Indicates the relative velocity of light, as set by the dielectric constant in menu RD2. |
| PRESS <ENTER> TO SELECT | Pressing the ENTER key implements your menu selection. The menu remains on the screen until another menu is selected for display or until the CLEAR/RET LOC key is pressed. |

| MENU TD2tb | DESCRIPTION |
|---|---|
| BANDPASS TIME DOMAIN SETUP | |
| START XXX.XXX ps | Sets the start time of the display. |
| STOP XXX.XXX ps | Sets the stop time of the display. |
| CENTER XXX.XXX ps | Sets the center time of the display. |
| SPAN XXX.XXX ps | Sets the span (Stop - Start) of the display. |
| MARKER RANGE | Takes you to Menu TD7d/7l, which lets you set the display to a range determined by two of the markers. |
| PHASOR ON/OFF IMPULSE SET RANGE TO ISOLATE ONE DISCONTINUITY | Switches Phasor Impulse processing on or off each time ENTER is pressed. |
| MORE | Takes you to Meun TD3, which contains additional selections for display setup. |
| PRESS <ENTER> TO SELECT | Pressing the ENTER key implements your menu selection. The menu remains on the screen until another menu is selected for display or until the CLEAR/RET LOC key is pressed. |

| MENU TD2db | DESCRIPTION |
|---|---|
| BANDPASS DISTANCE DISPLAY SETUP | |
| START XXX.XXX mm | Sets the start time of the display. |
| STOP XXX.XXX mm | Sets the stop time of the display. |
| CENTER XXX.XXX mm | Sets the center time of the display. |
| SPAN XXX.XXX mm | Sets the span (Stop - Start) of the display. |
| MARKER RANGE | Takes you to Menu TD7d/7l, which lets you set the display to a range determined by two of the markers. |
| PHASOR ON/OFF IMPULSE SET RANGE TO ISOLATE ONE DISCONTINUITY | Switches Phasor Impulse processing on or off each time ENTER is pressed. |
| MORE | Takes you to Menu TD3, which contains additional selections for display setup. |
| REL. VELOCITY X.X | Indicates the relative velocity of light, as set by the dielectric constant in menu RD2. |
| PRESS <ENTER> TO SELECT | Pressing the ENTER key implements your menu selection. The menu remains on the screen until another menu is selected for display or until the CLEAR/RET LOC key is pressed. |

| MENU | DESCRIPTION |
|---|---|
| BANDPASS TIME DOMAIN SETUP | |
| WINDOW NOMINAL | Takes you to Menu TD5, which lets you change the window type. |
| SET GATE | Takes you to menu TD4, which lets you set the gate. |
| PREVIOUS MENU | Returns you to Menu TD2. |
| PRESS <ENTER> TO SELECT | Pressing the ENTER key implements your menu selection. The menu remains |

-continued

| MENU | DESCRIPTION |
|---|---|
| OR TURN ON/OFF | on the screen until another menu is selected for display or until the CLEAR/RET LOC key is pressed. |

| MENU | DESCRIPTION |
|---|---|
| LOWPASS TIME DOMAIN SETUP | |
| WINDOW NOMINAL | Takes you to Menu TD5, which lets you change the window type. |
| SET GATE | Takes you to menu TD4, which lets you set the gate. |
| SET D.C. TERM XXX.XXX | Takes you to Menu TD6, which lets you set the D.C. term for lowpass processing. |
| PREVIOUS MENU | Returns you to Menu TD2 |
| PRESS <ENTER> TO SELECT | Pressing the ENTER key implements your menu selection. The menu remains on the screen until another menu is selected for display or until the CLEAR/RET LOC key is pressed. |

| MENU | DESCRIPTION |
|---|---|
| GATE | |
| START XXX.XXX mm | Sets the start time of the gate. |
| STOP XXX.XXX mm | Sets the stop time of the gate. |
| CENTER XXX.XXX mm | Sets the center time of the gate. |
| SPAN XXX.XXX mm | Sets the span (Stop - Start) of the gate. |
| SHAPE NOMINAL | Takes you to Menu TD5, which lets you set the shape of the gate. |
| GATE ON | Switches the gate on or off each time ENTER is pressed. |
| PREVIOUS MENU | Returns you to the previous menu. |
| PRESS <ENTER> TO SELECT | Pressing the ENTER key implements your menu selection. The menu remains on the screen until another menu is selected for display or until the CLEAR/RET LOC key is pressed. |

| MENU | DESCRIPTION |
|---|---|
| GATE | |
| START XXX.XXX ns | Sets the start time of the gate. |
| STOP XXX.XXX ns | Sets the stop time of the gate. |
| CENTER XXX.XXX ns | Sets the center time of the gate. |
| SPAN XXX.XXX ns | Sets the span (Stop - Start) of the gate. |
| SHAPE NOMINAL | Takes you to Menu TD5, which lets you set the shape of the gate. |
| GATE ON | Switches the gate on or off each time ENTER is pressed. |
| PREVIOUS MENU | Returns you to the previous menu. |
| PRESS <ENTER> TO SELECT | Pressing the ENTER key implements your menu selection. The menu remains on the screen until another menu is selected for display or until the CLEAR/RET LOC key is pressed. |

| MENU | DESCRIPTION |
|---|---|
| SHAPE | |
| RECTANGULAR | Selects a Rectangular (one-term) shape. |
| NOMINAL | Selects a two-term Hamming shape. |
| LOW SIDELOBE | Selects a three-term Blackman-Harris shape. |
| MIN SIDELOBE | Selects a four-term Blackman-Harris shape. |
| HELP | Displays an informational help menu. |
| PRESS <ENTER> TO SELECT | Pressing the ENTER key implements your menu selection. The menu remains on the screen until another menu is selected for display or until the CLEAR/RET LOC key is pressed. |

| MENU | DESCRIPTION |
|---|---|
| SET DC TERM FOR LOW PASS PROCESSING | Since it is impossible to measure the true D.C. term required for lowpass processing, a value must be estimated. This menu allows a choice between five different selections for this value. |
| AUTO EXTRAPOLATE | Sets the D.C. term to a value determined by extrapolating the data points near the zero frequency. |
| LINE IMPEDANCE | Sets the D.C. term to the characteristic impedance of the transmission medium ($Z_o$). |
| OPEN | Sets the D.C. term to correspond to an open circuit. |
| SHORT | Sets the D.C. term to correspond to a short circuit. |
| OTHER -XXX.XXX# ABOVE VALUE | Sets the D.C. term to the value entered. |

| MENU | DESCRIPTION |
|---|---|
| REPRESENTS A REFLECTION COEFF. CF XX.XXX mU PRESS <ENTER> TO SELECT | Pressing the ENTER key implements your menu selection. The menu remains on the screen until another menu is selected for display or until the CLEAR/RET LOC key is pressed. |

| MENU | DESCRIPTION |
|---|---|
| TIME MARKER RANGE | |
| START TIME MARKER ( ) XXX.XXX nS | Sets the start time to the value of the selected marker. |
| STOP TIME MARKER ( ) XXX.XXX nS | Sets the stop time to the value of the selected marker. |
| RESTORE ORIGINAL RANGE | Returns the display to the original time range that was in effect before the marker range was selected. |
| PREVIOUS MENU | Returns you to the TD2 menu. |
| USE KEYPAD TO CHOOSE MARKER (1–6) OR PRESS <ENTER> TO SELECT | Pressing the ENTER key implements your menu selection. The menu remains on the screen until another menu is selected for display or until the CLEAR/RET LOC key is pressed. |

TABLE 4-2

Command Code Classes

| Command Code | Description | Para. | Table | Page |
|---|---|---|---|---|
| Channels | DSP, D13, D24, D14, CH1, CH2, CH3, CH4 | 4-4.4 | 4-4 | 4-16 |
| Data entry | 0 thru 9, -,.,GHZ, MHZ, KHZ, PSC, NSC, USC, DBL, DBM, DEG, MMT, CMT, MTR, XX1, XX3, XM3, REU, IMU | 4-4.5 | 4-5 | 4-16 |
| Measurement Control | S11, S21, S22, S12, SRT, STP, PWR, CWF, FHI, FME, FLO, HLD, TRS, CTN, WFS, SA1, SA2, TA2, SWP | 4-4.6 | 4-6 | 4-17 |
| Display Control | MAG, PHA, MPH, SWR, SMI, ISM, SME, ISE, SMC, ISC, DLA, PLR, PLG, LIN, LPH, REL, IMG, RIM, SCL, OFF, REF, ASC, APR | 4-4.7 | 4-7 | 4-19 |
| Enhancement | IFN, IFR, IFM, AVG, AOF, SON, SOF | 4-4.8 | 4-8 | 4-22 |
| Reference Delay | RDD, RDT, RDA, DIA, DIT, DIP, DIM, DIE | 4-4.9 | 4-9 | 4-22 |
| Trace Memory | DAT, MEM, DTM, DNM, MIN, DIV, ADD, MUL, STD, SDK, RCK | 4-4.10 | 4-10 | 4-23 |
| Markers | MK1-MK6, MOF, MON, MO1-MO6, DR1-DR6, DRO, DRF, MR1-MR6, MMN, MMX, M1S-M6S, M1E-M6E, M1C-M6C | 4-4.11 | 4-11 | 4-25 |
| Limits | LUP, LLO, LON, LOF, LFR, LFD, LFP | 4-4.12 | 4-12 | 4-26 |
| Hard copy output | TDD, PFS, PGR, PMK, PTB, PMT, PT0-PT9, PST, FFD, PLS, PLD, PLT, PMN, PLH, PGT, PFL, PTL, PTR, PBL, PBR, DPN, GPN, MPN, HPN, LDT, LNM, LMS, LID, TDD, RTB, SPD | 4-4.13 | 4-13 | 4-28 |
| Miscellaneous Functions | RST, FON, FOF, BC0, BC1, BLU, CYN, TST, RTL, DFP, DGS, DCP, DC1, DC3 | 4-4.14 | 4-14 | 4-30 |
| Calibration | C12, C8T, CRF, CFR, CFT, CRL, NOC, SRT, STP, DFC, FRS, FR1, FRP, FIL, DFQ, DFD, CWC, CWF, TDC, P1C, P2C, CMS, CFS, CMK, CFK, CMN, CFN, CM3, CF3, CNG, CND, COO, COS, CC0, CC1, CC2, CC3, BBL, SLD, BEG, TCD, NCS, KEC, CON, COF, A12, A8T, ARF, AFR, AFT, ARL | 5-5.1 | * | * |
| Save/Recall | STO, RLD, SV1-SV4, RC1-RC4 | 5-5.2 | * | * |
| Data Transfer | OM1-OM6, OAP, OKP, OID, ONP, FMA, FMB, FMC, LSB, MSB, OC1-OC9, OCA, OCB, OCC, OCL OCD, IC1-IC9 ICA, ICB, ICC, ICL, IFV, OS1-OS4, OFP, IS1-IS4, IFP, ODR, ORD, OFD, ICD, IFD | 5-5.3 | * | * |
| Group Execute Trigger | DEF, END | 5-5.4 | * | * |

TABLE 4-2-continued

Command Code Classes

| Command Code | Description | Para. | Table | Page |
|---|---|---|---|---|
| Disk Functions | SDK, RCK, STO, RLD, TDD, RTB, DEC, DEN, INT, LKT | 5–5.5 | * | * |
| Time Domain | FQD, DBP, TBP, DPI, TPI, DLP, TLP, DCA, DCZ, DCO, DCS, DCV, MRR, LPI, LPS, FGT, GON, GOF, GDS, SRT, STP, GST, GSP, GCT, GSN, GRT, GNM, GLS, GMS, WRT, WNM, WLS, WMS | 5–5.6 | * | * |
| Status bytes/SRQ | LPI, LPS, OPB, OEB, IPM, IEM, SQ0, SQ1, CSB | 5–5.7 | * | * |

*Denotes material to be included in Section V of the follow-on packet

TABLE 4-3

An Alphabetical List of Command Codes

| Command Code | Description | Para. | Table | Page |
|---|---|---|---|---|
| ADD | Select Complex Addition as Trace Math | 4–4.10 | 4–10 | 4–23 |
| AFR | Assume Frequency Response | * | * | * |
| AFT | Assumme Frequency Response - Transmission Only | * | * | * |
| AOF | Averaging Off | 4–4.8 | 4–8 | 4–22 |
| APR | Set Group Delay Aperature Percentage | * | * | * |
| ARF | Assume Reflection Only - One Port | * | * | * |
| ARL | Assume Frequency Response - Reflecton Only | * | * | * |
| ASC | Autoscale Display | 4–4.7 | 4–7 | 4–19 |
| AVG (value) | Averaging On and Set to Value | 4–4.8 | 4–8 | 4–22 |
| A8T | Assume 8 Term | * | * | * |
| A12 | Assume 12 Term | * | * | * |
| BBL | Broadband Load | * | * | * |
| BC0 | Blank CRT | 4–4.14 | 4–14 | 4–30 |
| BC1 | Unblank CRT | 4–4.14 | 4–14 | 4–30 |
| BEG | Begin Calibration | * | * | * |
| BLU | Select Blue Color | 4–4.14 | 4–14 | 4–30 |
| C12 | Calibrate Full 12 Term | * | * | * |
| C8T | Calibrate 8 Term - One Path Two Port) | * | * | * |
| CC0–CC3 (value) | Capacitance For Open Device | * | * | * |
| CFK | Female K Connector ™ for the Specified Port | * | * | * |
| CFN | Female Type N Connector for the Specified Port | * | * | * |
| CFS | Female SMA Connector for the Specified Port | * | * | * |
| CFR | Calibrate Frequency Response | * | * | * |
| CFT | Calibrate Frequency Response - Transmission Only | * | * | * |
| CH1–CH4 | Select Active Channel 1 Through 4 | 4–4.4 | 4–4 | 4–16 |
| CMK | Male K Connector For The Specified Port | * | * | * |
| CMN | Male Type N Connector For The Specified Port | * | * | * |
| CMS | Male SMA Connector For The Specified Port | * | * | * |
| CMT | Centimeter | 4–4.5 | 4–5 | 4–16 |
| CM3 | Male GPC-3.5 Connector for the Specified Port | * | * | * |
| CF3 | Female GPC-3.5 Connector for the Specified Port | * | * | * |
| CND | Connector Type Other | * | * | * |
| CNG | Connector Type GPC-7 | * | * | * |
| CNO (value) | Connector Offset Value For "OTHER" connector | * | * | * |
| CCF | Correction Off | * | * | * |
| CON | Apply Cal Correction | * | * | * |
| COO (value) | Connector Offset for Open Device | * | * | * |
| COS (value) | Connector Offset for Short Device | * | * | * |
| CRF | Calibrate Reflection Only - One Port | * | * | * |
| CRL | Calibrate Frequency Response - Reflecion Only | * | * | * |
| CSB | Clear Both Status Bytes | * | * | * |
| CTN | Continue Sweeping From Hold | 4–4.6 | 4–6 | 4–17 |
| CWC | CW Cal | * | * | * |
| CWF (value) | CW Frequency | 4–4.6 | 4–6 | 4–17 |
| CYN | Select Cyan Color | 4–4.14 | 4–14 | 4–30 |
| D13 | Dual Channel 1 and 3 Display | 4–4.4 | 4–4 | 4–16 |
| D14 | Four Channel Display 1 Through 4 | 4–4.4 | 4–4 | 4–16 |
| D24 | Dual Channel 2 and 4 Display | 4–4.4 | 4–4 | 4–16 |
| DAT | Display Data | 4–4.10 | 4–10 | 4–23 |
| DBL | dB | 4–4.5 | 4–5 | 4–16 |
| DBM | dBm | 4–4.5 | 4–5 | 4–16 |
| DBP | Distance Bandpass Mode | * | * | * |
| DC1 | Display Channels 1 and 2 Operating Parameters | 4–4.14 | 4–14 | 4–30 |
| DC3 | Display Channels 3 and 4 Operating Parameters | 4–4.14 | 4–14 | 4–30 |
| DCA | DC Term For Low Pass, Auto | * | * | * |
| DCO | DC Term For Low Pass, Open | * | * | * |
| DCP | Display Calibration Parameters | * | * | * |
| DCS | DC Term For Low Pass, Short | * | * | * |

TABLE 4-3-continued

An Alphabetical List of Command Codes

| Command Code | Description | Para. | Table | Page |
|---|---|---|---|---|
| DCV (value) | Set DC Term for Low Pass To Value Specified | * | * | * |
| DCZ | DC Term for Lowpass, Line Impedance | * | * | * |
| DEC (filename) | Delete Cal File | * | * | * |
| DED (filename) | Delete Data File | * | * | * |
| DEF | Begin Definition of GET Action | * | * | * |
| DEG | Degree | 4-4.5 | 4-5 | 4-16 |
| DEN (filename) | Delete Norm File | * | * | * |
| DFC | Discrete Frequency Cal | * | * | * |
| DFD | Discrete Frequencies Done | * | * | * |
| DFP | Display Global Operating Parameters | 4-4.14 | 4-14 | 4-30 |
| DFQ (value) | Discrete Frequencies | * | * | * |
| DGS | Display GPIB Status | 4-4.14 | 4-14 | 4-30 |
| DIA | Set Dielectric Constant to 1.0 for Air | 4-4.9 | 4-9 | 4-22 |
| DIE (value) | Enter Dielectric Constant | 4-4.9 | 4-9 | 4-22 |
| DIM | Set Dielectric Constant to 1.69 for Microporous Teflon | 4-4.9 | 4-9 | 4-22 |
| DIP | Set Dielectric Constant to 2.26 for Polyethylene | 4-4.9 | 4-9 | 4-22 |
| DIT | Set Dielectric Constant to 2.1 for Teflon | 4-4.9 | 4-9 | 4-22 |
| DIV | Set Complex Division as Trace Math | 4-4.10 | 4-10 | 4-23 |
| DLA | Group Delay Display Format | 4-4.7 | 4-7 | 4-19 |
| DLP | Distance Lowpass Mode | * | * | * |
| DNM | Display Data Normalized to Memory | 4-4.10 | 4-10 | 4-23 |
| DPI | Distance Phasor Impulse Mode | * | * | * |
| DPN (value) | Data Pen Number | 4-4.13 | 4-13 | 4-28 |
| DR1-DR6 | Select Delta Reference Marker | 4-4.11 | 4-11 | 4-25 |
| DRF | Delta Reference Mode On | 4-4.11 | 4-11 | 4-25 |
| DRO | Delta Reference Mode Off | 4-4.11 | 4-11 | 4-25 |
| DSP | Single Channel Display | 4-4.4 | 4-4 | 4-16 |
| DTM | Display Data and Memory | 4-4.10 | 4-10 | 4-23 |
| END | End Definition of GET Action | * | * | * |
| FFD | Form Feed Sent to Printer | * | * | * |
| FGT | Frequency With Time Gate | * | * | * |
| FH1 | Frequency Resolution High | 4-4.6 | 4-6 | 4-17 |
| FIL | Fill Range | * | * | * |
| FLO | Frequency Resolution Low | 4-4.6 | 4-6 | 4-17 |
| FMA | ASCII Format Data Transfer | * | * | * |
| FMB | Floating Point Format 64 Bit Data Transfer | * | * | * |
| FMC | Floating Point Format 32 Bit Data Transfer | * | * | * |
| FME | Frequency Resolution Medium | 4-4.6 | 4-6 | 4-17 |
| FOF | Blank All Frequency Information | 4-4.14 | 4-14 | 4-30 |
| FON | Display All Frequency Information | 4-4.14 | 4-14 | 4-30 |
| FQD | Frequency Domain | * | * | * |
| FRI (value) | Fill Range Increment | * | * | * |
| FRP (value) | Fill Range Points | * | * | * |
| FRS (value) | Fill Range Start | * | * | * |
| GCT (value) | Gate Center, Value in Time or Distance | * | * | * |
| GDS | Gate Symbol Displayed | * | * | * |
| GHZ | Gigahertz | 4-4.5 | 4-5 | 4-16 |
| GLS | Gate Shape Low Sidelobe | * | * | * |
| GMS | Gate Shape Minimum Sidelobe | * | * | * |
| GNM | Gate Shape Nominal | * | * | * |
| GOF | Gate Off | * | * | * |
| GON | Gate On | * | * | * |
| GPN (value) | Graticule Pen Number | 4-4.13 | 4-13 | 4-28 |
| GRT | Gate Shape Rectangular | * | * | * |
| GSN (value) | Gate Span, Value in Time or Distance | * | * | * |
| GSP (value) | Gate Stop, Value in Time or Distance | * | * | * |
| GST (value) | Gate Start, Value in Time or Distance | * | * | * |
| HLD | Hold Mode | 4-4.6 | 4-6 | 4-17 |
| HPN (value) | Header Pen Number | 4-4.13 | 4-13 | 4-28 |
| IC1-IC9 | Load Cal Coefficients 1 Through 9 | * | * | * |
| ICA-ICC | Load Cal Coefficients 10 Through 12 | * | * | * |
| ICD | Load Corrected Data | * | * | * |
| ICL | Input 12 Calibration Coefficients in String Format | * | * | * |
| IEM | Input Extended Status Byte Mask | * | * | * |
| IFN | Set IF Bandwith to Normal | 4-4.8 | 4-8 | 4-22 |
| IFR | Set IF Bandwith to Reduced | 4-4.8 | 4-8 | 4-22 |
| IFM | Set IF Bandwith to Minimum | 4-4.8 | 4-8 | 4-22 |
| IFD | Load Final Data | * | * | * |
| IFV | Input List Of Frequencies | * | * | * |
| IMG | Imaginary Display Format | 4-4.7 | 4-7 | 4-16 |
| IMU | Imaginary Units | 4-4.5 | 4-5 | 4-16 |
| INT | Initalize Data Disk | * | * | * |
| IPM | Input Primary Status Byte Mask | * | * | * |
| ISC | Select Inverted Compressed Smith Chart for Active Channel | 4-4-7 | 4-7 | 4-16 |
| ISE (value) | Expand Inverted Smith Chart (10, 20, or 30 dB) | 4-4.7 | 4-7 | 4-16 |

TABLE 4-3-continued

An Alphabetical List of Command Codes

| Command Code | Description | Para. | Table | Page |
|---|---|---|---|---|
| ISM | Inverted Smith Chart | 4-4.7 | 4-7 | 4-16 |
| KEC | Keep Existing Cal | * | * | * |
| KHZ | Kilohertz | 4-4.5 | 4-5 | 4-16 |
| LDT (string) | Label Date | 4-4.13 | 4-13 | 4-28 |
| LFD (value) | Set Limit Delta for Limit Frequency Readout on Active Channel | 4-4.12 | 4-12 | 4-26 |
| LFP | Select Phase Limit Readout for Active Channel | 4-4.12 | 4-12 | 4-26 |
| LFR | Select Limit Frequency Readout for Active Channel | 4-4.12 | 4-12 | 4-26 |
| LIN | Linear Magnitude Display Format | 4-4.7 | 4-7 | 4-19 |
| LID (string) | Label Device ID | 4-4.13 | 4-13 | 4-28 |
| LLO (value) | Set Lower Limit | 4-4.12 | 4-12 | 4-26 |
| LMS (string) | Label Model and Serial Number | 4-4.12 | 4-12 | 4-26 |
| LNM (string) | Label Operator's Name | 4-4.12 | 4-12 | 4-26 |
| LOF | Disable Limits | 4-4.12 | 4-12 | 4-28 |
| LON | Enable Limits | 4-4.12 | 4-12 | 4-28 |
| LPH | Linear Magnitude and Phase Display Format | 4-4.7 | 4-7 | 4-19 |
| LPI | Lowpass Impulse | * | * | * |
| LPS | Lowpass Step | * | * | * |
| LSB | Least Significant Byte First Data Transfer Mode | * | * | * |
| LUP (value) | Set Upper Limit | 4-4.12 | 4-12 | 4-28 |
| MAG | Log Magnitude Display Format | 4-4.7 | 4-7 | 4-19 |
| MEM | Display Memory | 4-4.10 | 4-10 | 4-23 |
| MHZ | Megahertz | 4-4.5 | 4-5 | 4-16 |
| MIN | Select Complex Subtraction as Trace Math | 4-4.10 | 4-10 | 4-23 |
| MK1-MK6 (value) | Set Marker To Value | 4-4.11 | 4-11 | 4-25 |
| MMN | Marker To Min | 4-4.11 | 4-11 | 4-25 |
| MMT | Millimeter | 4-4.11 | 4-11 | 4-25 |
| MMX | Marker To Max | 4-4.11 | 4-11 | 4-25 |
| MO1-MO6 | Markers Off | 4-4.11 | 4-11 | 4-25 |
| M1C-M6C | Marker Sweep CW Frequency | 4-4.11 | 4-11 | 4-25 |
| M1E-M6E | Marker Sweep End Frequency | 4-4.11 | 4-11 | 4-25 |
| M1S-M6S | Marker Sweep Start Frequency | 4-4.11 | 4-11 | 4-25 |
| MON | Markers Enabled | 4-4.11 | 4-11 | 4-25 |
| MPH | Log Magnitude and Phase Display Format | 4-4.7 | 4-7 | 4-19 |
| MPN (value) | Marker Pen Number | 4-4.13 | 4-13 | 4-28 |
| MR1-MR6 | Marker Selected for Readout and Data Output | 4-4.11 | 4-11 | 4-25 |
| MRR | Marker Range Restore | * | * | * |
| MSB | Most Signifigant Byte First Data Transfer Mode | * | * | * |
| MTR | Meter | 4-4.5 | 4-5 | 4-16 |
| MUL | Select Complex Multiplication as Trace Math | 4-4.10 | 4-10 | 4-23 |
| NCS | Next Cal Step | * | * | * |
| NOC | Normal Cal | * | * | * |
| NSC | Nanosecond | 4-4.5 | 4-5 | 4-16 |
| OAP | Output Active Parameter | * | * | * |
| OC1-OC9 | Output Cal Coefficients 1 Through 9 | * | * | * |
| OCA-OCC | Output Cal Coefficients 10 Through 12 | * | * | * |
| OCD | Output Corrected Data | * | * | * |
| OCL | Output All 12 Cal Coefficients in String Format | * | * | * |
| ODR | Output Disk Directory | * | * | * |
| OEB | Output Extended Status Byte | * | * | * |
| OFD | Output Final Data | * | * | * |
| OFF (value) | Set Offset Value | 4-4.7 | 4-7 | 4-19 |
| OFP | Output Front Panel Setup in String Format | * | * | * |
| OFV | Output Frequency Values | * | * | * |
| OID | Output Identify | * | * | * |
| OKP | Output Front Panel Key Pressed | * | * | * |
| OM1-OM6 | Output Marker Value 1 Through 6 | * | * | * |
| ONP | Output Number Of Data Points | * | * | * |
| OPB | Output Primary Status Byte | * | * | * |
| ORD | Output Raw Data | * | * | * |
| OS1-OS4 | Output Stored Setup In String Format | * | * | * |
| P1C | Port 1 Connector Specification | * | * | * |
| P2C | Port 2 Connector Specification | * | * | * |
| PBL | Plot Bottom Left, ¼ Screen | 4-4.13 | 4-13 | 4-28 |
| PBR | Plot Bottom Right, ¼ Screen | 4-4.13 | 4-13 | 4-28 |
| PFS | Print Full Screen | 4-4.13 | 4-13 | 4-28 |
| PGR | Print Graph | 4-4.13 | 4-13 | 4-28 |
| PGT | Plot Graticule | 4-4.13 | 4-13 | 4-28 |
| PHA | Phase Display Format | 4-4.7 | 4-7 | 4-19 |
| PLD | Plot Data Area Only | 4-4.13 | 4-13 | 4-28 |
| PFL | Full Size Plot | 4-4.13 | 4-13 | 4-26 |
| PLG | Polar Log Display Format | 4-4.7 | 4-7 | 4-19 |
| PLH | Plot Header | 4-4.13 | 4-13 | 4-28 |
| PLM | Plot Markers and Limits | 4-4.13 | 4-13 | 4-28 |
| PLR | Polar Linear Display Format | 4-4.7 | 4-7 | 4-19 |

TABLE 4-3-continued

An Alphabetical List of Command Codes

| Command Code | Description | Para. | Table | Page |
|---|---|---|---|---|
| PLS | Plot Entire Screen | 4-4.13 | 4-13 | 4-28 |
| PLT | Plot Trace(s) | 4-4.13 | 4-13 | 4-28 |
| PMK | Print Marker Data Only | 4-4.13 | 4-13 | 4-28 |
| PMN | Plot Menu | 4-4.13 | 4-13 | 4-28 |
| PMT | Print Marker And Tabular Data | 4-4.13 | 4-13 | 4-28 |
| PSC | Picosecond | 4-4.5 | 4-5 | 4-16 |
| PST | Stop Print /Plot | 4-4.13 | 4-13 | 4-28 |
| PT0-PT9 | Set Print Tabular Data Density | 4-4.13 | 4-13 | 4-28 |
| PTB | Print Tabular Data Only | 4-4.13 | 4-13 | 4-28 |
| PTL | Plot Top left, ¼ Size | 4-4.13 | 4-13 | 4-28 |
| PTR | Plot Top Right, ¼ Size | 4-4.13 | 4-13 | 4-28 |
| PWR (value) | Set Power Level | 4-4.6 | 4-6 | 4-17 |
| RC1-RC4 | Recall Front Panel Setup From Internal Memory Numbers 1 Through 4 | 4-4.10 | 4-10 | 4-23 |
| RCK (filename) | Recall Normalization Data From Disk | 4-4.9 | 4-9 | 4-22 |
| RDA | Autoadjust Reference Delay | 4-4.9 | 4-9 | 4-22 |
| RDD (value) | Reference Delay (Value in Distance) | 4-4.9 | 4-9 | 4-22 |
| RDT (value) | Reference Delay (Value in Time) | 4-4.9 | 4-9 | 4-22 |
| REF | Set Reference Line of Display on Active Channel | 4-4.7 | 4-7 | 4-19 |
| REL | Real Display Format | 4-4.7 | 4-7 | 4-19 |
| REU | Real Units | 4-4.5 | 4-5 | 4-16 |
| RIM | Real and Imaginary Display Format | 4-4.7 | 4-7 | 4-19 |
| RLD (filename) | Reload Cal Data And Front Panel Setup From Disk | * | * | * |
| RST | Reset 360 To Default Parameters | 4-4.14 | 4-14 | 4-30 |
| RTB (filename) | Recall Tabular Data From Disk | 4-4.13 | 4-13 | 4-28 |
| RTL | Return to Local | 4-4.14 | 4-14 | 4-30 |
| S11 | Measure $S_{11}$ On Active Channel | 4-4.6 | 4-6 | 4-17 |
| S12 | Measure $S_{12}$ On Active Channel | 4-4.6 | 4-6 | 4-17 |
| S21 | Measure $S_{21}$ On Active Channel | 4-4.6 | 4-6 | 4-17 |
| S22 | Measure $S_{22}$ On Active Channel | 4-4.6 | 4-6 | 4-17 |
| SA1 (value) | Set Source Attenuator, Port 1 | 4-4.6 | 4-6 | 4-17 |
| SA2 (value) | Set Source Attenuator, Port 2 | 4-4.6 | 4-6 | 4-17 |
| SCL (value) | Set Resolution (scale) of Display | 4-4.7 | 4-7 | 4-19 |
| SDK (filename) | Store Data on Disk | 4-4.10 | 4-10 | 4-23 |
| SLD | Sliding Load | * | * | * |
| SMC (value) | Compressed Smith Chart (dB) | 4-4.7 | 4-7 | 4-19 |
| SME (value) | Expanded Smith Chart (10, 20, or 30 dB) | 4-4.7 | 4-7 | 4-19 |
| SMI | Smith Chart | 4-4.7 | 4-7 | 4-19 |
| SOF | Smoothing Off | 4-4.8 | 4-8 | 4-22 |
| SON (value) | Smoothing On and Set to Value | 4-4.8 | 4-8 | 4-22 |
| SPD (value) | Set Plotter Pen Speed Percentage | 4-4.13 | 4-13 | 4-28 |
| SQ0 | Disable SRQ | * | * | * |
| SQ1 | Enable SRQ | * | * | * |
| SRT (value) | Start Frequency, Distance, Or Time Value | 4-4.6 | 4-6 | 4-17 |
| STD | Store Active Channel Data Trace to Memory | 4-4.10 | 4-10 | 4-23 |
| STO (filename) | Store Cal Data And Front Panel Setup On Disk | * | * | * |
| STP (value) | Stop Frequency, Distance Or Time Value | 4-4.6 | 4-10 | 4-23 |
| SV1-SV4 | Save Front Panel Setup to Internal Memory Numbers 1 Through 4 | * | * | * |
| SWP | Select Continuous Sweep Mode | 4-4.6 | 4-10 | 4-23 |
| SWR | Select SWR Display Format | 4-4.7 | 4-7 | 4-19 |
| TA2 (value) | Set Test Attenuator, Port 2 | 4-4.6 | 4-6 | 4-17 |
| TBP | Time Bandpass Mode | * | * | * |
| TCD | Take Cal Data | * | * | * |
| TDC | Time Domain (Harmonic) Cal | * | * | * |
| TDD (filename) | Tabular Data to Disk | 4-4.13 | 4-13 | 4-28 |
| TLP | Time Lowpass Mode | * | * | * |
| TPI | Time Phasor Impulse Mode | * | * | * |
| TRS | Trigger/Restart Sweep | 4-4.6 | 4-6 | 4-17 |
| TST | Self Test | 4-4.14 | 4-14 | 4-30 |
| USC | Microsecond | 4-4.5 | 4-5 | 4-16 |
| WFS | Wait Full Sweep | 4-4.6 | 4-6 | 4-17 |
| WLS | Window Shape Low Sidelobe | * | * | * |
| WMS | Window Shape Min Sidelobe | * | * | * |
| WNM | Window Shape Nominal | * | * | * |
| WRT | Window Shape Rectangular | * | * | * |
| XM3 | Unitless Terminator $\times 10^{-3}$ | 4-4.5 | 4-5 | 4-16 |
| XX1 | Unitless Terminator | 4-4.5 | 4-5 | 4-16 |
| XX3 | Unitless Terminator $\times 10^3$ | 4-4.5 | 4-5 | 4-16 |

TABLE 4-4

Channel Control Command Codes

| COMMAND CODE | DESCRIPTION |
|---|---|
| DSP | Single Channel Display of Active Channel |
| D13 | Dual Channel Display, Channels 1 and 3 |
| D24 | Dual Channel Display, Channels 2 and 4 |
| D14 | Quad Display, All Four Channels |
| CH1 | Channel 1 Selected As Active Channel |
| CH2 | Channel 2 Selected As Active Channel |
| CH3 | Channel 3 Selected As Active Channel |
| CH4 | Channel 4 Selected As Active Channel |

TABLE 4-5

Data Entry Command Codes

| COMMAND CODE | DESCRIPTION |
|---|---|
| 0,1,2,3,4,5, 6,7,8,9 | Numerals For Numeric Entry |
| − | Minus Sign |
| . | Decimal Point |
| GHZ | Gigahertz Data Terminator |
| MHZ | Megahertz Data Terminator |
| KHZ | Kilohertz Data Terminator |
| PSC | Picoseconds Data Terminator |
| NSC | Nanoseconds Data Terminator |
| USC | Microseconds Data Terminator |
| DBL | dB Log Data Terminator |
| DBM | dBm Data Terminator |
| DEG | Degrees Data Terminator |
| MMT | Millimeter Data Terminator |
| CMT | Centimeter Data Terminator |
| MTR | Meter Data Terminator |
| XX1 | Unitless Data Terminator, ×1 |
| XX3 | Unitless Data Terminator, ×10$^{-3}$ |
| XM3 | Unitless Data Terminator, ×10$^{-3}$ |
| REU | Real Units Data Terminator |
| IMU | Imaginary Units Data Terminator |

TABLE 4-6

Measurement Control Command Codes

| COMMAND CODE | DESCRIPTION | VALUES | TERMINATORS |
|---|---|---|---|
| S11 | Selects $S_{11}$ as S-Parameter On Active Channel | N/A | N/A |
| S21 | Selects $S_{21}$ as S-Parameter On Active Channel | N/A | N/A |
| S22 | Selects $S_{22}$ as S-Parameter On Active Channel | N/A | N/A |
| S12 | Selects $S_{12}$ as S-Parameter On Active Channel | N/A | N/A |
| SRT | Sets Start Frequency | Depends On Frequency Range Of Instrument | GHZ, MHZ, KHZ |
| STP | Sets Stop Frequency | Depends On Frequency Range Of Instrument | GHZ, MHZ, KHZ |
| CWF | Sets CW Frequency | Depends On Frequency Range Of Instrument | GHZ, MHZ, KHZ |
| PWR | Sets Source Power | Depends On Power Range Of Source | DBM, XX1, XX3, XM3 |
| FHI | Sets Data Points To Maximum | N/A | N/A |
| FME | Sets Data Points To Normal | N/A | N/A |
| FLO | Sets Data Points To Minimum | N/A | N/A |
| SA1 | Sets Source Attenuator For Port 1 | 0 dB to 70 dB | DBL, DBM, XX1, XX3, XM3 |
| SA2 | Sets Source Attenuator For Port 2 | 0 dB to 70 dB | DBL, DBM, XX1, XX3, XM3 |
| TA2 | Sets Test Attenuator For Port 2 | 0 dB to 40 dB | DBL, DBM, XX1, XX3, XM3 |
| HLD | Holds Sweep At Current Point | N/A | N/A |
| CTN | Continue Sweep After Hold | N/A | N/A |
| TRS | Triggers or Restarts a Sweep | N/A | N/A |
| WFS | Wait full sweep | N/A | N/A |
| SWP | Selects Continuous Sweep Mode | N/A | N/A |

TABLE 4-7

Display Control Command Codes

| COMMAND CODE | DESCRIPTION | VALUES | TERMINATORS |
|---|---|---|---|
| MAG | Selects Log Magnitude Display for Active Channel | N/A | N/A |
| PHA | Selects Phase Display for Active Channel | N/A | N/A |
| MPH | Selects Log Magnitude and Phase Display for Active Channel | N/A | N/A |
| SMI | Selects Normal Smith Chart Display for Active Channel | N/A | N/A |
| SWR | Selects SWR Display for Active Channel | N/A | N/A |
| ISM | Selects Inverted Normal Smith Chart Display for | N/A | N/A |

TABLE 4-7-continued

Display Control Command Codes

| COMMAND CODE | DESCRIPTION | VALUES | TERMINATORS |
|---|---|---|---|
| | Active Channel | | |
| DLA | Selects Group Delay Display for Active Channel | N/A | N/A |
| PLR | Selects Linear Polar Display for Active Channel | N/A | N/A |
| PLG | Selects Log Polar Display for Active Channel | N/A | N/A |
| LIN | Selects Linear Magnitude Display for Active Channel | N/A | N/A |
| LPH | Selects Linear Magnitude and Phase Display for Active Channel | N/A | N/A |
| REL | Selects Real Display for Active Channel | N/A | N/A |
| IMG | Selects Imaginary Display for Active Channel | N/A | N/A |
| RIM | Selects Real And Imaginary Display for Active Channel | N/A | N/A |
| SME | Selects Expanded Smith Chart Display for Active Channel | 10.20.30 | DBL.XX1 |
| ISE | Selects Inverted Expanded Smith Chart Display for Active Channel | 10.20.30 | DBL.XX1 |
| SMC | Selects Compressed Smith Chart Display for Active Channel | 3 | DBL.XX1 |
| ISC | Selects Inverted Compressed Smith Chart Display for Active Channel | 3 | DBL.XX1 |
| SCL | Sets Scaling Of Display On Active Channel | Depends on Graph Type: | Depends on Graph Type: |
| | Log Mag and Log Polar: | 0.001 to 50 dB/div | DBL.XX1.XX3.XM3 |
| | Phase: | 0.01 to 90 degrees/div | DEG (.XX1.XX3 XM3 for PHA display) |
| | Group Delay: | 1 femtosecond/div to 999.999 s/div | PSC.NSC.USC |
| | Linear Mag & Linear Polar: | 1 nanounit/div to 999.999 units/div | XX1.XX3.XM3 |
| | Real: | 1 nanounit/div to 999.999 units/div | REU.XX1.XX3.XM3 |
| | Imag: | 1 nanounit/div to 999.999 units/div | IMU (.XX1.XX3.XM3 for IMG display) |
| | Smith/inverted Smith: | N/A | N/A |
| OFF | Set Offset of Display on Active Channel (This code moves the graph's reference position to the offset value) | Depends On Graph Type: | Depends On Graph Type: |
| | Log Mag & Log Polar: | −999.999 to 999.999 dB | DBL.XX1.XX3.XM3 |
| | Phase: | −180 to 180 degrees | DEG (.XX1.XX3.XM3 for PHA display) |
| | Group Delay: | −999.999 to 999.999 s | PSC.NSC.USC |
| | Linear Mag & Linear Polar: | 0 to 999.999 units | XX1.XX3.XM3 |
| | Real: | −999.999 to 999.999 units | REU.XX1.XX3.XM3 |
| | Imaginary | −999.999 to 999.999 units | IMU (.XX1.XX3.XM3 for IMG display) |
| | Smith/Inverted Smith: | N/A | N/A |
| REF | Set Reference Line of Display on Active Channel | Depends on Graph Type: | Depends on Graph Type: |
| | Log Magnitude, MAG Display: | 0 to 8 | DBL.XX1.XX3.XM3 |
| | Log Magnitude, MPH Display: | 0 to 4 | DBL.XX1.XX3.XM3 |
| | Phase, PHA Display: | 0 to 8 | DEG.XX1.XX3.XM3 |
| | Phase, MPH Display: | 0 to 4 | DEG |
| | Group Delay: | 0 to 8 | PSC.NSC.USC.XX1.XX3.XM3 |
| | Linear Magnitude, LIN Display: | 0 to 8 | XX1.XX3.XM3 |
| | Linear Magnitude, LPH Display: | 0 to 4 | XX1.XX3.XM3 |
| | Real, REL Display: | 0 to 8 | REU.XX1.XX3.XM3 |
| | Real, RIM Display: | 0 to 4 | REU.XX1.XX3.XM3 |
| | Imaginary, IMG Display: | 0 to 8 | IMU.XX1.XX3.XM3 |
| | Imaginary, RIM Display: | 0 to 4 | IMU |
| | Smith/Inverted Smith: | N/A | N/A |
| | Linear Polar/Log Polar: | N/A | N/A |
| ASC | Autoscale Display On Active Channel | N/A | N/A |
| APR | Set Group Delay Aperture Percentage | 0 to 20 | XX1.XX3.XM3 |

TABLE 4-8

Enhancement Command Codes

| COMMAND CODE | DESCRIPTION | VALUES | TERMINATORS |
|---|---|---|---|
| IFN | Selects Normal IF Bandwidth | N/A | N/A |

TABLE 4-8-continued
Enhancement Command Codes

| COMMAND CODE | DESCRIPTION | VALUES | TERMINATORS |
|---|---|---|---|
| IFR | Selects Reduced IF Bandwidth | N/A | N/A |
| IFM | Selects Minimum IF Bandwidth | N/A | N/A |
| AVG | Turns ON Averaging and Sets to Value | 1 to 4095 | XX1.XX3.XM3 |
| AOF | Turns Off Averaging | N/A | N/A |
| SON | Turns ON Smoothing and Sets to Value | 0 to 20 | XX1.XX3.XM3 |
| SOF | Turns Off Smoothing | N/A | N/A |

TABLE 4-9
Reference Delay Command Codes

| COMMAND CODE | DESCRIPTION | VALUES | TERMINATORS |
|---|---|---|---|
| RDD | Sets Reference Delay As a Distance Value for the Active Channel | −999.999 to 999.999 s | MMT.CMT.MTR |
| RDT | Sets Reference Delay As a Time Value for the Active Channel | −999.999 to 999.999 s | PSC.NSC.USC |
| RDA | Selects Automatic Reference Delay for the Active Channel | N/A | N/A |
| DIA | Selects Air Dielectric (1.00) | N/A | N/A |
| DIT | Selects Teflon Dielectric (2.10) | N/A | N/A |
| DIP | Selects Polyethylene Dielectric (2.26) | N/A | N/A |
| DIM | Selects Microporous Teflon Dielectric (1.69) | N/A | N/A |
| DIE | Sets Dielectric to Value | 1 to 999.999 | XX1.XX3.XM3 |

TABLE 4-10
Trace Memory Command Codes

| COMMAND CODE | DESCRIPTION |
|---|---|
| DAT | Displays Data Trace on Active Channel |
| MEM | Displays Memory Trace on Active Channel |
| DTM | Displays Data and Memory Traces on Active Channel |
| DNM | Displays Measured Data Normalized to Memory on Active Channel |
| MIN | Selects Complex Subtraction As Trace Math on Active Channel |
| DIV | Selects Complex Division As Trace Math on Active Channel |
| ADD | Selects Complex Addition As Trace Math on Active Channel |
| MUL | Selects Complex Multiplication As Trace Math on Active Channel |
| STD | Stores Active Channel's Data Trace to Memory |
| SDK | Stores Active Channel's Trace Memory to Disk Under The Specified File Name |
| RCK | Retrieves Active Channel's Trace Memory From Disk File Specified |

TABLE 4-11
Marker Command Codes

| COMMAND CODE | DESCRIPTION | VALUES | TERMINATORS |
|---|---|---|---|
| MK1–MK6 | Turns On Marker 1–6 and Sets Them to Value As Shown Below: | | |
| | Frequency Markers | Limited to Current Sweep Range | GHZ.MHZ.KHZ |
| | Time Markers: | Limited to Current Zoom Range | PSC.NSC.USC |
| | Distance Markers: | Limited to Current Zoom Range | MMT.CMT.MTR |
| MOF | Disables Markers | N/A | N/A |
| MON | Enables Markers | N/A | N/A |
| MO1–MO6 | Turns Off Marker 1–6 | N/A | N/A |
| DR1–DR6 | Turns On Marker 1–6 As Delta Reference Marker | N/A | N/A |
| DRF | Turns On Delta Reference Marker Mode | N/A | N/A |
| DRO | Turns Off Delta Reference Marker Mode | N/A | N/A |
| MR1–MR6 | Selects Marker 1–6 As Readout Marker | N/A | N/A |

TABLE 4-11-continued

Marker Command Codes

| COMMAND CODE | DESCRIPTION | VALUES | TERMINATORS |
|---|---|---|---|
| MMX | Moves Active Marker to Maximum Trace Value | N/A | N/A |
| MMN | Moves Active Marker to Minimum Trace Value | N/A | N/A |
| M1S–M6S | Marker Sweep With Marker 1–6 As Start Frequency | N/A | N/A |
| M1E–M6E | Marker Sweep With Marker 1–6 As Stop Frequency | N/A | N/A |
| M1C–M6C | CW Marker Sweep With Marker 1–6 As CW Frequency | N/A | N/A |

TABLE 4-12

Limits Command Codes

| COMMAND CODE | DESCRIPTION | VALUES | TERMINATORS |
|---|---|---|---|
| LUP | Turns On Limit 1 On the Active Channel and sets It to value, as Shown Below | Depends On Graph Type: | Depends On Graph Type: |
| LLO | Turns On Limit 2 On the Active Channel and sets It to Value, as Shown Below | Depends On Graph Type: | Depends On Graph Type: |
| LFD | Set Limit Delta On Active Channel for Limit Frequency Readout, as Shown Below | Depends On Graph Type: | Depends On Graph Type: |
| | Log Mag & Log Polar: | −999.999 to 999.999 dB | DBL.XX1.XX3.XM3 |
| | Phase: | −180 to 180 degrees | DEG (.XX1.XX3 XM3 for PHA display) |
| | Group Delay: | −999.999 to 999.999 s | PSC.NSC.USC |
| | Linear Mag & Linear Polar: | 0 to 999.999 U | XX1.XX3.XM3 |
| | Real: | −999.999 to 999.999 U | REU.XX1.XX3.XM3 |
| | Imaginary: | −999.999 to 999.999 U | IMU (.XX1.XX3.XM3 for IMG display) |
| | Smith/Inverted Smith: | 0 to 1.413 units | XX1.XX3.XM3 |
| LOF | Disables Limits On Active Channel | N/A | N/A |
| LON | Enables Limits On Active Channel | N/A | N/A |
| LFR | Selects Limit Frequency Readout for Active Channel | N/A | N/A |
| LFP | Selects Phase Limit Frequency Readout for Active Channel for Log Magnitude/linear Magnitude and Phase Displays | N/A | N/A |

```
10  ! EXAMPLE ON USE OF STRINGS
20  Q$=CHR$ (34) ! QUOTE SYMBOL
30  M$="4_TO_8_FILTR" ! MODEL
40  I$="456789" ! I.D.
50  D$="8/25/87" ! DATE
60  O$="GPIB_WHIZ" ! OPERATOR
```

-continued

```
70  OUTPUT 706 "LMS"&Q$&M$&Q$
80  OUTPUT 706 "LID"&Q$&I$&Q$
90  OUTPUT 706 "LDT"&Q$&D$&Q$
100 OUTPUT 706 "LNM"&Q$&O$&Q$
110 END
```

TABLE 4-13

Hard Copy Command Codes

| COMMAND CODE | DESCRIPTION | VALUES | TERMINATORS |
|---|---|---|---|
| PFS | Prints Full Screen | N/A | N/A |
| PGR | Prints Graph Area Only | N/A | N/A |
| PMK | Prints Tabular Marker Data | N/A | N/A |
| PTB | Prints Tabular Trace Data | N/A | N/A |
| PMT | Prints Tabular Marker and Trace Data | N/A | N/A |
| PT0–PT9 | Selects Tabular Printout Point Density | N/A | N/A |
| PST | Stops Print/Plot | N/A | N/A |
| FFD | Printer Form Feed | N/A | N/A |
| PLS | Plots Entire Screen | N/A | N/A |
| PLD | Plots Graph Area | N/A | N/A |
| PLT | Plots Data Trace(s) | N/A | N/A |
| PMN | Plots Menu | N/A | N/A |
| PLM | Plots Markers and Limits | N/A | N/A |

TABLE 4-13-continued

Hard Copy Command Codes

| COMMAND CODE | DESCRIPTION | VALUES | TERMINATORS |
|---|---|---|---|
| PLH | Plots Header | N/A | N/A |
| PGT | Plots Graticule | N/A | N/A |
| PFL | Selects Full Size Plot | N/A | N/A |
| PTL | Selects ¼ Size Plot, Top Left | N/A | N/A |
| PTR | Selects ¼ Size Plot, Top Right | N/A | N/A |
| PBL | Selects ¼ Size Plot, Bottom Left | N/A | N/A |
| PBR | Selects ¼ Size Plot, Bottom Right | N/A | N/A |
| DPN | Sets Pen Number for Plotting Data | 1 to 8 | XX1 |
| GPN | Sets Pen Number for Plotting Graticule | 1 to 8 | XX1 |
| MPN | Sets Pen Number for Plotting Markers and Limits | 1 to 8 | XX1 |
| HPN | Sets Pen Number for Plotting Header | 1 to 8 | XX1 |
| LMS | Labels Model and Serial Number of Device | String of Characters Up To 12 Characters Long | N/A |
| LDT | Labels Date of Test | String of Characters Up to 12 Characters Long | N/A |
| LID | Labels Device ID | String of Characters Up to 12 Characters Long | N/A |
| LNM | Labels Operator's Name | String of Characters Up to 12 Characters Long | N/A |
| TDD | Stores Tabular Data to Disk in File Specified (See File Naming Conventions In Paragraph 5-5.5) | N/A | N/A |
| RTB | Recalls Tabular Data From Disk File Specified to Printer | N/A | N/A |
| SPD | Sets Plotter Pen Speed Percentage | 10 to 100 | XX1,XX3,XM3 |

TABLE 4-14

Miscellaneous Command Codes

| COMMAND CODE | DEFINITION | NOTES |
|---|---|---|
| RST | Resets 360 to its Default State | Similar to pressing the "DEFAULT PROGRAM" key. |
| FOF | Implements Frequency Blanking | Instructs the 360 to blank any frequency information from the screen and any hard copy output. This code is useful for security reasons. |
| FON | Disables Frequency Blanking | Frequency blanking can be turned off using this code. |
| BC0 | Implements Display Blanking | Allows for the ultimate in secutriy — a totally blank screen. In this mode, the 360 is fully operational over the GPIB but nothing appears on the display. |
| BC1 | Disables Display Blanking | Screen blanking is turned off using the BC1 mnemonic. |
| BLU | Selects Blue As 3rd Color Plane Color | Allows selection of the third color used by the 360 for markers, limits, and some menu annotation. |
| CYN | Selects Cyan As 3rd Color Plane Color | Allows selection of the third color used by the 360 for markers, limits, and some menu annotation. |
| TST | Runs A Self Test | Instructs tho 360 to perform a self test. An error in the self test would be reported in the primary status byte, bit 7 (see paragraph 5-5.7). |
| RTL | Returns to Local Control | Performs the same function as the control panel RETURN TO LOCAL key. This code has no effect if the 360 is in local lockout. |
| DFP | Displays Global Operating Parameters | Displays Global Operating Parameters in the data area of the screen. |
| DGS | Displays GPIB System Parameters | Displays GPIB System Parameters in the data area of the screen. |
| DCP | Displays Calibration Parameters | Displays Calibration Parameters in the data area of the screen. |
| DC1 | Displays Channel 1 and 2 Operating Parameters | Displays Channels 1 and 2 Operating Parameters in the data area of the screen. |
| DC3 | Displays Channel 3 and 4 Operating Parameters | Displays Channels 1 and 2 Operating Parameters in the data area of the screen. |

TABLE 5-1

Calibration Command Codes

| COMMAND CODE | DESCRIPTION | VALUES | TERMINATORS |
|---|---|---|---|
| RPC | Repeat Previous Calibration | N/A | N/A |
| LTC | Specify Coaxial Line Type | N/A | N/A |
| LTU | Specify Microstrip Line Type | N/A | N/A |
| LTW | Specify Waveguide Line Type | N/A | N/A |
| SCM | Specify Standard Calibration Method | N/A | N/A |
| OCM | Specify Offset Short Calibration Method | N/A | N/A |
| LCM | Specify LRL Calibration Method | N/A | N/A |
| C12 | Begin 12-term Calibration | N/A | N/A |

TABLE 5-1-continued

Calibration Command Codes

| COMMAND CODE | DESCRIPTION | VALUES | TERMINATORS |
|---|---|---|---|
| C8T | Begin 8-term (1 Port) Calibration | N/A | N/A |
| CRF | Begin Reflection Only (1 Port) Calibration | N/A | N/A |
| CFR | Begin Frequency Response Calibration | N/A | N/A |
| CFT | Begin Transmission Only Frequency Response Calibration | N/A | N/A |
| CRL | Begin Reflection Only Frequency Response Calibration | N/A | N/A |
| NOC | Specify Normal 501-point Calibration | N/A | N/A |
| DFC | Specify Discrete Frequency Calibration | N/A | N/A |
| CWC | Specify CW Calibration | N/A | N/A |
| TDC | Specify Time Domain Harmonic Calibration | N/A | N/A |
| SRT | Enter Start Frequency for Normal or Harmonic Calibration | Depends on Frequency Range of Instrument | GHZ,MHZ,KHZ |
| STP | Enter Stop Frequency for Normal or Harmonic Calibration | Depends on Frequency Range of Instrument | GHZ,MHZ,KHZ |
| DFQ | Enter Discrete Frequency for Calibration | Depends on Frequency Range of Instrument | GHZ,MHZ,KHZ |
| CWF | Enter CW Frequency for Calibration | Depends on Frequency Range of Instrument | GHZ,MHZ,KHZ |
| FRS | Enter Fill Range Start Frequency | Depends on Frequency Range of Instrument | GHZ,MHZ,KHZ |
| FRI | Enter Fill Range Frequency Increment | Depends on Frequency Range of Instrument | GHZ,MHZ,KHZ |
| FRP | Enter Fill Rangs Number of Points | 1 to (501 — Current Number of Points) | XX1,XX3,XM3 |
| IFV | Input Frequency List for Calibration | List of Frequencies in Current Data Format | N/A |
| FIL | Fill Frequency Range Defined by FRS, FRI, and FRP | N/A | N/A |
| DFD | Discrete Frequency Entry Done | N/A | N/A |
| WCO | Enter Waveguide Cutoff Frequency | 0 — Current Start Freqency | GHZ,MHZ,KHZ |
| VSW | Enter Microstrip Width | 0.001 mm–1.0 m | MMT,CMT,MTR |
| SBT | Enter Microstrip Substrate Thickness | 0.001 mm–1.0 m | MMT,CMT,MTR |
| SBD | Enter Microstrip Substrate Relative Dielectric Constant | 1.0–9999.99 | XX1,XX3,XM3 |
| USE | Enter Microstrip Effective Relative Dielectric Constant | 1.0–9999.99 | XX1,XX3,XM3 |
| USZ | Enter Microstrip Characteristic Impedance | 1.0–9999.99 | XX1,XX3,XM3 |
| P1C | Set Up to Specify Port 1 Calibration Standards | N/A | N/A |
| P2C | Set Up to Specify Port 2 Calibration Standards | N/A | N/A |
| CMS | Male SMA Connector for Specified Port | N/A | N/A |
| CFS | Female SMA Connector for Specified Port | N/A | N/A |
| CMK | Male K ™ Connector for Specified Port | N/A | N/A |
| CFK | Female K Connector for Specified Port | N/A | N/A |
| CMN | Male Type N Connector for Specified Port | N/A | N/A |
| CFN | Female Type N Connector for Specified Port | N/A | N/A |
| CM3 | Male GPC-3.5 Connector for Specified Port | N/A | N/A |
| CF3 | Female GPC-3.5 Connector for Specified Port | N/A | N/A |
| CNG | GPC-7 Connector for Specified Port | N/A | N/A |
| CND | Other Connector Specification | N/A | N/A |
| COO | Connector Offset for Open Device | –999.999 m to 999.999 m | MMT,CMT,MTR |
| COS | Connector Offset for Short Device | –999.999 m to 999.999 m | MMT,CMT,MTR |
| CC0 | Capacitance Coefficient for Open Device, Implied X 10 E-15 | –999.999 to 999.999 | XX1 |
| CC1 | Capacitance Coefficient for Open Device, Implied X 10 E-27 | –999.999 to 999.999 | XX1 |
| CC2 | Capacitance Coefficient for Open Device, Implied X 10 E-36 | –999.999 to 999.999 | XX1 |
| CC3 | Capacitance Coefficient for Open Device, Implied X 10 E-45 | –999.999 to 999.999 | XX1 |
| BBL | Specify Broadband Load for Calibration | N/A | N/A |
| SLD | Specify Sliding Load for Calibration | N/A | N/A |
| BEG | Begin Calibration Data Collection Steps | N/A | N/A |
| TCD | Take Calibration Data for Current Standard | N/A | N/A |
| NCS | Go on to Next Calibration Step | N/A | N/A |
| KEC | Keep Existing Calibration | N/A | N/A |
| COF | Turn Any Vector Error Correction Off | N/A | N/A |
| CON | Turn Vector Error Correcion On if Available | N/A | N/A |
| A12 | Simulate 12-term Calibration | N/A | N/A |
| A8T | Simulate 8-term (1 Port) Calibration | N/A | N/A |
| ARF | Simulate Reflection Only (1 Port) Calibration | N/A | N/A |
| AFR | Simulate Frequency Response Calibration | N/A | N/A |
| AFT | Simulate Transmission Only Frequency Response Calibration | N/A | N/A |
| ARL | Simulate Reflection Only Frequency Response Calibration | N/A | N/A |

TABLE 5-2

Calibration Code Ordering

| Order | Item | Command Code Examples | Required (R) or Optional (O) |
|---|---|---|---|
| 1 | Line Type | LTC, LTW, LTV | O |
| 2 | Calibration Method | SCM, OCM, LCM | O |
| 3 | Calibration Type | C12, C8T, CRF, CFR, CFT, CRL | R |
| 4 | Data Points | NOC, DFC, TDC, CWC | O |
| 5 | Frequency | | |
| | Range | SRT, STP | O |
| | Discrete | DFQ, IFV, FRS, FRI, FRP, FIL | R |
| | CW | CWF | O |
| 6 | Connector Type/Offset Short Values | P1C, P2C, CMS, CFS, CMK, CFK, CMN, CFN, CM3, CF3, CNG, CND, COO, COS, CC0, CC1, CC2, CC3, SH1, SH2 | O |
| 7 | Load Type | SLD, BBL | O |
| 8 | Begin Data Collection Steps | BEG | R |

```
10  ! 1ST STEP - BROADBAND LOADS ON
      BOTH PORTS
20  DISP "CONNECT LOADS TO BOTH PORTS"
30  DISP "HIT END LINE WHEN READY"
40  INPUT NS
50  ! NS JUST A "DUMMY"[- WAIT FOR USER
60  ! TAKE LOAD MEASUREMENT USING
      100 AVERAGES
70  OUTPUT 706; "AVG 100 XX1 TCD NCS"
80  ! 2ND STEP - PORT 1: OPEN, PORT 2: SHORT
90  DISP "CONNECT OPEN TO PORT 1"
100 DISP "CONNECT SHORT TO PORT 2"
110 DISP "HIT END LINE WHEN READY"
120 INPUT NS
130 ! TAKE OPEN/SHORT MEASUREMENT WITH
      20 AVERAGES
```

-continued

```
140 OUTPUT 706; "AVG 20 XX1 TCD NCS"
150 ! 3RD STEP - PORT 1: SHORT, PORT 2: OPEN
160 DISP "CONNECT SHORT TO PORT 1"
170 DISP "CONNECT OPEN TO PORT 2"
180 DISP "HIT END LINE WHEN READY"
190 INPUT NS
200 OUTPUT 706; "TCD NCS"
210 ! 4TH STEP - THROUGH LINE
220 DISP "CONNECT THROUGH LINE"
230 DISP "BETWEEN PORTS"
240 DISP "HIT END LINE WHEN READY"
250 INPUT NS
260 OUTPUT 706; "TCD NCS"
270 CALIBRATION COMPLETE - SAVE TO DISK
```

TABLE 5-3

Advanced Command Codes: Save/Recall

| COMMAND CODE | DESCRIPTION | VALUES | TERMINATORS |
|---|---|---|---|
| STO | Store calibration data and front panel setup to disk file. | String for file name up to 8 characters long | N/A |
| RLD | Recall calibration data and front panel setup from disk file | String for file name up to 8 characters long | N/A |
| SV1–SV4 | Save front panel setup to internal memory location 1–4 | N/A | N/A |
| RC1–RC4 | Recall front panel setup data from internal memory location 1–4 | N/A | N/A |

TABLE 5-4

Data Transfer Command Codes

| COMMAND CODE | DESCRIPTION | DATA FORMATS |
|---|---|---|
| OM1–OM6 | Output Marker 1–6 Value | ASCII |
| OAP | Output Active Parameter Value | ASCII |
| OKP | Output Front Panel Key Pressed | ASCII |
| OID | Output Identify String | 40 byte ASCII String |
| ONP | Output Number of Points | ASCII |
| FMA | Select ASCII Data Format | N/A |
| FMB | Select 64-Bit IEEE 754 Floating Point Data Format | N/A |
| FMC | Select 32-Bit IEEE 754 Floating Point Data Format | N/A |
| LSB | Select Least Significant Byte First Data Transfer Mode | N/A |
| MSB | Select Most Significant Byte First Data Transfer Mode | N/A |

TABLE 5-4-continued

Data Transfer Command Codes

| COMMAND CODE | DESCRIPTION | DATA FORMATS |
|---|---|---|
| OC1–OC9 | Output Calibration Coefficient 1–9 | FMA, FMB, FMC |
| OCA–OCC | Output Calibration Coefficient A, B or C | FMA, FMB, FMC |
| OCL | Output All 12-Term Calibration Coefficients | Binary String |
| IC1–IC9 | Input Calibration Coefficient 1–9 | FMA, FMB, FMC |
| ICA–ICC | Input Calibration Coefficient A, B, or C | FMA, FMB, FMC |
| ICL | Input All 12-term Calibration Coefficients | Binary String |
| OFV | Output Frequency Values | FMA, FMB, FMC |
| IFV | Input List of Frequencies | FMA, FMB, FMC |
| OS1–OS4 | Output Stored Setup 1–4 | Binary String |
| OFP | Output Current Front Panel Setup | Binary String |
| IS1–IS4 | Input Stored Setup 1–4 | Binary String |
| IFP | Input Front Panel Setup | Binary String |
| ODR | Output Disk Directory | Binary String |
| ORD | Output Raw (Uncorrected) Data For S-Parameter on Acive Channel | FMA, FMB, FMC |
| OCD | Output Corrected Data for S-Parameter on Active Channel | FMA, FMB, FMC |
| OFD | Output Final (display Format) Data For S-parameter on Active Channel | FMA, FMB, FMC |
| ICD | Input Corrected Data For S-Parameter on Active Channel | FMA, FMB, FMC |
| IFD | Input Final (Display Format) Data For S-Parameter on Active Channel | FMA, FMB, FMC |

TABLE 5-5

OutPut Values Versus Various Graph Types

| Display Type | Output Values |
|---|---|
| Log Magnitude | dB. Degrees |
| Phase | dB. Degrees |
| Log Mag & Phase | dB. Degrees |
| Linear Magnitude | Lin Mag(Rho or Tau), Degrees |
| Linear Mag & Phase | Lin Mag(Rho or Tau), Degrees |
| Smith Chart | Ohms, Ohms (r + jx) |
| Inverted Smith | Siemens, Siemens (g + jb) |
| Group Delay | Seconds, Degrees |
| Log Polar | dB, Degrees |
| Linear Polar | Lin Mag(Rho or Tau), Degrees |
| Real | Real, imag |
| Imaginary | Real, imag |
| Real & Imaginary | Real, imag |
| SWR | SWR, Degrees |

Number of Bytes

| 4 | 9 | 9 | 6 | 6 | 6 |
|---|---|---|---|---|---|
| xxxx Model # | xx.xxxxxx Low Freq. GHZ | xx.xxxxxx High Freq. GHZ | Sxxx.x Low Pwr dBM | Sxxx.x High Pwr dBM | xxx.xx S.W. Rev. |

TABLE 5-6

Calibration Coefficient Ordering

| Coefficient # | Calibration Type | | | | | | |
|---|---|---|---|---|---|---|---|
| | 12-term C12 | 8-term C8T | Reflection Only CRF | Frequency Response CFR | Transmission Freq. Response CFT | Reflection Freq. Response CRL | None |
| 1 | EDF | EDF | EDF | ERF | ETF | ERF | — |
| 2 | ESF | ESF | ESF | ETF | — | — | — |
| 3 | ERF | ERF | ERF | — | — | — | — |
| 4 | EXF | ETF | — | — | — | — | — |
| 5 | ELF | — | — | — | — | — | — |
| 6 | ETF | — | — | — | — | — | — |
| 7 | EDR | — | — | — | — | — | — |
| 8 | ESR | — | — | — | — | — | — |
| 9 | ERR | — | — | — | — | — | — |
| A | EXR | — | — | — | — | — | — |
| B | ELR | — | — | — | — | — | — |
| C | ETR | — | — | — | — | — | — |

TABLE 5-8

Disk Functions Command Codes

| COMMAND CODE | DESCRIPTION | VALUES |
|---|---|---|
| SDK | Store Active Channel's Trace Memory to Disk File | String Up to 8 Characters Long for File Name |
| RCK | Recall Active Channel's Trace Memory From Disk File | String Up to 8 Characters Long for File Name |
| STO | Store Calibration Data and Front Panel Setup Information to Disk File | String Up to 8 Characters Long for File Name |
| RLD | Recall Calibration Data and Front Panel Setup Information From Disk File | String Up to 8 Characters Long for File Name |
| TDD | Store Tabular Printout Data to ASCII Disk File | String Up to 8 Characters Long for File Name |
| RTB | Recall Tabular Data File From Disk to Output to Printer | String Up to 8 Characters Long for File Name |
| DEC | Delete Calibration and Front Panel Setup File From Disk | String Up to 8 Characters Long for File Name |
| DED | Delete Tabular Printout Data File From Disk | String Up to 8 Characters Long for File Name |
| DEN | Delete Trace Memory File From Disk | String Up to 8 Characters Long for File Name |
| INT | Initialize (Format) Disk in Drive as a Data-Only Disk | N/A |
| LKT | Load Calibration Kit Information From Disk | N/A |

```
! EXAMPLE 1 - SAVE CAL AND FRONT
! PANEL SETUP TO DISK
Q$ = CHR$(34)          ! DOUBLE QUOTE SYMBOL(")
C$ = "12_TERM"         ! FILE NAME FOR CAL DATA
! STORE TO DISK FILE "12_TERM. CAL"
OUTPUT 706; "STO" &Q$&C$&Q$
! EXAMPLE 2 - SAVE TABULAR DATA
! TO DISK FILE
Q$ = CHR$(34)          ! DOUBLE QUOTE SYMBOL(")
T$ = "S21_THRU"        ! FILE NAME FOR TAB DATA
! STORE TO DISK FILE "S21_THRU. DAT"
OUTPUT 706; "TDD"&Q$&T$&Q$
! EXAMPLE 3 - SAVE TRACE MEMORY
! TO DISK, RECALL IT ON A DIFFERENT
! CHANNEL AND THEN DELETE FILE
OUTPUT 706; "CH1 D13 S11 CH3 S21 FHI WFS"
OUTPUT 706; "CH1 STD"   ! STORE TRACE TO MEMORY
Q$ = CHR(34)            ! DOUBLE QUOTE SYMBOL(")
N$ = "S11TRACE"         ! FILE NAME FOR TRACE DATA
! STORE TO DISK FILE "S11TRACE.NRM"
OUTPUT 706; "SDK"&Q$&N$&Q$
! RECALL SAME DATA ON CHANNEL 3
OUTPUT 706; "CH3 RCK" &Q$&N$&Q$
! DELETE THE TRACE MEMORY FILE
OUTPUT 706; "DKN" &Q$&N$&Q$
```

Primary Status Byte:

| Bit # | | | | | | | |
|---|---|---|---|---|---|---|---|
| 7 | 6 | 5 | 4 | 3 | 2 | 1 | 0 |
| Self Test Fail | SRQ | 2nd Byte Has Status | Action Not Possible | Out of Range | Syntax Error | Sweep Complete in Hold | Cal Sweep Complete |

Secondary Status Byte:

| Bit # | | | | | | | |
|---|---|---|---|---|---|---|---|
| 7 | 6 | 5 | 4 | 3 | 2 | 1 | 0 |
| Power On | Key Pressed | X* | X | X | Hardware Error | X | Disk Error |

*X denotes not used.

TABLE 5-10

Time Domain Command Codes

| COMMAND CODE | DESCRIPTION | VALUES | TERMINATORS |
|---|---|---|---|
| FQD | Select Frequency Domain for Active Channel | N/A | N/A |
| TBP | Select Bandpass Mode With Time Readouts for active Channel | N/A | N/A |
| DBP | Select Bandpass Mode With Distance Readouts for Active Channel | N/A | N/A |
| TPI | Select Phasor Impulse Mode With Time Readouts for Active Channel | N/A | N/A |
| DPI | Select Phasor Impulse Mode With Distance Readouts for Active Channel | N/A | N/A |
| TLP | Select Lowpass Mode With Time Readouts for Active Channel | N/A | N/A |
| DLP | Select Lowpass Mode With Distance Readouts for Active Channel | N/A | N/A |

TABLE 5-10-continued

Time Domain Command Codes

| COMMAND CODE | DESCRIPTION | VALUES | TERMINATORS |
|---|---|---|---|
| FGT | Select Frequency With Time Gate Mode | N/A | N/A |
| LPI | Select Lowpass Impulse Response for Active Channel | N/A | N/A |
| LPS | Select Lowpass Step Response for Active Channel | N/A | N/A |
| GCN | Turn Gate On on Active Channel | N/A | N/A |
| GCF | Turn Gate Off on Active Channel | N/A | N/A |
| GDS | Display Gate Symbols on Active Channel With Gate Off | N/A | N/A |
| ZST | Set Start of Time Domain Zoom Range for All Channels in Time Domain | | |
| | Time Mode: | −999.999 to 999.999 us | PSC, NSC, USC |
| | Distance Mode: | −999.999 to 999.999 m | MMT, CMT, MTR |
| ZSP | Set Stop of Time Domain Zoom Range for All Channels in Time Domain | | |
| | Time Mode: | −999.999 to 999.999 us | PSC, NSC, USC |
| | Distance Mode: | −999.999 to 999.999 m | MMT, CMT, MTR |
| ZCT | Set Center of Time Domain Zoom Range for All Channels in Time Domain | | |
| | Time Mode: | −999.999 to 999.999 us | PSC, NSC, USC |
| | Distance Mode: | −999.999 to 999.999 m | MMT, CMT, MTR |
| ZSN | Set Span of Time Domain Zoom Range for All Channels in Time Domain | | |
| | Time Mode: | 0 to 999.999 us | PSC, NSC, USC |
| | Distance Mode: | 0 to 999.999 m | MMT, CMT, MTR |
| GST | Set Gate Start Value for All Channels in Time Domain | | |
| | Time Mode: | −999.999 to 999.999 us | PSC, NSC, USC |
| | Distance Mode: | −999.999 to 999.999 m | MMT, CMT, MTR |
| GSP | Set Gate Stop Value for all Channels in Time Domain | | |
| | Time Mode: | −999.999 to 999.999 us | PSC, NSC, USC |
| | Distance Mode: | −999.999 to 999.999 m | MMT, CMT, MTR |
| GCT | Set Gate Center Value for All Channels in Time Domain | | |
| | Time Mode: | 0.0000 to 999.999 us | PSC, NSC, USC |
| | Distance Mode: | 0.0000 to 999.999 m | MMT, CMT, MTR |
| GSN | Set Gate Span Value for all Channels in Time Domain | | |
| | Time Mode: | 0.0000 to 999.999 us | PSC, NSC, USC |
| | Distance Mode: | 0.0000 to 999.999 m | MMT, CMT, MTR |
| GRT | Select Rectangular Gate Shape for all Time Domain Channels | N/A | N/A |
| GNM | Select Nominal Gate Shape for all Time Domain Channels | N/A | N/A |
| GLS | Select Low Sidelobe Gate Shape for all Time Domain Channels | N/A | N/A |
| GMS | Select Minimum Sidelobe Gate Shape for all Time Domain Channels | N/A | N/A |
| WRT | Select Rectangular Window Shape for all Time Domain Channels | N/A | N/A |
| WNM | Select Nominal Window Shape for all Time Domain Channels | N/A | N/A |
| WLS | Select Low Sidelobe Window Shape for all Time Domain Channels | N/A | N/A |
| WMS | Select Minimum Sidelobe Window Shape for all Time Domain Channels | N/A | N/A |
| MRR | Restore Original Range After a Marker Zoom Operation | N/A | N/A |
| DCA | Select Auto d.c. term for Low Pass | N/A | N/A |
| DCZ | Select Line Impedance d.c. term for Low Pass | N/A | N/A |
| DCO | Select Open d.c. Term for Low Pass | N/A | N/A |
| DCS | Select Short d.c. Term for Low Pass | N/A | N/A |
| DCV* | Sect Low Pass d.c Term to Value | −100M Ω to 1000M Ω | XX1, XX3, XM3 |

What is claimed is:

1. A measurement system comprising:

source means for providing respective signals at a respective discrete frequency in a prescribed microwave frequency range;

first local oscillator means for providing first oscillator signals in a first oscillator frequency range;

harmonics means for receiving the first oscillator signals, and for providing harmonics of the first oscillator signals;

first mixing means for receiving respective signals at the respective discrete frequency and for receiving the respective harmonics of the first oscillator signals and for providing first intermediate signals in a first intermediate frequency range;

second local oscillator means for providing second oscillator signals in a second oscillator frequency range;

second mixing means for receiving the respective first intermediate signals and for receiving the respective signals in the second oscillator signals and for providing second intermediate signals in a second intermediate frequency range;

third local oscillator means for providing third local oscillator signals in a third oscillator frequency range;

third mixing means for receiving the respective second intermediate signals and for receiving the respective third oscillator signals and for providing third intermediate signals in a third intermediate frequency range;

bandpass filter means for filtering the third intermediate signals; and oscillator frequency selection means for selecting, for the respective discrete frequency, first and second oscillator frequencies which result in a provision, by said first and second mixing means, of provide no spurious signals in the passband of said bandpass filter means.

2. A measurement system comprising:

source means for providing respective signals at a respective discrete frequency in a prescribed microwave frequency range;

first local oscillator means for providing first oscillator signals in a first oscillator frequency range;

harmonics means for receiving the first oscillator signals, and for providing harmonics of the first oscillator signals;

first mixing means for receiving respective signals at the respective discrete frequency and for receiving the respective harmonics of the first oscillator signals and for providing first intermediate signals in a first intermediate frequency range;

second local oscillator means for providing second oscillator signals in a second oscillator frequency range;

second mixing means for receiving the respective first intermediate signals and for receiving the second oscillator signals and for providing second intermediate signals in a second intermediate frequency range;

third local oscillator means for providing third oscillator signals in a third oscillator frequency range;

third mixing means for receiving the respective second intermediate signals and for receiving the respective third oscillator signals and for providing third intermediate signals in a third intermediate frequency range;

bandpass filter means for filtering signals in the third intermediate frequency range;

synchronous detector means for receiving the third intermediate signals and for providing in-phase and quadrature versions of the third intermediate signals; and variable bandwidth filter means for filtering the in-phase and quadrature versions of the third intermediate signals.

3. A system for measuring microwave frequency signals incident upon a device under test (DUT), comprising:

source means for producing a microwave frequency stimulus signal at any of a plurality of discrete frequencies, said source means including means which substantially locks the stimulus signal at a respective one of said discrete frequencies in response to at least one correction signal;

splitting means for splitting the stimulus signal so as to provide at least one reference stimulus signal and at least one test stimulus signal;

coupling means for providing the at least one test stimulus signal to the DUT and for receiving from the DUT the at least one test stimulus signal that has been incident upon the DUT;

first downconverting means including, at least one first local oscillator means for producing first local oscillator signals in at least one first local oscillator frequency range, harmonics generator means for receiving the first local oscillator signals and for producing sampling pulses, and sampling means responsive to the sampling pulses for sampling the at least one reference stimulus signal and the at least one test stimulus signal that has been incident upon he DUT so as to downconvert the at least one reference stimulus signal and the at least one test stimulus signal that has been incident upon the DUT to a first intermediate frequency range;

second downconverting means for simultaneously linearly downconverting the at least one reference stimulus signal in said first intermediate frequency range and the at least one test stimulus signal that has been incident upon the DUT in said first intermediate frequency range to a second intermediate frequency range; and reference oscillator means for producing a first signal at a first frequency;

phase comparison means for comparing the phase of the linearly downconverted version of the at least one reference stimulus signal in the second intermediate frequency range with the phase of the first signal at the first frequency and producing the at least one correction signal.

4. The system of claim 3 further including:

third downconverting means for simultaneously linearly downconverting, to DC levels, the downconverted versions of the at least one reference stimulus signal and the at least one test stimulus signal that has been incident upon the DUT.

5. The system of claim 3 and further including:

means for calculating a phase shift n the at least one test stimulus signal that has been incident upon the DUT, the phase shift being calculated relative to the at least one reference stimulus signal.

6. The system of claim 5 further including means for calculating an amplitude change in the at least one test stimulus signal that has been incident upon the DUT.

7. The system of claim 3 wherein said second downconverting means includes:

at least one second local oscillator means for providing second local oscillator mixing signals in at least one second oscillator frequency range; and mixer means for mixing the second local oscillator mixing signals with the at least one reference stimulus signal downconverted to the first intermediate frequency range and for mixing the second mixing signals with the at least one test stimulus signal that has been incident upon the DUT and that has been downconverted to the first intermediate frequency range so as to downconvert the at least one reference and the at least one test stimulus signals from the first intermediate frequency range to the second intermediate frequency.

8. The system of claim 1 wherein said mixer means includes at least one double balanced mixer means.

9. The system of claim 3 and further including:
synchronous detector means for producing DC Real and DC Imaginary versions of the at least one reference stimulus signal and the at least one test stimulus signal that has been incident upon the DUT.

10. The system of claim 9 further comprising:
variable bandwidth filter means for filtering out noise in the respective DC Real and DC Imaginary versions of the at least one reference stimulus signal and the at least one test stimulus signal that has been incident upon the DUT.

11. The system of claim 3 and further including:
third downconverting means for simultaneously linearly downconverting, to DC levels the downconverted versions of the at least one reference stimulus signal and the at least one test stimulus signal that has been incident upon the DUT;
wherein said third downconverting means includes synchronous detector means for producing DC Real and DC Imaginary versions of the at least one reference stimulus signal and the at least one test stimulus signal that has been incident upon the DUT.

12. The system of claim 3 wherein the second intermediate frequency is a microwave frequency signal.

13. The system of claim 3 and further including:
third downconverting means for simultaneously linearly downconverting the at least one reference stimulus signal and the t least one test stimulus signal that has been incident upon the DUT so as to downconvert to a third intermediate frequency range the at least one reference stimulus signal and the at least one test stimulus signal that has been incident upon the DUT.

14. The system of claim 13 wherein said third downconverting means includes at least one image reject mixer means.

15. The system of claim 3 and further including:
local oscillator means for producing mixing signals; and
mixer means for mixing the mixing signals with the version of the at least one reference stimulus signal downconverted to the second intermediate frequency range and for mixing the mixing signals with the version of the at least one test stimulus signal that has been downconverted to the second intermediate frequency range and that has been incident upon the DUT so as downconvert the at least one reference and the at least one test stimulus signals to a third intermediate frequency range.

16. The system of claim 3 wherein the linearly downconverted versions of the at least one reference stimulus signal and the at least one test stimulus signal that has been incident upon the DUT are microwave frequency signals.

17. The system of claim 3 wherein said splitting means splits the stimulus signal so as to provide the at least one reference stimulus signal and the at least one test stimulus signal at substantially equal amplitudes.

18. The system of claim 3 wherein said coupling means includes:
at least one first coupler means for providing the at least one test stimulus signal to the DUT in a forward direction; and
at least one second coupler means for providing the at least one test stimulus signal to the DUT in a reverse direction.

19. The system of claim 3 wherein said phase comparison means includes:
noise reduction means for reducing noise in the linearly downconverted versions of the at least one reference stimulus signal and the at least one test stimulus signal that has been incident upon the DUT.

20. The system of claim 19 wherein said noise reduction means includes at least one integrator circuit.

21. The system of claim 20 wherein said noise reduction means includes at least two integrator circuits.

22. The system of claim 21 wherein said phase comparison means includes:
mixer means for mixing the at least one linearly downconverted version of the reference stimulus signal with the signal at the prescribed frequency.

23. The system of claim 22 wherein said mixer means includes at least one double balanced mixer means.

24. The system of claim 23 wherein said mixer means includes at least two double balance mixer means.

25. The system of claim 3 wherein said source means produces an unsynthesized signal.

26. The system of claim 3 further including processor means for calculating a phase shift in the at least one test stimulus signal that has been incident upon the DUT, the phase shift being calculated relative to the at least one reference stimulus signal.

27. The system of claim 3 further comprising processor means for:
(i) calculating a phase shift in the at least one test stimulus signal that has been incident upon the DUT, the phase shift being calculated relative to the at least one reference stimulus signal, and
(ii) calculating an amplitude change in the at least one test stimulus signal that has been incident upon the DUT.

28. A system for measuring microwave frequency signals incident upon a device under test (DUT), comprising:
source means for producing a microwave frequency stimulus signal at any of a plurality of discrete frequencies, said source means including means which substantially locks the stimulus signal at a respective one of said discrete frequencies in response to at least one correction signal;
splitting means for splitting the stimulus signal so as to provide at least one reference stimulus signal and at last one test stimulus signal;
coupling means for providing the at least one test stimulus signal to the DUT and for receiving from the DUT at least one test stimulus signal that has been incident upon the DUT;
at least one first local oscillator means for producing first local oscillator signals in at least one first oscillator frequency range;
harmonics generator means for receiving the first local oscillator signals and for producing sampling pulses;
sampling means responsive to the sampling pulses for sampling the at least one reference stimulus signal and the at least one test stimulus signal that has been incident upon the DUT so as to downconvert the at least one reference stimulus signal and the at least one test stimulus signal that has been incident upon the DUT to a first intermediate frequency range;
at least one second local oscillator means for producing second local oscillator mixing signals in at least one second oscillator frequency range;

mixer means for mixing the second local oscillator mixing signals with the at least one reference stimulus signal downconverted to the first intermediate frequency range and the at least one test stimulus signal that has been incident upon the DUT and that has been downconverted to the first intermediate frequency range so as to further downconvert the at least one reference stimulus signal and the at least one test stimulus signal to a second intermediate frequency range;

reference oscillator means for producing a first signal at a first frequency;

phase comparison means for comparing a phase of the version of the at least one reference stimulus signal downconverted to the second intermediate frequency range with the phase of the first signal at the first frequency and producing the at least one correction signal;

at least one third local oscillator means for producing third local oscillator mixing signals in at least one third oscillator frequency range;

mixer means for mixing the third local oscillator mixing signals with the version of the at least one reference stimulus signal downconverted to the second intermediate frequency and for mixing the third mixing signals with the version of the at least one test stimulus signal that has been incident upon the DUT and that has been downconverted to the second intermediate frequency so as to further downconvert the at least one reference stimulus signal and the at least one test stimulus that has been incident upon the DUT to a third intermediate frequency;

means responsive to said third intermediate frequency for producing DC Real and DC Imaginary versions of the at least one reference stimulus signal and the at least one test stimulus signal that has been incident upon the DUT; and means responsive to said DC Real and DC Imaginary version producing means for calculating a phase shift in the at least one test stimulus signal that has been incident upon the DUT relative to the at least one reference stimulus signal.

29. The system of claim 28 wherein said sampling means includes mode switching means for switching said sampling means between, (i) a sampling mode in which sampling pulses sample the at least one reference stimulus signal and the at least one test stimulus signal that has been incident upon the DUT, and (ii) a direct mode in which the at least one reference stimulus signal and the at least one test stimulus signal that has been incident upon the DUT pass said sampling means substantially without frequency downconversion.

30. The system of claim 29 wherein:

said mode switching means switches said sampling means into the sampling mode when said source means produces the stimulus signal in a prescribed higher frequency range; and said mode switching means switches said sampling means into the direct mode when said source means produces the stimulus signal in a prescribed lower frequency range.

31. The system of claim 30 further comprising:

filter means for respectively filtering the at least one reference stimulus signal and the at least one test stimulus signal that has been incident upon the DUT so as to pass only signals in a first passband.

32. The system of claim 31 further comprising:

filter switching means for coupling said filter means to said sampling means and for decoupling said filter means from said sampling means;

wherein said filter switching means couples said filter means to said sampling means when said sampling means is in the sampling mode and said filter switching means decouples said filter means from said sampling means when said sampling means is in the direct mode.

33. The system of claim 32 wherein said mixer means for providing signals in said second intermediate frequency range includes at least one double balanced mixer means.

34. The system of claim 28 further comprising:

processor means for controlling the frequency of operation of said at least one first local oscillator means and said at least one second local oscillator means.

35. The system of claim 34 wherein:

said processor means causes said at least one first local oscillator means to produce the first local oscillator signals at a respective first unique frequency in at least one other prescribed frequency range for each respective discrete stimulus signal frequency; and said processor means causes said at least one second local oscillator means to provide second local oscillator mixing signals at a respective second unique frequency in at least one prescribed frequency range for each respective discrete stimulus signal frequency.

36. A system for measuring microwave frequency signals incident upon a device under test (DUT) comprising:

reference oscillator means for producing a signal at a prescribed frequency;

source means for producing a microwave frequency stimulus signal at any of a plurality of respective discrete frequencies;

splitting means for splitting the stimulus signal so as to provide at least one reference stimulus signal and at least one test stimulus signal;

coupling means for providing the at least one test stimulus signal to the DUT and for receiving from the DUT at least one test stimulus signal that has been incident upon the DUT; and means responsive to the frequency of said stimulus signal having a harmonic mode of operation and means for downconverting said at least one reference stimulus signal and said at least one test stimulus signal to a first intermediate frequency range when said frequency of said stimulus signal is within a first predetermined range of frequencies and a direct mode of operation and means for providing said at least one reference stimulus signal and said at least one test stimulus signal without their being downconverted when said frequency of said stimulus signal is within a second predetermined range of frequencies, said downconverting means including at least one first local oscillator means for producing first local oscillator signals in a first oscillator frequency range, harmonic generator means for receiving the first local oscillator signals and for producing sampling pulses, and sampling means responsive to the sampling pulses for sampling and downconverting the at least one reference stimulus signal and the at least one test stimulus signal that has been incident upon the DUT to a first intermediate frequency range.

37. The system of claim 36 wherein said mode switching means switches said sampling means into:

(i) the harmonic mode when said source means produces the stimulus signal in a prescribed higher frequency range; and (ii) the direct mode when said source means produces the stimulus signal in a prescribed lower frequency range.

38. The system of claim 36 further comprising:

at least one second local oscillator means for providing second local oscillator mixing signals in at least one second oscillator frequency range; and mixer means for mixing the second local oscillator mixing signals with the at least one reference stimulus signal downconverted to the first intermediate frequency range and for mixing the second mixing signals with the at least one test stimulus signal that has been incident upon the DUT and that has been downconverted to the first intermediate frequency range so as to downconvert the at least one reference and the at least one test stimulus signals from the first intermediate frequency range to a second intermediate frequency range.

39. The system of claim 38 further comprising:

at least one third local oscillator means for producing third local oscillator mixing signals in a third oscillator frequency range;

mixer means for mixing the third local oscillator mixing signals with the at least one reference stimulus signal downconverted to the second intermediate frequency and for mixing the third mixing signals with the at least one test stimulus signal that has been downconverted to the second intermediate frequency and that has been incident upon the DUT so as to downconvert the at least one test reference stimulus signals to a third intermediate frequency; and synchronous detector means for producing DC Real and DC Imaginary versions of the at least one reference stimulus signal and the at least one test stimulus signal that has been incident upon the DUT.

40. The system of claim 39 further comprising:

processor means for calculating a phase shift in the at least one test stimulus signal that has been incident upon the DUT, the phase shift being calculated relative to the at least one reference stimulus signal.

41. The system of claim 39 further comprising processor means for:

(i) calculating a phase shift in the at least one test stimulus signal that has been incident upon the DUT, the phase shift being calculated relative to the at least one reference stimulus signal, and (ii) calculating an amplitude change in the at least one test stimulus signal that has been incident upon the DUT.

42. A method for measuring microwave frequency signals incident upon a device under test (DUT) comprising the steps of:

producing a first signal at a first frequency;

producing a microwave frequency stimulus signal at any of a plurality of respective discrete frequencies;

locking the stimulus signal at a respective discrete frequency in response to at least one correction signal;

splitting the stimulus signal so as to provide at least one reference stimulus signal and at least one test stimulus signal;

providing the at least one test stimulus signal to the DUT;

receiving from the DUT at least one test stimulus signal that has been incident upon the DUT;

simultaneously linearly downconverting the at least one reference stimulus signal and the at least one test stimulus signal that has been incident upon the DUT so as to produce linearly downconverted versions of the at least one reference stimulus signal and the at least one test stimulus signal that has been incident upon the DUT;

comparing a phase of the linearly downconverted version of the at least one reference stimulus signal with a phase of the first signal at the first frequency; and producing the at least one correction signal in response to the phase comparison.

43. The method of claim 42 wherein said step of locking comprises the step of varying the respective discrete frequency so as to cause a limiting of a phase difference between the linearly downconverted version of the at least one reference stimulus signal and the first signal at the first frequency.

44. The method of claim 43 wherein said step of locking comprises the step of substantially removing the phase drift in a frequency of the respective discrete stimulus signal.

45. The method of claim 43 further comprising the step of:

calculating a phase shift in the at least one test stimulus signal that has been incident upon the DUT, the phase shift being calculated relative to the at least one reference stimulus signal.

46. The method of claim 43 further comprising the steps of:

calculating a phase shift in the at least one test stimulus signal that has been incident upon the DUT, the phase shift being calculated relative to the at least one reference stimulus signal; and calculating an amplitude change in the at least one test stimulus signal that has been incident upon the DUT.

47. The method of claim 43 wherein the first frequency is a microwave frequency.

48. The method of claim 47 further comprising the steps of:

downconverting the linearly downconverted versions of the at least one reference stimulus signal and the at least one test stimulus signal that has been incident upon the DUT; and producing DC Real and DC Imaginary versions of the at least one reference stimulus signal and the at least one test stimulus signal that has been incident upon the DUT.

49. A method of operating a network analyzer so as to avoid the generation of spurious intermediate frequency signals when measuring microwave frequency signals incident upon a device under test (DUT) comprising the steps of:

(i) generating a reference and test stimulus signal having a frequency $F_{ST}$;

(ii) generating initial first and a second local oscillator signal having the frequencies $F_{LO1}$ and $F_{LO2}$;

(iii) providing first and second intermediate frequency signals having the frequencies $IF_1$ and $IF_2$, respectively as determined by the following equations $$IF_1 = M * F_{LO1} - F_{ST}, \text{ where M is an initial harmonic number; and}$$

$$IF_2 = F_{LO2} - IF_1;$$

(iv) generating in response to said second intermediate frequency signal having the frequency $IF_2$ and a third local oscillator signal having the frequency $F_{LO3}$, a third intermediate frequency signal having the frequency $IF_3$;

(v) generating a signal for different combinations of M and N, where M and N are harmonic numbers, when the following first and second conditions are met $$|M * F_{LO1} - N * F_{LO2}| < IF_3 - PB_3/2 \text{ and} \qquad (1)$$

$$|M * F_{LO1} - N * F_{LO2}| > IF_3 + PB_3/2 \text{ where } PB_3$$

is the bandwidth of a filter for filtering $IF_3$ (2)

and (vi) repeating steps (ii) through (v) with new values of $F_{LO1}$ and $F_{LO2}$ for each combination of M and N until neither the first or the second condition is met.

50. A method of operating a network analyzer as to avoid the generation of spurious intermediate frequency signals when measuring microwave frequency signals incident upon a device under test (DUT) comprising the steps of:

(i) generating a stimulus signal having the frequency FST;

(ii) generating first and second local oscillator signals having the frequencies $F_{LO1}$ and $F_{LO2}$, respectively, as determined by the following algorithm, $F = F_{ST} * 20$
$H = 1 + \text{Integer}(F + 1788)/10730$
$Z = 5365/(3 + H/1250)$
$F_{LO1} = 1 + \text{Integer} /20$
$F_{LO2} = H * F_{LO1} - F/20 + 2.25$ for producing first and second intermediate frequencies $IF_1$ and $IF_2$, respectively;

(iii) generating a third local oscillator signal having a frequency $F_{LO3}$ which, when mixed with $F_2$, produces a predetermined third intermediate frequency $F_3$;

(iv) testing for harmonics of $F_{LO1}$ and $F_{LO2}$ which will produce a spurious $F_3$ if the following first and second conditions of inequalities are met, $$|M * F_{LO1} - N * F_{LO2}| < IF_3 - PB_3/2 \quad (1)$$

$$|M * F_{LO1} - N * F_{LO2}| > IF_3 - PB_3/2 \quad (2)$$

where M and N are harmonic numbers and $PB_3$ is the bandwidth of a filter for filtering $IF_3$; and (v) changing the values of M, N, $F_{LO1}$ and $F_{LO2}$ while maintaining the relationship $F_{ST} = H * F_{LO1} - F_{LO2} + IF_2$ and avoiding the conditions of inequalities (1) and (2) above.

* * * * *

UNITED STATES PATENT AND TRADEMARK OFFICE
CERTIFICATE OF CORRECTION

PATENT NO. : 5,524,281
DATED : June 4, 1996
INVENTOR(S) : Bradley, et. al.

It is certified that error appears in the above-indentified patent and that said Letters Patent is hereby corrected as shown below:

Col. 175, line 9, delete "1" and insert --7--.

Col. 182, line 2, delete "$F_2$" and insert --$IF_2$--.

Col. 182, line 3, delete "$F_3$" and insert --$IF_3$--.

Col. 182, line 5, delete "$F_3$" and insert --$IF_3$--.

Signed and Sealed this

Twenty-ninth Day of July, 1997

*Attest:*

BRUCE LEHMAN

*Attesting Officer*   *Commissioner of Patents and Trademarks*